US011594176B2

(12) United States Patent
Godo et al.

(10) Patent No.: US 11,594,176 B2
(45) Date of Patent: Feb. 28, 2023

(54) SEMICONDUCTOR DEVICE, DISPLAY APPARATUS, ELECTRONIC DEVICE, AND OPERATION METHOD OF SEMICONDUCTOR DEVICE

(71) Applicant: Semiconductor Energy Laboratory Co., Ltd., Atsugi (JP)

(72) Inventors: Hiromichi Godo, Isehara (JP); Yoshiyuki Kurokawa, Sagamihara (JP); Kazuki Tsuda, Atsugi (JP); Satoru Ohshita, Atsugi (JP); Hidefumi Rikimaru, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/686,796

(22) Filed: Mar. 4, 2022

(65) Prior Publication Data
US 2022/0293049 A1    Sep. 15, 2022

(30) Foreign Application Priority Data

| Mar. 11, 2021 | (JP) | .............................. JP2021-039484 |
| Mar. 19, 2021 | (JP) | .............................. JP2021-046105 |
| Jul. 21, 2021 | (JP) | .............................. JP2021-120665 |

(51) Int. Cl.
*G09G 3/3208* (2016.01)
*H01L 27/32* (2006.01)
*H01L 29/786* (2006.01)

(52) U.S. Cl.
CPC ....... *G09G 3/3208* (2013.01); *H01L 27/3262* (2013.01); *H01L 27/3269* (2013.01); *H01L 29/7869* (2013.01); *H01L 29/78648* (2013.01)

(58) Field of Classification Search
CPC ......... G09G 3/3208; G09G 2310/0297; G09G 2310/027; G06F 7/00; G06F 17/00; H01L 27/3262
See application file for complete search history.

(56) References Cited

U.S. PATENT DOCUMENTS

| 6,147,630 A    * | 11/2000 | Sasai ........................ G06G 7/12 |
|                  |         | 341/110 |
| 2005/0122238 A1* | 6/2005  | Nomura .................. H03M 5/08 |
|                  |         | 341/53 |

(Continued)

FOREIGN PATENT DOCUMENTS

| EP | 0466331 A     | 1/1992 |
| JP | 2018-036639 A | 3/2018 |

OTHER PUBLICATIONS

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.

(Continued)

*Primary Examiner* — Kevin M Nguyen
(74) *Attorney, Agent, or Firm* — Robinson Intellectual Property Law Office; Eric J. Robinson

(57) ABSTRACT

A semiconductor device with a high driving speed is provided. The semiconductor device includes first to fourth cells, a converter circuit, and first to fourth wirings. The first and second cells make a first current and a second current each corresponding to the product of first data and second data flow in the first wiring and the second wiring, respectively. The third and fourth cells make base currents in the same amount flow in the first and second wirings. The converter circuit outputs, from an output terminal thereof, a voltage corresponding to the differential current between the sum of the first current and the base current flowing in the (Continued)

first wiring and the sum of the second current and the base current flowing in the second wiring.

13 Claims, 51 Drawing Sheets

(56) References Cited

U.S. PATENT DOCUMENTS

| | | |
|---|---|---|
| 2016/0295152 A1 | 10/2016 | Kurokawa |
| 2016/0343452 A1 | 11/2016 | Ikeda et al. |
| 2017/0063351 A1 | 3/2017 | Kurokawa |
| 2017/0116512 A1 | 4/2017 | Kurokawa |
| 2017/0118479 A1 | 4/2017 | Kurokawa |
| 2017/0263291 A1 | 9/2017 | Kurokawa |
| 2018/0061344 A1 | 3/2018 | Kurokawa |

OTHER PUBLICATIONS

Kang.M et al., "A Multi-Functional In-Memory Inference Processor Using a Standard 6T SRAM Array", IEEE Journal of Solid-State Circuits, Jan. 4, 2018, vol. 53, No. 2, pp. 642-655.

Zhang.J et al., "In-Memory Computation of a Machine-Learning Classifier in a Standard 6T SRAM Array", IEEE Journal of Solid-State Circuits, Mar. 10, 2017, vol. 52, No. 4, pp. 915-924.

Liu.Q et al., "A Fully Integrated Analog ReRAM Based 78.4TOPS/W Compute-In-Memory Chip with Fully Parallel MAC Computing", ISSCC 2020 (Digest of Technical Papers. IEEE International Solid-State Circuits Conference), Feb. 16, 2020, pp. 500-502.

Khaddam-Aljameh.R et al., "HERMES Core—A 14nm CMOS and PCM-based In-Memory Compute Core using an array of 300ps/LSB Linearized CCO-based ADCs and local digital processing", 2021 Symposium on VLSI Circuits Digest of Technical Papers, Jun. 13, 2021, pp. JFS2-5-1-JFS2-5-2.

Dutta.S et al., "Monolithic 3D Integration of High Endurance Multi-Bit Ferroelectric FET for Accelerating Compute-In-Memory", IEDM 20: Technical Digest of International Electron Devices Meeting, Dec. 12, 2020, pp. 801-804.

Esmanhotto.E et al., "High-Density 3D Monolithically Integrated Multiple 1T1R Multi-Level-Cell for Neural Networks", IEDM 20: Technical Digest of International Electron Devices Meeting, Dec. 12, 2020, pp. 805-808.

Saito.D et al., "IGZO-Based Compute Cell for Analog In-Memory Computing. DTCO Analysis to Enable Ultralow-Power AI at Edge", IEEE Transactions on Electron Devices, Oct. 5, 2020, vol. 67, No. 11, pp. 4616-4620.

* cited by examiner

400E

400F

400G

400H

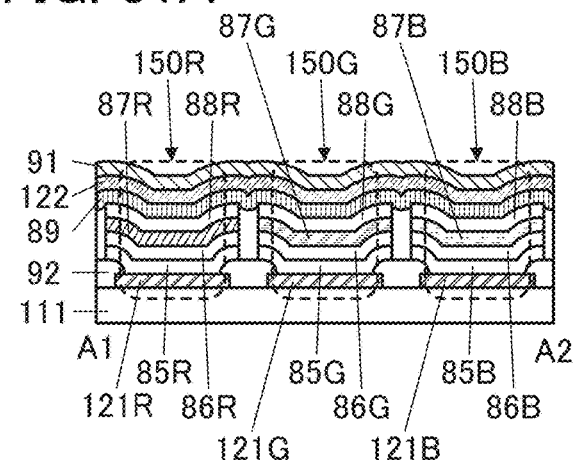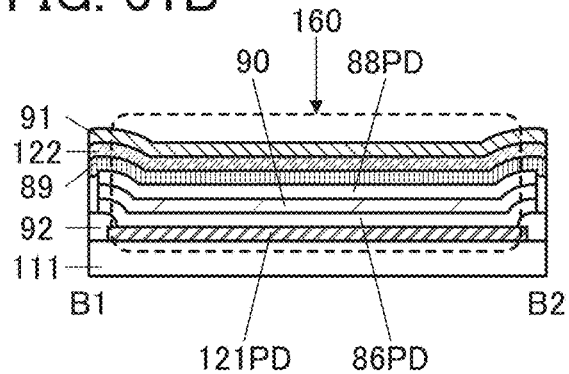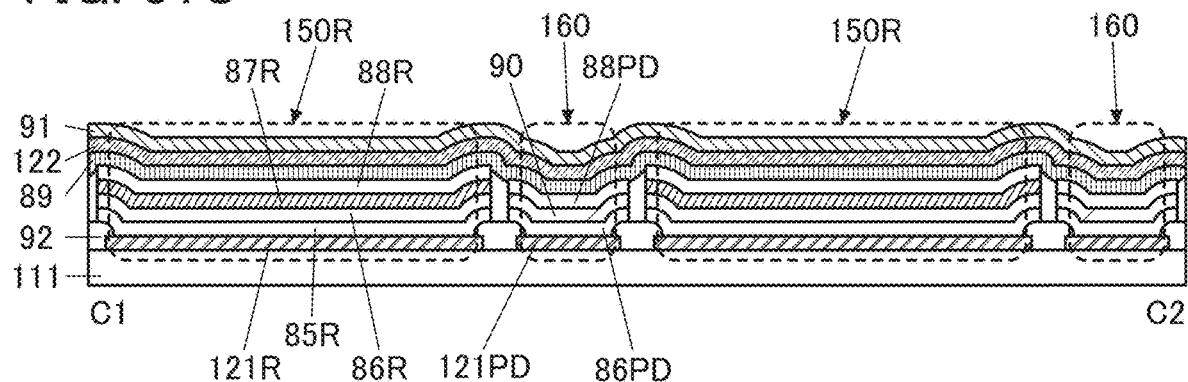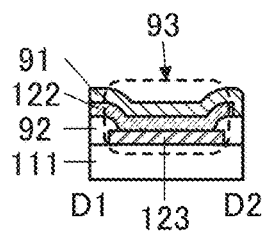

FIG. 32A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 32B
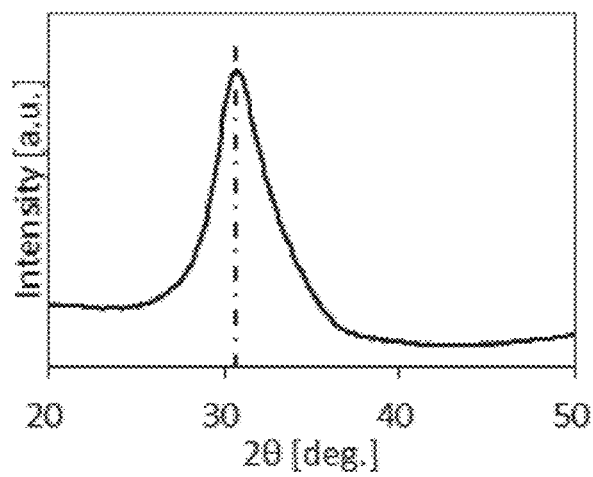
FIG. 32C
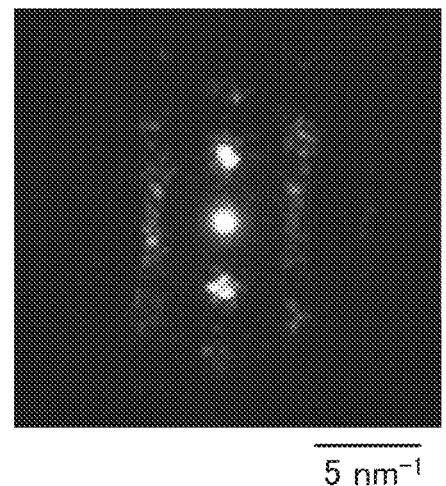

SEMICONDUCTOR DEVICE, DISPLAY APPARATUS, ELECTRONIC DEVICE, AND OPERATION METHOD OF SEMICONDUCTOR DEVICE

BACKGROUND OF THE INVENTION

1. Field of the Invention

One embodiment of the present invention relates to a semiconductor device, a display apparatus, an electronic device, and an operation method of a semiconductor device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

2. DESCRIPTION OF THE RELATED ART

Integrated circuits that imitate the mechanism of the human brain are currently under active development. The integrated circuits incorporate electronic circuits as the brain mechanism and include circuits corresponding to neurons and synapses of the human brain. Such integrated circuits may therefore be referred to as "neuromorphic", "brain-morphic", or "brain-inspired" circuits. The integrated circuits have a non-von Neumann architecture and are expected to be able to perform parallel processing with extremely low power consumption as compared with a von Neumann architecture, which consumes higher power with increasing processing speed.

An information processing model that imitates a biological neural network including neurons and synapses is referred to as an artificial neural network (ANN). For example, Non-Patent Documents 1 and 2 each disclose an arithmetic device including an artificial neural network constructed using a static random access memory (SRAM).

An attempt has been made to use an arithmetic device in which an artificial neural network is constructed, for example, for correction of images to be displayed by a display apparatus. For example, in a display apparatus disclosed in Patent Document 1, an arithmetic circuit in which an artificial neural network is constructed is used to adjust the luminance, tone, and the like of displayed images in accordance with the preference of the user.

REFERENCE

[Patent Document 1] Japanese Published Patent Application No. 2018-036639

Non-Patent Document

[Non-Patent Document 1] M. Kang et al., "IEEE Journal Of Solid-State Circuits", 2018, Volume 53, No. 2, pp. 642-655.

[Non-Patent Document 2] J. Zhang et al., "IEEE Journal Of Solid-State Circuits", 2017, Volume 52, No. 4, pp. 915-924.

SUMMARY OF THE INVENTION

Examples of an arithmetic device in which an artificial neural network is constructed include an arithmetic circuit that performs a product-sum operation to yield the sum of analog currents each corresponding to the product of a weight coefficient and input data. Since the arithmetic circuit uses analog currents for an arithmetic operation, its circuit scale and circuit area can be smaller than those of an arithmetic circuit formed of a digital circuit. Furthermore, the arithmetic circuit can have lower power consumption when designed such that the analog current used in the arithmetic operation becomes lower. However, such a low analog current extends the time taken to charge a capacitor, a wiring, an electrode, and the like of the circuit with electric charges and might accordingly slow down the operation of the arithmetic circuit.

An object of one embodiment of the present invention is to provide a semiconductor device with a reduced circuit area. Another object of one embodiment of the present invention is to provide a semiconductor device with a high driving speed. Another object of one embodiment of the present invention is to provide a display apparatus including any of the above semiconductor devices. Another object of one embodiment of the present invention is to provide an electronic device including the above display apparatus. Another object of one embodiment of the present invention is to provide an operation method of a semiconductor device which increases the driving speed. Another object of one embodiment of the present invention is to provide a novel semiconductor device, a novel display apparatus, or a novel electronic device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

(1) One embodiment of the present invention is a semiconductor device including a first cell, a second cell, a third cell, a fourth cell, a converter circuit, a first wiring, a second wiring, a third wiring, and a fourth wiring. The first cell is electrically connected to the first wiring and the third wiring, the second cell is electrically connected to the second wiring and the third wiring, the third cell is electrically connected to the first wiring and the fourth wiring, and the fourth cell is electrically connected to the second wiring and the fourth wiring. A first input terminal of the converter circuit is electrically connected to the first wiring, and a second input terminal of the converter circuit is electrically connected to the second wiring. The first cell has a function of retaining a first potential corresponding to one of two pieces of first data and a function of making a first current corresponding to the product of the one of the two pieces of first data and second data input from the third wiring to the first cell flow in the first wiring. The second cell has a function of retaining a second potential corresponding to the other of the two pieces of first data and a function of making a second current corresponding to the product of the other of the two pieces of first data and the second data input from the third wiring to the second cell flow in the second wiring. The value of either or each of the two pieces of first data is 0. The third cell has a function of retaining a third potential corresponding to third data and a function of making a third current corresponding to the product of fourth data input from the fourth wiring to the third cell and the third data flow in the first wiring. The fourth cell has a function of retaining the third potential corresponding to the third data and a function of making a fourth current corresponding to the product of the fourth data input from the fourth wiring to the fourth cell and the third data flow in the second wiring. The converter circuit has a function of outputting, from an output terminal of the converter circuit, a voltage corresponding to the differential current between the sum of the first current and the third current input to the first input terminal of the converter circuit and the sum of the second current and the fourth current input to the second input terminal of the converter circuit.

(2) Another embodiment of the present invention is the semiconductor device according to (1) in which the converter circuit outputs a voltage value corresponding to the sum of products of the first data and the second data.

(3) Another embodiment of the present invention is the semiconductor device according to (1) or (2) which includes a first reference cell and a second reference cell. Specifically, each of the first cell, the second cell, the third cell, and the fourth cell preferably includes a first transistor, a second transistor, and a first capacitor, and each of the first reference cell and the second reference cell preferably includes a third transistor, a fourth transistor, and a second capacitor. Each of the second transistor and the fourth transistor preferably has a function of allowing a current for operation in a subthreshold region to flow. In each of the first cell, the second cell, the third cell, and the fourth cell, it is preferable that one of a source and a drain of the first transistor be electrically connected to a gate of the second transistor and a first terminal of the first capacitor. In the first cell, it is preferable that the other of the source and the drain of the first transistor be electrically connected to the first wiring and one of a source and a drain of the second transistor, and a second terminal of the first capacitor be electrically connected to the third wiring. In the second cell, it is preferable that the other of the source and the drain of the first transistor be electrically connected to the second wiring and the one of the source and the drain of the second transistor, and the second terminal of the first capacitor be electrically connected to the third wiring. In the third cell, it is preferable that the other of the source and the drain of the first transistor be electrically connected to the first wiring and the one of the source and the drain of the second transistor, and the second terminal of the first capacitor be electrically connected to the fourth wiring. In the fourth cell, it is preferable that the other of the source and the drain of the first transistor be electrically connected to the second wiring and the one of the source and the drain of the second transistor, and the second terminal of the first capacitor be electrically connected to the fourth wiring. In each of the first reference cell and the second reference cell, it is preferable that one of a source and a drain of the third transistor be electrically connected to a gate of the fourth transistor and a first terminal of the second capacitor. In the first reference cell, it is preferable that the other of the source and the drain of the third transistor be electrically connected to the third wiring and one of a source and a drain of the fourth transistor, and a second terminal of the second capacitor be electrically connected to the third wiring. In the second reference cell, it is preferable that the other of the source and the drain of the third transistor be electrically connected to the fourth wiring and the one of the source and the drain of the fourth transistor, and the second terminal of the second capacitor be electrically connected to the fourth wiring.

(4) Another embodiment of the present invention is the semiconductor device according to any one of (1) to (3) which includes a first layer and a second layer. The first layer preferably includes the first cell, the second cell, the third cell, and the fourth cell and the second layer preferably includes a light-receiving element. The second layer is preferably positioned above the first layer. The light-receiving element is preferably electrically connected to the third wiring. The light-receiving element specifically preferably has a function of receiving light to generate a current corresponding to the intensity of the light and a function of making the current flow in the third wiring as the third data.

(5) Another embodiment of the present invention is a display apparatus which includes the semiconductor device according to (4) and a light-emitting device. Specifically, the second layer preferably includes the light-emitting device.

(6) Another embodiment of the present invention is an electronic device which includes the display apparatus according to (5) and a housing.

(7) Another embodiment of the present invention is an operation method of a semiconductor device including a first cell, a second cell, a third cell, a fourth cell, a converter circuit, a first wiring, a second wiring, a third wiring, and a fourth wiring. Specifically, the first cell is electrically connected to the first wiring and the third wiring, the second cell is electrically connected to the second wiring and the third wiring, the third cell is electrically connected to the first wiring and the fourth wiring, and the fourth cell is electrically connected to the second wiring and the fourth wiring. A first input terminal of the converter circuit is electrically connected to the first wiring, and a second input terminal of the converter circuit is electrically connected to the second wiring. The operation method of the semiconductor device includes a first step, a second step, a third step, and a fourth step. The first step includes a step of writing a first potential corresponding to one of two pieces of first data to the first cell and a step of writing a second potential corresponding to the other of the two pieces of first data to the second cell. The second step includes a step of writing a third potential corresponding to third data to each of the third cell and the fourth cell. The third step includes a step of transmitting second data to the third wiring and a step of transmitting fourth data to the fourth wiring. The fourth step includes a step in which the first cell makes a first current corresponding to the product of the second data and the one of the two pieces of first data flow in the first wiring; a step in which the second cell makes a second current corresponding to the product of the second data and the other of the two pieces of first data flow in the second wiring; a step in which the third cell makes a third current corresponding to the product of the third data and the fourth data flow in the first wiring; a step in which the fourth cell makes a fourth current corresponding to the product of the third data and the fourth data flow in the second wiring; and a step in which the converter circuit outputs, from an output terminal of the converter circuit, a voltage corresponding to the differential current between the sum of the first current and the third current input to the first input terminal of the converter circuit and the sum of the second current and the fourth current input to the second input terminal of the converter circuit.

(8) Another embodiment of the present invention is an operation method of a semiconductor device including a first cell, a second cell, a third cell, a fourth cell, a converter circuit, a first wiring, a second wiring, a third wiring, and a fourth wiring. Specifically, in the semiconductor device, the first cell is electrically connected to the first wiring and the third wiring, the second cell is electrically connected to the second wiring and the third wiring, the third cell is electrically connected to the first wiring and the fourth wiring, the fourth cell is electrically connected to the second wiring and the fourth wiring, a first input terminal of the converter circuit is electrically connected to the first wiring, and a second input terminal of the converter circuit is electrically connected to the second wiring. Note that first data, second data, third data, and fourth data are input to the semiconductor device. The first data includes two pieces of data. The value of either or each of the two pieces of data is 0. One of the two pieces of data is data input from the first wiring to the first cell. The other of the two pieces of data is data input from the second wiring to the second cell. The second data is data input from the third wiring to the first cell and the second cell. The third data is data input from the first wiring to the third cell and input from the second wiring to the fourth cell. The fourth data is data input from the fourth wiring to the third cell and the fourth cell. The operation method of the semiconductor device includes a first step and a second step. The first step includes a step in which the first cell retains a first potential corresponding to the one of the two pieces of data and makes a first current corresponding to the product of the second data input from the third wiring to the first cell and the one of the two pieces of data flow in the first wiring; a step in which the second cell retains a second potential corresponding to the other of the two pieces of data and makes a second current corresponding to the product of the second data input from the third wiring to the second cell and the other of the two pieces of data flow in the second wiring; a step in which the third cell retains a third potential corresponding to the third data and makes a third current corresponding to the product of the fourth data input from the fourth wiring to the third cell and the third data flow in the first wiring; and a step in which the fourth cell retains the third potential corresponding to the third data and makes a fourth current corresponding to the product of the fourth data input from the fourth wiring to the fourth cell and the third data flow in the second wiring. The second step includes a step in which the converter circuit outputs, from an output terminal of the converter circuit, a voltage corresponding to the differential current between the sum of the first current and the third current input to the first input terminal of the converter circuit and the sum of the second current and the fourth current input to the second input terminal of the converter circuit.

(9) Another embodiment of the present invention is the operation method of the semiconductor device according to (8) which includes a third step, a fourth step, a fifth step, a sixth step, a seventh step, and an eighth step. Specifically, the third step includes a step of selecting any one of a first mode, a second mode, and a third mode. The fourth step includes a step of proceeding to the sixth step when the first mode is selected in the third step; and a step of proceeding to the fifth step when the first mode is not selected in the third step. The fifth step includes a step of proceeding to the seventh step when the second mode is selected in the third step; and a step of proceeding to the eighth step when the second mode is not selected in the third step. The sixth step includes a step of setting the fourth data to $D_{XL}$. The seventh step includes a step of setting the fourth data to $D_{XM}$. The eighth step includes a step of setting the fourth data to $D_{XS}$. The $D_{XL}$ is a value larger than the $D_{XM}$ and the $D_{XS}$, the $D_{XM}$ is a value larger than the $D_{XS}$, and the $D_{XS}$ is a positive value. The first step and the second step are preferably performed after any one of the sixth step, the seventh step, and the eighth step is performed.

(10) Another embodiment of the present invention is the operation method of the semiconductor device according to (8) which includes a third step, a fourth step, a fifth step, a sixth step, a seventh step, and an eighth step and is different from the operation method according to (9). Specifically, the third step includes a step of selecting any one of a first mode, a second mode, and a third mode. The fourth step includes a step of proceeding to the sixth step when the first mode is selected in the third step; and a step of proceeding to the fifth step when the first mode is not selected in the third step. The fifth step includes a step of proceeding to the seventh step when the second mode is selected in the third step; and a step of proceeding to the eighth step when the second mode is not selected in the third step. The sixth step includes a step of setting the third data to $D_{WL}$. The seventh step includes a step of setting the third data to $D_{WM}$. The eighth step includes a step of setting the third data to $D_{WS}$. The $D_{WL}$ is a value larger than the $D_{WM}$ and the $D_{WS}$, the $D_{WM}$ is a value larger than the $D_{WS}$, and the $D_{WS}$ is a positive value. The first step and the second step are preferably performed after any one of the sixth step, the seventh step, and the eighth step is performed.

(11) Another embodiment of the present invention is an operation method of a semiconductor device including a first cell, a second cell, a plurality of third cells, a plurality of fourth cells, a converter circuit, a first wiring, a second wiring, a third wiring, and a plurality of fourth wirings. Specifically, in the semiconductor device, the first cell is electrically connected to the first wiring and the third wiring, the second cell is electrically connected to the second wiring and the third wiring, the plurality of third cells are electrically connected to the first wiring, the plurality of third cells are electrically connected to the respective fourth wirings, the plurality of fourth cells are electrically connected to the second wiring, the plurality of fourth cells are electrically connected to the respective fourth wirings, a first input terminal of the converter circuit is electrically connected to the first wiring, and a second input terminal of the converter circuit is electrically connected to the second wiring. Note that first data, second data, third data, and fourth data are input to the semiconductor device. The first data includes two pieces of data. The value of either or each of the two pieces of data is 0. One of the two pieces of data is data input from the first wiring to the first cell. The other of the two pieces of data is data input from the second wiring to the second cell. The second data is data input from the third wiring to the first cell and the second cell. The third data is data input from the first wiring to the plurality of third cells and input from the second wiring to the plurality of fourth cells. The fourth data is data input from the fourth wiring to the third cell and the fourth cell. The operation method of the semiconductor device includes a first step and a second step. The first step includes a step in which the first cell retains a first potential corresponding to the one of the two pieces of data and makes a first current corresponding to the product of the second data input from the third wiring to the first cell and the one of the two pieces of data flow in the first wiring; a step in which the second cell retains a second potential corresponding to the other of the two pieces of data and makes a second current corresponding to the product of the second data input from the third wiring to the second cell and the other of the two pieces of data flow in the second wiring; a step in which each of the plurality of third cells retains a third potential corresponding to the third data and makes a third current corresponding to the product of the fourth data input from the fourth wiring to the third cell and the third data flow in the first wiring; and a step in which each of the plurality of fourth cells retains the third potential corresponding to the third data and makes a fourth current corresponding to the product of the fourth data input from the fourth wiring to the fourth cell and the third data flow in the second wiring. The second step includes a step in which the converter circuit outputs, from an output terminal of the converter circuit, a voltage corresponding to the differential current between a current amount input to the first input terminal of the converter circuit and a current amount input to the second input terminal of the converter circuit.

(12) Another embodiment of the present invention is the operation method of the semiconductor device according to (11) which includes a third step, a fourth step, a fifth step, a sixth step, a seventh step, and an eighth step. Specifically, the third step includes a step of selecting any one of a first mode, a second mode, and a third mode. The fourth step includes a step of proceeding to the sixth step when the first mode is selected in the third step; and a step of proceeding to the fifth step when the first mode is not selected in the third step. The fifth step includes a step of proceeding to the seventh step when the second mode is selected in the third step; and a step of proceeding to the eighth step when the second mode is not selected in the third step. The sixth step includes a step of setting, to $R_L$, the number of the fourth wirings to which the fourth data is input. The seventh step includes a step of setting, to $R_M$, the number of the fourth wirings to which the fourth data is input. The eighth step includes a step of setting, to $R_S$, the number of the fourth wirings to which the fourth data is input. The $R_L$ is a positive integer larger than the $R_M$ and the $R_S$, the $R_M$ is a positive integer larger than the $R_S$, and the $R_S$ is a positive integer. The first step and the second step are preferably performed after any one of the sixth step, the seventh step, and the eighth step is performed.

(13) Another embodiment of the present invention is the operation method of the semiconductor device according to any one of (9), (10), and (12) in which the first mode is selected in the third step when arithmetic processing performed by the semiconductor device is an authentication operation using an image.

(14) Another embodiment of the present invention is the operation method of the semiconductor device according to any one of (9), (10), and (12) in which any one of the first mode, the second mode, and the third mode is selected in the third step in accordance with power supplied to the semiconductor device.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves might be semiconductor devices, or might each include a semiconductor device.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor element, an inductor, a resistor element, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit, an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor element" can be, for example, a circuit element or a wiring having a resistance higher than 0Ω. Therefore, in this specification and the like, a "resistor element" includes a wiring having a resistance, a transistor in which a current flows between its source and drain, a diode, and a coil. Thus, the term "resistor element" can be sometimes replaced with the terms "resistor", "load", and "region having a resistance", and the like, conversely, the terms "resistor", "load", and "region having a resistance" can be sometimes replaced with the term "resistor element" and the like. The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance may be higher than or equal to 1Ω and lower than or equal to $1×10^9$Ω.

In this specification and the like, a "capacitor element" can be, for example, a circuit element having an electrostatic capacitance greater than 0 F, a region of a wiring having an electrostatic capacitance greater than 0 F, parasitic capacitance, or gate capacitance of a transistor. The terms "capacitor element", "parasitic capacitance", "gate capacitance", and the like can be sometimes replaced with the term "capacitor" and the like; conversely, the term "capacitor" can be sometimes replaced with the terms "capacitor element", "parasitic capacitance", "gate capacitance", and the like. The term "a pair of electrodes" of a capacitor can be replaced with the terms "a pair of conductors", "a pair of conductive regions", and "a pair of regions", for example. Note that the electrostatic capacitance can be greater than or equal to 0.05 fF and less than or equal to 10 pF, for example. As another example, the electrostatic capacitance may be greater than or equal to 1 pF and less than or equal to 10 μF.

In this specification and the like, a transistor includes three terminals called a gate, a source, and a drain. The gate is a control terminal for controlling the on/off state of the transistor. The two terminals functioning as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be sometimes used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, with the multi-gate structure, a drain-source current does not change very much even if a drain-source voltage changes when the transistor operates in a saturation region, so that a flat slope of voltage-current characteristics can be obtained. By utilizing the flat slope of the voltage-current characteristics, an ideal current source circuit or an active load having an extremely high resistance can be obtained. Accordingly, a differential circuit, a current mirror circuit, or the like having excellent properties can be obtained.

A single circuit element shown in a circuit diagram may include a plurality of circuit elements. For example, a single resistor shown in a circuit diagram may be two or more resistors electrically connected to each other in series. For another example, a single capacitor shown in a circuit diagram may be two or more capacitors electrically connected to each other in parallel. For another example, a single transistor shown in a circuit diagram may be two or more transistors which are electrically connected to each other in series and whose gates are electrically connected to each other. For another example, a single switch shown in a circuit diagram may be a switch including two or more transistors which are electrically connected to each other in series or in parallel and whose gates are electrically connected to each other.

In this specification and the like, a node can be referred to as a terminal, a wiring, an electrode, a conductive layer, a conductor, an impurity region, and the like depending on the circuit configuration and the device structure. Furthermore, a terminal, a wiring, and the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials that these wirings supply are not necessarily equal to each other. Similarly, in the case where two wirings are both described as "functioning as a wiring for supplying a low-level potential", the levels of the low-level potentials that these wirings supply are not necessarily equal to each other.

A current means an electric charge transfer (electrical conduction); for example, the expression "electrical conduction of positively charged particles is caused" can be rephrased as "electrical conduction of negatively charged particles is caused in the opposite direction". Therefore, unless otherwise specified, a current in this specification and the like refers to an electric charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a carrier with a positive electric charge moves, and the amount of a current is expressed as a positive value. In other words, the direction in which a carrier with a negative electric charge moves is opposite to the direction of a current, and the amount of a current is expressed as a negative value. Thus, in the case where the polarity of a current (or the direction of a current) is not specified in this specification and the like, the expression "a current flows from an element A to an element B" can be replaced with "a current flows from an element B to an element A", for example. As another example, the expression "a current is input to an element A" can be replaced with "a current is output from an element A".

Ordinal numbers such as "first", "second", and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram showing these components is rotated by 180°.

The terms such as "over", "above", "under", and "below" do not necessarily mean that a component is placed directly on or under and directly in contact with another component. For example, the expression "electrode B over insulating layer A" does not necessarily mean that the electrode B is on and in direct contact with the insulating layer A, and can mean the case where another component is provided between the insulating layer A and the electrode B. In a similar manner, for example, the expression "electrode B above insulating layer A" does not necessarily mean that the electrode B is over and in direct contact with the insulating layer A, and can mean the case where another component is provided between the insulating layer A and the electrode B. In a similar manner, for example, the expression "electrode B below insulating layer A" does not necessarily mean that the electrode B is under and in direct contact with the insulating layer A, and can mean the case where another component is provided between the insulating layer A and the electrode B.

In this specification and the like, components arranged in a matrix and their positional relation are sometimes described using terms such as "row" and "column" The positional relation between components is changed as appropriate in accordance with the direction from which each component is described. Thus, the positional relation is not limited to that described with a term used in this specification and the like and can be explained with another term as appropriate depending on the situation. For example, the term "row direction" can be replaced with the term "column direction" when the direction of the diagram is rotated by 90°.

In this specification and the like, the terms "film" and "layer" can be interchanged with each other depending on circumstances. For example, the term "conductive layer" can be changed to the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

In this specification and the like, the terms "electrode", "wiring", and "terminal" do not have functional limitations. For example, an "electrode" is used as part of a wiring in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case where a plurality of electrodes, wirings, terminals, and the like are formed in an integrated manner. Therefore, for example, an "electrode" can be part of a wiring or a terminal, and a "terminal" can be part of a wiring or an electrode. Moreover, the terms "electrode", "wiring", and "terminal" are sometimes replaced with the term "region", for example.

In this specification and the like, the terms "wiring", "signal line", "power supply line", and the like can be interchanged with each other depending on the case or in accordance with circumstances. For example, the term "wiring" can be changed into the term "signal line" in some cases. Also, for example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power source line" or the like in some cases. The term "potential"

that is applied to a wiring can be changed into the term "signal" or the like depending on the case or in accordance with circumstances. Inversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, the density of defect states in the semiconductor may be increased, the carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples are hydrogen (included also in water), lithium, sodium, silicon, boron, phosphorus, carbon, and nitrogen. Specifically, when the semiconductor is a silicon layer, examples of impurities that change the characteristics of the semiconductor include Group 1 elements, Group 2 elements, Group 13 elements, and Group 15 elements (with the exception of oxygen and hydrogen).

In this specification and the like, a switch is in a conduction state (on state) or in a non-conduction state (off state) to control whether a current flows therethrough or not. Alternatively, a switch has a function of selecting and changing a current path. Thus, a switch may have two or more terminals through which a current flows, in addition to a control terminal. For example, an electrical switch or a mechanical switch can be used. That is, a switch is not limited to a certain element and can be any element capable of controlling a current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the conduction state of the transistor refers to a state in which a source electrode and a drain electrode of the transistor are regarded as being electrically short-circuited or a state in which a current can flow between the source electrode and the drain electrode, for example. The non-conduction state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white-light-emitting device. Note that a combination of such a white-light-emitting device with coloring layers (e.g., color filters) enables providing a full-color display apparatus.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain white light emission, two or more light-emitting layers that emit light of complementary colors are selected. For example, when emission colors of a first light-emitting layer and a second light-emitting layer are complementary colors, the light-emitting device can be configured to emit white light as a whole. The same applies to a light-emitting device including three or more light-emitting layers.

A light-emitting device with a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the light-emitting device with a tandem structure, it is preferable that an intermediate layer such as a charge-generation layer be provided between the plurality of light-emitting units.

When the white-light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

In this specification, "parallel" indicates a state where the angle formed between two straight lines is greater than or equal to $-10°$ and less than or equal to $10°$. Thus, the case where the angle is greater than or equal to $-5°$ and less than or equal to $5°$ is also included. The terms "approximately parallel" and "substantially parallel" indicate that the angle formed between two straight lines is greater than or equal to $-30°$ and less than or equal to $30°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included. The terms "approximately perpendicular" and "substantially perpendicular" indicate that the angle formed between two straight lines is greater than or equal to $60°$ and less than or equal to $120°$.

According to one embodiment of the present invention, a semiconductor device with a reduced circuit area can be provided. According to another embodiment of the present invention, a semiconductor device with a high driving speed can be provided. According to another embodiment of the present invention, a display apparatus including any of the above semiconductor devices can be provided. According to another embodiment of the present invention, an electronic device including the above display apparatus can be provided. According to another embodiment of the present invention, an operation method of a semiconductor device which increases the driving speed can be provided. According to another embodiment of the present invention, a novel semiconductor device, a novel display apparatus, or a novel electronic device can be provided.

Note that the effects of one embodiment of the present invention are not limited to the effects mentioned above. The effects described above do not preclude the existence of other effects. The other effects are the ones that are not described above and will be described below. Effects that are not described above will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIGS. 31A to 31D are schematic cross-sectional views showing structure examples of a light-emitting device, a light-receiving element, and a connection electrode included in a display apparatus.

FIG. 32A shows classification of IGZO crystal structures, FIG. 32B shows an XRD spectrum of crystalline IGZO, and FIG. 32C shows a nanobeam electron diffraction pattern of the crystalline IGZO.

DETAILED DESCRIPTION OF THE INVENTION

Figure 1:
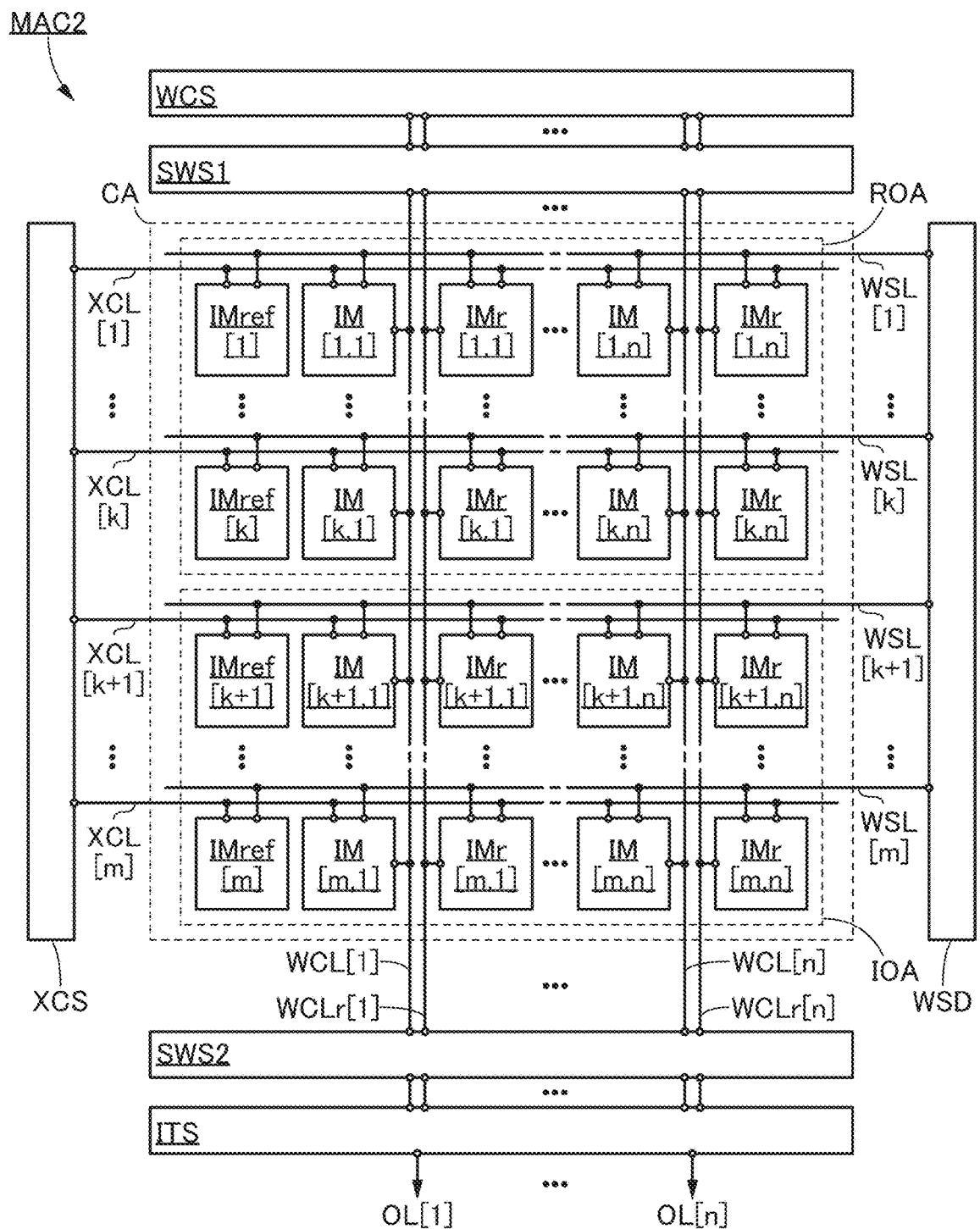
FIG. 1 is a block diagram showing a configuration example of a semiconductor device.

In an artificial neural network (hereinafter referred to as a neural network), the connection strength between synapses can be changed when existing data is given to the neural network. Such processing for determining connection strengths by providing a neural network with existing information is sometimes called learning.

When a neural network in which "learning" has been performed (connection strengths have been determined) is provided with some information, new information can be output on the basis of the connection strengths. Such processing for outputting new information on the basis of provided information and connection strengths in a neural network is sometimes called inference or recognition.

Examples of neural network models include a Hopfield neural network and a hierarchical neural network. Specifically, a multilayer neural network may be called a deep neural network (DNN), and machine learning using a deep neural network may be called deep learning.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide contained in a channel formation region of a transistor is called an oxide semiconductor in some cases. That is, a metal oxide included in a channel formation region of a transistor that has at least one of an amplifying function, a rectifying function, and a switching function can be referred to as a metal oxide semiconductor. In addition, an OS transistor is a transistor including a metal oxide or an oxide semiconductor.

In this specification and the like, a metal oxide containing nitrogen is also referred to as a metal oxide in some cases. In addition, a metal oxide containing nitrogen may be referred to as a metal oxynitride.

In this specification and the like, one embodiment of the present invention can be constituted with an appropriate combination of a structure shown in one embodiment and any of the structures shown in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

The embodiments in this specification are described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification, a plan view is sometimes used to explain a structure in each embodiment. A plan view is a diagram showing the appearance of a plane (section) of a structure cut in the horizontal direction, for example. Hidden lines (e.g., dashed lines) in a plan view can indicate the positional relation between a plurality of components included in a structure or the overlapping relation between the plurality of components. In this specification and the like, the term "plan view" can be replaced with the term "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is a diagram showing the appearance of a plane (section) of a structure cut in the vertical direction, for example. In this specification and the like, the term "cross-sectional view" can be replaced with the term "front view" or "side view". A plane (section) of a structure cut in a direction other than the vertical direction may be referred to as a cross-sectional view depending on circumstances.

In this specification and the like, when a plurality of components denoted by the same reference numerals need to be distinguished from each other, identification signs such as "_1", "[n]", and "[m,n]" are sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings of this specification, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes, values, or the like shown in the drawings. For example, the following can be included: a variation in a signal, a voltage, or a current due to noise or difference in timing.

Embodiment 1

In this embodiment, an arithmetic circuit which is a semiconductor device of one embodiment of the present invention is described.

<Configuration Example 1 of Arithmetic Circuit>

Figure 2:
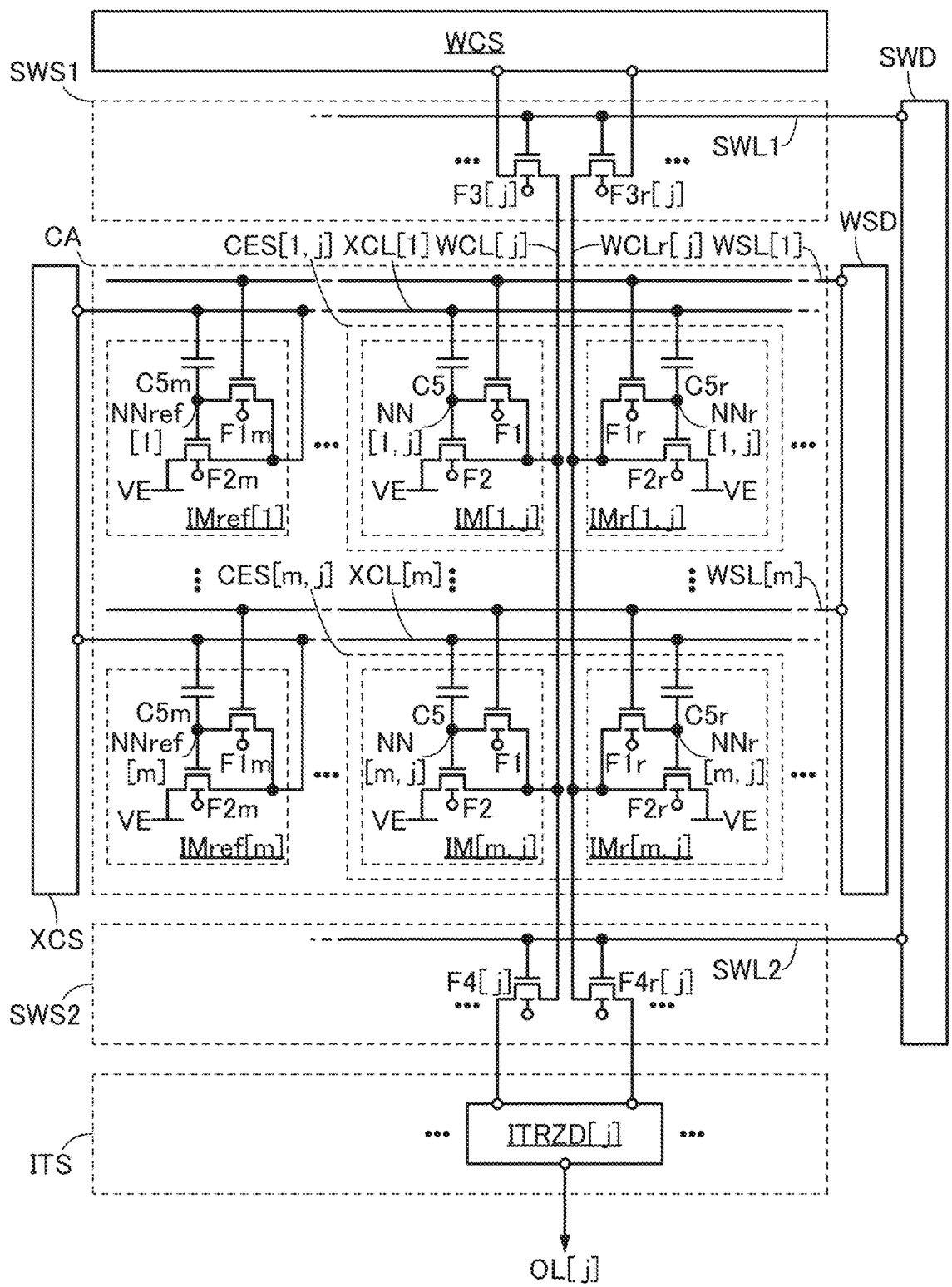
FIG. 2 is a block diagram showing a configuration example of a semiconductor device.

FIG. 2 shows a configuration example of an arithmetic circuit which performs a product-sum operation of positive, negative, or "0" first data and positive or "0" second data. An arithmetic circuit MAC1 illustrated in FIG. 2 performs a product-sum operation of the first data corresponding to a potential stored in each cell and the second data corresponding to an input potential, and performs an arithmetic operation of a function using the result of the product-sum operation. The function can be an activation function in the case where an arithmetic operation in a neural network is performed, for example. Note that the first data and the second data can be, for example, analog data or multilevel data (discrete data).

The arithmetic circuit MAC1 includes a circuit WCS, a circuit XCS, a circuit WSD, a circuit SWD, a circuit SWS1, a circuit SWS2, a circuit ITS, and a cell array CA.

The cell array CA includes cells IM[1,1] to IM[m,n] (here, m is an integer greater than or equal to 1 and n is an integer greater than or equal to 1), cells IMr[1,1] to IMr[m,n], and cells IMref[1] to IMref[m]. Of the cells IM[1,1] to IM[m,n], IMr[1,1] to IMr[m,n], and IMref[1] to IMref[m], FIG. 2 shows the cell IM[1, j] (j is an integer greater than or equal to 1 and less than or equal to n), the cell IM[m,j], the cell IMr[1, j], the cell IMr[m,j], the cell IMref[1], and the cell IMref[m].

In FIG. 2, the cell IM and the cell IMr positioned at the same address are collectively denoted as a circuit CES. In the arithmetic circuit MAC1, the circuit CES has a function of retaining first data in a pair of the cell IM and the cell IMr positioned at the same address. Specifically, each of the cells IM[1,1] to IM[m,n] and the cells IMr[1,1] to IMr[m,n] has a function of retaining a potential corresponding to the current amount that depends on the first data, for example.

The cells IMref[1] to IMref[m] have a function of supplying, to wirings XCL[1] to XCL[m], the retained potential and a potential corresponding to the second data necessary for a product-sum operation, for example.

In the cell array CA in FIG. 2, the cells are arranged in a matrix of m rows and 2×n+1 columns; however, the cell array CA may have any structure in which cells are arranged in a matrix of one or more rows and three or more columns.

The cell IMr can have a configuration similar to that of the cell IM. FIG. 2 shows the cell IMr having a configuration similar to that of the cell IM, for example. To distinguish the transistors, the capacitors, and the like included in the cell IM and the cell IMr, "r" is added to the reference numerals representing the transistors and the capacitor included in the cell IMr.

The cells IM[1,1] to IM[m,n] each include a transistor F1, a transistor F2, and a capacitor C5, the cells IMr[1,1] to IMr[m,n] each include a transistor F1r, a transistor F2r, and a capacitor C5r, and the cells IMref[1] to IMref[m] each include a transistor F1m, a transistor F2m, and a capacitor C5m, for example.

In particular, the sizes of the transistors F1 (e.g., channel length, channel width, and transistor structure) included in the cells IM[1,1] to IM[m,n] and the cells IMr[1,1] to IMr[m,n] are preferably equal to each other, and the sizes of the transistors F2 included in the cells IM[1,1] to IM[m,n] and the cells IMr[1,1] to IMr[m,n] are preferably equal to each other. The sizes of the transistors F1m included in the cells IMref[1] to IMref[m] are preferably equal to each other, and the sizes of the transistors F2m included in the cells IMref[1] to IMref[m] are preferably equal to each other. The sizes of the transistors F1, F1r, and F1m are preferably equal to each other, and the sizes of the transistors F2, F2r, and F2m are preferably equal to each other.

By making the transistors have the same size, the transistors can have substantially the same electrical characteristics. By making the transistors F1 and F1r included in the cells IM[1,1] to IM[m,n] and the cells IMr[1,1] to IMr[m,n] have the same size and making the transistors F2 and F2r included in the cells IM[1,1] to IM[m,n] and the cells IMr[1,1] to IMr[m,n] have the same size, the cells IM[1,1] to IM[m,n] and the cells IMr[1,1] to IMr[m,n] can perform substantially the same operation when in the same conditions as each other. The same conditions mean that, for example, the transistors F1 and F1r have the same source potential, the same drain potential, and the same gate potential, the transistors F2 and F2r have the same source potential, the same drain potential, and the same gate potential, and the same voltage is input to the cells IM[1,1] to IM[m,n] and the cells IMr[1,1] to IMr[m,n]. By making the transistors F1m included in the cells IMref[1] to IMref[m] have the same size and making the transistors F2m included in the cells IMref[1] to IMref[m] have the same size, the cells IMref[1] to IMref[m] can perform substantially the same operation to yield substantially the same results, for example. Specifically, the cells IMref[1] to IMref[m] can perform substantially the same operation when in the same conditions as each other. The same conditions mean that, for example, the transistors F1m have the same source potential, the same drain potential, and the same gate potential, the transistors F2m have the same source potential, the same drain potential, and the same gate potential, and the same voltage is input to the cells IMref[1] to IMref[m].

Unless otherwise specified, the transistors F1, F1r, and F1m in an on state may operate in a linear region in the end. In other words, the gate voltage, the source voltage, and the drain voltage of each of the transistors may be biased as appropriate so that the transistors operate in the linear region. Note that one embodiment of the present invention is not limited thereto. For example, the transistors F1, F1r, and F1m in an on state may operate in a saturation region or may operate both in a linear region and in a saturation region.

Unless otherwise specified, the transistors F2, F2r, and F2m may operate in a subthreshold region (i.e., a voltage between the gate and the source of the transistor F2, F2r, or F2m may be lower than the threshold voltage, preferably a drain current exponentially increases with respect to the voltage between the gate and the source). In other words, the gate voltage, the source voltage, and the drain voltage of each of the transistors may be biased as appropriate so that the transistors operate in the subthreshold region. Thus, the transistors F2, F2r, and F2m may operate so that an off-state current flows between the source and the drain.

The transistor F1, the transistor F1r, and/or the transistor F1m are/is preferably an OS transistor, for example. In addition, it is further preferable that a channel formation region in the transistor F1, the transistor F1r, and/or the transistor F1m be an oxide containing at least one of indium, gallium, and zinc. Instead of the oxide, the channel formation region may be an oxide containing at least one of indium, an element M (as the element M, one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be used, for example), and zinc. The transistor F1, the transistor F1r, and/or the transistor F1m can be, if not an OS transistor, a transistor including silicon in its channel formation region (hereinafter referred to as a Si transistor). As the silicon, amorphous silicon (referred to as hydrogenated amorphous silicon in some cases), microcrystalline silicon, polycrystalline silicon, single crystal silicon, or the like can be used, for example.

With the use of an OS transistor as the transistor F1, the transistor F1r, and/or the transistor F1m, the leakage current of the transistor F1, the transistor F1r, and/or the transistor F1m can be suppressed, so that the power consumption of the arithmetic circuit can be reduced. Specifically, in the case where the transistor F1, the transistor F1r, and/or the transistor F1m are/is in a non-conduction state, the amount of a leakage current from a retention node to a write word line can be extremely small and the frequency of refresh operations for the potential of the retention node can be reduced. By reducing the frequency of refresh operations, the power consumption of the arithmetic circuit can be reduced. By making a leakage current from the retention node to a wiring WCL or the wiring XCL extremely small, cells can retain the potential of the retention node for a long time, so that the arithmetic operation accuracy of the arithmetic circuit can be high.

The use of an OS transistor also as the transistor F2, the transistor F2r, and/or the transistor F2m enables an operation with a wide range of current in the subthreshold region, leading to a reduction in the current consumption. By using an OS transistor also as the transistor F2, the transistor F2r, and/or the transistor F2m, the transistor F2, the transistor F2r, and/or the transistor F2m can be manufactured concurrently with the transistor F1 and the transistor F1m, and thus the number of manufacturing steps of the arithmetic circuit can be decreased in some cases. The transistor F2, the transistor F2r, and/or the transistor F2m can be, if not an OS transistor, a Si transistor.

It is further preferable that the transistors F1, F1r, and F1m have the structures of a transistor 300, a transistor 500, and the like described in Embodiment 5.

When a semiconductor device or the like is highly integrated into a chip or the like, the chip may have heat when the circuit is driven. This heat makes the temperature of a transistor rise to change the characteristics of the transistor and the field-effect mobility thereof may change or the operation frequency thereof may decrease. Since an OS transistor has higher heat resistance than a Si transistor, the change in the field-effect mobility and the decrease in the operation frequency due to a change in temperature do not easily occur. Even when an OS transistor has a high temperature, it is likely to keep a property of the drain current increasing exponentially with respect to a gate-source voltage. With the use of an OS transistor, even in a high temperature environment, an arithmetic operation, processing, or the like can be easily performed. Thus, to be highly resistant to heat due to driving, a semiconductor device preferably includes an OS transistor as its transistor.

In each of the cells IM[1,1] to IM[m,n], a first terminal of the transistor F1 is electrically connected to a gate of the transistor F2. A first terminal of the transistor F2 is electrically connected to a wiring VE. A first terminal of the capacitor C5 is electrically connected to the gate of the transistor F2.

In each of the cells IMr[1,1] to IMr[m,n], a first terminal of the transistor F1r is electrically connected to a gate of the transistor F2r. A first terminal of the transistor F2r is electrically connected to the wiring VE. A first terminal of the capacitor C5r is electrically connected to the gate of the transistor F2r.

In each of the cells IMref[1] to IMref[m], a first terminal of the transistor F1m is electrically connected to a gate of the transistor F2m. A first terminal of the transistor F2m is electrically connected to the wiring VE. A first terminal of the capacitor C5m is electrically connected to the gate of the transistor F2m.

In each of the transistor F1, the transistor F2, the transistor F1r, the transistor F2r, the transistor F1m, and the transistor F2m in FIG. 2, a back gate is illustrated. Although the connection structure of the back gate is not illustrated, a target to which the back gate is electrically connected can be determined at the design stage. For example, in a transistor including a back gate, a gate and the back gate may be electrically connected to each other to increase the on-state current of the transistor. For example, a gate and a back gate of the transistor F1 may be electrically connected, a gate and a back gate of the transistor F1r may be electrically connected, and a gate and a back gate of the transistor F1m may be electrically connected. Alternatively, for example, in a transistor including a back gate, a wiring for electrically connecting the back gate of the transistor to an external circuit or the like may be provided and a potential may be supplied to the back gate of the transistor with the external circuit or the like to change the threshold voltage of the transistor or to reduce the off-state current of the transistor.

The transistor F1 and the transistor F2 illustrated in FIG. 2 have back gates; however, the semiconductor device of one embodiment of the present invention is not limited thereto. For example, the transistor F1 and the transistor F2 illustrated in FIG. 2 may each have a structure not including a back gate, that is, a single-gate structure. It is also possible that some transistors include back gates and the other transistors do not include back gates.

The transistor F1 and the transistor F2 illustrated in FIG. 2 are n-channel transistors; however, the semiconductor device of one embodiment of the present invention is not limited thereto. For example, some or all of the transistors F1 and the transistors F2 may be replaced with p-channel transistors.

The above-described examples of changes in the structure and the polarity of the transistor are not limited to the transistor F1 and the transistor F2. For example, the structures and the polarities of the transistor F1r, the transistor F2r, the transistor F1m, and the transistor F2m, those of a transistor F3[j], a transistor F3r[j], a transistor F4[j], and a transistor F4r[j] which are described later, those of transistors described in other parts of the specification, and those of transistors illustrated in other drawings can also be changed.

The wiring VE functions as a wiring for making a current flow between the first terminal and a second terminal of the transistor F2 in each of the cells IM[1, j] and IM[m,j] and between the first terminal and a second terminal of the transistor F2r in each of the cells IMr[1, j] and IMr[m,j], and a wiring for making a current flow between the first terminal and a second terminal of the transistor F2m in each of the cells IMref[1] and IMref[m]. The wiring VE functions as a wiring for supplying a constant voltage, for example. The constant voltage can be, for example, a low-level potential, the ground potential, or the like.

In the cell IM[1, j], a second terminal of the transistor F1 is electrically connected to the wiring WCL[j], and the gate of the transistor F1 is electrically connected to a wiring WSL[1]. The second terminal of the transistor F2 is electrically connected to the wiring WCL[j], and a second terminal of the capacitor C5 is electrically connected to the wiring XCL[1]. In FIG. 2, in the cell IM[1, j], a connection portion of the first terminal of the transistor F1, the gate of the transistor F2, and the first terminal of the capacitor C5 is a node NN[1, j].

In the cell IM[m,j], the second terminal of the transistor F1 is electrically connected to the wiring WCL[j], and the gate of the transistor F1 is electrically connected to a wiring WSL[m]. The second terminal of the transistor F2 is electrically connected to the wiring WCL[j], and the second terminal of the capacitor C5 is electrically connected to the wiring XCL[m]. In FIG. 2, in the cell IM[m,j], a connection portion of the first terminal of the transistor F1, the gate of the transistor F2, and the first terminal of the capacitor C5 is a node NN[m,j].

In the cell IMr[1, j], a second terminal of the transistor F1r is electrically connected to the wiring WCLr[j], and a gate of the transistor F1r is electrically connected to the wiring WSL[1]. The second terminal of the transistor F2r is electrically connected to a wiring WCLr[j], and a second terminal of the capacitor C5r is electrically connected to the wiring XCL[1]. In FIG. 2, in the cell IMr[1, j], a connection portion of the first terminal of the transistor F1r, the gate of the transistor F2r, and the first terminal of the capacitor C5r is a node NNr[1, j].

In the cell IMr[m,j], the second terminal of the transistor F1r is electrically connected to the wiring WCLr[j], and the gate of the transistor F1r is electrically connected to the wiring WSL[m]. The second terminal of the transistor F2r is electrically connected to the wiring WCLr[j], and the second terminal of the capacitor C5r is electrically connected to the wiring XCL[m]. In FIG. 2, in the cell IMr[m,j], a connection portion of the first terminal of the transistor F1r, the gate of the transistor F2r, and the first terminal of the capacitor C5r is a node NNr[m,j].

In the cell IMref[1], a second terminal of the transistor F1m is electrically connected to the wiring XCL[1], and the gate of the transistor F1m is electrically connected to the wiring WSL[1]. The second terminal of the transistor F2m is electrically connected to the wiring XCL[1], and a second terminal of the capacitor C5m is electrically connected to the wiring XCL[1]. In FIG. 2, in the cell IMref[1], a connection portion of the first terminal of the transistor F1m, the gate of the transistor F2m, and the first terminal of the capacitor C5m is a node NNref[1].

In the cell IMref[m], the second terminal of the transistor F1m is electrically connected to the wiring XCL[m], and the gate of the transistor F1m is electrically connected to the wiring WSL[m]. The second terminal of the transistor F2m is electrically connected to the wiring XCL[m], and the second terminal of the capacitor C5m is electrically connected to the wiring XCL[m]. In FIG. 2, in the cell IMref[m], a connection portion of the first terminal of the transistor F1m, the gate of the transistor F2m, and the first terminal of the capacitor C5m is a node NNref[m].

The nodes NN[1, j] to NN[m,j], the nodes NNr[1, j] to NNr[m,j], and the nodes NNref[1] to NNref[m] function as retention nodes of the cells.

In the case where the transistor F1 is in an on state in the cells IM[1, j] and IM[m,j], for example, the transistor F2 is a diode-connected transistor. When a constant voltage supplied by the wiring VE is the ground potential (GND), the transistor F1 is in an on state, and a current in an amount I flows from the wiring WCL to the second terminal of the transistor F2, the potential of the gate of the transistor F2 (node NN) depends on the current amount I. Since the transistor F1 is in an on state, the potential of the second terminal of the transistor F2 is ideally equal to that of the gate of the transistor F2 (node NN). By turning off the transistor F1, the potential of the gate of the transistor F2 (node NN) is retained. Accordingly, the transistor F2 can make a current in the amount i, which depends on the ground potential of the first terminal of the transistor F2 and the potential of the gate of the transistor F2 (node NN), flow between the source and the drain of the transistor F2. In this specification and the like, this operation is called "setting (programing) the amount of a current flowing between the source and the drain of the transistor F2 in the cell IM to I", for example.

In a similar manner, the amount of a current flowing between the source and the drain of the transistor F2r in each of the cells IMr[1, j] and IMr[m,j] can be set when the transistor F1 is replaced with the transistor F1r, the transistor F2 is replaced with the transistor F2r, and the node NN is replaced with the node NNr in the above description. The amount of a current flowing between the source and the drain of the transistor F2m in each of the cells IMref[1] and IMref[m] can be set when the transistor F1 is replaced with the transistor F1m, the transistor F2 is replaced with the transistor F2m, and the node NN is replaced with the node NNref in the above description.

The circuit SWS1 includes the transistor F3[j] and the transistor F3r[j], for example. A first terminal of the transistor F3[j] is electrically connected to the wiring WCL[j], a second terminal of the transistor F3[j] is electrically connected to the circuit WCS, and a gate of the transistor F3[j] is electrically connected to a wiring SWL1. A first terminal of the transistor F3r[j] is electrically connected to the wiring WCLr[j], a second terminal of the transistor F3r[j] is electrically connected to the circuit WCS, and a gate of the transistor F3r[j] is electrically connected to the wiring SWL1.

The wiring SWL1 functions as, for example, a wiring for switching the on state and the off state of the transistors F3[j] and F3r[j]. Accordingly, the wiring SWL1 is supplied with a high-level potential or a low-level potential.

As each of the transistors F3[j] and F3r[j], for example, a transistor which can be used as the transistor F1 and/or the transistor F2 can be used. It is particularly preferable to use an OS transistor as each of the transistors F3[j] and F3r[j]. Instead of the transistors F3[j] and F3r[j], electrical switches such as analog switches, or mechanical switches may be used.

As described above, the circuit SWS1 has a function of switching the conduction state and the non-conduction state between the circuit WCS and each of the wirings WCL[j] and WCLr[j]. In other words, the circuit SWS1 switches the conduction state and the non-conduction state between the circuit WCS and each of the wirings WCL[j] and WCLr[j] by using the transistors F3[j] and F3r[j] as switching elements.

The circuit SWS2 includes the transistor F4[j] and the transistor F4r[j], for example. A first terminal of the transistor F4[j] is electrically connected to the wiring WCL[j], a second terminal of the transistor F4[j] is electrically connected to a first input terminal of a converter circuit ITRZD [j] which is described later, and a gate of the transistor F4[j] is electrically connected to a wiring SWL2. A first terminal of the transistor F4r[j] is electrically connected to the wiring WCLr[j], a second terminal of the transistor F4r[j] is electrically connected to a second input terminal of the converter circuit ITRZD[j] which is described later, and a gate of the transistor F4r[j] is electrically connected to the wiring SWL2.

The wiring SWL2 functions as, for example, a wiring for switching the on state and the off state of the transistors F4[j]

and F4r[j]. Accordingly, the wiring SWL2 is supplied with a high-level potential or a low-level potential.

As each of the transistors F4[j] and F4r[j], for example, a transistor which can be used as the transistor F1 and/or the transistor F2 can be used. It is particularly preferable to use an OS transistor as each of the transistors F4[j] and F4r[j]. Instead of the transistors F4[j] and F4r[j], electrical switches such as analog switches, or mechanical switches may be used.

As described above, the circuit SWS2 has a function of switching the conduction state and the non-conduction state between the circuit ITS and each of the wirings WCL[j] and WCLr[j]. In other words, the circuit SWS2 can switch the conduction state and the non-conduction state between the circuit ITS and each of the wirings WCL[j] and WCLr[j] by using the transistors F4[j] and F4r[j] as switching elements.

The circuit WCS has a function of supplying, to the wirings WCL[1] to WCL[n], a current in an amount corresponding to the first data. In other words, the circuit WCS supplies, when the transistors F3[j] and F3r[j] are in an on state, the first data that is to be stored in each cell of the cell array CA.

The circuit XCS has a function of making a current in an amount corresponding to later-described reference data or a current in an amount corresponding to the second data flow in the wirings XCL[1] to XCL[m]. That is, in the arithmetic circuit MAC1 in FIG. 2, the circuit XCS makes a current in an amount corresponding to the reference data or a current in an amount corresponding to the second data flow in each of the cells IMref[1] to IMref[m] included in the cell array CA.

The circuit WSD has a function of supplying a predetermined signal to any of the wirings WSL[1] to WSL[m] at the time of writing of the first data to the cells of the cell array CA, to select a row of the cell array CA to which the first data is to be written. For example, when the circuit WSD supplies the wiring WSL[1] with a high-level potential and supplies the wirings WSL[2] (not shown) to WSL[m] with a low-level potential, the transistors F1 and F1r whose gates are electrically connected to the wiring WSL[1] can be turned on and the transistors F1 and F1r whose gates are electrically connected to the wirings WSL[2] to WSL[m] can be turned off.

In the arithmetic circuit MAC1 in FIG. 2, the circuit SWD is electrically connected to the wirings SWL1 and SWL2. The circuit SWD has a function of supplying a predetermined signal to the wiring SWL1 to establish the conduction state or the non-conduction state between the circuit WCS and the cell array CA and a function of supplying a predetermined signal to the wiring SWL2 to establish the conduction state or the non-conduction state between later-described converter circuits ITRZD[1] to ITRZD[n] and the cell array CA.

The circuit ITS includes the converter circuit ITRZD[j].

The converter circuit ITRZD[j] has the input terminals and an output terminal, for example. The output terminal of the converter circuit ITRZD[j] is electrically connected to a wiring OL[j], for example.

The converter circuit ITRZD[j] has a function of acquiring the difference between the amounts of currents input from the wirings WCL and WCLr to the input terminals, converting the difference into a voltage corresponding to the difference, and outputting the voltage from the output terminal, for example. Examples of the voltage can be an analog voltage and a digital voltage. The converter circuit ITRZD[j] may include an arithmetic circuit of a function system. In that case, for example, the arithmetic circuit may perform an arithmetic operation of a function with the use of the voltage obtained by the conversion, to output the results of the arithmetic operation to the wiring OL[j].

In the case of performing an arithmetic operation of the hierarchical neural network, a sigmoid function, a tan h function, a softmax function, a ReLU function, a threshold function, or the like can be used as the above-described function.

<Operation Example 1 of Arithmetic Circuit>

An operation example of the arithmetic circuit MAC1 shown in FIG. 2 is described.

Figure 3:
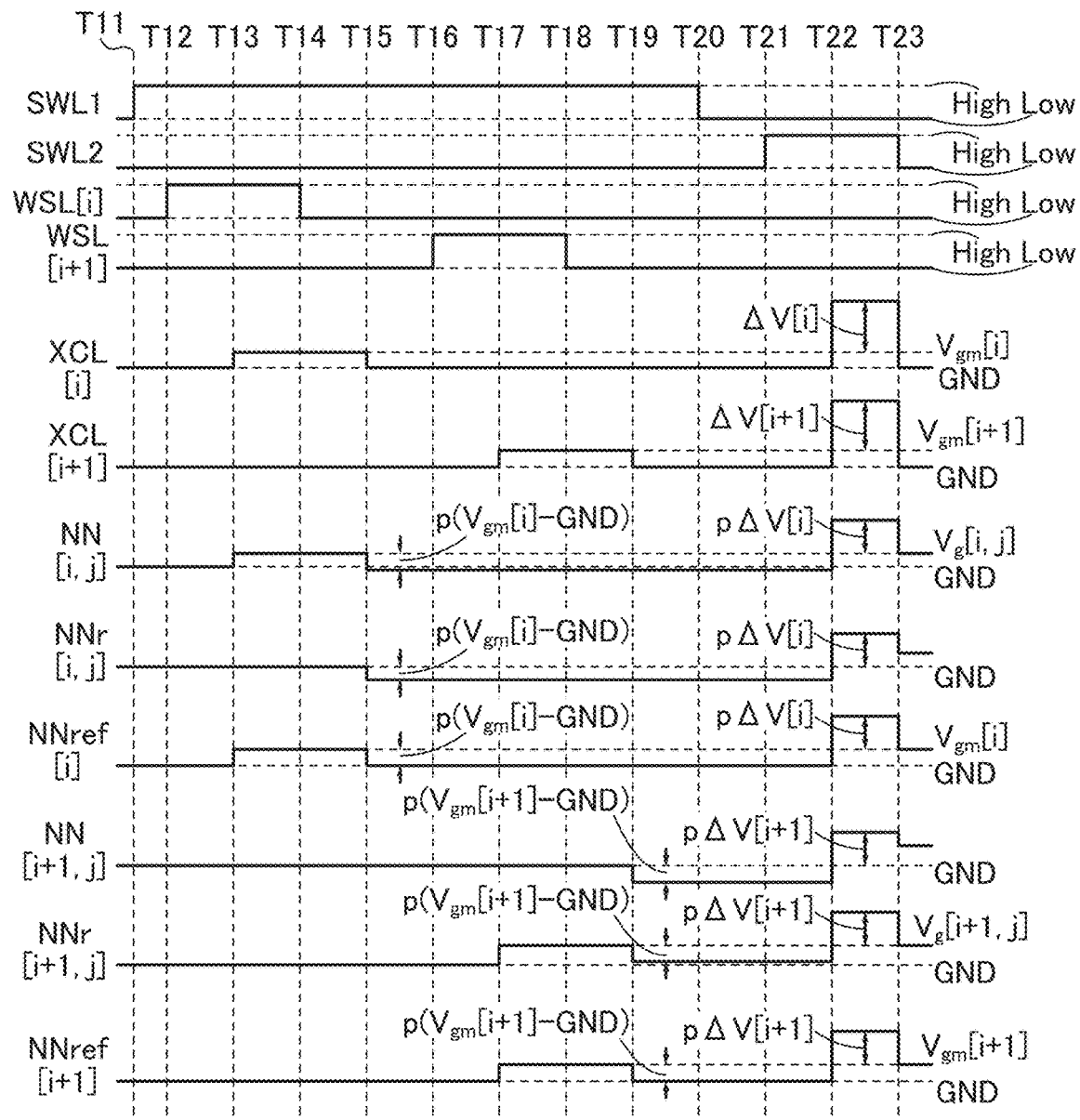
FIG. 3 is a timing chart showing an operation example of a semiconductor device.

FIG. 3 shows a timing chart of the operation example of the arithmetic circuit MAC1. The timing chart in FIG. 3 shows changes in the potentials of the wiring SWL1, the wiring SWL2, the wiring WSL[i] (i is an integer greater than or equal to 1 and less than or equal to m−1), the wiring WSL[i+1], the wiring XCL[i], the wiring XCL[i+1], the node NN[i,j] (j is an integer greater than or equal to 1 and less than or equal to n−1), the node NNr[i,j], the node NNref[i], the node NN[i+1, j], the node NNr[i+1, j], and the node NNref[i+1] in the period from Time T11 to Time T23 and around the period.

Note that in this operation example, the potential of the wiring VE is the ground potential GND. Before Time T1, the potential of each of the node NN[i,j], the node NNr[i,j], the node NNref[i], the node NN[i+1, j], the node NNr[i+1, j], and the node NNref[i+1] is the ground potential GND as the initial setting.

In this operation example, the amount of a current flowing between the source and the drain of the transistor F2 of the cell IM and the amount of a current flowing between the source and the drain of the transistor F2r of the cell IMr in each of circuits CES[1, j] to CES[m,j] are set depending on the first data. The amount of the current flowing between the source and the drain of the transistor F2 and the amount of the current flowing between the source and the drain of the transistor F2r which are set depending on the first data are defined as follows.

In the case where α[i,j] that is the value of the positive first data is written to the circuit CES[i,j], the amount of a current flowing between the source and the drain of the transistor F2 of the cell IM[i,j] included in the circuit CES[i,j] is set to $\alpha[i,j] \times I_{Wut}$, and the amount of a current flowing between the source and the drain of the transistor F2r of the cell IMr[i,j] is set to 0. Note that $I_{Wut}$ denotes the amount of a current that flows when the first data (α[i,j]) has an absolute value of 1.

In the case where α[i,j] that is the value of the negative first data is written to the circuit CES[i,j], the amount of a current flowing between the source and the drain of the transistor F2 of the cell IM[i,j] included in the circuit CES[i,j] is set to 0, and the amount of a current flowing between the source and the drain of the transistor F2r of the cell IMr[i,j] is set to $|\alpha[i,j]| \times I_{Wut}$.

Note that in the case where the amount of the current flowing between the source and the drain of the transistor F2 of the cell IM[i,j] and/or the amount of the current flowing between the source and the drain of the transistor F2r of the cell IMr[i,j] are/is set to 0, no current flows between the source and the drain of the transistor F2 and/or the transistor F2r but in this specification and the like, the expression "a current in the amount 0 flows between the source and the drain of the transistor F2 and/or the transistor F2r" is sometimes used.

<< From Time T11 to Time T12>>

In the period from Time T11 to Time T12, a high-level potential (denoted with High in FIG. 3) is applied to the wiring SWL1, and a low-level potential (denoted with Low in FIG. 3) is applied to the wiring SWL2. Accordingly, a high-level potential is applied to each of the gates of the transistors F3[j] and F3r[j] to turn on the transistors F3[j] and F3r[j], and a low-level potential is applied to each of the gates of the transistors F4[j] and F4r[j] to turn off the transistors F4[j] and F4r[j].

In the period from Time T11 to Time T12, a low-level potential is applied to each of the wirings WSL[i] and WSL[i+1]. Accordingly, in the i-th row of the cell array CA, a low-level potential is applied to each of the gates of the transistors F1 included in the cells IM[i,1] to IM[i,n], the gates of the transistors F1r included in the cells IMr[i,1] to IMr[i,n], and the gate of the transistor F1m included in the cell IMref[i], so that the transistors F1, the transistors F1r, and the transistor F1m are turned off. In addition, in the i+1-th row of the cell array CA, a low-level potential is applied to each of the gates of the transistors F1 included in the cells IM[i+1,1] to IM[i+1, n], the gates of the transistors F1r included in the cells IMr[i+1,1] to IMr[i+1, n], and the gate of the transistor F1m included in the cell IMref[i+1], so that the transistors F1, the transistors F1r, and the transistor F1m are turned off.

In the period from Time T11 to Time T12, the ground potential GND is applied to the wirings XCL[i] and XCL[i+1].

In the period from Time T11 to Time T12, the ground potential GND is applied to the wirings WCL[j] and WCLr[j] as in the wiring VE.

In the period from Time T11 to Time T12, no current flows in the wiring WCL[j], the wiring XCL[i], and the wiring XCL[i+1]. That is, no current flows between the source and the drain of the transistor F2 included in each of the cells IM[i,j] and IM[i+1, j], no current flows between the source and the drain of the transistor F2r included in each of the cells IMr[i,j] and IMr[i+1, j], and no current flows between the source and the drain of the transistor F2m included in each of the cells IMref[1] and IMref[i+1].

<<From Time T12 to Time T13>>

In the period from Time T12 to Time T13, a high-level potential is applied to the wiring WSL[i]. Accordingly, in the i-th row of the cell array CA, a high-level potential is applied to each of the gates of the transistors F1 included in the cells IM[i,1] to IM[i,n], the gates of the transistors F1r included in the cells IMr[i,1] to IMr[i,n], and the gate of the transistor F1m included in the cell IMref[i], so that the transistors F1, F1r, and F1m are turned on. Furthermore, in the period from Time T12 to Time T13, a low-level potential is applied to each of the wirings WSL[1] to WSL[m] except the wiring WSL[i], so that in the rows other than the i-th row of the cell array CA, the transistors F1 included in the cells IM[1,1] to IM[m,n], the transistors F1r included in the cells IMr[1,1] to IMr[m,n], and the transistors F1m included in the cells IMref[1] to IMref[m] are in an off state.

The ground potential GND has been applied to the wirings XCL[1] to XCL[m] since before Time T12.

<<From Time T13 to Time T14>>

In the period from Time T13 to Time T14, the first data α[i,j] is written to the circuit CES[i,j]. Here, a current in an amount $I_0[i,j]$ flows from the circuit WCS to the cell IM[i,j] through the wiring WCL[j], and a current in an amount $I_{0r}[i,j]$ flows from the circuit WCS to the cell IMr[i,j] through the wiring WCL[j]. Specifically, in the case where the first data α[i,j] is positive, for example, a current in the amount $I_0[i,j]=α[i,j]×I_{Wut}$ flows from the circuit WCS to the cell IM[i,j] through the wiring WCL[j], and a current in the amount $I_{0r}[i,j]=0$ flows from the circuit WCS to the cell IMr[i,j] through the wiring WCLr[j]. In the case where the first data α[i,j] is negative, for example, a current in the amount $I_0[i,j]=0$ flows from the circuit WCS to the cell IM[i,j] through the wiring WCL[j], and a current in the amount $I_{0r}[i,j]=|α[i,j]|×I_{Wut}$ flows from the circuit WCS to the cell IMr[i,j] through the wiring WCLr[j].

When α[i,j] is 0, $I_0[i,j]=0$ and $I_{0r}[i,j]=0$. In this case, no current flows from the circuit WCS to the cell array CA through the transistors F3[j] and F3r[j] but in this specification and the like, an expression like "a current in the amount $I_0[i,j]=0$ flows" or "a current in the amount $I_{0r}[i,j]=0$ flows" is sometimes used.

In the period from Time T13 to Time T14, a conduction state is established between the wiring WCL[j] and the first terminal of the transistor F1 included in the cell IM[i,j] in the i-th row of the cell array CA, and a non-conduction state is established between the wiring WCL[j] and the first terminals of the transistors F1 included in the cells IM[1, j] to IM[m,j] in the rows other than the i-th row of the cell array CA. Accordingly, when the first data α[i,j] is positive, a current in the amount $I_0[i,j]=|α[i]|×I_{Wut}$ flows from the wiring WCL[j] to the cell IM[i,j]. When the first data α[i,j] is negative, no current flows (a current in the amount $I_0[i,j]=0$ flows) from the wiring WCL[j] to the cell IM[i,j].

In the period from Time T13 to Time T14, a conduction state is established between the wiring WCLr[j] and the first terminal of the transistor F1r included in the cell IMr[i,j] in the i-th row of the cell array CA, and a non-conduction state is established between the wiring WCLr[j] and the first terminals of the transistors F1r included in the cells IMr[1, j] to IMr[m,j] in the rows other than the i-th row of the cell array CA. Accordingly, when the first data α[i,j] is positive, no current flows (a current in the amount $I_{0r}[i,j]=0$ flows) from the wiring WCLr[j] to the cell IMr[i,j]. When the first data α[i,j] is negative, a current in the amount $I_{0r}[i,j]=|α[i,j]|×I_{Wut}$ flows from the wiring WCLr[j] to the cell IMr[i,j].

When the first data α[i,j] is positive and the transistor F1 included in the cell IM[i,j] is turned on, the transistor F2 has a diode-connected structure. Therefore, when a current flows from the wiring WCL[j] to the cell IM[i,j], the potentials of the gate of the transistor F2 and the second terminal of the transistor F2 are substantially equal to each other. The potentials are determined with the amount of a current flowing from the wiring WCL[j] to the cell IM[i,j], the potential of the first terminal of the transistor F2 (here, the ground potential GND), and the like. In this operation example, a current in the amount $I_0[i,j]$ flows from the wiring WCL[j] to the cell IM[i,j], whereby the potential of the gate of the transistor F2 (the node NN[i,j]) becomes $V_g[i,j]$. That is, a voltage between the gate and the source of the transistor F2 is $V_g[i,j]−GND$, and the current amount $I_0[i,j]$ is set as the amount of a current flowing between the first terminal and the second terminal of the transistor F2.

Here, the current amount $I_0[i,j]$ in the case where the threshold voltage of the transistor F2 is $V_{th}[i,j]$ and the transistor F2 operates in a subthreshold region can be expressed by the following formula.

[Formula 1]

$$I_0[i,j]=I_a \exp\{J(V_g[i,j]-V_{th}[i,j])\} \quad (1.1)$$

Note that $I_a$ is a drain current for the case where $V_g[i,j]$ is $V_{th}[i,j]$, and J is a correction coefficient determined with the temperature, the device structure, and the like.

The current amount $I_{0r}[i,j]$ in the case where the first data α[i,j] is negative and the transistor F2r of the cell IMr[i,j] operates in a subthreshold region like the transistor F2 of the cell IM[i,j] can be expressed by the following formula in a manner similar to that of Formula (1.1), with the cell IM[i,j], the wiring WCL[j], the transistor F1, and the transistor F2 in the above description respectively replaced with the cell IMr[i,j], the wiring WCLr[j], the transistor F1r, and the transistor F2r.

[Formula 2]

$$I_{0r}[i,j] = I_a \exp\{J(V_g[i,j] - V_{thr}[i,j])\} \quad (1.2)$$

Note that $V_{thr}[i,j]$ denotes the threshold voltage of the transistor F2r. Note also that $V_{thr}[i,j]$ is preferably equal to $V_{th}[i,j]$. In this operation example, the correction coefficient J of the transistor F2 is the same as that of the transistor F2r.

In the period from Time T13 to Time T14, a current in an amount $I_{ref0}[i]$ flows as the reference data from the circuit XCS to the wiring XCL[i]. Note that the current amount $I_{ref0}[i]$ can be expressed as $I_{ref0}[i] = I_{Xut}$. Furthermore, $I_{Xut}$ denotes the amount of a current flowing when the absolute value of the later-described second data is 1.

In the period from Time T13 to Time T14, since a conduction state is established between the first terminal of the transistor F1m included in the cell IMref[i] and the wiring XCL[i], a current in the amount $I_{ref0}[i]$ flows from the wiring XCL[i] to the cell IMref[i].

As in the cells IM[i,j] and IMr[i,j], when the transistor F1m included in the cell IMref[i] is turned on, the transistor F2m included in the cell IMref[i] has a diode-connected structure. Therefore, when a current flows from the wiring XCL[i] to the cell IMref[i], the potentials of the gate of the transistor F2m and the second terminal of the transistor F2m are substantially equal to each other. The potentials are determined with the amount of a current flowing from the wiring XCL[i] to the cell IMref[i], the potential of the first terminal of the transistor F2m (here, the ground potential GND), and the like. In this operation example, a current in the amount $I_{ref0}[i]$ flows from the wiring XCL[i] to the cell IMref[i], whereby the potential of the gate of the transistor F2 (the node NNref[i]) becomes $V_{gm}[i]$, and the potential of the wiring XCL[i] at this time is also $V_{gm}[i]$. That is, a voltage between the gate and the source of the transistor F2m is $V_{gm}[i]-GND$, and the current amount $I_{ref0}[i]$ is set as the amount of a current flowing between the first terminal and the second terminal of the transistor F2m.

Here, the current amount $I_{ref0}[i]$ in the case where the threshold voltage of the transistor F2m is $V_{thm}[i]$ and the transistor F2m operates in a subthreshold region can be expressed by the following formula.

[Formula 3]

$$I_{ref0}[i] = I_a \exp\{J(V_{gm}[i] - V_{thm}[i])\} \quad (1.3)$$

Note that the correction coefficient J is the same as that of the transistor F2 included in the cell IM[i,j]. For example, the same device structure and the same size (channel length and channel width) are used for the transistors. In addition, although the correction coefficient J of each transistor varies due to a variation in manufacture, the variation is suppressed so that the following arguments make sense with sufficient accuracy for practical use.

Here, w[i,j] in the cell IM[i,j] is defined as follows.

[Formula 4]

$$w[i,j] = \exp\{J(V_g[i,j] - V_{th}[i,j] - V_{gm}[i] + V_{thm}[i])\} \quad (1.4)$$

Therefore, Formula (1.1) can be rewritten into the following formula with the use of Formula (1.3), Formula (1.4), $I_0[i,j] = |\alpha[i,j]| \times I_{Wut}$, and $I_{ref0}[i] = I_{Xut}$.

[Formula 5]

$$I_0[i,j] = w[i,j] I_{ref0}[i] \leftrightarrow |\alpha[i,j]| \times I_{Wut} = w[i,j] I_{Xut} \quad (1.5)$$

In a similar manner, $w_r[i,j]$ in the cell IMr[i,j] is defined as follows.

[Formula 6]

$$w_r[i,j] = \exp\{(V_g[i,j] - V_{thr}[i,j] - V_{gm}[i] + V_{thm}[i])\} \quad (1.6)$$

Therefore, Formula (1.2) can be rewritten into the following formula with the use of Formula (1.3), Formula (1.6), $I_{0r}[i,j] = |\alpha[i,j]| \times I_{Wut}$, and $I_{ref0}[i] = I_{Xut}$.

[Formula 7]

$$I_{0r}[i,j] = w_r[i,j] I_{ref0}[i] \leftrightarrow |\alpha[i,j]| \times I_{Wut} = w_r[i,j] I_{Xut} \quad (1.7)$$

Note that $w[i,j] = |\alpha[i,j]|$ in the case where $I_{Wut}$ and $I_{Xut}$ are equal to each other in Formula (1.5). In other words, w[i,j] becomes equal to the absolute value of the first data $\alpha[i,j]$ and it is thus preferable that $I_{Wut}$ be equal to $I_{Xut}$. In a similar manner, $w_r[i,j] = |\alpha[i,j]|$ in the case where $I_{Wut}$ and $I_{Xut}$ are equal to each other in Formula (1.7). Description of this operation example is made on the assumption that $I_{Wut}$ is equal to $I_{Xut}$.

Note that in this operation example, in the period from Time T13 to Time T14, the first data $\alpha[i,j]$ is positive, a current in the amount $I_0[i,j] = |\alpha[i,j]| \times I_{Wut}$ flows from the wiring WCL[j] to the cell IM[i,j], and no current flows (a current in the amount $I_{0r}[i,j] = 0$ flows) from the wiring WCLr[j] to the cell IMr[i,j]. Accordingly, the potential of the node NN[i,j] becomes $V_g[i,j]$ and that of the node NNr[i,j] does not change from the ground potential GND.

<<From Time T14 to Time T15>>

In the period from Time T14 to Time T15, a low-level potential is applied to the wiring WSL[i]. Accordingly, in the i-th row of the cell array CA, a low-level potential is applied to each of the gates of the transistors F1 included in the cells IM[i,1] to IM[i,n], the gates of the transistors F1r included in the cells IMr[i,1] to IMr[i,n], and the gate of the transistor F1m included in the cell IMref[i], so that the transistors F1, F1r, and F1m are turned off.

When the transistor F1 included in the cell IM[i,j] is turned off, $V_g[i,j] - V_{gm}[i]$, which is the difference between the potential of the gate of the transistor F2 (the node NN[i,j]) and the potential of the wiring XCL[i], is retained in the capacitor C5. When the transistor F1r included in the cell IMr[i,j] is turned off, $GND - V_{gm}[i]$, which is the difference between the potential of the gate of the transistor F2r (the node NNr[i,j]) and the potential of the wiring XCL[i], is retained in the capacitor C5r. When the transistor F1m included in the cell IMref[i] is turned off, 0, which is the difference between the potential of the gate of the transistor F2m (the node NNref[i]) and the potential of the wiring XCL[i], is retained in the capacitor C5m. In the operation from Time T13 to Time T14, the voltage retained in the capacitor C5m might be a voltage that is not 0 (e.g., Vas) depending on the transistor characteristics of the transistor F1m or the transistor F2m and the like. In this case, the node NNref[i] can be regarded as having a potential obtained by adding $V_{ds}$ to the potential of the wiring XCL[i].

<<From Time T15 to Time T16>>

In the period from Time T15 to Time T16, the ground potential GND is applied to the wiring XCL[i] from the circuit XCS.

Thus, the potentials of the nodes NN[i,1] to NN[i,n] change because of capacitive coupling of the capacitors C5 included in the cells IM[i,1] to IM[i,n] in the i-th row, the potentials of the nodes NNr[i,1] to NNr[i,n] change because of capacitive coupling of the capacitors C5r included in the cells IMr[i,1] to IMr[i,n], and the potential of the node NNref[i] changes because of capacitive coupling of the capacitor C5m included in the cell IMref[i].

The amount of change in the potentials of the nodes NN[i,1] to NN[i,n] is a potential obtained by multiplying the amount of change in the potential of the wiring XCL[j] by the capacitive coupling coefficient that is determined by the configurations of the cells IM[i,1] to IM[i,n] included in the cell array CA. The capacitive coupling coefficient is calculated on the basis of the capacitance of the capacitor C5, the gate capacitance of the transistor F2, the parasitic capacitance, and the like. When the capacitive coupling coefficient due to the capacitor C5 is p in each of the cells IM[i,1] to IM[i,n], the potential of the node NN[i,j] in the cell IM[i,j] decreases by $p(V_{gm}[i]-GND)$ from the potential in the period from Time T14 to Time T15.

Similarly, when the potential of the wiring XCL[i] changes, the potential of the node NNr[i,j] also changes because of capacitive coupling of the capacitor C5r included in the cell IMr[i,j]. In the case where the capacitive coupling coefficient due to the capacitor C5r is p like that due to the capacitor C5, the potential of the node NNr[i,j] in the cell IMr[i,j] decreases from the potential in the period from Time T14 to Time T15 by $p(V_{gm}[i]-GND)$.

Similarly, when the potential of the wiring XCL[i] changes, the potential of the node NNref[i] also changes because of capacitive coupling of the capacitor C5m included in the cell IMref[i]. In the case where the capacitive coupling coefficient due to the capacitor C5m is p like that due to the capacitor C5, the potential of the node NNref[i] of the cell IMref[i] decreases from the potential in the period from Time T14 to Time T15 by $p(V_{gm}[i]-GND)$.

In the timing chart in FIG. 3, p is 1, for example. Thus, the potential of the node NNref[i] is the ground potential GND in the period from Time T15 to Time T16.

Accordingly, the potential of the node NN[i,j] of the cell IM[i,j] decreases, so that the transistor F2 is turned off. In a similar manner, the potential of the node NNr[i,j] of the cell IMr[i,j] decreases, so that the transistor F2r is turned off. In a similar manner, the potential of the node NNref[i] of the cell IMref[i] decreases, so that the transistor F2m is also turned off. Therefore, no current flows between the source and the drain of the transistor F2 included in the cell IM[i,j], no current flows between the source and the drain of the transistor F2r included in the cell IMr[i,j], and no current flows between the source and the drain of the transistor F2m included in the cell IMref[i].

<<From Time T16 to Time T17>>

In the period from Time T16 to Time T17, a high-level potential is applied to the wiring WSL[i+1]. Accordingly, in the i+1-th row of the cell array CA, a high-level potential is applied to each of the gates of the transistors F1 included in the cells IM[i+1,1] to IM[i+1, n], the gates of the transistors F1r included in the cells Mr[i+1,1] to IMr[i+1, n], and the gate of the transistor F1m included in the cell IMref[i+1], so that the transistors F1, F1r, and F1m are turned on. Furthermore, in the period from Time T16 to Time T17, a low-level potential is applied to each of the wirings WSL[1] to WSL[m] except the wiring WSL[i+1], so that in the rows other than the i+1-th row of in the cell array CA, the transistors F1 included in the cells IM[1,1] to IM[m,n], the transistors F1r included in the cells IMr[1,1] to IMr[m,n], and the transistors F1m included in the cells IMref[1] to IMref[m] are in an off state.

The ground potential GND has been applied to the wirings XCL[1] to XCL[m] since before Time T16.

<<From Time T17 to Time T18>>

In the period from Time T17 to Time T18, the first data α[i+1, j] is written to the circuit CES[i+1, j]. Here, a current in an amount $I_0[i+1, j]$ flows from the circuit WCS to the cell IM[i+1, j] through the wiring WCL[j], and a current in an amount $I_{0r}[i+1, j]$ flows from the circuit WCS to the cell IMr[i+1, j] through the wiring WCL[j]. Specifically, in the case where the first data α[i+1, j] is positive, for example, a current in the amount $I_0[i+1, j]=|α[i+1, j]|×I_{Wut}$ flows from the circuit WCS to the cell IM[i+1, j] through the wiring WCL[j], and a current in the amount $I_{0r}[i+1, j]=0$ flows from the circuit WCS to the cell IMr[i+1, j] through the wiring WCLr[j]. In the case where the first data α[i+1, j] is negative, for example, a current in the amount $I_0[i+1, j]=0$ flows from the circuit WCS to the cell IM[i+1, j] through the wiring WCL[j], and a current in the amount $I_{0r}[i+1, j]=|α[i+1, j]|×I_{Wut}$ flows from the circuit WCS to the cell IMr[,+1, j] through the wiring WCLr[j].

When α[i+1, j] is 0, $I_0[i+1,j]=0$ and $I_{0r}[i, j]=0$. In this case, no current flows from the circuit WCS to the cell array CA through the transistors F3[j] and F3r[j] but as in the cases where $I_0[i,j]=0$ and $I_{0r}[i,j]=0$, an expression such as "the current in the amount $I_0[i+1, j]=0$ flows" or "the current in the amount $I_{0r}[i+1, j]=0$ flows" is sometimes used in this specification and the like.

At this time, a conduction state is established between the wiring WCL[j] and the first terminal of the transistor F1 included in the cell IM[i+1, j] in the i+1-th row of the cell array CA, and a non-conduction state is established between the wiring WCL[j] and the first terminals of the transistors F1 included in the cells IM[1, j] to IM[m,j] in the rows other than the i+1-th row of the cell array CA. Accordingly, when the first data α[i+1, j] is positive, a current in the amount $I_0[i+1, j]=|α[i+1, j]|×I_{Wut}$ flows from the wiring WCL[j] to the cell IM[i+1, j]. When the first data α[i+1, j] is negative, no current flows (a current in the amount $I_0[i+1, j]=0$ flows) from the wiring WCL[j] to the cell IM[i+1, j].

In the period from Time T17 to Time T18, a conduction state is established between the wiring WCLr[j] and the first terminal of the transistor F1r included in the cell IMr[i+1, j] in the i+1-th row of the cell array CA, and a non-conduction state is established between the wiring WCLr[j] and the first terminals of the transistors F1r included in the cells IMr[1, j] to IMr[m,j] in the rows other than the i+1-th row of the cell array CA. Accordingly, when the first data α[i+1, j] is positive, no current flows (a current in the amount $I_{0r}[i+1, j]=0$ flows) from the wiring WCLr[j] to the cell IMr[i+1, j]. When the first data α[i+1, j] is negative, a current in the amount $I_{0r}[i+1, j]=α[i+1, j]×I_{Wut}$ flows from the wiring WCLr[j] to the cell IMr[i+1, j].

When the first data α[i+1, j] is positive and the transistor F1 included in the cell IM[i+1, j] is turned on, the transistor F2 has a diode-connected structure. Therefore, when a current flows from the wiring WCL[j] to the cell IM[i+1, j], the potentials of the gate of the transistor F2 and the second terminal of the transistor F2 are substantially equal to each other. The potentials are determined with the amount of a current flowing from the wiring WCL[j] to the cell IM[i+1, j], the potential of the first terminal of the transistor F2 (here, the ground potential GND), and the like. In this operation example, a current in the amount $I_0[i+1, j]$ flows from the wiring WCL[j] to the cell IM[i+1, j], whereby the potential of the gate of the transistor F2 (the node NN[i+1, j]) becomes $V_g[i+1, j]$. That is, a voltage between the gate and the source of the transistor F2 is $V_g[i+1, j]-GND$, and a current in the amount $I_0[i+1, j]$ is set as a current flowing between the first terminal and the second terminal of the transistor F2.

Here, the current amount $I_0[i+1, j]$ in the case where the threshold voltage of the transistor F2 is $V_{th}[i+1, j]$ and the transistor F2 operates in a subthreshold region can be expressed by the following formula.

[Formula 8]

$$I_0[i+1,j]=I_a \exp\{J(V_g[i+1,j]-V_{th}[i+1,j])\} \quad (1.8)$$

Note that the correction coefficient is J, which is the same as those of the transistor F2 included in the cell IM[i,j] and the transistor F2m included in the cell IMref[i].

The current amount $I_{0r}[i+1, j]$ in the case where the first data ac[i+1, j] is negative and the transistor F2r of the cell IMr[i+1, j] operates in a subthreshold region like the transistor F2 of the cell IM[i+1, j] can be expressed by the following formula in a manner similar to that of Formula (1.8), with the cell IM[i+1, j], the wiring WCL[j], the transistor F1, and the transistor F2 in the above description respectively replaced with the cell IMr[i+1, j], the wiring WCLr[j], the transistor F1r, and the transistor F2r.

[Formula 9]

$$I_{0r}[i+1,j]=I_a \exp\{J(V_g[i+1,j]-V_{thr}[i+1,j])\} \quad (1.9)$$

Note that $V_{thr}[i+1, j]$ denotes the threshold voltage of the transistor F2r. Note that $V_{thr}[i+1, j]$ is preferably equal to $V_{th}[i,j]$. In this operation example, the correction coefficient J of the transistor F2 is the same as that of the transistor F2r.

In the period from Time T17 to Time T18, a current in an amount $I_{ref0}[i+1]$ flows as the reference data from the circuit XCS to the wiring XCL[i+1]. Like the current amount $I_{ref0}[i]$, the current amount $I_{ref0}[i+1]$ can be expressed as $I_{ref0}[i+1]=I_{Xut}$. Furthermore, $I_{Xut}$ denotes the amount of a current flowing when the absolute value of the later-described second data is 1.

In the period from Time T17 to Time T18, since a conduction state is established between the first terminal of the transistor F1m included in the cell IMref[i+1] and the wiring XCL[i+1], a current in the amount $I_{ref0}[i+1]$ flows from the wiring XCL[i+1] to the cell IMref[i+1].

As in the cells IM[i+1, j] and IMr[i+1, j], when the transistor F1m included in the cell IMref[i+1] is turned on, the transistor F2m included in the cell IMref[i+1] has a diode-connected structure. Therefore, when a current flows from the wiring XCL[i+1] to the cell IMref[i+1], the potentials of the gate of the transistor F2m and the second terminal of the transistor F2m are substantially equal to each other. The potentials are determined with the amount of a current flowing from the wiring XCL[i+1] to the cell IMref[i+1], the potential of the first terminal of the transistor F2m (here, the ground potential GND), and the like. In this operation example, a current in the amount $I_{ref0}[i+1]$ flows from the wiring XCL[i+1] to the cell IMref[i+1], whereby the potential of the gate of the transistor F2 (the node NNref[i+1]) becomes $V_{gm}[i+1]$, and the potential of the wiring XCL[i+1] at this time is also $V_{gm}[i+1]$. That is, a voltage between the gate and the source of the transistor F2m is $V_{gm}[i+1]-GND$, and the current amount $I_{ref0}[i+1]$ is set as the amount of a current flowing between the first terminal and the second terminal of the transistor F2m.

Here, the current amount $I_{ref0}[i+1]$ in the case where the threshold voltage of the transistor F2m is $V_{thm}[i+1]$ and the transistor F2m operates in a subthreshold region can be expressed by the following formula.

[Formula 10]

$$I_{ref0}[i+1]I_a \exp\{J(V_{gm}[i+1]-V_{thm}[i+1])\} \quad (1.10)$$

Note that the correction coefficient J is the same as that of the transistor F2 included in the cell IM[i+1, j].

Here, a weight coefficient w[i+1, j] in the cell IM[i,j] is defined as follows.

[Formula 11]

$$w[i+1,j]=\exp\{J(V_g[i+1,j]-V_{th}[i+1,j]-V_{gm}[i+1]+V_{thm}[i+1])\} \quad (1.11)$$

Therefore, Formula (1.8) can be rewritten into the following formula with the use of Formula (1.10), Formula (1.11), $I_0[i+1, j]=|\alpha[i+1, j]|\times I_{Wut}$, and $I_{ref0}[i+1]=I_{Xut}$.

[Formula 12]

$$I_0[i+1,j]=w[i+1,j]I_{ref0}[i+1] \leftrightarrow |\alpha[i+1,j]|\times I_{Wut}=w[i+1,j]I_{Xut} \quad (1.12)$$

In a similar manner, w[i+1, j] in the cell IMr[i,j] is defined as follows.

[Formula 13]

$$w_r[i+1,j]=\exp\{J(V_g[i+1,j]-V_{thr}[i+1,j]-V_{gm}[i+1]+V_{thm}[i+1])\} \quad (1.13)$$

Therefore, Formula (1.9) can be rewritten into the following formula with the use of Formula (1.10), Formula (1.13), $I_{0r}[i+1, j]=|\alpha[i+1, j]|\times I_{Wut}$, and $I_{ref0}[i+1]=I_{Xut}$.

[Formula 14]

$$I_{0r}[i+1,j]=w_r[i+1,j]I_{ref0}[i+1] \leftrightarrow |\alpha[i+1,j]|\times I_{Wut}=w_r[i+1,j]I_{Xut} \quad (1.14)$$

Note that $w[i+1, j]=|\alpha[i+1, j]|$ in the case where $I_{Wut}$ and $I_{Xut}$ are equal to each other in Formula (1.12). In a similar manner, $w_r[i+1, j]=|\alpha[i+1, j]|$ in the case where $I_{Wut}$ and $I_{Xut}$ are equal to each other in Formula (1.14).

Note that in this operation example, in the period from Time T17 to Time T18, the first data $\alpha[i+1, j]$ is negative, a current in the amount $I_{0r}[i+1, j]=|\alpha[i+1, j]|\times I_{Wut}$ flows from the wiring WCLr[j] to the cell IMr[i+1, j], and no current flows (a current in the amount $I_0[i+1, j]=0$ flows) from the wiring WCL[j] to the cell IM[i+1, j]. Accordingly, the potential of the node NN[i+1, j] does not change from the ground potential GND and that of the node NNr[i+1, j] becomes $V_g[i,j]$.

<<From Time T18 to Time T19>>

In the period from Time T18 to Time T19, a low-level potential is applied to the wiring WSL[i+1]. Accordingly, in the i+1-th row of the cell array CA, a low-level potential is applied to each of the gates of the transistors F1 included in the cells IM[i+1,1] to IM[i+1, n], the gates of the transistors F1r included in the cells IMr[i+1,1] to IMr[i+1, n], and the gate of the transistor F1m included in the cell IMref[i+1], so that the transistors F1, F1r, and F1m are turned off.

When the transistor F1 included in the cell IM[i+1, j] is turned off, $GND-V_{gm}[i]$, which is the difference between the potential of the gate of the transistor F2 (the node NN[i+1, j]) and the potential of the wiring XCL[i+1], is retained in the capacitor C5. When the transistor F1r included in the cell IMr[i+1, j] is turned off, $V_g[i+1, j]-V_{gm}[i+1]$, which is the difference between the potential of the gate of the transistor F2r (the node NNr[i+1, j]) and the potential of the wiring XCL[i+1], is retained in the capacitor C5r. When the transistor F1m included in the cell IMref[i+1] is turned off, 0, which is the difference between the potential of the gate of the transistor F2m (the node NNref[i+1]) and the potential of the wiring XCL[i+1], is retained in the capacitor C5m. In the operation from Time T18 to Time T19, the voltage retained in the capacitor C5m might be a voltage that is not 0 (e.g., $V_{ds}$) depending on the transistor characteristics of the transistor F1m or the transistor F2m and the like. In this case, the node NNref[i+1] can be regarded as having a potential obtained by adding $V_{ds}$ to the potential of the wiring XCL[i+1].

<<From Time T19 to Time T20>>

In the period from Time T19 to Time T20, the ground potential GND is applied to the wiring XCL[i+1].

Thus, the potentials of the nodes NN[i+1,1] to NN[i+1, n] change because of capacitive coupling of the capacitors C5 included in the cells IM[i+1,1] to IM[i+1, n] in the i+1-th row, the potentials of the nodes NNr[i+1,1] to NNr[i+1, n] change because of capacitive coupling of the capacitors C5r included in the cells IMr[i+1,1] to IMr[i+1, n], and the potential of the node NNref[i+1] changes because of capacitive coupling of the capacitor C5m included in the cell IMref[i+1].

The amount of change in the potentials of the nodes NN[i+1,1] to NN[i+1, n] is a potential obtained by multiplying the amount of change in the potential of the wiring XCL[i+1] by the capacitive coupling coefficient that is determined by the configurations of the cells IM[i+1,1] to IM[i+1, n] included in the cell array CA. The capacitive coupling coefficient is calculated on the basis of the capacitance of the capacitor C5, the gate capacitance of the transistor F2, the parasitic capacitance, and the like. In the case where the capacitive coupling coefficient due to the capacitor C5 in each of the cells IM[i+1,1] to IM[i+1, n] is p like that due to the capacitor C5 in each of the cells IM[i,1] to IM[i,n], the potential of the node NN[i+1, j] in the cell IM[i+1, j] decreases from the potential in the period from Time T18 to Time T19 by $p(V_{gm}[i+1]-GND)$.

Similarly, when the potential of the wiring XCL[i+1] changes, the potential of the node NNr[i+1, j] also changes because of capacitive coupling of the capacitor C5r included in the cell IMr[i+1, j]. In the case where the capacitive coupling coefficient due to the capacitor C5r is p like that due to the capacitor C5, the potential of the node NNr[i+1, j] of the cell IMr[i+1, j] decreases from the potential in the period from Time T18 to Time T19 by $p(V_{gm}[i+1]-GND)$.

Similarly, when the potential of the wiring XCL[i+1] changes, the potential of the node NNref[i+1] also changes because of capacitive coupling of the capacitor C5m included in the cell IMref[i+1]. In the case where the capacitive coupling coefficient due to the capacitor C5m is p like that due to the capacitor C5, the potential of the node NNref[i+1] in the cell IMref[i+1] decreases from the potential in the period from Time T18 to Time T19 by $p(V_{gm}[i+1]-GND)$.

In the timing chart in FIG. 3, p is 1, for example. Thus, the potential of the node NNref[i+1] is the ground potential GND in the period from Time T20 to Time T21.

Accordingly, the potential of the node NN[i+1, j] of the cell IM[i+1, j] decreases, so that the transistor F2 is turned off. In a similar manner, the potential of the node NNr[i+1, j] of the cell IMr[i+1, j] decreases, so that the transistor F2r is also turned off In a similar manner, the potential of the node NNref[i+1] of the cell IMref[i+1] decreases, so that the transistor F2m is also turned off. Therefore, no current flows between the source and the drain of the transistor F2 included in the cell IM[i+1, j], no current flows between the source and the drain of the transistor F2r included in the cell IMr[i+1, j], and no current flows between the source and the drain of the transistor F2m included in the cell IMref[i+1].

<<From Time T20 to Time T21>>

In the period from Time T20 to Time T21, a low-level potential is applied to the wiring SWL1. Accordingly, a low-level potential is applied to each of the gates of the transistors F3[j] and F3r[j], whereby the transistors F3[j] and F3r[j] are turned off.

<<From Time T21 to Time T22>>

In the period from Time T21 to Time T22, a high-level potential is applied to the wiring SWL2. Accordingly, a high-level potential is applied to each of the gates of the transistors F4[j] and F4r[j], whereby the transistors F4[j] and F4r[j] are turned on.

<<From Time T22 to Time T23>>

In the period from Time T22 to Time T23, a current in an amount $x[i] \times I_{ref0}[i]$, i.e., x[i] times the current amount $I_{ref0}[i]$, flows from the circuit XCS to the wiring XCL[i] as the second data. Since $I_{ref0}[i]=I_{Xut}$, $x[i] \times I_{ref0}[i]=x[i] \times I_{Xut}$. In this operation example, x[i] corresponds to the value of the second data. At this time, the potential of the wiring XCL[i] changes from 0 to $V_{gm}[i]+\Delta V[i]$.

When the potential of the wiring XCL[i] changes, the potentials of the nodes NN[i,1] to NN[i,n] also change because of the capacitive coupling of the capacitors C5 included in the cells IM[i,1] to IM[i,n] in the i-th row of the cell array CA. Thus, the potential of the node NN[i,j] in the cell IM[i,j] becomes $V_g[i,j]+p\Delta V[i]$.

Similarly, when the potential of the wiring XCL[i] changes, the potential of the node NNr[i,j] also changes because of capacitive coupling of the capacitor C5r included in the cell IMr[i,j]. Thus, the potential of the node NNr[i,j] in the cell IMr[i,j] becomes $p\Delta V[i]$.

Similarly, when the potential of the wiring XCL[i] changes, the potential of the node NNref[i] also changes because of capacitive coupling of the capacitor C5m included in the cell IMref[i]. Thus, the potential of the node NNref[i] of the cell IMref[i] becomes $V_{gm}[i]+p\Delta V[i]$.

Accordingly, an amount $I_1[i,j]$ of a current flowing between the first terminal and the second terminal of the transistor F2 and an amount $I_{ref1}[i]$ of a current flowing between the first terminal and the second terminal of the transistor F2m in the period from Time T22 to Time T23 can be expressed as follows.

[Formula 15]

$$I_1[i, j] = I_a \exp\{J(V_g[i, j] + p\Delta V[i] - V_{th}[i, j])\} \quad (1.15)$$
$$= I_0[i, j]\exp(Jp\Delta V[i])$$

[Formula 16]

$$I_{ref1}[i] = I_a \exp\{J(V_{gm}[i] + p\Delta V[i] - V_{thm}[i])\} \quad (1.16)$$
$$= x[i]I_{ref0}[i]$$

Note that x[i] is as expressed by the following formula.

[Formula 17]

$$x[i]=\exp(Jp\Delta V[i]) \quad (1.17)$$

Therefore, Formula (1.15) can be rewritten into the following formula with the use of Formula (1.5) and Formula (1.17).

[Formula 18]

$$I_1[i,j]=x[i]w[i,j]I_{ref0}[i] \quad (1.18)$$

That is, the amount of a current flowing between the first terminal and the second terminal of the transistor F2 included in the cell IM[i,j] is proportional to the product of w[i,j] that is the first data and x[i] that is the second data.

Note that an amount $I_{1r}[j]$ of a current flowing between the first terminal and the second terminal of the transistor F2r in the period from Time T22 to Time T23 is 0.

In the period from Time T22 to Time T23, a current in an amount $x[i+1] \times I_{ref0}[i+1]$, i.e., $x[i+1]$ times the current amount $I_{ref0}[i+1]$, flows from the circuit XCS to the wiring XCL[i+1] as the second data. In this operation example, x[i+1] corresponds to the value of the second data. At this time, the potential of the wiring XCL[i+1] changes from 0 to $V_{gm}[i+1]+\Delta V[i+1]$.

When the potential of the wiring XCL[i+1] changes, the potentials of the nodes NN[i+1,1] to NN[i+1, n] also change because of the capacitive coupling of the capacitors C5 included in the cells IM[i+1,1] to IM[i+1, n] in the i+1-th row of the cell array CA. Thus, the potential of the node NN[i+1, j] of the cell IM[i+1, j] becomes $p\Delta V[i+1]$.

Similarly, when the potential of the wiring XCL[i+1] changes, the potential of the node NNr[i+1, j] also changes because of capacitive coupling of the capacitor C5r included in the cell IMr[i+1, j]. Thus, the potential of the node NNr[i+1, j] of the cell IMr[i+1, j] becomes $V_{gm}[i+1]+p\Delta V[i+1]$.

Similarly, when the potential of the wiring XCL[i+1] changes, the potential of the node NNref[i+1] also changes because of capacitive coupling of the capacitor C5m included in the cell IMref[i+1]. Thus, the potential of the node NNref[i+1] of the cell IMref[i+1] becomes $V_{gm}[i+1]+p\Delta T[i+1]$.

Accordingly, an amount $I_1[i+1, j]$ of a current flowing between the first terminal and the second terminal of the transistor F2r and an amount $I_{ref1}[i+1]$ of a current flowing between the first terminal and the second terminal of the transistor F2m in the period from Time T22 to Time T23 can be expressed as follows.

[Formula 19]

$$I_{1r}[i+1, j] = I_a \exp\{J(V_g[i+1, j] + p\Delta V[i+1] - V_{thr}[i+1, j])\} \quad (1.19)$$
$$= I_{0r}[i+1, j]\exp(Jp\Delta V[i+1])$$

[Formula 20]

$$I_{ref1}[i+1] = I_a \exp\{J(V_{gm}[i+1] + p\Delta V[i+1] - V_{thm}[i+1])\} \quad (1.20)$$
$$= x[i+1]I_{ref0}[i+1]$$

Note that x[i+1] is as expressed by the following formula.

[Formula 21]

$$x[i+1]=\exp(Jp\Delta V[i+1]) \quad (1.21)$$

Therefore, Formula (1.19) can be rewritten into the following formula with the use of Formula (1.14) and Formula (1.21).

[Formula 22]

$$I_{1r}[i+1,j]=x[i+1]w_r[i+1,j]I_{ref0}[i+1] \quad (1.22)$$

That is, the amount of a current flowing between the first terminal and the second terminal of the transistor F2r included in the cell IMr[i+1, j] is proportional to the product of $w_r[i+1, j]$ that is the first data and x[i+1] that is the second data.

Note that an amount $I_1[i+1, j]$ of a current flowing between the first terminal and the second terminal of the transistor F2 in the period from Time T22 to Time T23 is 0.

Here, the sum of the amounts of currents flowing from the converter circuit ITRZD[j] to the cells IM[i,j] and IM[i+1, j] through the transistor F4[j] and the wiring WCL[j] and the sum of the amounts of currents flowing from the converter circuit ITRZD[j] to the cells IMr[i,j] and IMr[i+1, j] through the transistor F4r[j] and the wiring WCLr[j] are discussed. The former sum of current amounts, $I_S[j]$, and the latter sum of current amounts, $I_{Sr}[j]$, can be expressed by the following formulae on the assumption that $I_{ref0}[i]$ is equal to $I_{ref0}[i+1]$ ($I_{ref0}[i]=I_{ref0}[i+1]=I_{ref0}$).

[Formula 23]

$$I_S[j] = I_1[i, j] + I_1[i+1, j] \quad (1.23)$$
$$= I_{ref0}(x[i]w[i, j] + x[i+1]w[i+1, j])$$

$$I_{Sr}[j] = I_{1r}[i, j] + I_{1r}[i+1, j] \quad (1.24)$$
$$= I_{ref0}(x[i]w_r[i, j] + x[i+1]w_r[i+1, j])$$

Since $I_1[i+1, j]$ is 0 in this operation example, $I_S[j]$ is substantially equal to $I_1[i,j]$ in Formula (1.23). Note that in the case where the first data $\alpha[i+1, j]$ is positive, $u_r[i+1, j]$ is larger than 0 and thus, $I_1[i+1, j]$ is not necessarily 0. Since $I_{1r}[i,j]$ is 0 in this operation example, $I_{Sr}[j]$ is substantially equal to $I_{1r}[i+1, j]$ in Formula (1.24). Note that in the case where the first data $\alpha[i,j]$ is negative, w[i+1, j] is larger than 0 and thus, $I_{1r}[i,j]$ is not necessarily 0.

In the case where the second data x[i] and/or the second data x[i+1] are/is 0, the potential applied to the wiring XCL[i] and/or the wiring XCL[i+1] in the period from Time T22 to Time T23 may be the ground potential GND, for example. When the ground potential GND is applied to the wiring XCL[i] and/or the wiring XCL[i+1], the potential(s) of the node NN[i,j], the node NNr[i,j], the node NN[i+1, j], and/or the node NNr[i+1, j] are/is not changed from that in the period from Time T21 to Time T22; thus, no current flows between the source and the drain of the transistor F2 in the cell IM[i,j] and/or the cell IM[i+1, j], and no current flows between the source and the drain of the transistor F2r in the cell IMr[i,j] and/or the cell IMr[i+1, j].

Thus, the current amount $I_S[j]$ output from the converter circuit ITRZD[j] is proportional to the sum of products of the weight coefficients w[i,j] and w[i+1, j] (the positive first data) and the values x[i] and x[i+1] of signals of neurons (the second data), and the current amount $I_{Sr}[j]$ output from the converter circuit ITRZD[j] is proportional to the sum of products of the absolute values of the weight coefficients w[i,j] and w[i+1, j] (the negative first data) and the values x[i] and x[i+1] of signals of neurons (the second data).

Although in the above-described operation example, the sum of the amounts of currents flowing in the cells IM[i,j] and IM[i+1, j] is described, the sum of the amounts of currents flowing in a plurality of cells, i.e., the cells IM[1, j] to IM[m,j], may be described. In this case, Formula (1.23) and Formula (1.24) can be rewritten into the following formulae.

[Formula 24]

$$I_S[j] = I_{ref0} \sum_{i=1}^{m} x[i]w[i,j] \quad (1.25)$$

$$I_{Sr}[j] = I_{ref0} \sum_{i=1}^{m} x[i]w_r[i,j] \quad (1.26)$$

Note that the current amount $I_S[j]$ and the current amount $I_{Sr}[j]$ when the first data $\alpha[i,j]$ is positive can be expressed by Formula (1.25) and Formula (1.26) where $w[i,j]=|\alpha[i,j]|$ and $w_r[i,j]=0$; the current amount $I_S[j]$ and the current amount $I_{Sr}[j]$ when the first data $\alpha[i,j]$ is negative can be expressed by these formulae where $w[i,j]=0$ and $w_r[i,j]=|\alpha[i,j]|$; and the current amount $I_S[j]$ and the current amount $I_{Sr}[j]$ when the first data $\alpha[i,j]$ is 0 can be expressed by these formulae where $w[i,j]=0$ and $w_r[i,j]=0$.

The converter circuit ITRZD[j] refers to the amount $I_S[j]$ of the current flowing in the wiring WCL[j] and the amount $I_{Sr}[j]$ of the current flowing in the wiring WCLr[j] to output a voltage corresponding to the differential current between $I_S[j]$ and $I_{Sr}[j]$. The differential current can be expressed by the following formula.

[Formula 25]

$$I_S[j] - I_{Sr}[j] = I_{ref0} \sum_{i=1}^{m} x[i](w[i,j] - w_r[i,j]) \quad (1.27)$$

That is, the amount of the differential current expressed by Formula (1.27) depends on the sum of products of the positive, negative, or "0" first data and the positive, negative, or "0" second data. Therefore, the sum of products of the first data and the second data can be calculated from the differential current.

Thus, even in the case of the arithmetic circuit MAC1 including the cell array CA including three or more rows and two or more columns, a product-sum operation can be performed in the above-described manner. In the arithmetic circuit MAC1 of such a case, cells in one (the i-th column) of a plurality of columns retain the current amounts $I_{ref0}[i]$ and $x[i] \times I_{ref0}[i]$, whereby product-sum operations, the number of which corresponds to the number of the rest of the columns among the plurality of columns, can be executed concurrently. That is, when the number of columns in a memory cell array is increased, a semiconductor device that achieves a high-speed product-sum operation can be provided.

<Configuration Example 2 of Arithmetic Circuit>

The operation of the converter circuit ITRZD[j] might be delayed in the case where the amount $I_S[j]$ of the current flowing from the converter circuit ITRZD[j] to the wiring WCL[j] through the transistor F4[j] and the amount $I_{Sr}[j]$ of the current flowing from the converter circuit ITRZD[j] to the wiring WCLr[j] through the transistor F4r[j] are small, e.g., in the case where each of the current amounts $I_S[j]$ and $I_{Sr}[j]$ is within the range where the transistor F2 and the transistor F2r operate in a subthreshold region. In general, a small current amount extends the time taken by charge of capacitors or the like to sometimes delay the operation of the entire circuit. Moreover, in the case where the converter circuit ITRZD[j] includes an analog-to-digital converter circuit and the operation frequency is increased with the current amounts $I_S[j]$ and $I_{Sr}[j]$ remaining small, error of the input/output characteristics of the analog-to-digital converter circuit might increase.

FIG. 1 shows an arithmetic circuit that is configured to solve the above problems. An arithmetic circuit MAC2 shown in FIG. 1 is a variation of the arithmetic circuit MAC1 shown in FIG. 2 and is different from the arithmetic circuit MAC1 in that the cell array CA includes a region ROA and a region IOA.

Like the cell array CA in FIG. 2, the cell array CA in FIG. 1 includes the cells IM[1,1] to IM[m,n], the cells IMr[1,1] to IMr[m,n], and the cells IMref[1] to IMref[m].

The region ROA and the region IOA are formed by dividing the cell array CA in the row direction. In FIG. 1, for example, the region ROA is shown as a region including the cells IM, IMr, and IMref that are arranged in the first to k-th rows (k is an integer greater than or equal to 1 and less than or equal to m−1) in the cell array CA, and the region IOA is shown as a region including the cells IM, IMr, and IMref that are arranged in the k+1-th to m-th rows in the cell array CA.

Although the cell array CA of the arithmetic circuit MAC2 in FIG. 1 is divided into the region ROA extending from the first row to the k-th row and the region IOA extending from the k+1-th row to the m-th row, one embodiment of the present invention is not limited thereto. The cell array CA of the arithmetic circuit MAC2 may have the region IOA extending from the first row to the k-th row and the region ROA extending from the k+1-th row to the m-th row. Alternatively, the cell array CA of the arithmetic circuit MAC2 may have the region ROA extending in one or more rows selected from the first to m-th rows and the region IOA extending in the other rows.

<Operation Example 2 of Arithmetic Circuit>

Next, an operation example of the arithmetic circuit MAC2 shown in FIG. 1 is described.

Figure 4:
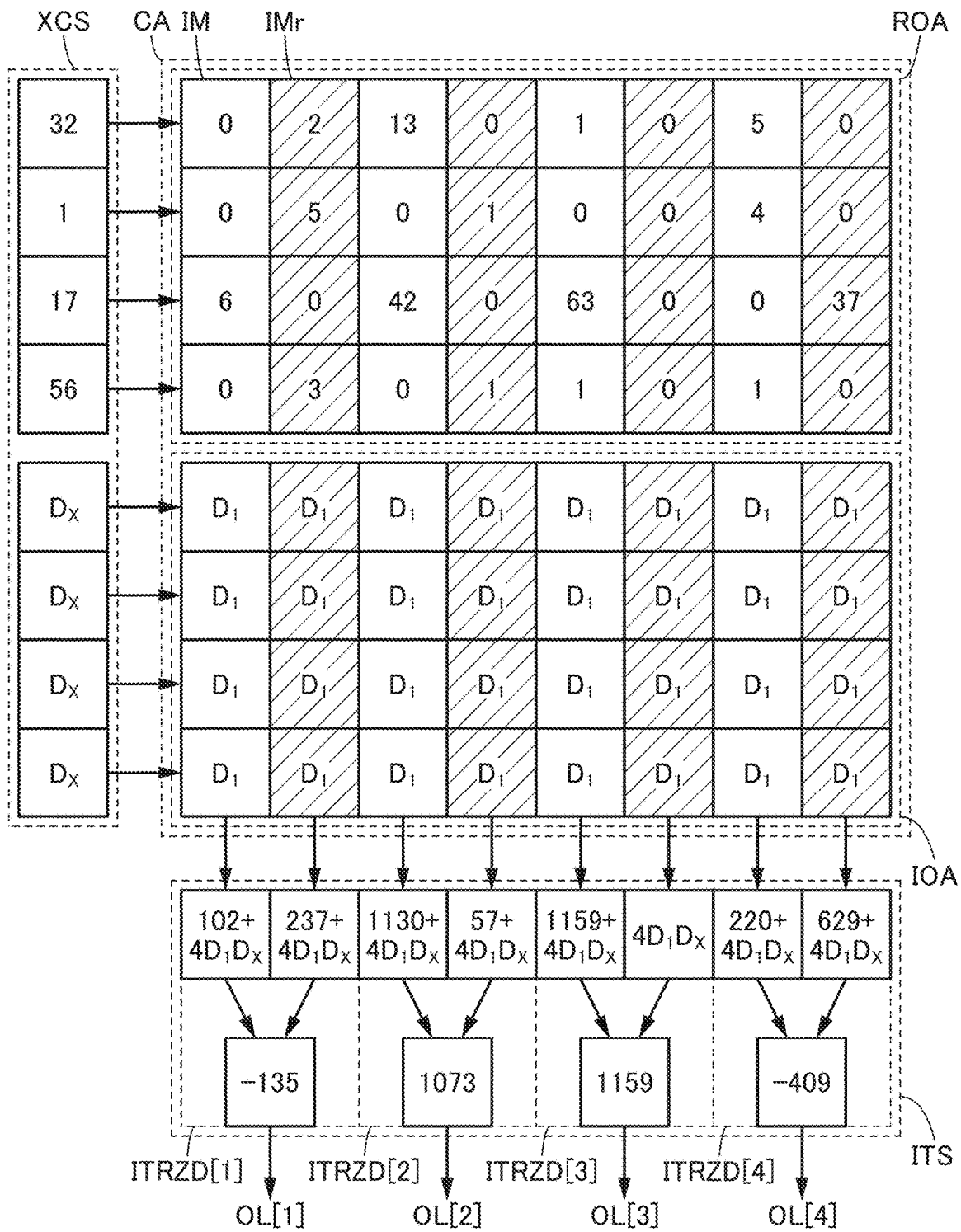
FIG. 4 a block diagram showing an operation example of a semiconductor device.

FIG. 4 is a block diagram illustrating an operation example of the arithmetic circuit MAC2. FIG. 4 shows the cell array CA, the circuit XCS, and the circuit ITS of the arithmetic circuit MAC2. Of the cells in the cell array CA, only the cells IM and IMr are shown.

The cell array CA of the arithmetic circuit MAC2 in FIG. 4 is configured such that m is 8 and n is 4 in FIG. 1. That is, with attention focused on only the cells IM and IMr, the cells IM and IMr are arranged in a matrix of eight rows and eight columns in the cell array CA. When the cells IMref are included, the cell array CA has a matrix of eight rows and nine columns.

The arithmetic circuit MAC2 in FIG. 4 is configured such that k is 4 in FIG. 1. Accordingly, the region ROA includes the cells IM and IMr arranged in the first to fourth rows in the cell array CA of the arithmetic circuit MAC2 in FIG. 4, and the region IOA includes the cells IM and IMr arranged in the fifth to eighth rows in the cell array CA of the arithmetic circuit MAC2 in FIG. 4.

Note that the blocks representing the cells IMr in the cell array CA are hatched.

Figure 5:
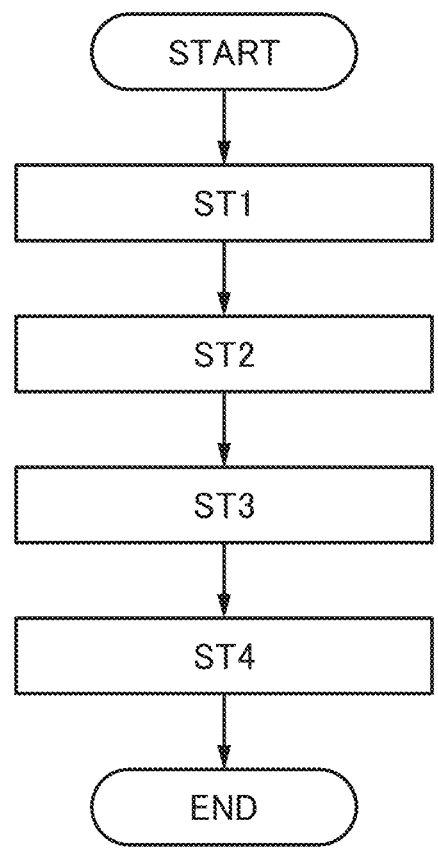
FIG. 5 is a flowchart showing an operation example of a semiconductor device.

FIG. 5 is a flowchart illustrating an operation example of the arithmetic circuit MAC2 shown in FIG. 4. The operation example of the arithmetic circuit MAC2 illustrated in FIG. 5 includes Steps ST1 to ST4. Each of Steps ST1 to ST4 is described below.

<<Step ST1>>

Step ST1 includes, for example, a step of writing the value of the first data to the cells IM and IMr included in the region ROA of the arithmetic circuit MAC2 in FIG. 4.

In this operation example, each member of a matrix W below is written to the cells IM and IMr included in the region ROA of the arithmetic circuit MAC2 in FIG. 4.

[Formula 26]

$$W = \begin{pmatrix} -2 & 13 & 1 & 5 \\ -5 & -1 & 0 & 4 \\ 6 & 42 & 63 & -37 \\ -3 & -1 & 1 & 1 \end{pmatrix} \quad (1.28)$$

For wiring of the first data to the cells IM and IMr, refer to the above description of the operation in the period from Time T12 to Time T15 or the period from Time T16 to Time T19 in the timing chart in FIG. 3.

For example, since the value in the first row and the first column in the matrix W is −2, 0 is written to the cell IM[1,1] as w[1,1], and 2 is written to the cell IMr[1,1] as $w_r$[1, 1]. For another example, since the value in the third row and the second column in the matrix W is 42, 42 is written to the cell IM[3,2] as w[3,2], and 0 is written to the cell IMr[3,2] as $w_r$[3, 2]. For another example, since the value in the second row and the third column in the matrix W is 0, 0 is written to the cell IM[2,3] as w[2,3], and 0 is written to the cell IMr[2,3] as $w_r$[2, 3].

<<Step ST2>>

Step ST2 includes, for example, a step of writing the value of third data to the cells IM and IMr included in the region IOA of the arithmetic circuit MAC2 in FIG. 4.

The third data is a freely set value $D_1$ here. The value $D_1$ is preferably larger than the value of each member included in the matrix W, for example.

In Step ST1, the first data is written to one of the cell IM and the cell IMr in the region ROA and 0 is written to the other, whereas in Step ST2, $D_1$ is written to both the cell IM and the cell IMr in the region IOA. Accordingly, as shown by the arithmetic circuit MAC2 in FIG. 4, $D_1$ is written to all of the cells IM and IMr included in the region IOA.

<<Step ST3>>

Step ST3 includes, for example, a step of inputting the second data to the cells IM and IMr included in the region ROA of the arithmetic circuit MAC2 in FIG. 4 and inputting fourth data to the cells IM and IMr included in the region IOA.

In this operation example, each member of a matrix X below is input to the cells IM and IMr included in the region ROA of the arithmetic circuit MAC2 in FIG. 4.

[Formula 27]

$$X = (32 \ 1 \ 17 \ 56) \quad (1.29)$$

Specifically, 32, 1, 17, and 56 are respectively input to the first row, the second row, the third row, and the fourth row of the cell array CA.

In this operation example, $D_X$ is input as the fourth data to the cells IM and IMr included in the region IOA of the arithmetic circuit MAC2 in FIG. 4. Specifically, $D_X$ is input to the fifth to eighth rows in the cell array CA.

Note that for input of the second data to the cells IM and IMr included in the region ROA and input of the second data to the cells IM and IMr included in the region IOA, refer to the above description of the operation in the period from Time T21 to Time T23 in the timing chart in FIG. 3.

<<Step ST4>>

Step ST3 includes, for example, a step in which the circuit ITS performs an operation using the first data and the third data that have been written to the cells IM and IMr in the cell array CA of the arithmetic circuit MAC2 in FIG. 4 and the second data and the fourth data input to the cell array CA, to output the operation result. Specifically, Step ST4 includes a step in which the cells IM included in the region ROA each output a current corresponding to the product of the written first data and the input second data; a step in which the cells IMr included in the region ROA each output a current corresponding to the product of the written first data and the input second data; a step in which the cells IM included in the region IOA each output a current corresponding to the product of the written third data and the input fourth data; a step in which the cells IMr included in the region IOA each output a current corresponding to the product of the written third data and the input fourth data; and a step in which the converter circuit outputs a voltage corresponding to the differential current between the sum of the currents output from the cells IM included in the region ROA and the cells IM included in the region IOA and the sum of the currents output from the cells IMr included in the region ROA and the cells IMr included in the region IOA.

For example, in the region ROA in the first column of the cell array CA, a product-sum operation is performed using the first data and the second data in the column to output 32×0+1×0+17×6+56×0=102. In the region IOA in the first column of the cell array CA, a product-sum operation is performed using the third data and the fourth data in the column to output $D_1 \times D_X + D_1 \times D_X + D_1 \times D_X + D_1 \times D_X = 4D_1 D_X$. Thus, the result of the product-sum operation performed by the eight cells IM arranged in the first column of the cell array CA is $102 + 4D_1 D_X$.

For another example, in the region ROA in the second column of the cell array CA, a product-sum operation is performed using the first data and the second data in the column to output 32×2+1×5+17×0+56×3=237. In the region IOA in the first column of the cell array CA, a product-sum operation is performed using the third data and the fourth data in the column to output $D_1 \times D_X + D_1 \times D_X + D_1 \times D_X + D_1 \times D_X = 4D_1 D_X$. Thus, the result of the product-sum operation performed by the eight cells IMr arranged in the first column of the cell array CA is $237 + 4D_1 D_X$.

Then, $102 + 4D_1 D_X$, which is the product-sum operation result in the first column, is input to one of the two input terminals of the converter circuit ITRZD[1] included in the circuit ITS, and $237 + 4D_1 D_X$, which is the product-sum operation result in the second column, is input to the other of the two input terminals of the converter circuit ITRZD[1]. The converter circuit ITRZD[1], which has a function of acquiring the difference between the amounts of the currents input to the two input terminals, acquires the difference between $102 + 4D_1 D_X$, which is the product-sum operation result in the first column, and $237 + 4D_1 D_X$, which is the product-sum operation result in the second column. Thus, the converter circuit ITRZD[1] outputs, to a wiring OL[1], a signal (e.g., a current or a voltage) corresponding to $(102 + 4D_1 D_X) - (237 + 4D_1 D_X) = -135$. This result agrees with the sum of products of the members in the first row of X in Formula (1.29) and the members in the first column of W in Formula (1.28).

In a similar manner, product-sum operations are performed in the third to eighth columns in the cell array CA. The results of the product-sum operations are, as shown in FIG. 4, $1130 + 4D_1 D_X$ in the third column, $57 + 4D_1 D_X$ in the fourth column, $1159 + 4D_1 D_X$ in the fifth column, $4D_1 D_X$ in the sixth column, $220 + 4D_1 D_X$ in the seventh column, and $629 + 4D_1 D_X$ in the eighth column. Furthermore, the converter circuit ITRZD[2] outputs, to a wiring OL[2], a signal (e.g., a current or a voltage) corresponding to (1130+4$D_1D_X$)−(57+4$D_1D_X$)=1073; the converter circuit ITRZD[3] outputs, to a wiring OL[3], a signal (e.g., a current or a voltage) corresponding to (1159+4$D_1D_X$)−(4$D_1D_X$)=1159; and the converter circuit ITRZD[4] outputs, to a wiring OL[4], a signal (e.g., a current or a voltage) corresponding to (220+4$D_1D_X$)−(629+4$D_1D_X$)=−409. These values, 1073, 1159, and −409, agree respectively with the sum of products of the members in the first row of X in Formula (1.29) and the members in the second column of W in Formula (1.28), the sum of products of the members in the first row of X in Formula (1.29) and the members in the third column of W in Formula (1.28), and the sum of products of the members in the first row of X in Formula (1.29) and the members in the fourth column of W in Formula (1.28).

Through the operations in Steps ST1 to ST4, the current amount corresponding to 4$D_1D_X$ is added to the current amounts corresponding to the results of the product-sum operations in the first to fourth rows, and the resultant currents are input to the input terminals of the converter circuits ITRZD[1] to ITRZD[4] included in the circuit ITS. In this specification and the like, a current corresponding to the sum of products of the third data and the fourth data calculated by the cells IM or IMr in the region IOA is referred to as a base current.

In Steps ST1 to ST4, abase current corresponding to 4$D_1D_X$ is additionally input to the input terminals of the converter circuits ITRZD[1] to ITRZD[4], so that the converter circuits ITRZD[1] to ITRZD[4] can have a higher operation speed than when no base current is input.

The base currents generated in the columns of the cell array CA are equal to each other; thus, the converter circuit ITRZD[1] cancels the base currents flowing in the first and second columns, so that the sum of products (−135) of the members in the first row of X in Formula (1.29) and the members in the first column of W in Formula (1.28) is output to the wiring OL[1]. The same applies to the third and fourth columns, the fifth and sixth columns, and the seventh and eighth columns; the converter circuits ITRZD[2] to ITRZD[4] cancel the base currents flowing in the respective columns, so that the converter circuits ITRZD[2], ITRZD[3], and ITRZD[4] respectively output the sum of products (1073, 1159, and −409) to the wirings OL[2], OL[3], and OL[4].

Note that the operation method of the semiconductor device of one embodiment of the present invention is not limited thereto. The operation method of the semiconductor device of one embodiment of the present invention may be modified as appropriate as long as an object of one embodiment of the present invention is achieved.

Figure 6:
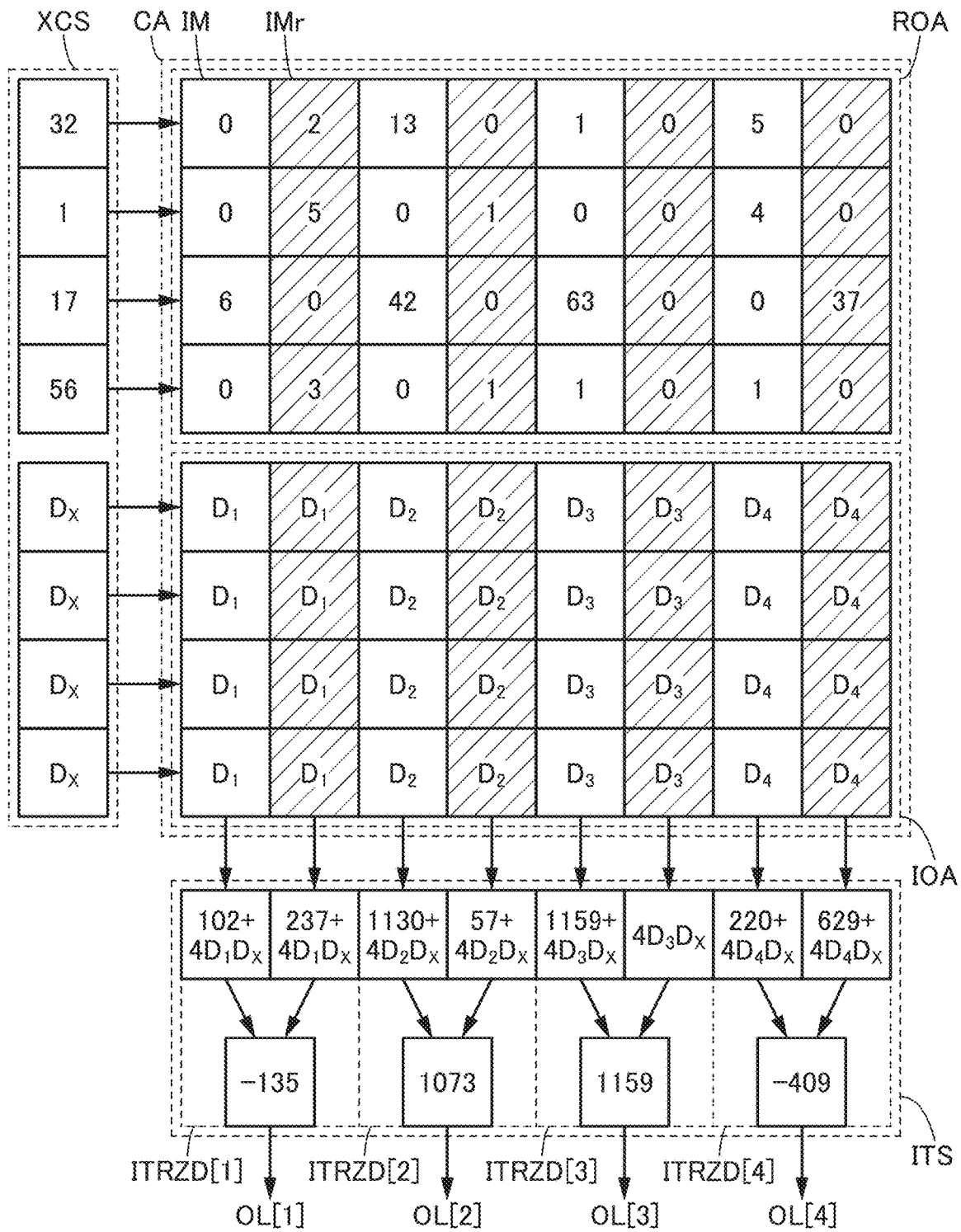
FIG. 6 is a block diagram showing an operation example of a semiconductor device.

For example, the third data written to the cells IM and IMr included in the region IOA of the cell array CA may have different values, instead of the same value. Specifically, it is possible to employ the method as shown in FIG. 6 in which, in the region IOA of the cell array CA, $D_1$ is written to the cells IM and IMr arranged in the first and second columns; $D_2$ is written to the cells IM and IMr arranged in the third and fourth columns; $D_3$ is written to the cells IM and IMr arranged in the fifth and sixth columns; and $D_4$ is written to the cells IM and IMr arranged in the seventh and eighth columns. Note that the values $D_2$ to $D_4$ are freely set like $D_1$, and the values $D_1$ to $D_4$ may be different from each other. When the same value is written to the cells IM and IMr arranged in the first and second columns (the third and fourth columns, the fifth and sixth columns, or the seventh and eighth columns) in the region IOA as described above, the converter circuit ITRZD[1] (the converter circuit ITRZD[2], the converter circuit ITRZD[3], or the converter circuit ITRZD[4]) cancels the base currents generated in the corresponding columns, which means that a product-sum operation can be performed as in the operation example shown in FIG. 4.

In reality, the base current enabling a stable operation of the analog converter circuits of the converter circuits ITRZD[1] to ITRZD[4] might be different between the analog converter circuits. In this manner, the analog converter circuits of the converter circuits ITRZD[1] to ITRZD[4] might have a variation; thus, the base current to be input is preferably determined separately for the converter circuits ITRZD[1] to ITRZD[4]. In other words, in the case where a high base current is needed for a stable operation of the analog converter circuit of the converter circuit ITRZD[1], the value $D_1$ written to the cells IM and IMr arranged in the first and second columns is set large; in the case where a high base current is not needed for a stable operation of the analog converter circuit of the converter circuit ITRZD[2], the value $D_2$ written to the cells IM and IMr arranged in the third and fourth columns is set small, for example.

In the above-described operation example of the arithmetic circuit MAC2, 0 is often written to the cells IM[i,j] and IMr[i,j] in the region ROA of the cell array CA, in some cases. For example, in the operation example of the arithmetic circuit shown in FIG. 4, 0 is written to each of the cells IMr[1,3] to IMr[4,3] in the sixth column of the cell array CA. In this case, the current amounts output from the cells IMr[1,3] to IMr[4,3] are substantially 0 and thus, the base current in the sixth column of the cell array CA is preferably made high to allow a stable operation of the analog-to-digital converter circuit included in the converter circuit ITRZD[3]. That is, the value $D_3$ written to the cells IM and IMr arranged in the fifth and sixth columns is set large. As described above, in the case where a column in the region ROA of the cell array CA has many cells IM[i,j] or IMr[i,j] to which 0 is written, the value written to the cells IM[i,j] and IMr[i,j] in that column in the region IOA may be set large to increase the base current.

Figure 7:
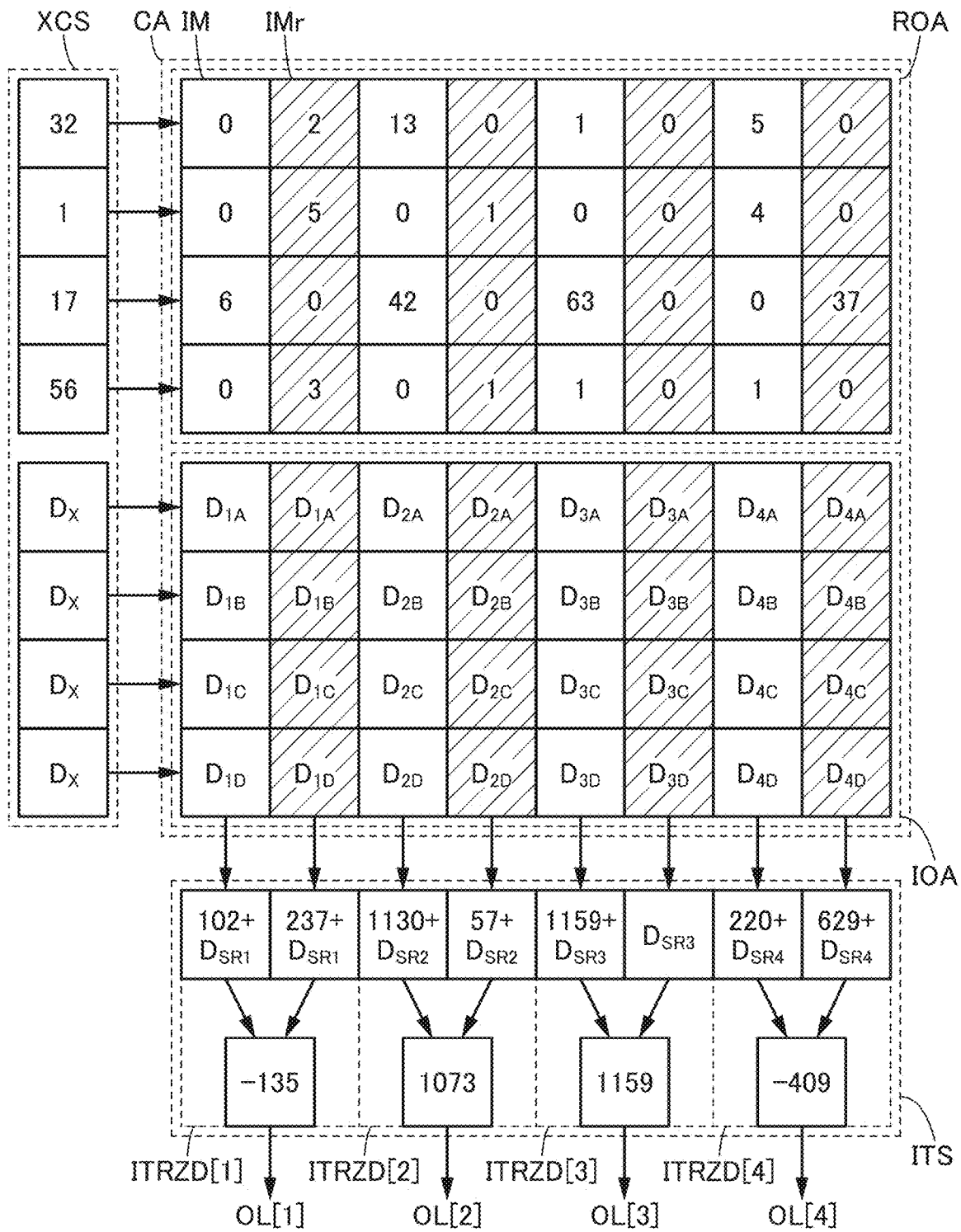
FIG. 7 is a block diagram showing an operation example of a semiconductor device.

It is also possible to employ the method in which, for example, the same value is written as the third data to a pair of the cell IM[i,j] and the cell IMr[i,j] included in the region IOA of the cell array CA, with the value being different from that written to another pair of the cell IM and the cell IMr. Specifically, it is possible to employ the method as shown in FIG. 7 in which, in the region IOA of the cell array CA, $D_{1A}$, $D_{1B}$, $D_{1C}$, and $D_{1D}$ are written to the cells IM and IMr in the first row, the second row, the third row, and the fourth row, respectively, in the first and second columns: $D_{2A}$, $D_{2B}$, $D_{2C}$, and $D_{2D}$ are written to the cells IM and IMr in the first row, the second row, the third row, and the fourth row, respectively, in the third and fourth columns; $D_{3A}$, $D_{3B}$, $D_{3C}$, and $D_{3D}$ are written to the cells IM and IMr in the first row, the second row, the third row, and the fourth row, respectively, in the fifth and sixth columns; and $D_{4A}$, $D_{4B}$, $D_{4C}$, and $D_{4D}$ are written to the cells IM and IMr in the first row, the second row, the third row, and the fourth row, respectively, in the seventh and eighth columns. Note that the values $D_{1A}$, $D_{1B}$, $D_{1C}$, $D_{1D}$, $D_{2A}$, $D_{2A}$, $D_{2C}$, $D_{2D}$, $D_{3A}$, $D_{3B}$, $D_{3C}$, $D_{3D}$, $D_{4A}$, $D_{4B}$, $D_{4C}$, and $D_{4D}$ may be the same or different from each other. When the same value is written to a pair of the cells IM and IMr arranged in the first and second columns (the third and fourth columns, the fifth and sixth columns, or the seventh and eighth columns) in the region IOA as described above, the converter circuit ITRZD[1] (the converter circuit ITRZD[2], the converter circuit ITRZD[3], or the converter circuit ITRZD[4]) cancels the base currents generated in the corresponding columns, which means that a product-sum operation can be performed as in the operation example shown in FIG. 4. Note that $D_{SR1}$, $D_{SR2}$, $D_{SR3}$, and $D_{SR4}$ in FIG. 7 respectively represent $D_{1A} \times D_X + D_{1B} \times D_X + D_{1C} \times D_X + D_{1D} \times D_X$, $D_{2A} \times D_X + D_{2B} \times D_X + D_{2C} \times D_X + D_{2D} \times D_X$, $D_{3A} \times D_X + D_{3B} \times D_X + D_{3C} \times D_X + D_{3D} \times D_X$, and $D_{4A} \times D_X + D_{4B} \times D_X + D_{4C} \times D_X + D_{4D} \times D_X$.

<Configuration Example 3 of Arithmetic Circuit>

Although the arithmetic circuit MAC1 and the arithmetic circuit MAC2 have a configuration in which the second data is input from the circuit XCS in the above description, the arithmetic circuit MAC1 and the arithmetic circuit MAC2 may have a configuration in which an image obtained with an image sensor is directly input.

Figure 8:
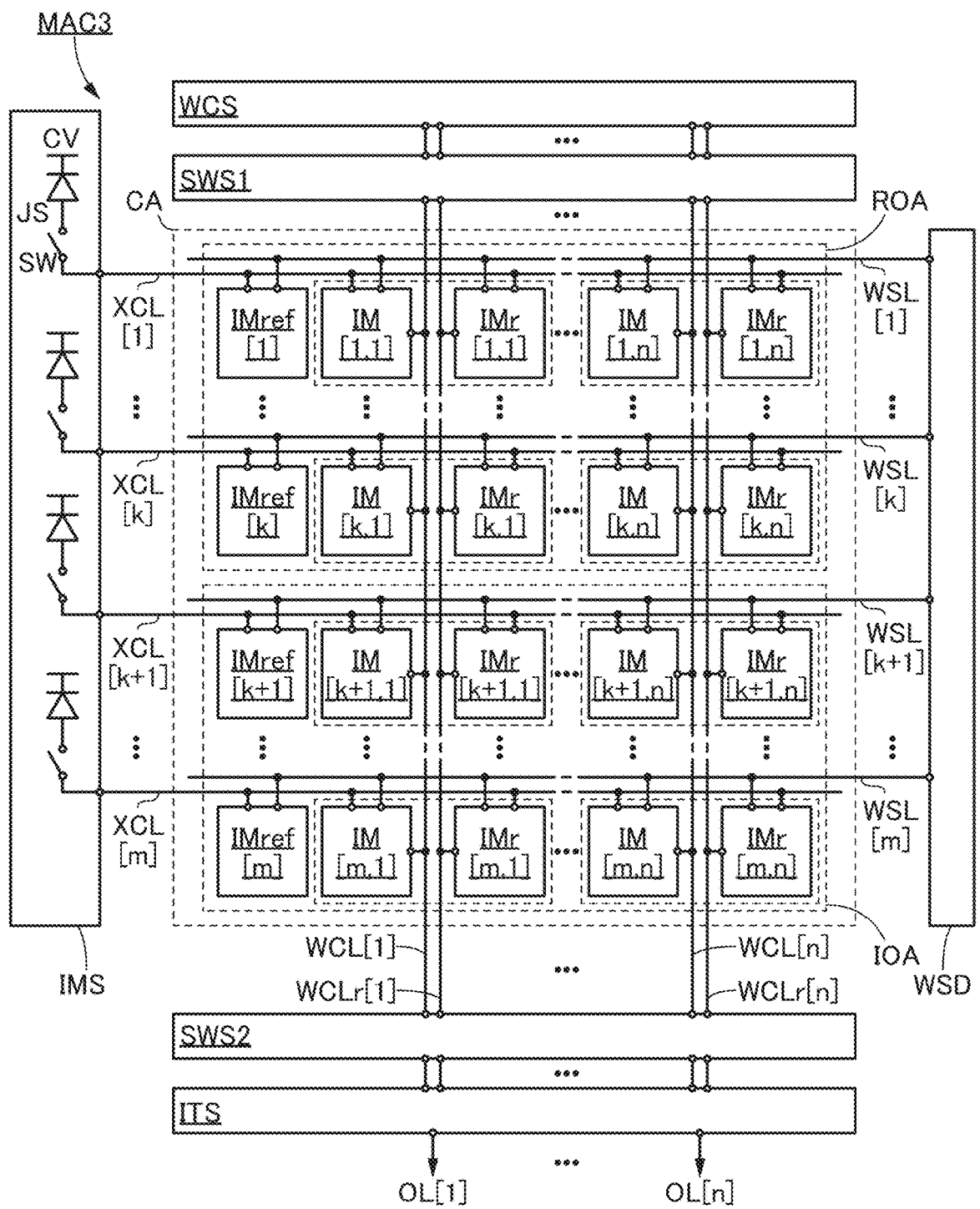
FIG. 8 is a block diagram showing a configuration example of a semiconductor device.

An arithmetic circuit MAC3 shown in FIG. 8 has the configuration of the arithmetic circuit MAC2 shown in FIG. 1 in which the circuit XCS is replaced with a circuit IMS. The circuit IMS includes, for example, a plurality of light-receiving elements JS and a plurality of switches SW. First terminals of the plurality of switches SW are electrically connected to the wirings XCL[1] to XCL[m], and anodes of the plurality of light-receiving elements JS are electrically connected to second terminals of the plurality of switches SW. A cathode of each of the plurality of light-receiving elements JS is electrically connected to a wiring CV.

The wiring CV has a function of supplying a constant potential, for example. The constant potential can be, for example, a high-level potential or a potential that is higher than the ground potential.

The circuit IMS functions as an image sensor, for example. Specifically, the circuit IMS has a function of receiving light with the light-receiving elements JS and generating currents that depend on the intensity of the light. The currents can flow in the wirings XCL by turning on the plurality of switches SW. In other words, the image captured with the circuit IMS can be used as the second data (the multiplier (multiplicand) in the product-sum operation).

In FIG. 8, in the case where the cells IM and IMr included in the region IOA make a base current flow, the switches SW electrically connected to the wirings XCL[k+1] to XCL[m] are turned off and a predetermined current different from the aforementioned current is supplied to the wirings XCL[k+1] to XCL[m] (FIG. 8 does not show the circuit for supplying the predetermined current). By contrast, in the case where the cells IM and IMr included in the region IOA make no base current flow, the switches SW electrically connected to the wirings XCL[k+1] to XCL[m] are turned on, and the cells IM and IMr included in the region IOA can work as circuits performing multiplication of the first data and the second data like the cells IM and IMr included in the region ROA.

Note that this embodiment can be combined with any of the other embodiments in this specification as appropriate.

Embodiment 2

In this embodiment, examples of operation methods of the arithmetic circuits MAC1, MAC2, and MAC3 that are the semiconductor devices of embodiments of the present invention are described.

Each of the arithmetic circuits MAC1, MAC2, and MAC3 can perform arithmetic processing through any one of a low-peak-power mode operation (also referred to as first operation), a high-arithmetic-efficiency mode operation (also referred to as second operation), and a high-throughput mode operation (also referred to as third operation).

In the low-peak-power mode, the power consumption of the arithmetic circuit MAC1, MAC2, or MAC3 is kept low. In the low-peak-power mode, for example, the power consumption of the arithmetic circuit MAC1, MAC2, or MAC3 can be reduced by reducing the amounts of currents flowing in the wirings WCL and WCLr in the arithmetic circuit MAC1, MAC2, or MAC3. In this case, the reduction in the amounts of currents flowing in the wirings WCL and WCLr might reduce the operation speed of the arithmetic circuit MAC1, MAC2, or MAC3.

In the high-throughput mode, the operation speed of the arithmetic circuit MAC1, MAC2, or MAC3 is increased. In the high-throughput mode, for example, the operation speed of the arithmetic circuit MAC1, MAC2, or MAC3 can be increased by increasing the amounts of currents flowing in the wirings WCL and WCLr in the arithmetic circuit MAC1, MAC2, or MAC3. That is, the throughput per second (GOPS) is increased in the high-throughput mode. In this case, the increase in the amounts of currents flowing in the wirings WCL and WCLr might increase the power consumption of the arithmetic circuit MAC1, MAC2, or MAC3.

In the high-arithmetic-efficiency mode, the operation speed of the arithmetic circuit MAC1, MAC2, or MAC3 is higher than that in the low-peak-power mode and lower than that in the high-throughput mode. Accordingly, the power consumption of the arithmetic circuit MAC1, MAC2, or MAC3 in the high-arithmetic-efficiency mode is higher than that in the low-peak-power mode and lower than that in the high-throughput mode. Thus, the high-arithmetic-efficiency mode can be regarded as a mode in which the throughput per watt (TOPS/W) is high.

The operation of each of the arithmetic circuits MAC1, MAC2, and MAC3 is preferably switched between the low-peak-power mode, the high-arithmetic-efficiency mode, and the high-throughput mode in accordance with circumstances.

For example, in the case where an electronic device that includes the arithmetic circuit MAC1, MAC2, or MAC3 has a low remaining capacity (a low voltage) of its battery, the arithmetic circuit MAC1, MAC2, or MAC3 preferably operates in the low-peak-power mode; in the case where the electronic device that includes the arithmetic circuit MAC1, MAC2, or MAC3 has a high remaining capacity (a high voltage) of its battery, the arithmetic circuit MAC1, MAC2, or MAC3 preferably operates in the high-throughput mode. In this manner, the operation mode of the arithmetic circuit MAC1, MAC2, or MAC3 may be switched between the low-peak-power mode, the high-arithmetic-efficiency mode, and the high-throughput mode in accordance with the remaining capacity (voltage) of a battery or power supplied to the arithmetic circuit MAC1, MAC2, or MAC3.

For another example, in the case where an electronic device that includes the arithmetic circuit MAC1, MAC2, or MAC3 and a sensor capturing images of faces, fingerprints, or the like needs to perform an instantaneous operation such as an authentication operation using captured images of faces, fingerprints, or the like, the arithmetic circuit MAC1, MAC2, or MAC3 preferably operates in the high-throughput mode.

For another example, in the case where an electronic device that includes the arithmetic circuit MAC1, MAC2, or MAC3 identifies a large volume of images, the arithmetic circuit MAC1, MAC2, or MAC3 preferably operates in the high-throughput mode. Note that such identification of a large volume of images can be performed by arithmetic processing using a convolutional neural network, for example.

In the case where an electronic device that includes the arithmetic circuit MAC1, MAC2, or MAC3 has a sufficient remaining capacity (a sufficiently high voltage) of its battery and performs an operation other than the above ones (e.g., an operation that does not need to be performed instantaneously, or an operation not handling a large volume of images), the arithmetic circuit MAC1, MAC2, or MAC3 preferably operates in the high-arithmetic-efficiency mode.

<Operation Example 1 of Arithmetic Circuit>

Figure 9:
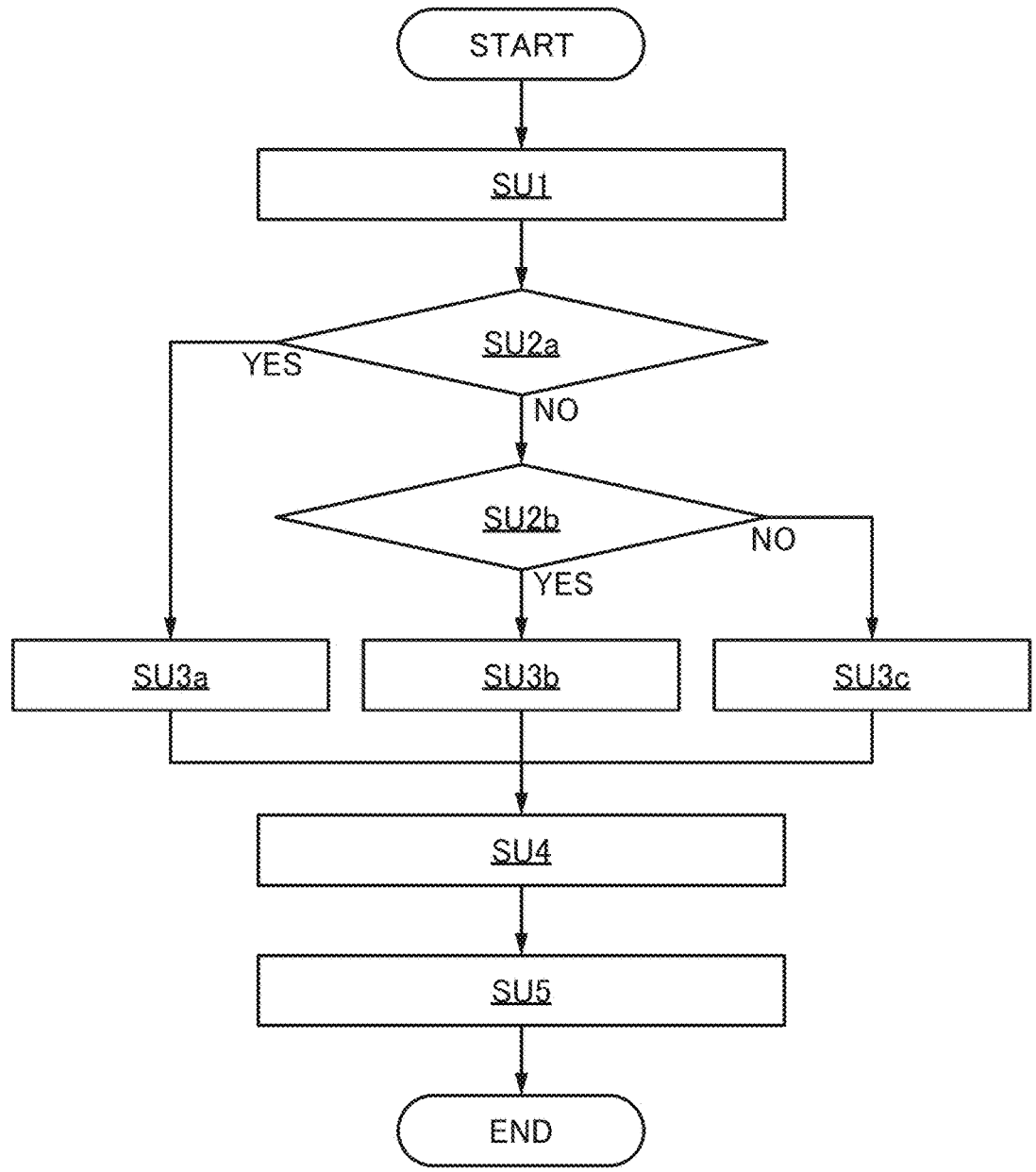
FIG. 9 is a flowchart showing an operation example of a semiconductor device.

Here, an operation example is described in which the arithmetic circuit MAC1, MAC2, or MAC3 selects any one of the low-peak-power mode, the high-arithmetic-efficiency mode, and the high-throughput mode to perform arithmetic processing. As an example, FIG. 9 shows a flowchart in which any one of the low-peak-power mode, the high-arithmetic-efficiency mode, and the high-throughput mode is selected and the arithmetic circuit MAC2 shown in FIG. 1 and FIG. 4 performs arithmetic processing in the selected mode. The flowchart in FIG. 9 includes Steps SU1 to SU5.

<<Step SU1>>

Step SU1 includes, for example, a step of determining the mode in which the arithmetic circuit MAC2 performs arithmetic processing. Note that in this operation example, any of an A mode, a B mode, and a C mode is selected.

In the description with reference to the flowchart in FIG. 9, the A mode is the high-throughput mode, the B mode is the high-arithmetic-efficiency mode, and the C mode is the low-peak-power mode, for example. Note that the combination of the modes for the A mode, the B mode, and the C mode may be different from the above one.

In the case where the arithmetic processing performed by the arithmetic circuit MAC2 does not need to be performed instantaneously or handles a small volume of data, for example, the C mode is selected as the mode of the arithmetic processing by the arithmetic circuit MAC2.

In the case where the arithmetic processing performed by the arithmetic circuit MAC2 needs to be performed instantaneously or handles a large volume of data, for example, the A mode is selected as the mode of the arithmetic processing by the arithmetic circuit MAC2.

In the case where the arithmetic processing performed by the arithmetic circuit MAC2 handles a medium volume of data, for example, the B mode is selected as the mode of the arithmetic processing by the arithmetic circuit MAC2. For another example, the B mode may be selected as the mode of the arithmetic processing by the arithmetic circuit MAC2 in the case where neither the A mode nor the C mode has been selected.

In the case where the electronic device that includes the arithmetic circuit MAC2 has a low remaining capacity (a low voltage) of its battery, it is also possible to select the C mode as the mode of the arithmetic processing by the arithmetic circuit MAC2 despite that the arithmetic circuit MAC2 would perform arithmetic processing that needs to be performed instantaneously or handles a middle or large volume of data.

A configuration may be employed in which a control circuit or the like that drives the arithmetic circuit MAC2 detects the type of arithmetic processing, the remaining capacity (voltage) of a battery, or the like to select one of the A mode, the B mode, and the C mode. The mode of arithmetic processing by the arithmetic circuit MAC2 may be selected by the user from the A mode, the B mode, and the C mode irrespective of the type of the arithmetic processing, the remaining capacity (voltage) of a battery, or the like.

<<Step SU2a>>

Step SU2a includes, for example, a step of determining whether the mode selected in Step SU1 is the A mode. The operation process proceeds to Step SU3a in the case where the arithmetic circuit MAC2 performs arithmetic processing in the A mode, and the operation process proceeds to Step SU2b in the case where the arithmetic circuit MAC2 performs arithmetic processing in a mode other than the A mode.

<<Step SU2b>>

Step SU2b includes, for example, a step of determining whether the mode selected in Step SU1 is the B mode. The operation process proceeds to Step SU3b in the case where the arithmetic circuit MAC2 performs arithmetic processing in the B mode, and the operation process proceeds to Step SU3c in the case where the arithmetic circuit MAC2 does not perform arithmetic processing in the B mode. At the time when the operation process proceeds to Step SU2b, it has been determined that the arithmetic circuit MAC2 does not perform arithmetic processing in the A mode in Step SU2a; accordingly, for the operation process to proceed to Step SU3c, the arithmetic circuit MAC2 should perform arithmetic processing in the C mode.

<<Step SU3a>>

Step SU3a includes a step of setting, to $D_{XL}$, $D_X$ that is to be input from the circuit XCS to the cells IM and IMr included in the region IOA in the arithmetic circuit MAC2 in FIG. 4, for example. Note that $D_{XL}$ can be a positive real number, including 0. After the value of $D_X$ is set, the operation process proceeds to Step SU4.

<<Step SU3b>>

Step SU3b includes a step of setting, to $D_{XM}$, $D_X$ that is to be input from the circuit XCS to the cells IM and IMr included in the region IOA in the arithmetic circuit MAC2 in FIG. 4, for example. Note that $D_{XM}$ can be a positive real number, including 0. After the value of $D_X$ is set, the operation process proceeds to Step SU4.

<<Step SU3c>>

Step SU3c includes a step of setting, to $D_{XS}$, $D_X$ that is to be input from the circuit XCS to the cells IM and IMr included in the region IOA in the arithmetic circuit MAC2 in FIG. 4, for example. Note that $D_{XS}$ can be a positive real number, including 0. After the value of $D_X$ is set, the operation process proceeds to Step SU4.

Note that in Steps SU3a to SU3c, $D_{XL}$ has a larger value than $D_{XM}$ and $D_{XS}$, and $D_{XM}$ has a larger value than $D_{XS}$. For example, $D_{XL}$, $D_{XM}$, and $D_{XS}$ may be 10, 5, and 1, respectively, or 100, 10, and 1, respectively. A description is made below of an example in which $D_{XL}=100$, $D_{XM}=10$, and $D_{XS}=1$.

<<Step SU4>>

Step SU4 includes, for example, a step of writing the first data to the cells IM and IMr included in the region ROA of the cell array CA in the arithmetic circuit MAC2, a step of writing the third data to the cells IM and IMr included in the region IOA of the cell array CA, and a step of inputting the second data and the fourth data from the circuit XCS to the cell array CA. For each of the above steps, refer to the operation example of the arithmetic circuit MAC2 described in Embodiment 1 with reference to FIG. 4. Specifically, the operations in Steps ST1 to ST3 of the flowchart in FIG. 5 may be performed in Step SU4, for example.

<<Step SU5>>

Step SU5 includes, for example, a step in which the circuit ITS performs an operation using the first data and the third data that have been written to the cells IM and IMr in the cell array CA of the arithmetic circuit MAC2 in FIG. 4 and the second data and the fourth data input to the cell array CA, to output the operation result.

In the case where the arithmetic circuit MAC2 performs arithmetic processing in the A mode, the result of the product-sum operation performed by the eight cells IM arranged in the first column of the cell array CA is 102+400$D_1$ since $D_{XL}$ is 100. In a similar manner, the result of the product-sum operation performed by the eight cells IMr in the second column is 237+400$D_1$, the result of the product-sum operation performed by the eight cells IM in the third column is 1130+400$D_1$, the result of the product-sum operation performed by the eight cells IMr in the fourth column is 57+400$D_1$, the result of the product-sum operation performed by the eight cells IM in the fifth column is 1159+400$D_1$, the result of the product-sum operation performed by the eight cells IMr in the sixth column is 400$D_1$, the result of the product-sum operation performed by the eight cells IM in the seventh column is 220+400$D_1$, and the result of the product-sum operation performed by the eight cells IMr in the eighth column is 629+400$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the B mode, the result of the product-sum operation performed by the eight cells IM arranged in the first column of the cell array CA is 102+40$D_1$ since $D_{XL}$ is 10. In a similar manner, the result of the product-sum operation performed by the eight cells IMr in the second column is 237+40$D_1$, the result of the product-sum operation performed by the eight cells IM in the third column is 1130+40$D_1$, the result of the product-sum operation performed by the eight cells IMr in the fourth column is 57+40$D_1$, the result of the product-sum operation performed by the eight cells IM in the fifth column is 1159+40$D_1$, the result of the product-sum operation performed by the eight cells IMr in the sixth column is 40$D_1$, the result of the product-sum operation performed by the eight cells IM in the seventh column is 220+40$D_1$, and the result of the product-sum operation performed by the eight cells IMr in the eighth column is 629+40$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the C mode, the result of the product-sum operation performed by the eight cells IM arranged in the first column of the cell array CA is 102+4$D_1$ since $D_{XL}$ is 1. In a similar manner, the result of the product-sum operation performed by the eight cells IMr in the second column is 237+4$D_1$, the result of the product-sum operation performed by the eight cells IM in the third column is 1130+4$D_1$, the result of the product-sum operation performed by the eight cells IMr in the fourth column is 57+4$D_1$, the result of the product-sum operation performed by the eight cells IM in the fifth column is 1159+4$D_1$, the result of the product-sum operation performed by the eight cells IMr in the sixth column is 4$D_1$, the result of the product-sum operation performed by the eight cells IM in the seventh column is 220+4$D_1$, and the result of the product-sum operation performed by the eight cells IMr in the eighth column is 629+4$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In other words, the base currents (the currents each corresponding to the sum of products of the third data and the fourth data calculated by the cells IM or IMr in the region IOA) that flow in the wirings WCL[1] to WCL[4] and the wirings WCLr[1] to WCLr[4] during the arithmetic processing by the arithmetic circuit MAC2 are the highest in the A mode and the lowest in the C mode.

The operation speed of arithmetic processing performed by the arithmetic circuit MAC2 in the A mode can be higher than that of arithmetic processing performed in the B mode and that of arithmetic processing performed in the C mode because the amounts of currents input to the input terminals of each of the converter circuits ITRZD[1] to ITRZD[4] in the A mode are larger than those in the B mode and those in the C mode.

The power consumption of arithmetic processing performed by the arithmetic circuit MAC2 in the C mode can be lower than that of arithmetic processing performed in the A mode and the B mode because the amounts of currents input to the input terminals of each of the converter circuits ITRZD[1] to ITRZD[4] in the C mode are smaller than those in the A mode and those in the B mode.

The operation method of the semiconductor device of one embodiment of the present invention is not limited to the above operation method. The operation method of the semiconductor device of one embodiment of the present invention may be modified in accordance with circumstances as long as an object of one embodiment of the present invention is achieved.

For example, although the value of $D_X$ to be input from the circuit XCS to the cells IM and IMr included in the region IOA of the cell array CA is set in Steps SU3a to SU3c in the flowchart in FIG. 9, the number of rows where $D_X$ from the circuit XCS is to be input in the region IOA of the cell array CA may be changed in each of Steps SU3a to SU3c.

Figure 10:
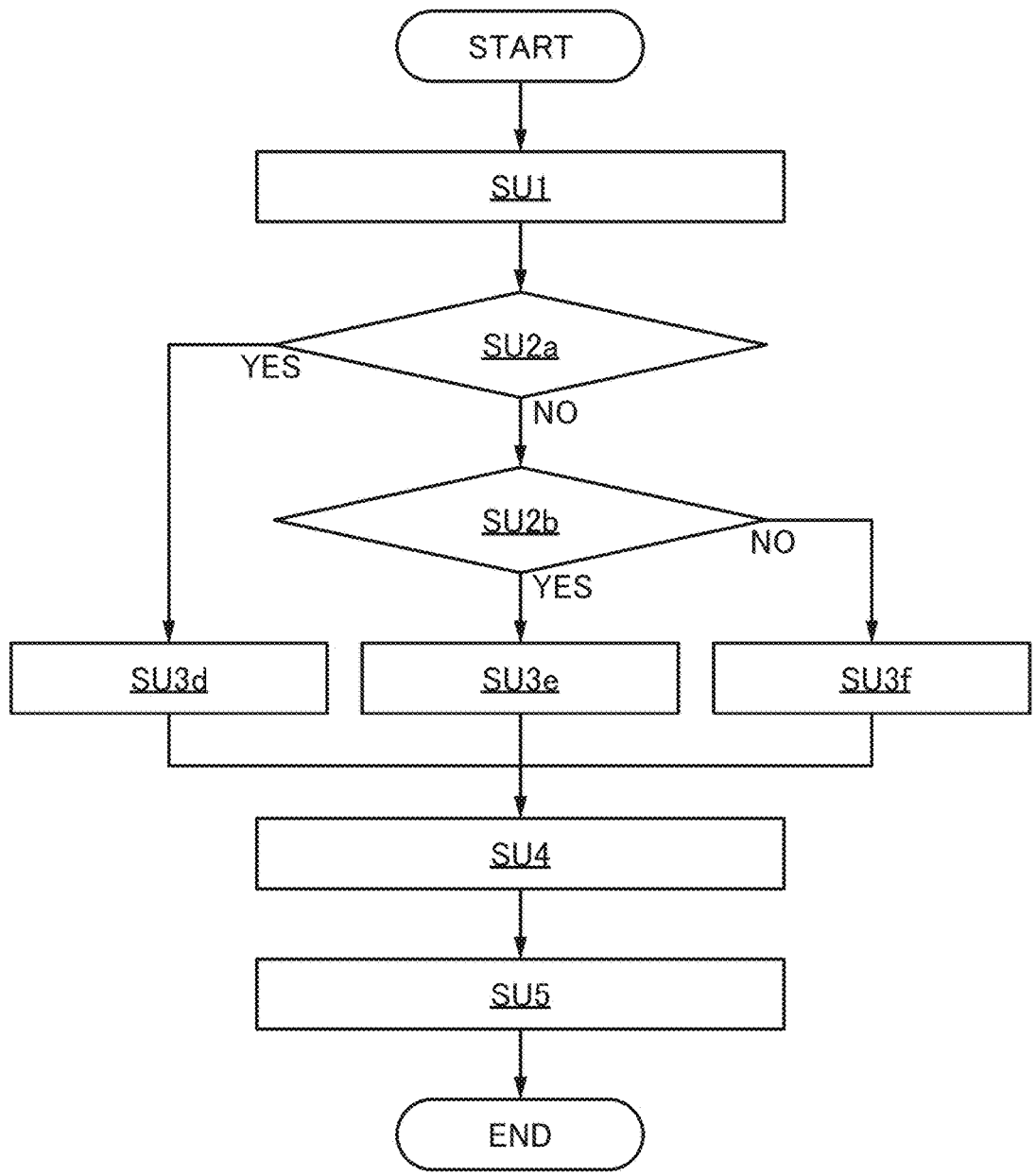
FIG. 10 is a flowchart showing an operation example of a semiconductor device.

FIG. 10 illustrates a specific variation. In FIG. 10, which is a variation of the flowchart in FIG. 9, Steps SU3a, SU3b, and SU3c in the flowchart in FIG. 9 are replaced with Steps SU3d, SU3e, and SU3f, respectively.

Step SU3d in FIG. 10 is substituted for Step SU3a in FIG. 9 and includes a step of setting, to $R_L$, the number of the wirings XCL through which $D_X$ is input from the circuit XCS to the cells IM and IMr included in the region IOA of the cell array CA. Step SU3d includes a step of inputting 0 to, if any, the wiring XCL to which $D_X$ from the circuit XCS to the cells IM and IMr in the region IOA of the cell array CA is not input.

Step SU3e in FIG. 10 is substituted for Step SU3b in FIG. 9 and includes a step of setting, to $R_M$, the number of the wirings XCL through which $D_X$ is input from the circuit XCS to the cells IM and IMr included in the region IOA of the cell array CA. Step SU3e includes a step of inputting 0 to, if any, the wiring XCL to which $D_X$ from the circuit XCS to the cells IM and IMr in the region IOA of the cell array CA is not input.

Step SU3f in FIG. 10 is substituted for Step SU3c in FIG. 9 and includes a step of setting, to $R_S$, the number of the wirings XCL through which $D_X$ is input from the circuit XCS to the cells IM and IMr included in the region IOA of the cell array CA. Step SU3f includes a step of inputting 0 to, if any, the wiring XCL to which $D_X$ from the circuit XCS to the cells IM and IMr in the region IOA of the cell array CA is not input.

Note that in Steps SU3*d* to SU3*f*, $R_L$ has a larger value than $R_M$ and $R_S$, and $R_L$ has a larger value than $R_S$. For example, $R_L$, $R_M$, and $R_S$ may be 4, 3, and 2, respectively, or 3, 2, and 1, respectively. Note that $R_S$ may be 0. A description is made below of an example in which $R_L$=4, $R_M$=3, $R_S$=2, and $D_X$=50.

The case is considered where Steps SU4 and SU5 are performed after the operation in any one of Steps SU3*d* to SU3*f*.

In the case where the arithmetic circuit MAC2 performs arithmetic processing in the A mode, for example, the result of the product-sum operation performed by the eight cells IM arranged in the first column of the cell array CA is 102+200$D_1$ since $R_L$ is 4. In a similar manner, the result of the product-sum operation performed by the eight cells IMr in the second column is 237+200$D_1$, the result of the product-sum operation performed by the eight cells IM in the third column is 1130+200$D_1$, the result of the product-sum operation performed by the eight cells IMr in the fourth column is 57+200$D_1$, the result of the product-sum operation performed by the eight cells IM in the fifth column is 1159+200$D_1$, the result of the product-sum operation performed by the eight cells IMr in the sixth column is 200$D_1$, the result of the product-sum operation performed by the eight cells IM in the seventh column is 220+200$D_1$, and the result of the product-sum operation performed by the eight cells IMr in the eighth column is 629+200$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the B mode, for example, the result of the product-sum operation performed by the eight cells IM arranged in the first column of the cell array CA is 102+150$D_1$ since $R_M$ is 3. In a similar manner, the result of the product-sum operation performed by the eight cells IMr in the second column is 237+150$D_1$, the result of the product-sum operation performed by the eight cells IM in the third column is 1130+150$D_1$, the result of the product-sum operation performed by the eight cells IMr in the fourth column is 57+150$D_1$, the result of the product-sum operation performed by the eight cells IM in the fifth column is 1159+150$D_1$, the result of the product-sum operation performed by the eight cells IMr in the sixth column is 150$D_1$, the result of the product-sum operation performed by the eight cells IM in the seventh column is 220+150$D_1$, and the result of the product-sum operation performed by the eight cells IMr in the eighth column is 629+150$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the C mode, for example, the result of the product-sum operation performed by the eight cells IM arranged in the first column of the cell array CA is 102+100$D_1$ since $R_S$ is 2. In a similar manner, the result of the product-sum operation performed by the eight cells IMr in the second column is 237+100$D_1$, the result of the product-sum operation performed by the eight cells IM in the third column is 1130+100$D_1$, the result of the product-sum operation performed by the eight cells IMr in the fourth column is 57+100$D_1$, the result of the product-sum operation performed by the eight cells IM in the fifth column is 1159+100$D_1$, the result of the product-sum operation performed by the eight cells IMr in the sixth column is 100$D_1$, the result of the product-sum operation performed by the eight cells IM in the seventh column is 220+100$D_1$, and the result of the product-sum operation performed by the eight cells IMr in the eighth column is 629+100$D_1$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

As described above, $D_X$ having a freely set value is input from the circuit XCS to rows whose number is set depending on which of the A mode, the B mode, and the C mode is selected, in the region IOA of the cell array CA (0 is input to the row where $D_X$ is not input), whereby the base current flowing in each of the wirings WCL[1] to WCL[4] and the wirings WCLr[1] to WCLr[4] can be the highest in the A mode and the lowest in the C mode.

The operation method of the semiconductor device of one embodiment of the present invention may combine the operations in Steps SU3*a* to SU3*c* of the flowchart in FIG. 9 in each of which the value of $D_X$ is changed and the operations in Steps SU3*d* to SU3*f* of the flowchart in FIG. 10 in each of which the number of rows where $D_X$ is input from the circuit XCS to the region IOA of the cell array CA is changed.

<Operation Example 2 of Arithmetic Circuit>

Another operation example of the semiconductor device of one embodiment of the present invention, which is different from the above operation example of the arithmetic circuit, is described.

Figure 11:
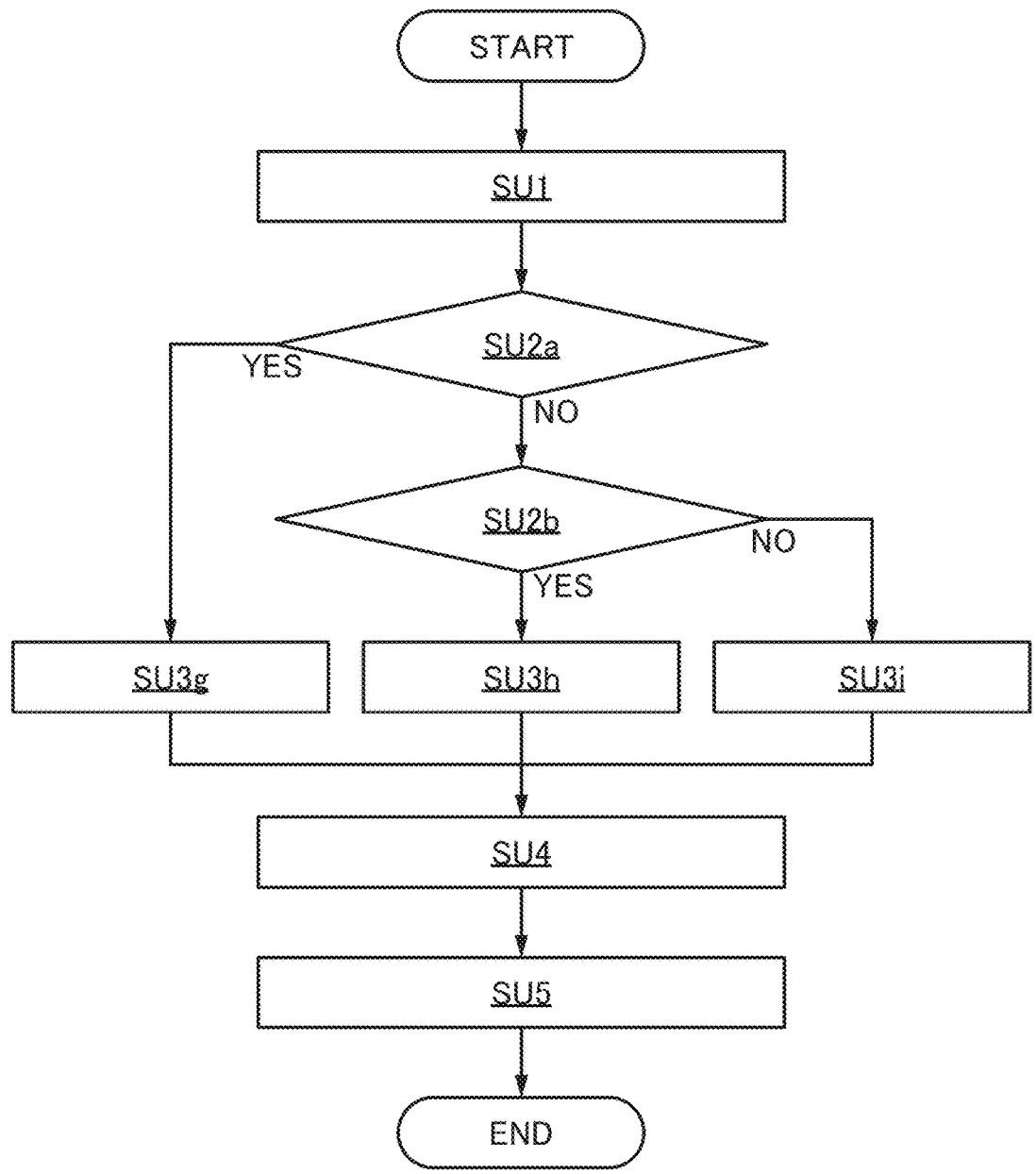
FIG. 11 is a flowchart showing an operation example of a semiconductor device.

In FIG. 11, which is a variation of the flowchart in FIG. 9, Steps SU3*a*, SU3*b*, and SU3*c* in the flowchart in FIG. 9 are replaced with Steps SU3*g*, SU3*h*, and SU3*i*, respectively.

Step SU3*g* in FIG. 11 is substituted for Step SU3*a* in FIG. 9 and includes a step of setting, to $D_{WL}$, the value of $D_1$ written to the cells IM and IMr included in the region IOA of the cell array CA.

Step SU3*h* in FIG. 11 is substituted for Step SU3*b* in FIG. 9 and includes a step of setting, to $D_{WM}$, the value of $D_1$ written to the cells IM and IMr included in the region IOA of the cell array CA.

Step SU3*i* in FIG. 11 is substituted for Step SU3*c* in FIG. 9 and includes a step of setting, to $D_{WS}$, the value of $D_1$ written to the cells IM and IMr included in the region IOA of the cell array CA.

Note that in Steps SU3*g* to SU3*i*, $D_{WL}$ has a larger value than $D_{WM}$ and $D_{WS}$, and $D_{WM}$ has a larger value than $D_{WS}$. For example, $D_{WL}$, $D_{WM}$, and $D_{WS}$ may be 10, 5, and 1, respectively, or 100, 10, and 1, respectively. A description is made below of an example in which $D_{WL}$=100, $D_{WM}$=10, and $D_{WS}$=1.

The case is considered where Steps SU4 and SU5 are performed after the operation in any one of Steps SU3*g* to SU3*i*.

In the case where the arithmetic circuit MAC2 performs arithmetic processing in the A mode, for example, the result of the product-sum operation performed by the eight cells IM arranged in the first column of the cell array CA is 102+400$D_X$ since $D_{WL}$ is 100. In a similar manner, the result of the product-sum operation performed by the eight cells IMr in the second column is 237+400$D_X$, the result of the product-sum operation performed by the eight cells IM in the third column is 1130+400$D_X$, the result of the product-sum operation performed by the eight cells IMr in the fourth column is 57+400$D_X$, the result of the product-sum operation performed by the eight cells IM in the fifth column is 1159+400$D_X$, the result of the product-sum operation performed by the eight cells IMr in the sixth column is 400$D_X$, the result of the product-sum operation performed by the eight cells IM in the seventh column is 220+400$D_X$, and the result of the product-sum operation performed by the eight cells IMr in the eighth column is 629+400$D_X$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the B mode, for example, the result of the product-sum operation performed by the eight cells IM arranged in the first column of the cell array CA is 102+40$D_X$ since $D_{WL}$ is 10. In a similar manner, the result of the product-sum operation performed by the eight cells IMr in the second column is 237+40$D_X$, the result of the product-sum operation performed by the eight cells IM in the third column is 1130+40$D_X$, the result of the product-sum operation performed by the eight cells IMr in the fourth column is 57+40$D_X$, the result of the product-sum operation performed by the eight cells IM in the fifth column is 1159+40$D_X$, the result of the product-sum operation performed by the eight cells IMr in the sixth column is 40$D_X$, the result of the product-sum operation performed by the eight cells IM in the seventh column is 220+40$D_X$, and the result of the product-sum operation performed by the eight cells IMr in the eighth column is 629+40$D_X$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In the case where the arithmetic circuit MAC2 performs arithmetic processing in the C mode, for example, the result of the product-sum operation performed by the eight cells IM arranged in the first column of the cell array CA is 102+4$D_X$ since $D_{WL}$ is 1. In a similar manner, the result of the product-sum operation performed by the eight cells IMr in the second column is 237+4$D_X$, the result of the product-sum operation performed by the eight cells IM in the third column is 1130+4$D_X$, the result of the product-sum operation performed by the eight cells IMr in the fourth column is 57+4$D_X$, the result of the product-sum operation performed by the eight cells IM in the fifth column is 1159+4$D_X$, the result of the product-sum operation performed by the eight cells IMr in the sixth column is 4$D_X$, the result of the product-sum operation performed by the eight cells IM in the seventh column is 220+4$D_X$, and the result of the product-sum operation performed by the eight cells IMr in the eighth column is 629+4$D_X$. Furthermore, the converter circuits ITRZD[1], ITRZD[2], ITRZD[3], and ITRZD[4] respectively output −135, 1073, 1159, and −409 from their output terminals as in the arithmetic circuit MAC2 shown in FIG. 4.

In other words, when the arithmetic processing by the arithmetic circuit MAC2 is performed in accordance with the flowchart in FIG. 11, the base currents (the currents each corresponding to the sum of products of the third data and the fourth data calculated by the cells IM or IMr in the region IOA) that flow in the wirings WCL[1] to WCL[4] and the wirings WCLr[1] to WCLr[4] are the highest in the A mode and the lowest in the C mode, as in the operation shown in the flowchart in FIG. 9. Consequently, the operation speed of arithmetic processing performed by the arithmetic circuit MAC2 in the A mode is higher than that of the arithmetic processing performed in the B mode and that of the arithmetic processing performed in the C mode, whereas the power consumption of arithmetic processing performed by the arithmetic circuit MAC2 in the C mode can be lower than that of the arithmetic processing performed in the A mode and that of the arithmetic processing performed in the B mode.

Note that the operation method of the semiconductor device of one embodiment of the present invention is not limited to the above. For example, although the flowcharts in FIG. 9 and FIG. 11 are based on the operation example of the arithmetic circuit MAC2 shown in FIG. 4 in the above description, the operation method of the semiconductor device of one embodiment of the present invention may be a combination of the steps in the flowchart in FIG. 9 or FIG. 11 and the operation example of the arithmetic circuit MAC2 shown in FIG. 6 or FIG. 7.

For example, the steps in the flowchart in FIG. 9 may be combined with the operation example of the arithmetic circuit MAC2 shown in FIG. 6 or FIG. 7. In other words, the value of $D_X$ may be changed depending on which of the A mode, the B mode, and the C mode is selected in the arithmetic circuit MAC2 shown in FIG. 6 or FIG. 7.

For another example, the steps in the flowchart in FIG. 11 may be combined with the operation example of the arithmetic circuit MAC2 shown in FIG. 6. Specifically, for example, Steps SU3g to SU3i in the flowchart in FIG. 11 may each be a step of setting all of $D_1$, $D_2$, $D_3$, and $D_4$ which are retained as the third data in the cells IM and IMr included in the region IOA of the cell array CA in the arithmetic circuit MAC2 shown in FIG. 6. For another example, in a similar manner, the steps in the flowchart in FIG. 11 may be combined with the operation example of the arithmetic circuit MAC2 shown in FIG. 7. In this case, $D_{1A}$, $D_{1B}$, $D_{1C}$, $D_{1D}$, $D_{2A}$, $D_{2B}$, $D_{2C}$, $D_{2D}$, DA, $D_{3B}$, $D_{3C}$, $D_{3D}$, $D_{4A}$, $D_{4B}$, $D_{4C}$, and $D_{4D}$ that are retained in the cells IM and IMr in the region IOA of the cell array CA of the arithmetic circuit MAC2 shown in FIG. 7 are also set in Steps SU3g to SU3i in the flowchart in FIG. 11.

The arithmetic circuit MAC2 operates by the method described in this embodiment, whereby the arithmetic processing mode of the arithmetic circuit MAC2 can be selected depending on the type of the operation, which can be an operation that needs to be performed instantaneously such as face authentication and fingerprint authentication, an operation for processing a large volume of images, an operation for low-power processing, or the like. As a result, the speed of arithmetic processing can be increased or the power consumption can be reduced, for example, depending on the type of the operation.

Note that this embodiment can be combined with any of the other embodiments in this specification as appropriate.

Embodiment 3

In this embodiment, the configurations of the circuits included in the arithmetic circuits in the above embodiments are described.

<Circuit WCS and Circuit XCS>

First, specific examples of the circuit WCS and the circuit XCS shown in FIG. 2 are described.

Figure 12A:
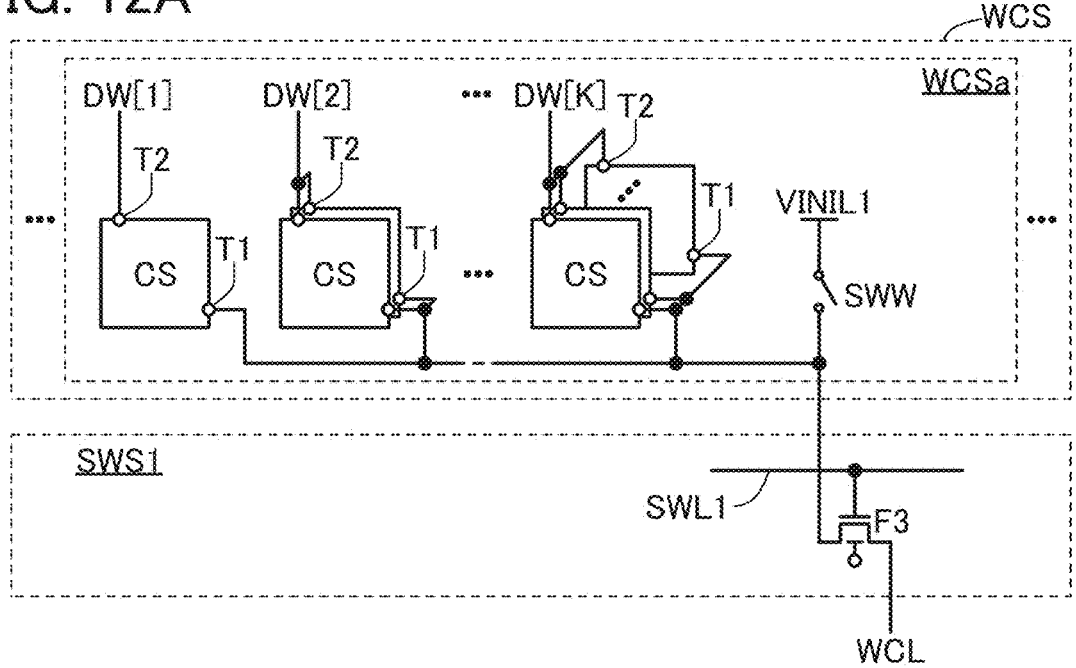
FIGS. 12A to 12C are block diagrams and a circuit diagram showing configuration examples of circuits included in a semiconductor device.

First, the circuit WCS is described. FIG. 12A is a block diagram showing an example of the circuit WCS. In FIG. 12A, the circuit SWS1, the transistor F3, the wiring SWL1, and the wiring WCL are illustrated to show the electrical connection between the circuit WCS and its nearby circuits.

The circuit WCS includes, for example, circuits WCSa the number of which is the same as that of the wirings WCL and WCLr. That is, the circuit WCS includes 2×n circuits WCSa.

The circuit SWS1 includes the transistors F3 the number of which is the same as that of the wirings WCL. That is, the circuit SWS1 includes n transistors F3. In a similar manner, the circuit SWS1 includes the transistors F3r the number of which is the same as that of the wirings WCLr. That is, the circuit SWS1 includes n transistors F3r.

Accordingly, the transistor F3 shown in FIG. 12A can be any one of the transistors F3[1] to F3[n] included in the arithmetic circuit MAC1 in FIG. 2. In a similar manner, the wiring WCL can be any one of the wirings WCL[1] to WCL[n] included in the arithmetic circuit MAC1 in FIG. 2. Furthermore, the transistor F3r shown in FIG. 12A can be any one of the transistors F3r[1] to F3r[n] included in the arithmetic circuit MAC1 in FIG. 2. In a similar manner, the wiring WCLr can be any one of the wirings WCLr[1] to WCLr[n] included in the arithmetic circuit MAC1 in FIG. 2.

Thus, the wirings WCL[1] to WCL[n] are electrically connected to the respective circuits WCSa through the respective transistors F3. In a similar manner, the wirings WCLr[1] to WCLr[n] are electrically connected to the respective circuits WCSa through the respective transistors F3r.

The circuit WCSa illustrated in FIG. 12A includes a switch SWW, for example. A first terminal of the switch SWW is electrically connected to the second terminal of the transistor F3 (the transistor F3r), and a second terminal of the switch SWW is electrically connected to a wiring VINIL1. The wiring VINIL1 functions as a wiring for supplying an initialization potential to the wiring WCL (the wiring WCLr), and the initialization potential can be set to the ground potential (GND), a low-level potential, a high-level potential, or the like. The switch SWW is turned on only when the initialization potential is supplied to the wiring WCL; otherwise, the switch is in an off state.

As the switch SWW, an electrical switch such as an analog switch or a transistor can be used, for example. When a transistor is used as the switch SWW, for example, the transistor can have a structure similar to that of the transistor F1 and the transistor F2. A mechanical switch may be used other than the electrical switch.

The circuit WCSa in FIG. 12A includes a plurality of current sources CS, for example. Specifically, the circuit WCSa has a function of outputting K-bit first data ($2^K$ values) (K is an integer greater than or equal to 1) as the current amount, and the circuit WCSa includes $2^K-1$ current sources CS at that time. The circuit WCSa includes one current source CS which outputs data corresponding to the first bit value as a current, two current sources CS which output data corresponding to the second bit value as a current, and $2^{K-1}$ current sources CS which output data corresponding to the K-th bit value as a current.

Each current source CS in FIG. 12A includes a terminal T1 and a terminal T2. The terminal T1 of each of the current sources CS is electrically connected to the second terminal of the transistor F3 included in the circuit SWS1. The terminal T2 of the one current source CS is electrically connected to a wiring DW[1], the terminals T2 of the two current sources CS are electrically connected to a wiring DW[2], and the terminals T2 of the $2^{K-1}$ current sources CS are electrically connected to a wiring DW[K].

The plurality of current sources CS included in the circuit WCSa have a function of outputting the constant currents in the same amount $I_{Wut}$ from the terminals T1. In actuality, when the arithmetic circuit MAC1 is manufactured, the transistors in the current sources CS may have different electrical characteristics; this may yield errors. The errors in the amount $I_{Wut}$ of the constant currents output from the terminals T1 of the plurality of current sources CS are preferably within 10%, further preferably within 5%, and still further preferably within 1%. In this embodiment, the description is made based on the assumption that there is no error in the amount $I_{Wut}$ of the constant currents output from the terminals T1 of the plurality of current sources CS included in the circuit WCSa.

The wirings DW[1] to DW[K] which are electrically connected to the current sources CS function as wirings for transmitting control signals to make the current sources CS output a constant current in the amount $I_{Wut}$. Specifically, for example, when a high-level potential is supplied to the wiring DW[1], the current source CS electrically connected to the wiring DW[1] supplies a constant current in the amount $I_{Wut}$ to the second terminal of the transistor F3, and when a low-level potential is supplied to the wiring DW[1], $I_{Wut}$ is not output by the current source CS electrically connected to the wiring DW[1]. For example, when a high-level potential is supplied to the wiring DW[2], the two current sources CS electrically connected to the wiring DW[2] supply $2 \times I_{Wut}$, a constant current, in total to the second terminal of the transistor F3, and when a low-level potential is supplied to the wiring DW[2], $2 \times I_{Wut}$, a constant current, in total is not output by the current sources CS electrically connected to the wiring DW[2]. For example, when a high-level potential is supplied to the wiring DW[K], the $2^{K-1}$ current sources CS electrically connected to the wiring DW[K] supply $2^{K-1} \times I_{Wut}$, a constant current, in total to the second terminal of the transistor F3, and when a low-level potential is supplied to the wiring DW[K], $2^{K-1} \times I_{Wut}$, a constant current, in total is not output by the current sources CS electrically connected to the wiring DW[K].

The amount of the current flowing from the one current source CS electrically connected to the wiring DW[1] corresponds to the value of the first bit, the amount of the current flowing from the two current sources CS electrically connected to the wiring DW[2] corresponds to the value of the second bit, and the amount of the current flowing from the K current sources CS electrically connected to the wiring DW[K] corresponds to the value of the K-th bit. The circuit WCSa with K of 2 is considered. For example, when the value of the first bit is "1" and the value of the second bit is "0", a high-level potential is supplied to the wiring DW[1], and a low-level potential is supplied to the wiring DW[2]. In this case, the constant current in the amount $I_{Wut}$ flows from the circuit WCSa to the second terminal of the transistor F3 (the transistor F3r) in the circuit SWS1. For example, when the value of the first bit is "0" and the value of the second bit is "1", a low-level potential is supplied to the wiring DW[1], and a high-level potential is supplied to the wiring DW[2]. In this case, a constant current in the amount $2 \times I_{Wut}$ flows from the circuit WCSa to the second terminal of the transistor F3 (the transistor F3r) in the circuit SWS1. For example, when the value of the first bit is "1" and the value of the second bit is "1", a high-level potential is supplied to the wiring DW[1] and the wiring DW[2]. In this case, a constant current in an amount $3 \times I_{Wut}$ flows from the circuit WCSa to the second terminal of the transistor F3 (the transistor F3r) in the circuit SWS1. For example, when the value of the first bit is "0" and the value of the second bit is "0", a low-level potential is supplied to the wiring DW[1] and the wiring DW[2]. In this case, no constant current flows from the circuit WCSa to the second terminal of the transistor F3 (the transistor F3r) in the circuit SWS1.

FIG. 12A shows the circuit WCSa when K is an integer greater than or equal to 3; when K is 1, the current sources CS electrically connected to the wirings DW[2] to DW[K] are not provided in the circuit WCSa in FIG. 12A. When K is 2, the current sources CS electrically connected to the wirings DW[3] to DW[K] are not provided in the circuit WCSa in FIG. 12A.

Next, a specific configuration example of the current source CS is described.

Figure 13A:
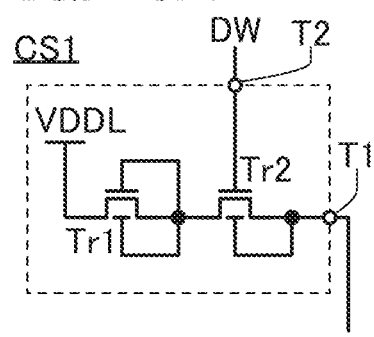
FIGS. 13A to 13D are circuit diagrams each showing a configuration example of a circuit included in a semiconductor device.

A current source CS1 illustrated in FIG. 13A can be used as the current source CS included in the circuit WCSa in FIG. 12A; the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the wiring DW.

The wiring DW is any one of the wirings DW[1] to DW[n] in FIG. 12A.

The wiring VDDL functions as a wiring for supplying a constant voltage. The constant voltage can be a high-level potential, for example.

When a constant voltage supplied by the wiring VDDL is set at a high-level potential, a high-level potential is input to the first terminal of the transistor Tr1. The potential of the second terminal of the transistor Tr1 is lower than the high-level potential. At this time, the first terminal of the transistor Tr1 functions as a drain, and the second terminal of the transistor Tr1 functions as a source. Since the gate of the transistor Tr1 is electrically connected to the second terminal of the transistor Tr1, the gate-source voltage of the transistor Tr1 is 0 V. When the threshold voltage of the transistor Tr1 is within an appropriate range, a current in the current range of a subthreshold region (drain current) flows between the first terminal and the second terminal of the transistor Tr1. The amount of the current is preferably smaller than or equal to $1.0 \times 10^{-8}$ A, further preferably smaller than or equal to $1.0 \times 10^{-12}$ A, and still further preferably smaller than or equal to $1.0 \times 10^{-15}$ A when the transistor Tr1 is an OS transistor. For example, the current is preferably within a range in which the current exponentially increases with respect to a gate-source voltage. That is, the transistor Tr1 functions as a current source for supplying a current within a current range of the transistor Tr1 operating in the subthreshold region. The current corresponds to the above-described $I_{Wut}$ or $I_{Xut}$.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected, the back gate-source voltage is 0 V. When the threshold voltage of the transistor Tr2 is within an appropriate range and a high-level potential is input to the gate of the transistor Tr2, the transistor Tr2 is turned on, and when a low-level potential is input to the gate of the transistor Tr2, the transistor Tr2 is turned off. Specifically, when the transistor Tr2 is in an on state, a current within the current range of the subthreshold region flows from the second terminal of the transistor Tr1 to the terminal T1, and when the transistor Tr2 is in an off state, the current within the current range of the subthreshold region does not flow from the second terminal of the transistor Tr1 to the terminal T1.

Figure 13B:
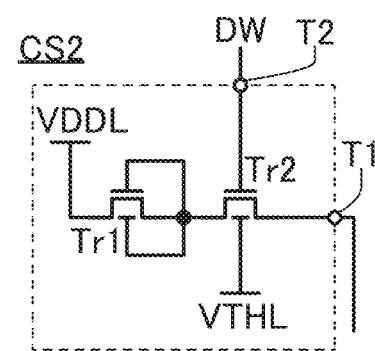

The circuit that can be used for the current source CS included in the circuit WCSa in FIG. 12A is not limited to the current source CS1 in FIG. 13A. For example, in the current source CS1, the back gate of the transistor Tr2 and the second terminal of the transistor Tr2 are electrically connected, but the back gate of the transistor Tr2 may be electrically connected to another wiring. Such a configuration example is illustrated in FIG. 13B. In a current source CS2 illustrated in FIG. 13B, the back gate of the transistor Tr2 is electrically connected to a wiring VTHL. When the wiring VTHL of the current source CS2 is electrically connected to an external circuit or the like, the external circuit or the like supplies a predetermined potential to the wiring VTHL and the back gate of the transistor Tr2 can be supplied with the predetermined potential. This can change the threshold voltage of the transistor Tr2. Specifically, the off-state current of the transistor Tr2 can be reduced by increasing the threshold voltage of the transistor Tr2.

Figure 13C:
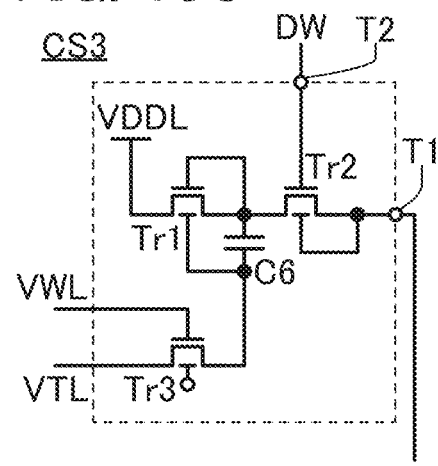

For example, in the current source CS1, the back gate of the transistor Tr1 and the second terminal of the transistor Tr1 are electrically connected; however, the voltage between the back gate and the second terminal of the transistor Tr2 may be retained with a capacitor. Such a configuration example is illustrated in FIG. 13C. A current source CS3 illustrated in FIG. 13C includes a transistor Tr3 and a capacitor C6 in addition to the transistor Tr1 and the transistor Tr2. The current source CS3 is different from the current source CS1 in that the second terminal of the transistor Tr1 and the back gate of the transistor Tr1 are electrically connected through the capacitor C6, and the back gate of the transistor Tr1 and a first terminal of the transistor Tr3 are electrically connected. In the current source CS3, a second terminal of the transistor Tr3 is electrically connected to a wiring VTL, and a gate of the transistor Tr3 is electrically connected to a wiring VWL. In the current source CS3, a high-level potential is supplied to the wiring VWL to turn on the transistor Tr3, so that the wiring VTL and the back gate of the transistor Tr1 can be in a conduction state. In this case, a predetermined potential can be input to the back gate of the transistor Tr1 from the wiring VTL. By supplying a low-level potential to the wiring VWL to turn off the transistor Tr3, a voltage between the second terminal of the transistor Tr1 and the back gate of the transistor Tr1 can be retained with the capacitor C6. That is, by setting the voltage supplied to the back gate of the transistor Tr1 by the wiring VTL, the threshold voltage of the transistor Tr1 can be changed and the threshold voltage of the transistor Tr1 can be fixed with the transistor Tr3 and the capacitor C6.

Figure 13D:
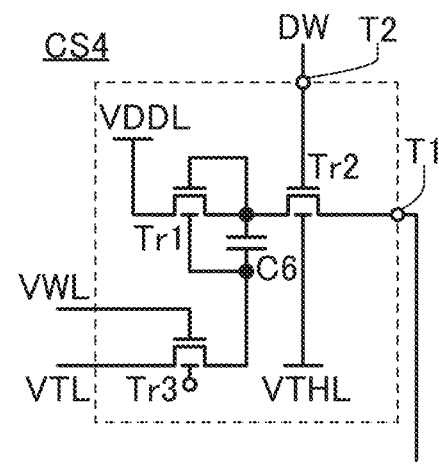

For example, a current source CS4 in FIG. 13D can be used as the current source CS included in the circuit WCSa in FIG. 12A. In the current source CS4, the back gate of the transistor Tr2 is electrically connected not to the second terminal of the transistor Tr2 as in the current source CS3 in FIG. 13C but to the wiring VTHL. The current source CS4 can change the threshold voltage of the transistor Tr2 with the potential supplied by the wiring VTHL, as in the current source CS2 in FIG. 13B.

When a high current flows between the first terminal and the second terminal of the transistor Tr1 in the current source CS4, the on-state current of the transistor Tr2 needs to be increased to supply the current from the terminal T1 out of the current source CS4. In this case, in the current source CS4, a high-level potential is supplied to the wiring VTHL to decrease the threshold voltage of the transistor Tr2 and increase the on-state current of the transistor Tr2, whereby a high current flowing between the first terminal and the second terminal of the transistor Tr1 can be supplied from the terminal T1 out of the current source CS4.

By using any one of the current sources CS1 to CS4 illustrated in FIGS. 13A to 13D as the current sources CS included in the circuit WCSa in FIG. 12A, the circuit WCSa can output a current corresponding to the K-bit first data. The above-mentioned current amount can be the amount of the current flowing between the first terminal and the second terminal of the transistor F1 that operates within the subthreshold region.

Figure 12B:
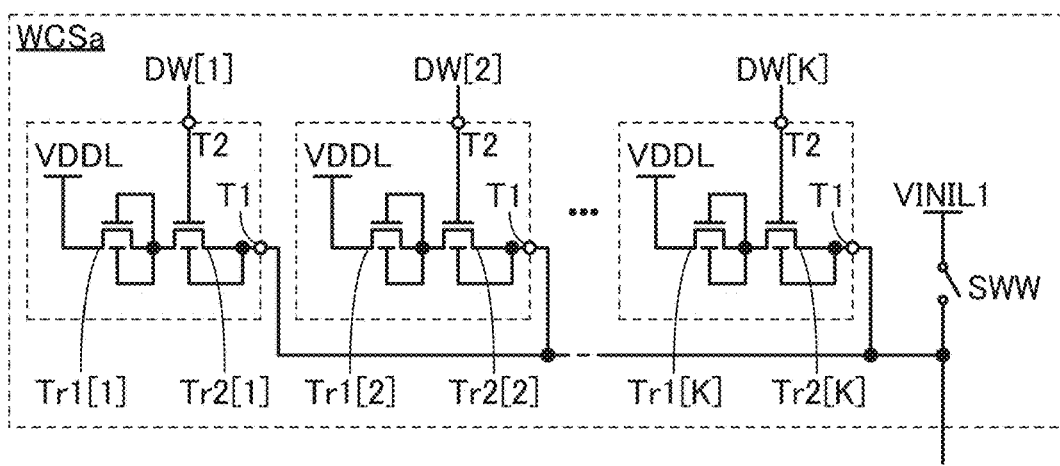

As the circuit WCSa in FIG. 12A, the circuit WCSa in FIG. 12B may be used. In the circuit WCSa in FIG. 12B, one current source CS in FIG. 13A is connected to each of the wirings DW[1] to DW[K]. When the channel width of the transistor Tr1[1] is w[1], the channel width of the transistor Tr1[2] is w[2], and the channel width of the transistor Tr1[K] is w[K], the ratio of the channel widths is x,[1]:w[2]:w[K]=1:2:$2^{K-1}$. Since a current flowing between a source and a drain of a transistor that operates in the subthreshold region is proportional to the channel width, the circuit WCSa illustrated in FIG. 12B can output a current corresponding to the K-bit first data like the circuit WCSa in FIG. 12A.

As the transistor Tr1 (including the transistors Tr1[1] to Tr1[K]), the transistor Tr2 (including the transistors Tr2[1] to Tr2[K]), and the transistor Tr3, a transistor which can be used as the transistor F1 and/or the transistor F2 can be used, for example. In particular, as the transistor Tr1 (including the transistors Tr1[1] to Tr2[K]), the transistor Tr2 (including the transistors Tr2[1] to Tr2[K]), and the transistor Tr3, OS transistors are preferably used.

Next, a specific example of the circuit XCS is described.

Figure 12C:
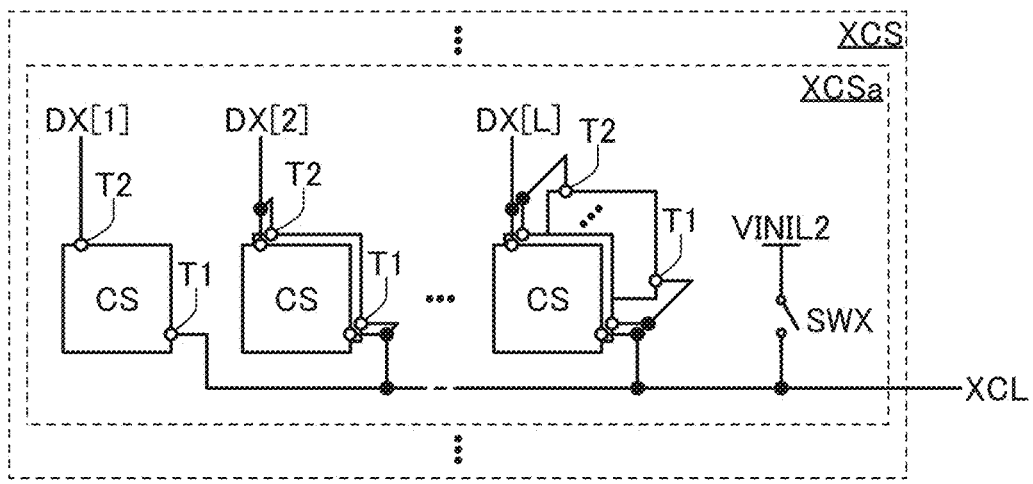

FIG. 12C is a block diagram showing an example of the circuit XCS. In FIG. 12C, to show the electrical connection between the circuit XCS and its nearby circuits, the wiring XCL is illustrated.

The circuit XCS includes, for example, circuits XCSa the number of which is the same as that of the wirings XCL. That is, the circuit XCS includes m circuits XCSa.

Thus, the wiring XCL shown in FIG. 12C can be any one of the wirings XCL[1] to XCL[m] included in the arithmetic circuit MAC1 in FIG. 2. Accordingly, the wirings XCL[1] to XCL[m] are electrically connected to the respective circuits XCSa.

The circuit XCSa illustrated in FIG. 12C includes a switch SWX, for example. A first terminal of the switch SWX is electrically connected to the wiring XCL, and a second terminal of the switch SWX is electrically connected to a wiring VINIL2. The wiring VINIL2 functions as a wiring for supplying an initialization potential to the wiring XCL, and the initialization potential can be set to the ground potential (GND), a low-level potential, a high-level potential, or the like. The initialization potential supplied by the wiring VINIL2 can be the same as the potential supplied by the wiring VINIL1. The switch SWX is turned on only when the initialization potential is supplied to the wiring XCL; otherwise, the switch is in an off state.

As the switch SWX, a switch that can be used as the switch SWW can be used, for example.

The circuit XCSa in FIG. 12C can have substantially the same configuration as the circuit WCSa in FIG. 13A. Specifically, the circuit XCSa has a function of outputting reference data as the current amount, and a function of outputting L-bit second data ($2^L$ values) (L is an integer greater than or equal to 1) as the current amount, and the circuit XCSa includes $2^L-1$ current sources CS at that time. The circuit XCSa includes one current source CS which outputs data corresponding to the first bit value as a current, two current sources CS which output data corresponding to the second bit value as a current, and $2^{L-1}$ current sources CS which output data corresponding to the L-th bit value as a current.

The reference data output by the circuit XCSa as a current can be data in which the first bit value is "1" and the second and subsequent bit values are "0", for example.

In FIG. 12C, the terminal T2 of the one current source CS is electrically connected to the wiring DX[1], the terminals T2 of the two current sources CS are electrically connected to the wiring DX[2], and the terminals T2 of the $2^{L-1}$ current sources CS are electrically connected to the wiring DX[L].

The plurality of current sources CS included in the circuit XCSa have a function of outputting the constant currents in the same amount $I_{Xut}$ from the terminals T1. The wirings DX[1] to DX[L] which are electrically connected to the current sources CS function as wirings for transmitting control signals to make the current sources CS output a constant current in the amount $I_{Xut}$. In other words, the circuit XCSa has a function of supplying the current amount corresponding to the L-bit data transmitted from the wirings DX[1] to $D_X$[L] to the wiring XCL.

Specifically, the circuit XCSa with L of 2 is considered. For example, when the value of the first bit is "1" and the value of the second bit is "0", a high-level potential is supplied to the wiring DX[1], and a low-level potential is supplied to the wiring DX[2]. In this case, the constant current in the amount $I_{Xut}$ flows from the circuit XCSa to the wiring XCL. For example, when the value of the first bit is "0" and the value of the second bit is "1", a low-level potential is supplied to the wiring DX[1], and a high-level potential is supplied to the wiring DX[2]. In this case, the constant current in the amount $2 \times I_{Xut}$ flows from the circuit XCSa to the wiring XCL. For example, when the value of the first bit is "1" and the value of the second bit is "1", a high-level potential is supplied to the wiring DX[1] and the wiring DX[2]. In this case, the constant current in the amount $3 \times I_{Xut}$ flows from the circuit XCSa to the wiring XCL. For example, when the value of the first bit is "0" and the value of the second bit is "0", a low-level potential is supplied to the wiring DX[1] and the wiring DX[2]. In this case, no constant current flows from the circuit XCSa to the wiring XCL. In this case, the expression "a current in the amount 0 flows from the circuit XCSa to the wiring XCL" is also sometimes used in this specification and the like. The current amount 0, $I_{Xut}$, $2 \times I_{Xut}$, $3 \times I_{Xut}$, or the like output from the circuit XCSa can be the second data output from the circuit XCSa; particularly, the current amount $I_{Xut}$ output from the circuit XCSa can be the reference data output from the circuit XCSa.

When the transistors in the current sources CS included in the circuit XCSa have different electrical characteristics and this yields errors, the errors in the amount $I_{Xut}$ of the constant currents output from the terminals T1 of the plurality of current sources CS are preferably within 10%, further preferably within 5%, and still further preferably within 1%. In this embodiment, the description is made based on the assumption that there is no error in the amount $I_{Xut}$ of the constant currents output from the terminals T1 of the plurality of current sources CS included in the circuit XCSa.

As the current source CS of the circuit XCSa, any of the current sources CS1 to CS4 in FIGS. 13A to 13D can be used in a manner similar to that of the current source CS of the circuit WCSa. In that case, the wiring DW in FIGS. 13A to 13D is replaced with the wiring DX. This allows the circuit XCSa to make a current within the current range of the subthreshold region flow in the wiring XCL as the reference data or the L-bit second data.

For the circuit XCSa in FIG. 12C, the circuit configuration similar to that of the circuit WCSa illustrated in FIG. 12B can be used. In this case, the circuit WCSa in FIG. 12B is replaced with the circuit XCSa, the wiring DW[1] is replaced with the wiring DX[1], the wiring DW[2] is replaced with the wiring DX[2], the wiring DW[K] is replaced with the wiring DX[L], the switch SWW is replaced with the switch SWX, and the wiring VINIL1 is replaced with the wiring VINIL2.

<Converter Circuit ITRZD[j]>

Figure 14:
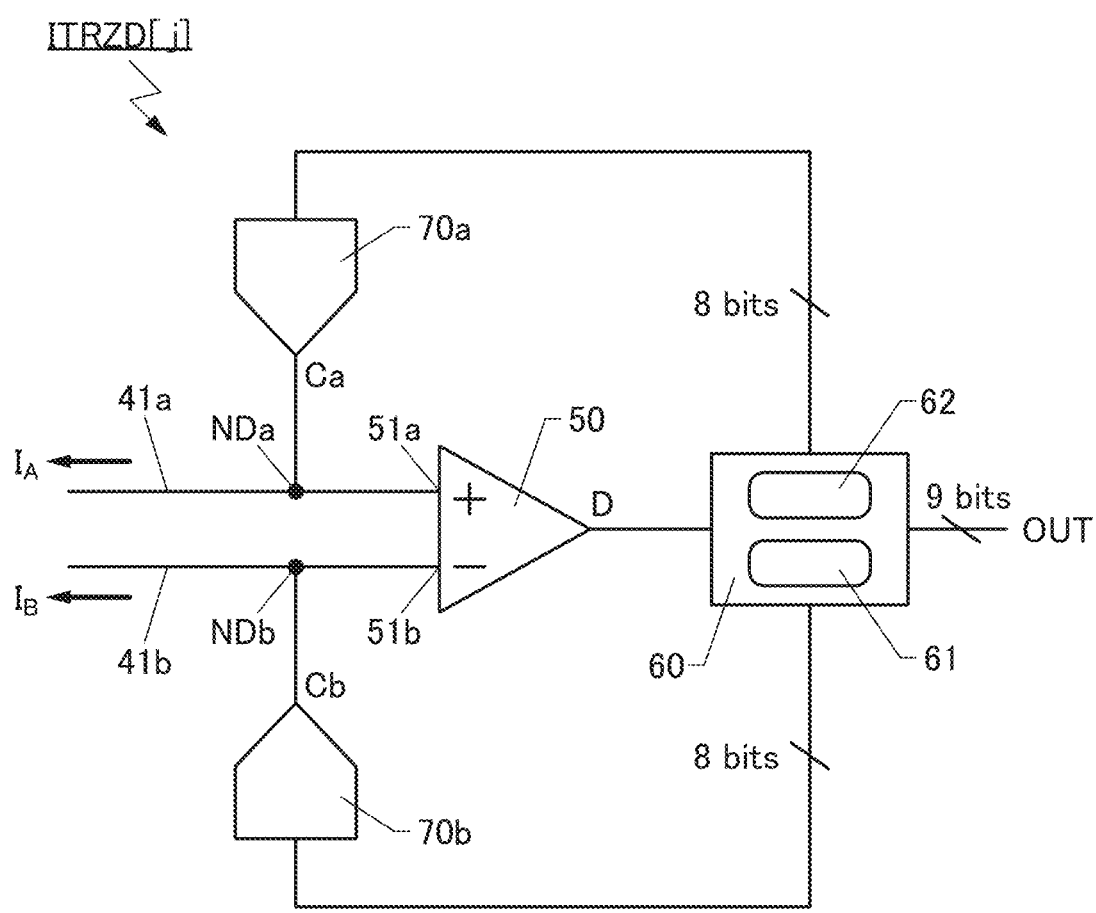
FIG. 14 is a block diagram showing a configuration example of a circuit included in a semiconductor device.

FIG. 14 is a block diagram of the converter circuit ITRZD[j]. The converter circuit ITRZD[j] includes a comparison portion 50, a control portion 60, a DA conversion portion (digital-to-analog conversion portion) 70a, and a DA conversion portion 70b. A wiring 41a and a wiring 41b are electrically connected to an input terminal 51a and an input terminal 51b of the comparison portion 50, respectively. Note that the converter circuit ITRZD[j] has a function of performing analog-to-digital (AD) conversion here.

The comparison portion 50 has a function of comparing the value of a current flowing in the input terminal 51a and that of a current flowing in the input terminal 51b to supply one of two potentials to an output terminal D. As an example, the case where a current in an amount $I_A$ flows to the input terminal 51a through the wiring 41a and a current in an amount $I_B$ flows to the input terminal 51b through the wiring 41b is considered. When the current amount $I_A$ exceeds the current amount $I_B$, the comparison portion 50 supplies the output terminal D with a high-level potential (hereinafter referred to as potential H) as output. When the current amount $I_A$ is smaller than or equal to the current amount Is, the comparison portion 50 supplies the output terminal D with a low-level potential (hereinafter referred to as potential L) as output. The output of the comparison portion 50 is input to the control portion 60 through the output terminal D.

The control portion 60 includes a sign generation portion 61 and a digital signal generation portion 62. The sign generation portion 61 has a function of generating a sign bit in accordance with the output of the comparison portion 50. For example, in the case where the output of the comparison portion 50 is the potential H, "0" is generated as a sign bit. In the case where the output of the comparison portion 50 is the potential L, "1" is generated as a sign bit. Note that the sign bit may be "1" in the case where the output of the comparison portion 50 is the potential H and may be "0" in the case where the output of the comparison portion 50 is the potential L.

The digital signal generation portion 62 has a function of generating a digital signal having a digital value and a resolution higher than or equal to eight bits and lower than or equal to 16 bits. Lower resolution leads to lower AD conversion accuracy but leads to a higher AD conversion rate. Higher resolution leads to higher AD conversion accuracy but leads to a lower AD conversion rate. Note that the resolution of the digital signal generation portion 62 is not limited to higher than or equal to eight bits and lower than or equal to 16 bits. The resolution of the digital signal generation portion 62 may be lower than or equal to seven bits and may be higher than or equal to 17 bits. The resolution can be set as appropriate in accordance with the purpose and the intended use.

In this embodiment, the digital signal generation portion 62 generates a digital signal with a resolution of eight bits. Note that in this specification and the like, the digits of a digital signal represented in binary form are sometimes referred to as bits.

The control portion 60 has a function of supplying, to the DA conversion portion(s) 70 (the DA conversion portion 70a and/or the DA conversion portion 70b), the digital signal generated by the digital signal generation portion 62. The control portion 60 has a function of outputting, to the outside (OUT), a signal obtained by adding a sign bit to a digital signal. When a digital signal has a resolution of eight bits, a 9-bit signed digital signal obtained by adding one bit of a sign bit can be output to the outside. The control portion 60 functions as a successive approximation register (SAR).

The DA conversion portion 70 functions as a current output digital-to-analog converter (DAC). That is, the DA conversion portion 70 has a function of outputting, to an output terminal(s) C (an output terminal Ca and/or an output terminal Cb), a current having a value corresponding to the digital signal supplied from the control portion 60.

In FIG. 14, the output terminal Ca of the DA conversion portion 70a is electrically connected to the input terminal 51a of the comparison portion 50 through a node NDa. Accordingly, an output current of the DA conversion portion 70a is input to the input terminal 51a of the comparison portion 50. That is, a current in the amount $I_A$ and the output current of the DA conversion portion 70a flow in the input terminal 51a. In other words, a current in the amount $I_A$ to which the output current of the DA conversion portion 70a has been added flows in the input terminal 51a.

In FIG. 14, the output terminal Cb of the DA conversion portion 70b is electrically connected to the input terminal 51b of the comparison portion 50 through a node NDb. Accordingly, an output current of the DA conversion portion 70b is input to the input terminal 51b of the comparison portion 50. That is, a current in the amount $I_B$ and the output current of the DA conversion portion 70b flow in the input terminal 51b. In other words, a current in the amount $I_B$ to which the output current of the DA conversion portion 70b has been added flows in the input terminal 51b.

Note that the node NDa is a node to which the output terminal of the DA conversion portion 70a, the wiring 41a, and the input terminal 51a are electrically connected. The node NDb is a node to which the output terminal of the DA conversion portion 70b, the wiring 41b, and the input terminal 51b are electrically connected.

<<Operation Example of Converter Circuit ITRZD[j]>>

Figure 15:
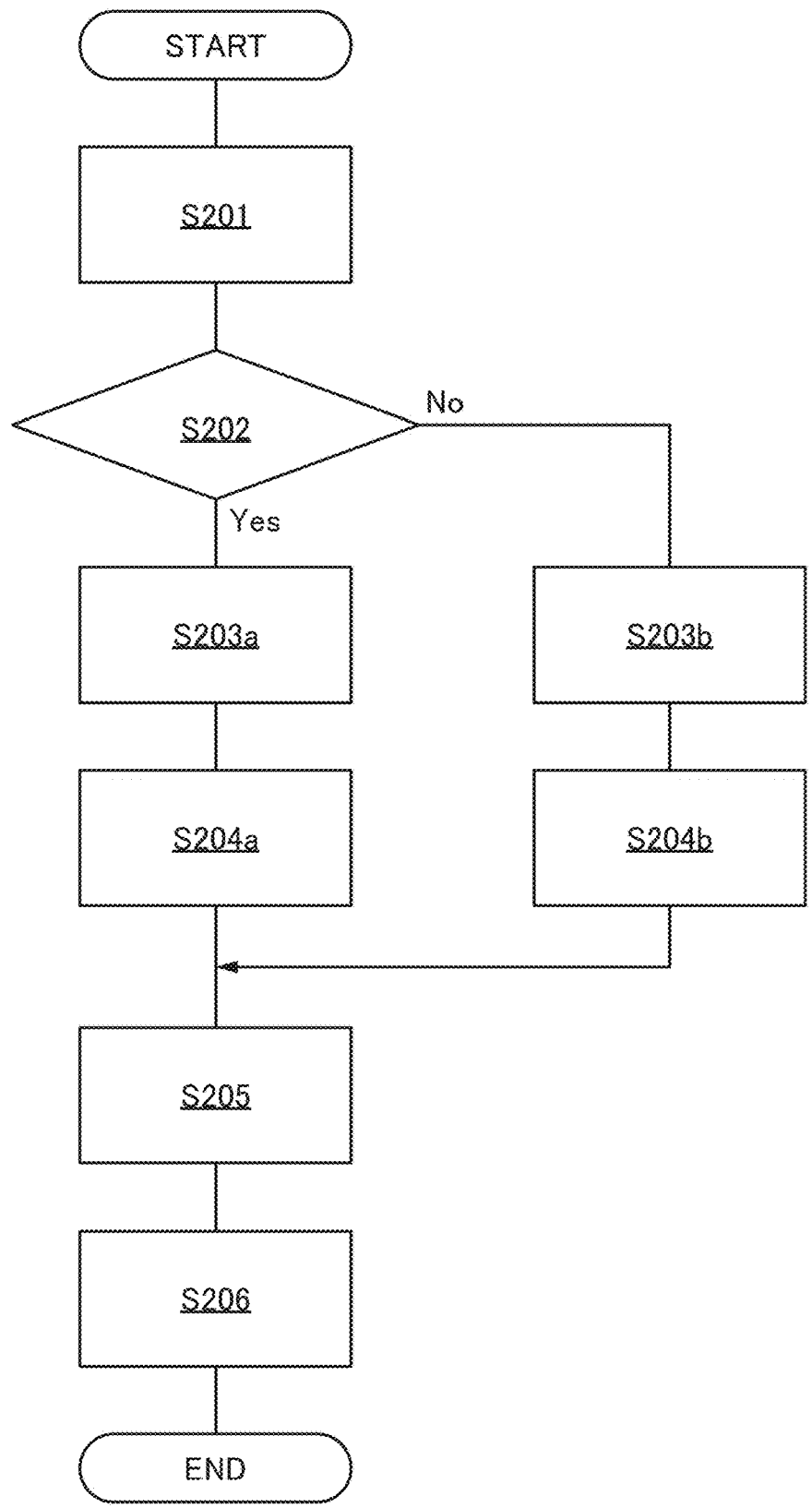
FIG. 15 is a flowchart showing an operation example of a circuit included in a semiconductor device.

FIG. 15 is a flowchart illustrating an operation example of the converter circuit ITRZD[j]. In this embodiment, the digital signal generated in the digital signal generation portion 62 has a resolution of eight bits, and the output current of the DA conversion portion 70 is in the steps of 1 nA. Here, an operation is described in which the difference (also referred to as differential current) between the current amount $I_A$ and the current amount $I_B$ is converted into a signed digital signal.

[Step S201]

The control portion 60 is reset. Specifically, an 8-bit digital signal is set to $(00000000)_2$. The digital signal is suppled to the DA conversion portion 70a and the DA conversion portion 70b. Accordingly, the DA conversion portion 70a and the DA conversion portion 70b cease to output a current.

[Step S202]

The comparison portion 50 compares the current amount $I_A$ with the current amount $I_B$. In this embodiment, in the case where the current amount $I_A$ is larger than the current amount $I_B$, the comparison portion 50 supplies the potential H to the output terminal D. In the case where the current amount $I_A$ is smaller than or equal to the current amount $I_B$, the comparison portion 50 supplies the potential L to the output terminal D.

[Step S203*a*]

In the case where the comparison portion 50 outputs the potential H in Step S202, "0" is set as a sign bit.

[Step S204*a*]

In the case where the sign bit is "0", successive approximation (SA) is performed with the DA conversion portion 70*b*. During the SA, $(00000000)_2$ as a digital signal keeps being supplied to the DA conversion portion 70*a*. Alternatively, power supply to the DA conversion portion 70*a* may be stopped. Stopping the power supply to the DA conversion portion 70*a* reduces power consumption. Note that the operation of SA will be described later.

[Step S203*b*]

In the case where the comparison portion 50 outputs the potential L in Step S202, "1" is set as a sign bit.

[Step S204*b*]

In the case where the sign bit is "1", SA is performed with the DA conversion portion 70*a*. During the SA, $(00000000)_2$ as a digital signal keeps being supplied to the DA conversion portion 70*b*. Alternatively, power supply to the DA conversion portion 70*b* may be stopped. Stopping the power supply to the DA conversion portion 70*b* reduces power consumption.

[Step S205]

After Step S204*a* or Step S204*b* ends, the obtained digital signal and the sign bit are combined to generate a signed digital signal. The sign bit may be the most significant bit or the least significant bit of the signed digital signal.

For example, in the case where the sign bit is "1" and the digital signal obtained through SA is $(01001011)_2$, the signed digital signal may be $(101001011)_2$ with the sign bit being used as the most significant bit (MSB). Alternatively, the signed digital signal may be $(010010111)_2$ with the sign bit being used as the least significant bit (LSB).

[Step S206]

The generated signed digital signal is output to the outside. In the case where the sign bit "0" is positive and the sign bit "1" is negative, the converter circuit ITRZD[j] can output a positive digital signal and a negative digital signal. Alternatively, the converter circuit ITRZD[j] of one embodiment of the present invention can output, as a digital signal, the magnitude relation and differential current between the current amount $I_A$ and the current amount $I_B$.

<<Example of Successive Approximation Operation>>

Figure 16:
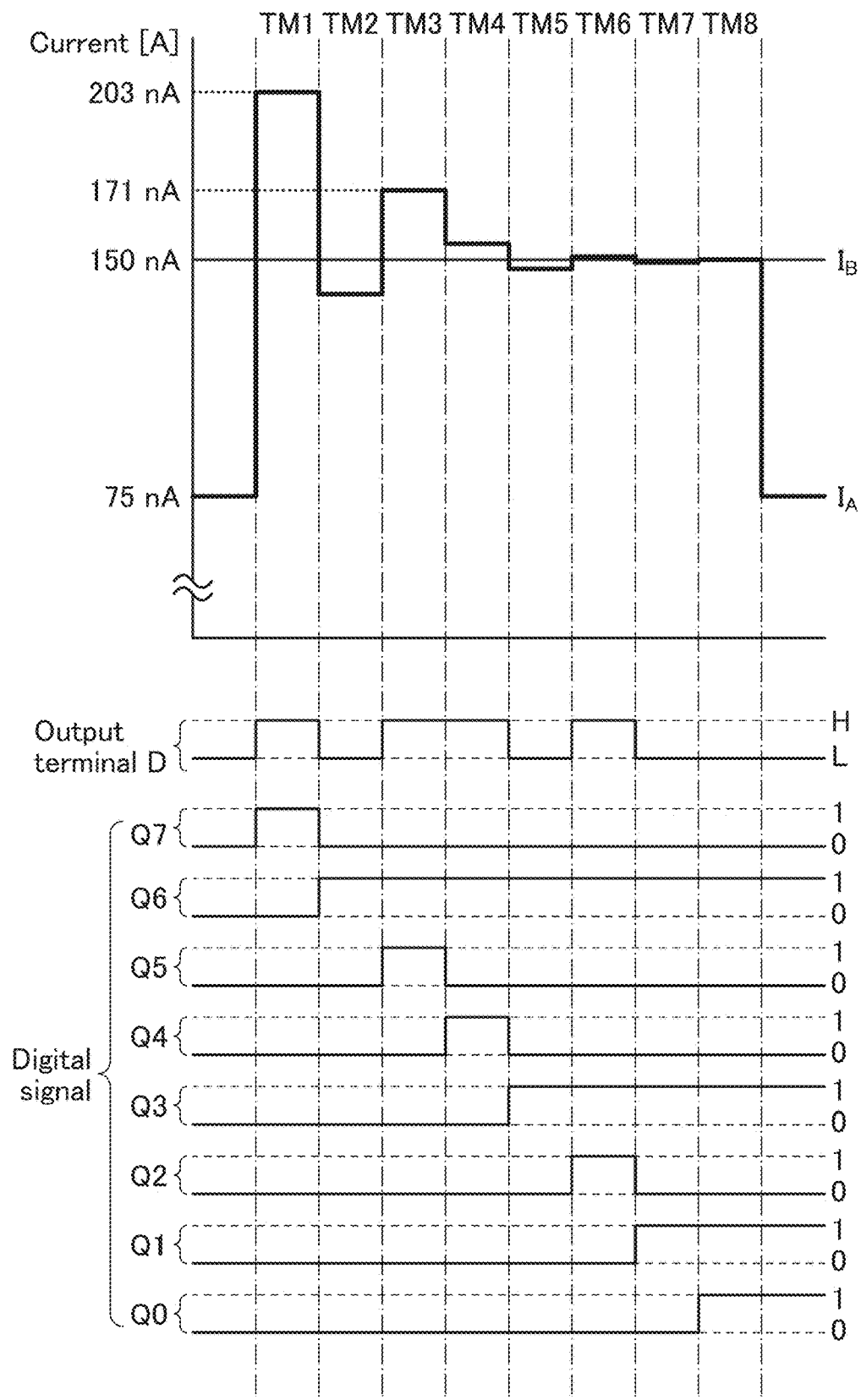
FIG. 16 is a timing chart showing an operation example of a circuit included in a semiconductor device.

A successive approximation operation corresponding to Step S204*b* is described with reference to FIG. 16. FIG. 16 shows the states of the current amount $I_A$, the current amount $I_B$, the output terminal D, and the digits of a digital signal (a Q0 bit to a Q7 bit) from Period TM1 to Period TM8. As already described above, the digital signal generated in the digital signal generation portion 62 has a resolution of eight bits, and the output current of the DA conversion portion 70 is in the steps of 1 nA. Here, the case where the current amount $I_A$ is 75 nA and the current amount $I_B$ is 150 nA is described. Note that the potential of the output terminal D is the potential L before the successive approximation operation (in the initial state). The digital signal in the initial state is $(00000000)_2$.

[Period TM1]

In Period TM1, the Q7 bit that is the MSB of the digital signal is set to "1". In other words, a digital signal $(10000000)_2$ is generated. The digital signal is input to the DA conversion portion 70*a*, and the DA conversion portion 70*a* outputs a current of 128 nA. This output is supplied to the input terminal 51*a* through the node NDa. Thus, a current of 203 nA (75+128 nA) flows in the input terminal 51*a*. Because a current of 150 nA flows in the input terminal 51*b*, the potential of the output terminal D becomes the potential H.

In the case where the potential of the output terminal D changes in Period TM1 from that in the initial state, the Q7 bit keeps being "0" after Period TM1 until the control portion 60 is reset. In the case where the potential of the output terminal D does not change from that in the initial state, the Q7 bit keeps being "1" after Period TM1 until the control portion 60 is reset. In this embodiment, the Q7 bit is "0" after Period TM1.

[Period TM2]

In Period TM2, the Q6 bit, which is lower than the MSB of the digital signal by one bit, is set to "1". In other words, a digital signal $(01000000)_2$ is generated. The digital signal is input to the DA conversion portion 70*a*, and the DA conversion portion 70*a* outputs a current of 64 nA. This output is supplied to the input terminal 51*a* through the node NDa. Accordingly, a current of 139 nA (75+64 nA) flows in the input terminal 51*a*, and the potential of the output terminal D is the potential L as in the initial state.

In the case where the potential of the output terminal D changes in Period TM2 from that in the initial state, the Q6 bit keeps being "0" in and after Period TM2 until the control portion 60 is reset. In the case where the potential of the output terminal D does not change from that in the initial state, the Q6 bit keeps being "1" in and after Period TM2 until the control portion 60 is reset. In this embodiment, the Q6 bit is "1" in and after Period TM2.

[Period TM3]

In Period TM3, the Q5 bit, which is lower than the MSB of the digital signal by two bits, is set to "1". In other words, a digital signal $(01100000)_2$ is generated. The digital signal is input to the DA conversion portion 70*a*, and the DA conversion portion 70*a* outputs a current of 96 nA (64+32 nA). This output is supplied to the input terminal 51*a* through the node NDa. Accordingly, a current of 171 nA (75+64+32 nA) flows in the input terminal 51*a*, and the potential of the output terminal D becomes the potential H.

In the case where the potential of the output terminal D changes in Period TM3 from that in the initial state, the Q5 bit keeps being "0" after Period TM3 until the control portion 60 is reset. In the case where the potential of the output terminal D does not change from that in the initial state, the Q5 bit keeps being "1" after Period TM3 until the control portion 60 is reset. In this embodiment, the Q5 bit is "0" after Period TM3.

[Period TM4]

In Period TM4, the Q4 bit, which is lower than the MSB of the digital signal by three bits, is set to "1". In other words, a digital signal $(01010000)_2$ is generated. The digital signal is input to the DA conversion portion 70*a*, and the DA conversion portion 70*a* outputs a current of 80 nA (64+16 nA). This output is supplied to the input terminal 51*a* through the node NDa. Accordingly, a current of 155 nA (75+64+16 nA) flows in the input terminal 51*a*, and the potential of the output terminal D becomes the potential H.

In the case where the potential of the output terminal D changes in Period TM4 from that in the initial state, the Q4 bit keeps being "0" after Period TM4 until the control portion 60 is reset. In the case where the potential of the output terminal D does not change from that in the initial state, the Q4 bit keeps being "1" after Period TM4 until the control portion 60 is reset. In this embodiment, the Q4 bit is "0" after Period TM4.

[Period TM5]

In Period TM5, the Q3 bit, which is lower than the MSB of the digital signal by four bits, is set to "1". In other words, a digital signal $(01001000)_2$ is generated. The digital signal is input to the DA conversion portion 70a, and the DA conversion portion 70a outputs a current of 72 nA (64+8 nA). This output is supplied to the input terminal 51a through the node NDa. Accordingly, a current of 147 nA (75+64+8 nA) flows in the input terminal 51a, and the potential of the output terminal D becomes the potential L.

In the case where the potential of the output terminal D changes in Period TM5 from that in the initial state, the Q3 bit keeps being "0" in and after Period TM5 until the control portion 60 is reset. In the case where the potential of the output terminal D does not change from that in the initial state, the Q3 bit keeps being "1" in and after Period TM5 until the control portion 60 is reset. In this embodiment, the Q3 bit is "1" in and after Period TM5.

[Period TM6]

In Period TM6, the Q2 bit, which is lower than the MSB of the digital signal by five bits, is set to "1". In other words, a digital signal $(01001100)_2$ is generated. The digital signal is input to the DA conversion portion 70a, and the DA conversion portion 70a outputs a current of 76 nA (64+8+4 nA). This output is supplied to the input terminal 51a through the node NDa. Accordingly, a current of 151 nA (75+64+8+4 nA) flows in the input terminal 51a, and the potential of the output terminal D becomes the potential H.

In the case where the potential of the output terminal D changes in Period TM6 from that in the initial state, the Q2 bit keeps being "0" after Period TM6 until the control portion 60 is reset. In the case where the potential of the output terminal D does not change from that in the initial state, the Q2 bit keeps being "1" after Period TM6 until the control portion 60 is reset. In this embodiment, the Q2 bit is "0" after Period TM6.

[Period TM7]

In Period TM7, the Q1 bit, which is lower than the MSB of the digital signal by six bits, is set to "1". In other words, a digital signal $(01001010)_2$ is generated. The digital signal is input to the DA conversion portion 70a, and the DA conversion portion 70a outputs a current of 74 nA (64+8+2 nA). This output is supplied to the input terminal 51a through the node NDa. Accordingly, a current of 149 nA (75+64+8+2 nA) flows in the input terminal 51a, and the potential of the output terminal D becomes the potential L.

In the case where the potential of the output terminal D changes in Period TM7 from that in the initial state, the Q1 bit keeps being "0" in and after Period TM7 until the control portion 60 is reset. In the case where the potential of the output terminal D does not change from that in the initial state, the Q1 bit keeps being "1" in and after Period TM7 until the control portion 60 is reset. In this embodiment, the Q1 bit is "1" in and after Period TM7.

[Period TM8]

In Period TM8, the Q0 bit, which is the LSB of the digital signal, is set to "1". In other words, a digital signal $(01001011)_2$ is generated. The digital signal is input to the DA conversion portion 70a, and the DA conversion portion 70a outputs a current of 75 nA (64+8+2+1 nA). This output is supplied to the input terminal 51a through the node NDa. Accordingly, a current of 150 nA (75+64+8+2+1 nA) flows in the input terminal 51a, and the potential of the output terminal D becomes the potential L.

In the case where the potential of the output terminal D changes in Period TM8 from that in the initial state, the Q0 bit keeps being "0" in and after Period TM8 until the control portion 60 is reset. In the case where the potential of the output terminal D does not change from that in the initial state, the Q0 bit keeps being "1" in and after Period TM8 until the control portion 60 is reset. In this embodiment, the Q0 bit is "1" in and after Period TM8.

In this manner, comparison is sequentially performed from the MSB to the LSB, whereby a differential current between the current amount $I_A$ and the current amount $I_B$ of 75 nA can be converted into the digital signal $(01001011)_2$.

Note that the successive approximation operation corresponding to Step S204b can be understood when the potential H and the DA conversion portion 70a in the above description are respectively replaced with the potential L and the DA conversion portion 70b.

Since the output current of the DA conversion portion 70 is in the steps of 1 nA in this embodiment, a differential current of 255 nA at a maximum can be converted into a digital signal. When the interval value of the output current of the DA conversion portion 70 is set larger, a higher differential current can be converted. For example, an interval value of the output current of the DA conversion portion 70 of 2 nA enables conversion of a differential current of 510 nA at a maximum into a digital signal.

More accurate AD conversion can be achieved by increasing the resolution of a digital signal and/or reducing the interval value of the output current of the DA conversion portion 70.

Note that this embodiment can be combined with any of the other embodiments in this specification as appropriate.

Embodiment 4

In this embodiment, configuration examples of a display apparatus combining the semiconductor device of one embodiment of the present invention with a display portion are described.

<Configuration Example 1>

Figure 17:
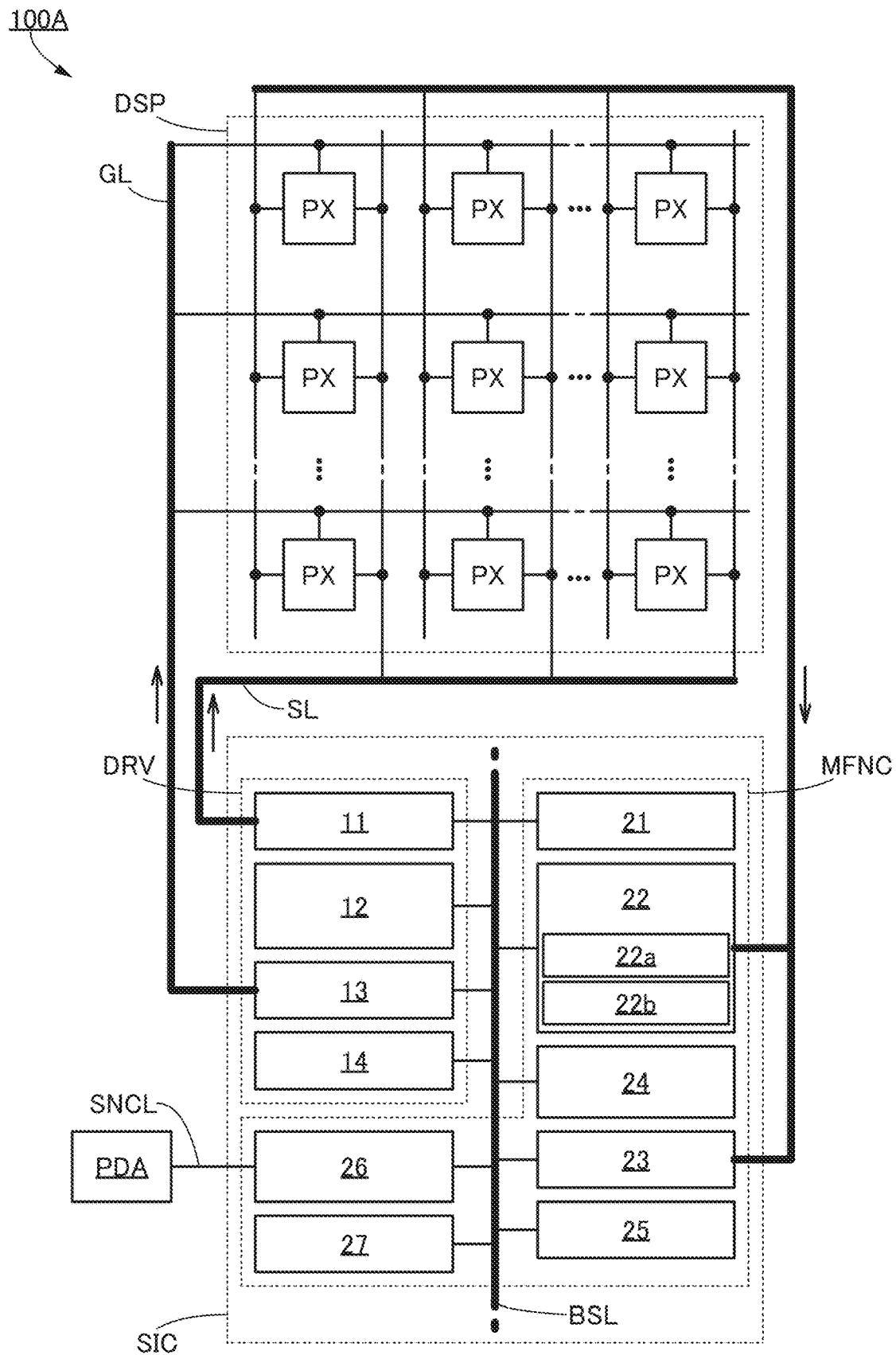
FIG. 17 is a block diagram showing a configuration example of a display apparatus.

FIG. 17 shows a configuration example of a display apparatus combining the semiconductor device described in the above embodiment with a display portion. A display apparatus 100A shown in FIG. 17 includes a display portion DSP and a circuit portion SIC, for example. A sensor PDA shown in FIG. 17 may be positioned inside or outside the display apparatus 100A.

In FIG. 17, the thick lines denote a plurality of wirings or a plurality of bus wirings.

In FIG. 17, the display portion DSP includes a plurality of pixel circuits PX arranged in a matrix, for example. The pixel circuit PX can be, for example, a pixel that includes at least one of a liquid crystal display device, a light-emitting device including an organic EL material, and a light-emitting device including a light-emitting diode such as a micro LED. Note that in the description in this embodiment, the pixel circuit PX in the display portion DSP includes a light-emitting device including an organic EL material.

The light-emitting device including an organic EL material in the display portion DSP can have, for example, a side-by-side (SBS) structure in which light-emitting elements exhibiting red (R), green (G), and blue (B) are separately provided. As another structure, a tandem structure in which light-emitting elements exhibiting a plurality of colors such as R, G, and B are connected in series through an intermediate layer (a charge-generation layer) and which is combined with coloring layers (e.g., color filters) can be employed. Specifically, the tandem structure enables the light-emitting device to emit light at high luminance. Note that the luminance of the light emitted by the display portion DSP can be, for example, higher than or equal to 500 cd/m$^2$, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

In FIG. 17, the circuit portion SIC includes a peripheral circuit DRV and a functional circuit MFNC.

The peripheral circuit DRV functions as a peripheral circuit for driving the display portion DSP, for example. Specifically, the peripheral circuit DRV includes, for example, a source driver circuit 11, a digital-to-analog converter circuit 12, a gate driver circuit 13, and a level shifter 14.

The functional circuit MFNC can be provided with, for example, a memory device storing image data to be displayed on the display portion DSP, a decoder for decoding encoded image data, a graphics processing unit (GPU) for processing image data, a power supply circuit, a correction circuit, and a CPU. In FIG. 17, the functional circuit MFNC includes a memory device 21, a GPU (AI accelerator) 22, an EL correction circuit 23, a timing controller 24, a CPU (NoffCPU (registered trademark)) 25, a sensor controller 26, and a power supply circuit 27, for example.

In the display apparatus 100A shown in FIG. 17, for example, a bus wiring BSL is electrically connected to each of the circuits included in the peripheral circuit DRV and each of the circuits included in the functional circuit MFNC.

The source driver circuit 11 has a function of transmitting image data to the pixel circuit PX included in the display portion DSP, for example. Thus, the source driver circuit 11 is electrically connected to the pixel circuit PX through a wiring SL.

The digital-to-analog converter circuit 12 has a function of, for example, converting image data that has been digitally processed by the GPU, correction circuit, or the like described later, into analog data. The image data converted into analog data is transmitted to the display portion DSP through the source driver circuit 11. Note that the digital-to-analog converter circuit 12 may be included in the source driver circuit 11, and the image data may be transmitted to the source driver circuit 11, the digital-to-analog converter circuit 12, and the display portion DSP in this order.

The gate driver circuit 13 has a function of selecting the pixel circuit PX to which image data is to be transmitted in the display portion DSP, for example. Thus, the gate driver circuit 13 is electrically connected to the pixel circuit PX through a wiring GL.

The level shifter 14 has a function of converting the signals to be input to the source driver circuit 11, the digital-to-analog converter circuit 12, the gate driver circuit 13, and the like into signals having appropriate levels, for example.

The memory device 21 has a function of storing image data to be displayed on the display portion DSP, for example. Note that the memory device 21 can be configured to store the image data as digital data or analog data.

In the case where the memory device 21 stores image data, the memory device 21 is preferably a nonvolatile memory. In this case, the memory device 21 can be a NAND memory or the like.

In the case where the memory device 21 stores temporary data generated in the GPU 22, the EL correction circuit 23, the CPU 25, or the like, the memory device 21 is preferably a volatile memory. In that case, a static random access memory (SRAM), a dynamic random access memory (DRAM), or the like can be used as the memory device 21.

The GPU 22 has a function of performing processing for plotting the image data read from the memory device 21 on the display portion DSP, for example. Specifically, the GPU 22 is configured to perform pipeline processing in parallel and can thus perform high-speed processing of the image data to be displayed on the display portion DSP. The GPU 22 can also function as a decoder for decoding an encoded image.

The functional circuit MFNC may include a plurality of circuits that can increase the display quality of the display portion DSP. As such circuits, for example, correction circuits (dimming or toning circuits) that detect and correct color irregularity of an image displayed on the display portion DSP to optimize the image may be provided. In the case where the pixel in the display portion DSP includes a liquid crystal display device, the functional circuit MFNC may be provided with a gamma correction circuit. In the case where the pixel in the display portion DSP includes a light-emitting device including an organic EL material, the functional circuit MFNC may be provided with an EL correction circuit. Note that because the description in this embodiment is made on the assumption that the pixel circuit PX in the display portion DSP includes the light-emitting device including an organic EL material, the functional circuit MFNC in this example is provided with the EL correction circuit 23.

The above-described image correction may be performed using artificial intelligence in the following manner, for example. A current flowing in the display device included in the pixel (or a voltage applied to the display device) is monitored and acquired, an image displayed on the display portion DSP is acquired with an image sensor or the like, the current (or voltage) and the image are used as input data in an arithmetic operation of the artificial intelligence (e.g., an artificial neural network), and the output result is used to determine whether the image should be corrected.

Such an arithmetic operation of artificial intelligence can be applied to not only image correction but also upconversion (downconversion) of image data. In this case, upconversion (downconversion) of low-resolution image data in accordance with the resolution of the display portion DSP allows a high-display-quality image to be displayed on the display portion DSP.

Note that the above-described arithmetic operation of the artificial intelligence can be performed using the GPU 22 included in the functional circuit MFNC. That is, the GPU 22 can be used to perform arithmetic operations for various kinds of correction (e.g., color irregularity correction 22$a$ and upconversion 22$b$).

Note that in this specification and the like, a GPU performing an arithmetic operation of the artificial intelligence is referred to as an AI accelerator. That is, the GPU included in the functional circuit MFNC may be replaced with an AI accelerator in the description in this specification and the like.

As an arithmetic circuit included in the AI accelerator, for example, the arithmetic circuit MAC1 or MAC2 that is the semiconductor device of the above embodiment can be used.

The timing controller 24 has a function of freely setting the frame rate at which an image is displayed on the display portion DSP. For example, the display apparatus 100A can be driven at a frame rate reduced by the timing controller 24 in the case where the display portion DSP displays a still image; for another example, the display apparatus 100A can be driven at a frame rate increased by the timing controller 24 in the case where the display portion DSP displays a moving image. In other words, the display apparatus 100A provided with the timing controller 24 can be driven at a frame rate that is changed depending on which of a still image and a moving image is displayed. Specifically, since the frame rate when the display portion DSP displays a still image can be lowered, the power consumption of the display apparatus 100A can be reduced.

The CPU 25 has a function of, for example, performing general-purpose processing such as execution of an operating system, control of data, and execution of various arithmetic operations and programs. In the display apparatus 100A, the CPU 25 has a function of, for example, giving an instruction for an operation for writing or reading image data to/from the memory device 21, an operation for correcting image data, an operation for a later-described sensor, or the like. Furthermore, the CPU 25 may have a function of, for example, transmitting a control signal to at least one of the circuits included in the functional circuit MFNC, such as the memory device, the GPU, the correction circuit, and the timing controller.

The CPU 25 may include a circuit for temporarily backing up data (hereinafter referred to as a backup circuit). The backup circuit is preferably capable of retaining the data even after supply of a power supply voltage is stopped. For example, in the case where the display portion DSP displays a still image, the CPU 25 can cease to work until an image different from the currently displayed still image is displayed. Accordingly, dynamic power consumption by the CPU 25 can be reduced in such a manner that the data under processing by the CPU 25 is backed up in the backup circuit and then supply of a power supply voltage to the CPU 25 is stopped to stop the CPU 25. In this specification and the like, a CPU including a backup circuit is referred to as an NoffCPU.

The sensor controller 26 has a function of, for example, controlling the sensor PDA. FIG. 17 shows a wiring SNCL as a wiring for electrically connecting the sensor PDA to the sensor controller 26.

The sensor PDA is, for example, a touch sensor that can be provided above, below, or inside the display portion DSP.

Alternatively, the sensor PDA may be an illuminance sensor, for example. Specifically, the illuminance sensor acquiring the intensity of the external light with which the display portion DSP is irradiated makes it possible to change the brightness (luminance) of an image displayed on the display portion DSP in accordance with the intensity of the external light. For example, under intense external light, the luminance of an image displayed on the display portion DSP can be increased to enhance the viewability of the image. By contrast, under weak external light, the luminance of an image displayed on the display portion DSP can be lowered to reduce the power consumption.

Further alternatively, the sensor PDA can be an image sensor, for example. For example, an image or the like acquired with the image sensor can be displayed on the display portion DSP. In the case where the sensor PDA is an image sensor, the circuit IMS shown in FIG. 8 may be used as the sensor PDA.

The power supply circuit 27 has a function of, for example, generating voltages to be supplied to the circuits included in the peripheral circuit DRV, the circuits included in the functional circuit MFNC, the pixels included in the display portion DSP, and the like. Note that the power supply circuit 27 may have a function of selecting a circuit to which a voltage is to be supplied. For example, the power supply circuit 27 stops supply of a voltage to the CPU 25, the GPU 22, and the like during a period in which the display portion DSP displays a still image, whereby the power consumption of the whole display apparatus 100A can be reduced.

<Configuration Example 2>

Here, a configuration example is described in which the sensor PDA of the above display apparatus 100A is an image sensor for acquiring images of the eyes and/or their surroundings of the user looking at an image displayed by the display apparatus 100A. Note that the eyes of the user mean the eyeballs, pupils, and the like, and the surroundings of the eyes of the user mean the eyelids, the *glabella*, and the inner and outer corners of the eyes, for example.

The sensor PDA can capture images of the eyes and/or their surroundings of the user looking at an image displayed by the display apparatus 100A, for example. The images of the user's eyes and/or their surroundings that have been captured by the sensor PDA are transmitted to the GPU 22 (AI accelerator). The GPU 22 can perform inference processing based on an artificial neural network from the transmitted images.

Figure 18:
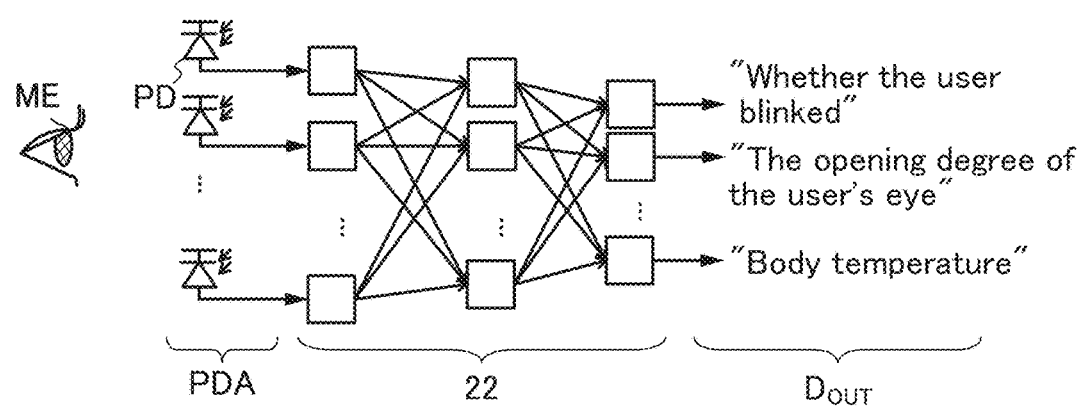
FIG. 18 illustrates a configuration example of a display apparatus.

FIG. 18 shows an operation example in which the sensor PDA captures images of the user's eyes and/or their surroundings and the inference processing based on an artificial neural network is performed using the captured images. Specifically, FIG. 18 shows an example in which a plurality of light-receiving elements PD included in the sensor PDA capture images of the user's eye ME and its surroundings and the captured images are transmitted to the GPU 22.

Note that the sensor PDA shown in FIG. 18 can be, for example, the circuit IMS of the arithmetic circuit MAC3 in FIG. 8. Accordingly, the light-receiving element PD included in the sensor PDA can be the light-receiving element JS shown in FIG. 8.

As described above, the GPU 22 performs inference processing based on an artificial neural network. Specifically, such inference processing based on an artificial neural network can be performed when the GPU 22 performs a product-sum operation of a captured image and a weight coefficient set in advance by learning as well as an arithmetic operation of an activation function using the result of the product-sum operation. Accordingly, as output data Dou-r obtained in the GPU 22, "whether the user blinked", "the opening degree of the user's eye", "the user's body temperature", or the like can be inferred from the user's eye ME and its surroundings.

The amount of a current generated in the light-receiving element PD in response to capturing of images of the user's eyes and/or surroundings is sometimes small. The second data (current) input to the arithmetic circuit MAC1 or MAC2 described in the above embodiment is a current such that the transistor $F2m$ operates in the subthreshold region; thus, in the case where the amount of a current generated in the light-receiving element PD is in the subthreshold region, the current generated in the light-receiving element PD can be input to the arithmetic circuit MAC1 or MAC2 as the second data. That is, the current generated in the light-receiving element PD can be used as input data of the arithmetic circuit MAC1 or MAC2 without being subjected to amplification, conversion, or the like. It is thus unnecessary to provide a circuit performing amplification, conversion, or the like.

Note that this embodiment can be combined with any of the other embodiments in this specification as appropriate.

Embodiment 5

In this embodiment, a structure example of a display apparatus of one embodiment of the present invention is described.

<Structure Example of Display Apparatus>

Figure 19:
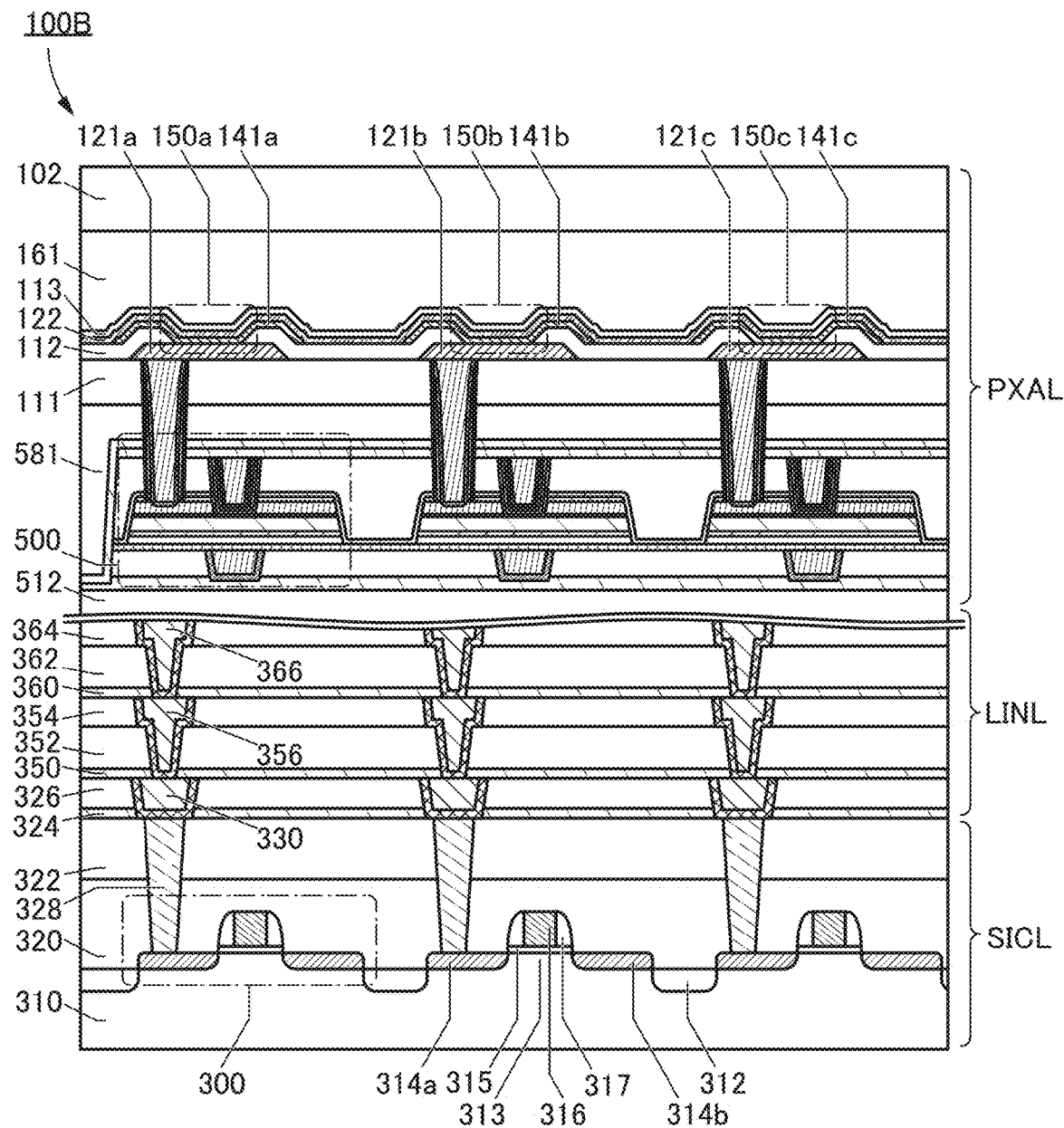
FIG. 19 is a schematic cross-sectional view showing a structure example of a display apparatus.

FIG. 19 is a cross-sectional view showing an example of a display apparatus of one embodiment of the present invention. A display apparatus 100B shown in FIG. 19 includes a pixel circuit and a driver circuit over a substrate 310, for example.

Specifically, the display apparatus 100B includes, for example, a circuit layer SICL, a wiring layer LINL, and a pixel layer PXAL. For example, the circuit layer SICL includes the substrate 310 on which the transistor 300 is formed. Above the transistor 300 is provided the wiring layer LINL that includes wirings electrically connected to the transistor 300, the later-described transistor 500, later-described light-emitting devices 150a, 150b, and 150c, and the like. Above the wiring layer LINL is provided the pixel layer PXAL that includes, for example, the transistor 500, the light-emitting devices 150a, 150b, and 150c, and the like.

As the circuit layer SICL, for example, the circuit portion SIC that is included in the display apparatus 100A described in Embodiment 4 with reference to FIG. 17 can be used. In this case, the wiring layer LINL can be provided with the wiring SL, the wiring GL, and the like shown in FIG. 17, and the pixel layer PXAL can be provided with the display portion DSP shown in FIG. 17.

As the substrate 310, a semiconductor substrate (e.g., a single crystal substrate) formed of silicon or germanium can be used, for example. Besides such a semiconductor substrate, any of the following examples can be used as the substrate 310: a silicon on insulator (SOI) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, and the like. Examples of a glass substrate include a barium borosilicate glass substrate, an alumino-borosilicate glass substrate, and a soda lime glass substrate. Examples of a material for a flexible substrate, an attachment film, a base film, or the like include plastic typified by polyethylene terephthalate (PET), polyethylene naphthalate (PEN), polyether sulfone (PES), and polytetrafluoroethylene (PTFE). Another example is a synthetic resin such as an acrylic resin. Furthermore, polypropylene, polyester, polyvinyl fluoride, and polyvinyl chloride can be given as examples. Alternatively, polyamide, polyimide, aramid, an epoxy resin, an inorganic film formed by evaporation, paper, or the like can be used. Note that in the case where the manufacturing process of the display apparatus 100B involves heat treatment, a highly heat-resistant material is preferably used for the substrate 310.

In the description of this embodiment, the substrate 310 is a semiconductor substrate containing silicon or the like.

The transistor 300 is provided on the substrate 310 and includes an element isolation layer 312, a conductor 316, an insulator 315, an insulator 317, a semiconductor region 313 that is part of the substrate 310, and low-resistance regions 314a and 314b functioning as source and drain regions. Accordingly, the transistor 300 is a transistor (Si transistor) whose channel formation region contains silicon. Although FIG. 19 shows a structure in which one of the source region and the drain region of the transistor 300 is electrically connected to later-described conductors 330, 356, and 366 through a later-described conductor 328, the electrical connection in the semiconductor device of one embodiment of the present invention is not limited thereto. In the semiconductor device of one embodiment of the present invention, for example, the other of the source region and the drain region of the transistor 300 may be electrically connected to the conductors 330, 356, and 366 through the conductor 328, or alternatively, a gate of the transistor 300 may be electrically connected to the conductors 330, 356, and 366 through the conductor 328.

The transistor 300 can have a fin-type structure when, for example, a top surface of the semiconductor region 313 and a side surface thereof in the channel width direction are covered with the conductor 316 with the insulator 315 as a gate insulating film therebetween. The effective channel width is increased in the fin-type transistor 300, whereby the on-state characteristics of the transistor 300 can be improved. In addition, contribution of the electric field of the gate electrode can be increased, so that the off-state characteristics of the transistor 300 can be improved.

Note that the transistor 300 can be a p-channel transistor or an n-channel transistor. Alternatively, both the p-channel transistor 300 and the n-channel transistor 300 may be included.

A region of the semiconductor region 313 where a channel is formed, a region in the vicinity thereof, the low-resistance regions 314a and 314b functioning as the source and drain regions, and the like preferably contain a semiconductor such as a silicon-based semiconductor, further preferably contain single crystal silicon. Alternatively, a material including germanium (Ge), silicon germanium (SiGe), gallium arsenide (GaAs), gallium aluminum arsenide (GaAlAs), gallium nitride (GaN), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The conductor 316 functioning as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that a material used for a conductor determines the work function; thus, selecting the material used for the conductor can adjust the threshold voltage of a transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

The element isolation layer 312 is provided to separate a plurality of transistors on the substrate 310 from each other. The element isolation layer can be formed by a local oxidation of silicon (LOCOS) method, an shallow trench isolation (STI) method, a mesa isolation method, or the like.

Note that the transistor 300 shown in FIG. 19 is only an example and is not limited to having the structure shown in FIG. 19; a transistor appropriate for a circuit configuration, a driving method, or the like can be used. For example, the transistor 300 may have a planar structure instead of a fin-type structure.

Over the transistor 300 shown in FIG. 19, an insulator 320, an insulator 322, an insulator 324, and an insulator 326 are stacked in this order from the substrate 310 side.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has an oxygen content higher than a nitrogen content, and silicon nitride oxide refers to a material that has a nitrogen content higher than an oxygen content. Moreover, in this specification, aluminum oxynitride refers to a material that has an oxygen content higher than a nitrogen content, and aluminum nitride oxide refers to a material that has a nitrogen content higher than an oxygen content.

The insulator 322 may function as a planarization film for eliminating a level difference caused by the transistor 300 or the like covered with the insulators 320 and 322. For example, a top surface of the insulator 322 may be planarized by planarization treatment using a chemical mechanical polishing (CMP) method or the like to increase the level of planarity.

For the insulator 324, it is preferable to use a barrier insulating film preventing diffusion of impurities such as water and hydrogen from the substrate 310, the transistor 300, or the like to a region above the insulator 324 (e.g., the region including the transistor 500, the light-emitting devices 150a to 150c, and the like). Accordingly, the insulator 324 is preferably formed using an insulating material having a function of inhibiting diffusion of impurities such as a hydrogen atom, a hydrogen molecule, and a water molecule, that is, an insulating material which does not easily transmit the above impurities. Alternatively, depending on circumstances, the insulator 324 is preferably formed using an insulating material having a function of inhibiting diffusion of impurities such as a nitrogen atom, a nitrogen molecule, a nitrogen oxide molecule (e.g., $N_2O$, $NO$, and $NO_2$), and a copper atom, that is, an insulating material which does not easily transmit the above impurities. The insulator 324 preferably has a function of inhibiting diffusion of oxygen (e.g., at least one of an oxygen atom and an oxygen molecule).

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. When a material with a low dielectric constant is used for an interlayer film, the parasitic capacitance generated between wirings can be reduced.

In addition, the conductors 328 and 330 and the like that are connected to the light-emitting devices and the like above the insulator 326 are embedded in the insulators 320, 322, 324, and 326. Note that each of the conductors 328 and 330 and the like functions as a plug or a wiring. A plurality of conductors functioning as plugs or wirings are collectively denoted by the same reference numeral in some cases. In this specification and the like, a wiring and a plug connected to the wiring may be a single component. That is, in some cases, part of a conductor functions as a wiring or part of a conductor functions as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 19, an insulator 350, an insulator 352, and an insulator 354 are sequentially stacked above the insulator 326 and the conductor 330. Furthermore, the conductor 356 is formed in the insulators 350, 352, and 354. The conductor 356 functions as a plug or a wiring that is connected to the transistor 300. Note that the conductor 356 can be formed using a material similar to that for the conductor 328 and the conductor 330.

Note that for example, the insulator 350 is preferably formed using an insulator having a barrier property against impurities such as hydrogen and water, like the insulator 324. The insulators 352 and 354 are preferably formed using an insulator having a relatively low dielectric constant to reduce the parasitic capacitance generated between wirings, like the insulator 326. Furthermore, the conductor 356 preferably includes a conductor having a barrier property against impurities such as hydrogen and water. In particular, the conductor having a barrier property against hydrogen is formed in an opening portion of the insulator 350 having a barrier property against hydrogen. With this structure, the transistor 300 and the transistor 500 can be separated by a barrier layer, so that the diffusion of hydrogen from the transistor 300 to the transistor 500 can be inhibited.

Note that as the conductor having a barrier property against hydrogen, tantalum nitride is preferably used, for example. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

An insulator 360, an insulator 362, and an insulator 364 are sequentially stacked over the insulator 354 and the conductor 356.

The insulator 360 is preferably formed using an insulator having a barrier property against impurities such as water and hydrogen, like the insulator 324 and the like. Thus, the insulator 360 can be formed using any of the materials usable for the insulator 324 and the like, for example.

The insulator 362 and the insulator 364 have functions of an interlayer insulating film and a planarization film. The insulators 362 and 364 are preferably formed using an insulator having a barrier property against impurities such as water and hydrogen, like the insulator 324. Thus, the insulator 362 and/or the insulator 364 can be formed using any of the materials usable for the insulator 324.

The conductor 366 is embedded to fill an opening portion provided in regions of the insulator 360, the insulator 362, and the insulator 364 that overlap with part of the conductor 356. The conductor 366 is also formed over the insulator 362. The conductor 366 functions as a plug or a wiring that is connected to the transistor 300, for example. Note that the conductor 366 can be formed using a material similar to that for the conductor 328 and the conductor 330.

An insulator 512 is provided above the insulator 364 and the conductor 366. A substance having a barrier property against oxygen or hydrogen is preferably used for the insulator 512. For the insulator 512, silicon oxide, silicon oxynitride, silicon nitride oxide, silicon nitride, aluminum oxide, aluminum oxynitride, aluminum nitride oxide, or aluminum nitride can be used, for example.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

The insulator 512 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used as the insulator 512, for example.

The transistor 500 that is an OS transistor is provided over the insulator 512, for example.

Figure 20A:
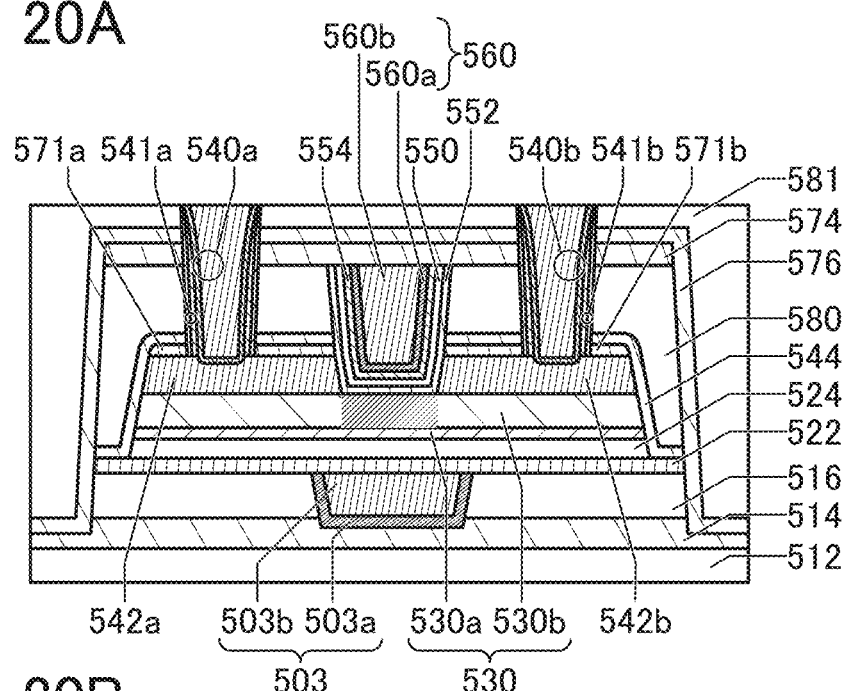
FIGS. 20A and 20B are schematic cross-sectional views showing a structure example of a transistor.
Figure 20B:
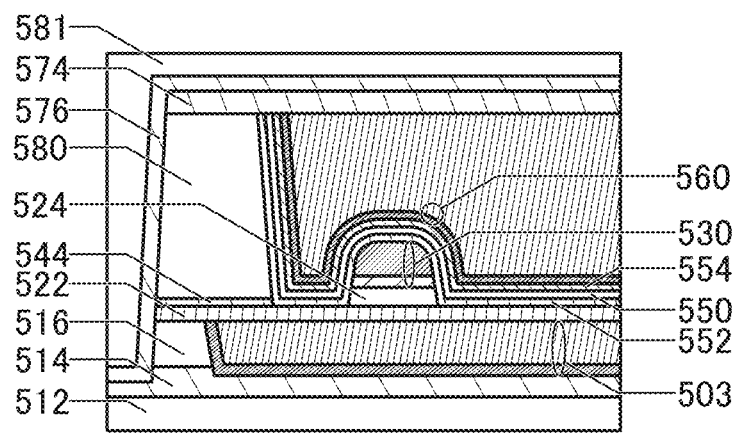

Here, details of the transistor 500 are described. FIGS. 20A and 20B show a structure example of the transistor 500 that is an OS transistor. FIG. 20A is a cross-sectional view of the OS transistor in the channel length direction, and FIG. 20B is a cross-sectional view of the OS transistor in the channel width direction.

As shown in FIGS. 20A and 20B, an insulator 514 and an insulator 516 are formed over the insulator 512.

The insulator 514 is preferably formed using a film having a barrier property inhibiting diffusion of impurities such as hydrogen from the substrate 310 or the region below the insulator 512 where circuit elements and the like are provided to the region where the transistor 500 is provided. Thus, the insulator 514 can be formed using silicon nitride deposited by a CVD method, for example.

The insulator 516 can be formed using a material similar to that for the insulator 512, for example.

As shown in FIGS. 20A and 20B, the transistor 500 includes the insulator 516 over the insulator 514; a conductor 503 (a conductor 503a and a conductor 503b) embedded in the insulator 514 or the insulator 516; an insulator 522 over the insulator 516 and the conductor 503; an insulator 524 over the insulator 522; an oxide 530a over the insulator 524; an oxide 530b over the oxide 530a; a conductor 542a over the oxide 530b; an insulator 571a over the conductor 542a; a conductor 542b over the oxide 530b; an insulator 571b over the conductor 542b; an insulator 552 over the oxide 530b; an insulator 550 over the insulator 552; an insulator 554 over the insulator 550; a conductor 560 (a conductor 560a and a conductor 560b) positioned over the insulator 554 and overlapping with part of the oxide 530b; and an insulator 544 positioned over the insulator 522, the insulator 524, the oxide 530a, the oxide 530b, the conductor 542a, the conductor 542b, the insulator 571a, and the insulator 571b. Here, as shown in FIGS. 20A and 20B, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of an insulator 580, and a bottom surface of the insulator 550. A top surface of the conductor 560 is positioned to be level with an upper portion of the insulator 554, an upper portion of the insulator 550, an upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening portion that reaches the oxide 530b is provided in the insulator 580 and the insulator 544. The insulator 552, the insulator 550, the insulator 554, and the conductor 560 are positioned inside the opening portion. In the channel length direction of the transistor 500, the conductor 560, the insulator 552, the insulator 550, and the insulator 554 are provided between the insulator 571a and conductor 542a and the insulator 571b and conductor 542b. The insulator 554 includes a region in contact with a side surface of the conductor 560 and a region in contact with a bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from the components formed below the oxide 530a.

Although the oxide 530 has a two-layer structure of the oxide 530a and the oxide 530b in the transistor 500, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode and the conductor 503 functions as a second gate (also referred to as a back gate) electrode. The insulators 552, 550, and 554 function as a first gate insulator, and the insulators 522 and 524 function as a second gate insulator. Note that a gate insulator is sometimes referred to as a gate insulating layer or a gate insulating film. The conductor 542a functions as one of a source and a drain, and the conductor 542b functions as the other of the source and the drain. A region of the oxide 530 overlapping with the conductor 560 at least partly functions as a channel formation region.

Figure 21A:
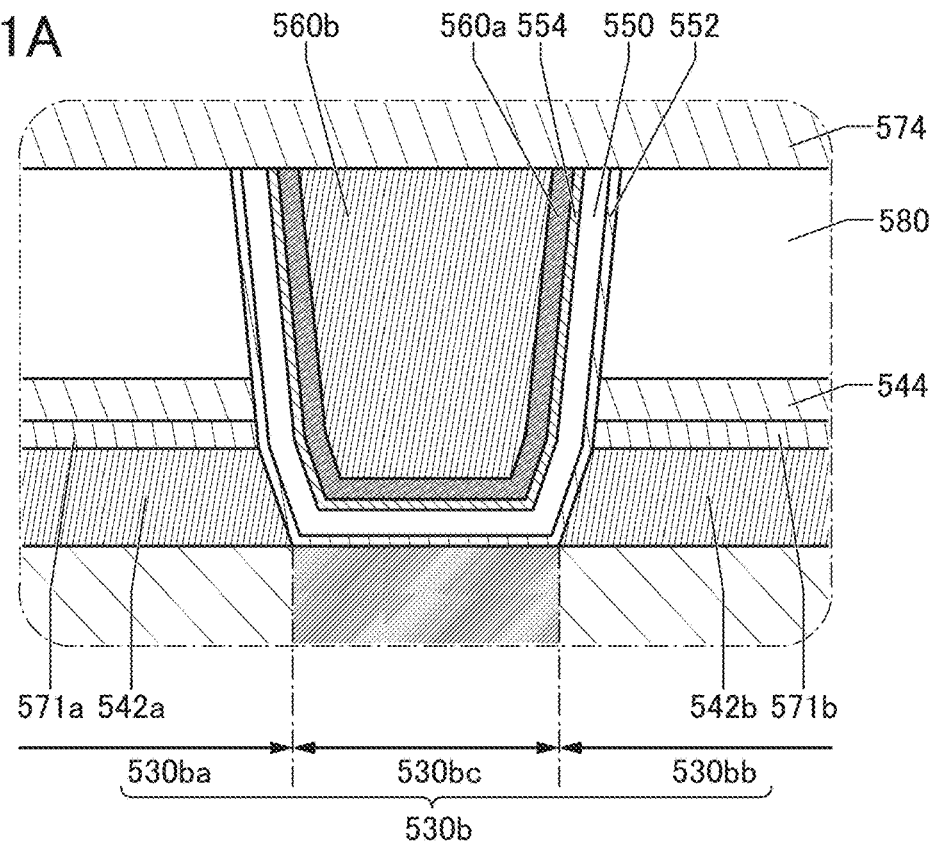
FIGS. 21A and 21B are schematic cross-sectional views each showing a structure example of a transistor.

FIG. 21A is an enlarged view of the vicinity of the channel formation region in FIG. 20A. Supply of oxygen to the oxide 530b forms the channel formation region in a region between the conductor 542a and the conductor 542b. Therefore, as illustrated in FIG. 21A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided in the region between the conductor 542a and the conductor 542b. The region 530ba is provided to overlap with the conductor 542a, and the region 530bb is provided to overlap with the conductor 542b.

The region 530bc functioning as the channel formation region contains fewer oxygen vacancies (an oxygen vacancy in a metal oxide is sometimes referred to as $V_O$ in this specification and the like) or a lower impurity concentration than the region 530ba and the region 530bb to have higher resistance and a lower carrier concentration. Thus, the region 530bc can be regarded as an i-type (intrinsic) or substantially i-type region.

When impurities or oxygen vacancies ($V_O$) are in a channel formation region of a metal oxide included in a transistor, electrical characteristics of the transistor easily vary and the reliability thereof may worsen. In some cases, hydrogen in the vicinity of an oxygen vacancy ($V_O$) forms a defect that is an oxygen vacancy ($V_O$) into which hydrogen enters (hereinafter sometimes referred to as $V_O H$), which generates an electron serving as a carrier. Therefore, when the channel formation region in the metal oxide includes oxygen vacancies, the transistor tends to have normally-on characteristics (a channel is generated even when no voltage is applied to a gate electrode and a current flows through the transistor). Therefore, the impurities, oxygen vacancies, and $V_O H$ are preferably reduced as much as possible in the channel formation region of the metal oxide.

The region 530ba and the region 530bb functioning as the source region and the drain region are each a low-resistance region with an increased carrier concentration because it includes many oxygen vacancies ($V_O$) or has a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{11}$ cm$^{-3}$, yet further preferably lower than $1 \times 10^{17}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or 530bb may be formed a region having a carrier concentration that is lower than or substantially equal to the carrier concentrations in the region 530ba and the region 530bb and higher than or substantially equal to the carrier concentration in the region 530bc. That is, the region functions as a junction region between the region 530bc and the region 530ba or 530bb. The hydrogen concentration in the junction region is sometimes lower than or substantially equal to the hydrogen concentrations in the region 530ba and the region 530bb and higher than or substantially equal to the hydrogen concentration in the region 530bc. The number of oxygen vacancies in the junction region is sometimes smaller than or substantially equal to the numbers of oxygen vacancies in the region 530ba and the region 530bb and larger than or substantially equal to the number of oxygen vacancies in the region 530bc.

Note that FIG. 21A illustrates an example in which the region 530ba, the region 530bb, and the region 530bc are formed in the oxide 530b; however, the present invention is not limited to this. For example, the above regions may be formed not only in the oxide 530b but also in the oxide 530a.

In the oxide 530, the boundaries between the regions are difficult to detect clearly in some cases. The concentrations of a metal element and impurity elements such as hydrogen and nitrogen, which are detected in each region, may be not only gradually changed between the regions, but also continuously changed in each region. That is, the region closer to the channel formation region preferably has lower concentrations of a metal element and impurity elements such as hydrogen and nitrogen.

In the transistor 500, the oxide 530 (the oxide 530a and the oxide 530b) which includes the channel formation region preferably contains a metal oxide functioning as a semiconductor (hereinafter also referred to as oxide semiconductor).

The metal oxide functioning as a semiconductor preferably has a band gap greater than or equal to 2 eV, further preferably greater than or equal to 2.5 eV. The use of such a metal oxide having a wide band gap can reduce the off-state current of the transistor.

For example, as the oxide 530, a metal oxide such as an In-M-Zn oxide containing indium, the element M, and zinc is preferably used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like. Alternatively, In—Ga oxide, In—Zn oxide, or indium oxide may be used as the oxide 530.

Here, the atomic ratio of In to the element M in the metal oxide used as the oxide 530b is preferably higher than that in the metal oxide used as the oxide 530a.

When the oxide 530a is provided under the oxide 530b in the above manner, impurities and oxygen can be inhibited from diffusing into the oxide 530b from the components formed below the oxide 530a.

The density of defect states at the interface between the oxide 530a and the oxide 530b can be made low when the oxide 530a and the oxide 530b contain the same element (as a main component) in addition to oxygen. Since the density of defect states at the interface between the oxides 530a and 530b can be decreased, the influence of interface scattering on carrier conduction is small, and a high on-state current can be obtained.

The oxide 530b preferably exhibits crystallinity. In particular, as the oxide 530b, a c-axis-aligned crystalline oxide semiconductor (CAAC-OS) is preferably used.

The CAAC-OS is a metal oxide having a dense structure with high crystallinity and few impurities and defects (e.g., oxygen vacancies ($V_O$)). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

By contrast, in the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

When impurities and oxygen vacancies are in a channel formation region of a metal oxide included in a transistor, electrical characteristics of the transistor easily vary and the reliability thereof may worsen. In some cases, hydrogen in the vicinity of an oxygen vacancy forms a defect that is an oxygen vacancy into which hydrogen enters (hereinafter sometimes referred to as $V_O H$), which generates an electron serving as a carrier. Therefore, when the channel formation region in the metal oxide includes oxygen vacancies, the transistor tends to have normally-on characteristics (a channel is generated even when no voltage is applied to a gate electrode and a current flows through the transistor). Therefore, the impurities, oxygen vacancies, and $V_OH$ are preferably reduced as much as possible in the channel formation region of the metal oxide. In other words, the metal oxide preferably includes an i-type (intrinsic) or substantially i-type channel formation region with a low carrier concentration.

By contrast, when an insulator containing oxygen that is released by heating (hereinafter, also referred to as excess oxygen) is provided in the vicinity of the metal oxide and heat treatment is performed, oxygen can be supplied from the insulator to the metal oxide so as to reduce oxygen vacancies and $V_OH$. Note that too much oxygen supplied to the source region or the drain region might decrease the on-state current or the field-effect mobility of the transistor 500. Furthermore, a variation in the amount of oxygen supplied to the source region or the drain region in the substrate plane leads to variable characteristics of the semiconductor device including the transistor.

Hence, the region 530*bc* functioning as the channel formation region in the metal oxide is preferably an i-type or substantially i-type region with a low carrier concentration, whereas the region 530*ba* and the region 530*bb* functioning as the source region and the drain region are preferably n-type regions with a high carrier concentration. That is, it is preferable that in the metal oxide, oxygen vacancies and $V_OH$ in the region 530*bc* be reduced and supply of too much oxygen to the region 530*ba* and the region 530*bb* be prevented.

Thus, in this embodiment, microwave treatment is performed in an atmosphere containing oxygen in a state where the conductor 542*a* and the conductor 542*b* are provided over the oxide 530*b* so that oxygen vacancies and $V_OH$ in the region 530*bc* are reduced. Here, the microwave treatment refers to, for example, treatment using an apparatus including a power source that generates high-density plasma with the use of a microwave.

The microwave treatment in an oxygen-containing atmosphere converts an oxygen gas into plasma using a microwave or a high-frequency wave such as RF and activates the oxygen plasma. At this time, the region 530*bc* can be irradiated with the microwave or the high-frequency wave such as RF. The effect of the plasma, the microwave, and the like enables $V_OH$ in the region 530*bc* to be cut off, hydrogen (H) to be removed from the region 530*bc*, and oxygen vacancies ($V_O$) to be filled with oxygen. That is, the reaction "$V_OH \rightarrow H+V_O$" occurs in the region 530*bc*, so that the hydrogen concentration in the region 530*bc* can be reduced. As a result, oxygen vacancies and $V_OH$ in the region 530*bc* can be reduced to lower the carrier concentration.

In the microwave treatment in an oxygen-containing atmosphere, the effect of the microwave, the high-frequency wave such as RF, the oxygen plasma, and the like is blocked by the conductor 542*a* and the conductor 542*b* and does not reach the region 530*ba* or the region 530*bb*. Furthermore, the effect of the oxygen plasma can be reduced by the insulator 571 and the insulator 580 which are provided to cover the oxide 530*b* and the conductor 542. Hence, a reduction in $V_OH$ and supply of too much oxygen do not occur in the region 530*ba* or the region 530*bb* during the microwave treatment, preventing a decrease in carrier concentration.

After formation of an insulating film to be the insulator 552 or an insulating film to be the insulator 550, microwave treatment is preferably performed in an oxygen-containing atmosphere. When such microwave treatment in an oxygen-containing atmosphere is performed with the insulating film to be the insulator 552 or the insulating film to be the insulator 550 being provided, oxygen can be efficiently injected into the region 530*bc*. The insulating film to be the insulator 552 that is provided in contact with a side surface of the conductor 542 and a surface of the region 530*bc* can inhibit excessive oxygen injection into the region 530*bc* and resultantly inhibit oxidation of the side surface of the conductor 542. It is also possible to inhibit oxidation of the side surface of the conductor 542 during formation of the insulating film to be the insulator 550.

Oxygen injected into the region 530*bc* can be in any of various forms such as an oxygen atom, an oxygen molecule, or an oxygen radical (also referred to as O radical which is an atom, a molecule, or an ion having an unpaired electron). Note that oxygen injected into the region 530*bc* is preferably in one or more of the above forms, and is favorably an oxygen radical. In this manner, the insulator 552 and the insulator 550 can have improved film quality, which increases the reliability of the transistor 500.

In the above manner, oxygen vacancies and $V_OH$ can be selectively removed from the region 530*bc* in the metal oxide, whereby the region 530*bc* can be an i-type or substantially i-type region. Furthermore, supply of an excess amount of oxygen to the region 530*ba* and the region 530*bb* functioning as the source region and the drain region can be inhibited and the state of the n-type regions before the microwave treatment can be maintained. As a result, a change in the electrical characteristics of the transistor 500 can be inhibited, and thus a variation in the electrical characteristics of the transistors 500 in the substrate plane can be reduced.

The above structure allows the semiconductor device to have a small variation in transistor characteristics. The semiconductor device can have high reliability. In addition, the semiconductor device can have favorable electrical characteristics.

As illustrated in FIG. 20B, a curved surface may be provided between the side and top surfaces of the oxide 530*b* in a cross-sectional view in the channel width direction of the transistor 500. In other words, the end portion of the side surface and the end portion of the top surface may be curved (hereinafter, such a shape is also referred to as a rounded shape).

The radius of curvature of the curved surface is preferably greater than 0 nm and less than the thickness of the oxide 530*b* in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 530*b* with the insulator 552, the insulator 550, the insulator 554, and the conductor 560.

The oxide 530 preferably has a stacked-layer structure of oxide layers with different chemical compositions. Specifically, the atomic ratio of the element M to a metal element that is the main component in the metal oxide used as the oxide 530*a* is preferably higher than that in the metal oxide used as the oxide 530*b*. Moreover, the atomic ratio of the element M to In in the metal oxide used as the oxide 530*a* is preferably higher than that in the metal oxide used as the oxide 530*b*. Moreover, the atomic ratio of In to the element M in the metal oxide used as the oxide 530*b* is preferably higher than that in the metal oxide used as the oxide 530*a*.

The oxide 530b is preferably an oxide having crystallinity, such as a CAAC-OS. An oxide having crystallinity, such as a CAAC-OS, has a dense structure with few impurities and defects (e.g., oxygen vacancies) and high crystallinity. Accordingly, extraction of oxygen from the oxide 530b by the source electrode or the drain electrode can be suppressed. This inhibits extraction of oxygen from the oxide 530b even when heat treatment is performed; hence, the transistor 500 is stable with respect to high temperatures in the manufacturing process (what is called thermal budget).

Here, the conduction band minimum is gradually varied at a junction portion of the oxide 530a and the oxide 530b. In other words, the conduction band minimum at the junction portion of the oxide 530a and the oxide 530b is continuously varied or continuously connected. To vary the conduction band minimum gradually, the density of defect states in a mixed layer formed at the interface between the oxide 530a and the oxide 530b is preferably made low.

Specifically, when the oxide 530a and the oxide 530b contain the same element as a main component in addition to oxygen, a mixed layer with a low density of defect states can be formed. For example, in the case where the oxide 530b is an In-M-Zn oxide, the oxide 530a may be an In-M-Zn oxide, a M-Zn oxide, an oxide of the element M, In—Zn oxide, indium oxide, or the like.

Specifically, as the oxide 530a, a metal oxide having an atomic ratio of InM:Zn=1:3:4 or a neighborhood thereof, or InM:Zn=1:1:0.5 or a neighborhood thereof may be used. As the oxide 530b, a metal oxide having an atomic ratio of In:M:Zn=1:1:1 or a neighborhood thereof, or In:Zn=4:2:3 or a neighborhood thereof may be used. Note that the neighborhood of an atomic ratio includes ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

Providing the insulator 552 formed of aluminum oxide or the like in contact with a top surface and a side surface of the oxide 530 as shown in FIG. 20A and the like might cause the indium contained in the oxide 530 to be unevenly distributed at the interface between the oxide 530 and the insulator 552 and its vicinity. In this case, the vicinity of a surface of the oxide 530 has an atomic ratio close to that of indium oxide or In—Zn oxide. Such an increase in the atomic ratio of indium in the vicinity of the surface of the oxide 530, especially the vicinity of a surface of the oxide 530b, can increase the field-effect mobility of the transistor 500.

The density of defect states at the interface between the oxide 530a and the oxide 530b can be made low when the oxide 530a and the oxide 530b have the aforementioned composition. This reduces the influence of interface scattering on carrier conduction, and the transistor 500 can have a high on-state current and high frequency characteristics.

At least one of the insulators 512, 514, 544, 571, 574, 576, and 581 preferably functions as a barrier insulating film that inhibits diffusion of impurities such as water and hydrogen from the substrate side or from above the transistor 500 into the transistor 500. Therefore, at least one of the insulators 512, 514, 544, 571, 574, 576, and 581 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material which does not easily transmit the impurities. Alternatively, it is preferable to use an insulating material having a function of inhibiting diffusion of oxygen (e.g., at least one of oxygen atoms, oxygen molecules, and the like), that is, an insulating material which does not easily transmit the oxygen.

An insulator having a function of inhibiting diffusion of impurities, such as water and hydrogen, and oxygen is preferably used for the insulators 512, 514, 544, 571, 574, 576, and 581: for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulators 512, 544, and 576. For example, aluminum oxide or magnesium oxide, which has high hydrogen-trapping and hydrogen-fixing capabilities, is preferably used for the insulators 514, 571, 574, and 581. Accordingly, impurities such as water and hydrogen can be inhibited from diffusing to the transistor 500 side from the substrate side through the insulators 512 and 514. Furthermore, impurities such as water and hydrogen can be inhibited from diffusing to the transistor 500 side from an interlayer insulating film and the like positioned outward from the insulator 581. In addition, oxygen contained in the insulator 524 and the like can be inhibited from diffusing to the substrate side through the insulators 512 and 514. Furthermore, oxygen contained in the insulator 580 and the like can be inhibited from diffusing to above the transistor 500 through the insulator 574 and the like. In this manner, the transistor 500 is preferably surrounded by the insulators 512, 514, 571, 544, 574, 576, and 581 having a function of inhibiting diffusion of oxygen and impurities such as water and hydrogen.

Here, an oxide including an amorphous structure is preferably used as the insulators 512, 514, 544, 571, 574, 576, and 581. For example, a metal oxide such as $AlO_x$ (x is a given number greater than 0) or $MgO_y$ (y is a given number greater than 0) is preferably used. In such a metal oxide including an amorphous structure, an oxygen atom has a dangling bond, and the metal oxide has a property of trapping or fixing hydrogen with the dangling bond in some cases. When such a metal oxide including an amorphous structure is used as the component of the transistor 500 or provided around the transistor 500, hydrogen in or around the transistor 500 can be trapped or fixed. In particular, hydrogen contained in the channel formation region of the transistor 500 is preferably trapped or fixed. When a metal oxide including an amorphous structure is used as the component of the transistor 500 or provided around the transistor 500, the transistor 500 and the semiconductor device with favorable characteristics and high reliability can be fabricated.

The insulators 512, 514, 544, 571, 574, 576, and 581 each preferably have an amorphous structure, but may partly include a region with a polycrystalline structure. Alternatively, the insulators 512, 514, 544, 571, 574, 576, and 581 may each have a multilayer structure including a layer with an amorphous structure and a layer with a polycrystalline structure. For example, a stacked-layer structure in which a layer with a polycrystalline structure is formed over a layer with an amorphous structure may be employed.

The insulators 512, 514, 544, 571, 574, 576, and 581 can be deposited by a sputtering method, for example. Since a deposition gas used in a sputtering method does not need to include a molecule containing hydrogen, the hydrogen concentration in the insulators 512, 514, 544, 571, 574, 576, and 581 can be reduced. Note that the deposition method is not limited to a sputtering method and may be appropriately selected from a chemical vapor deposition (CVD) method, a molecular beam epitaxy (MBE) method, a pulsed laser deposition (PLD) method, an atomic layer deposition (ALD) method, and the like.

The resistivity of the insulators 512, 544, and 576 is preferably low in some cases. For example, the insulators 512, 544, and 576 with a resistivity of approximately $1\times10^{13}$ $\Omega$cm can sometimes relieve charge buildup of the conductor 503, 542, or 560 in the treatment using plasma or the like in the manufacturing process of a semiconductor device. The resistivity of the insulators 512, 544, and 576 is preferably higher than or equal to $1\times10^{10}$ $\Omega$cm and lower than or equal to $1\times10^{15}$ $\Omega$cm.

The insulators 516, 574, 580, and 581 preferably have a lower dielectric constant than the insulator 514. When a material with a low dielectric constant is used for an interlayer film, the parasitic capacitance generated between wirings can be reduced. For the insulators 516, 580, and 581, silicon oxide, silicon oxynitride, silicon oxide to which fluorine is added, silicon oxide to which carbon is added, silicon oxide to which carbon and nitrogen are added, or porous silicon oxide, is used as appropriate, for example.

The insulator 581 preferably functions as an interlayer film and a planarization film.

The conductor 503 is provided to overlap with the oxide 530 and the conductor 560. The conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a side wall of the above opening. The conductor 503b is provided so as to be embedded in a recessed portion formed in the conductor 503a. Here, an upper portion of the conductor 503b is substantially level with upper portions of the conductor 503a and the insulator 516.

Here, the conductor 503a is preferably formed using a conductive material which has a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 503a is preferably formed using a conductive material having a function of inhibiting diffusion of oxygen (e.g., at least one of oxygen atoms and oxygen molecules).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When a conductive material having a function of inhibiting oxygen diffusion is used for the conductor 503a, a reduction in conductivity of the conductor 503b due to oxidation of the conductor 503b can be inhibited. As the conductive material having a function of inhibiting oxygen diffusion, for example, titanium, titanium nitride, tantalum, tantalum nitride, ruthenium, or ruthenium oxide is preferably used. Thus, the conductor 503a may be a single layer or a stacked layer of the above conductive materials. For example, titanium nitride may be used for the conductor 503a.

Furthermore, the conductor 503b is preferably formed using a conductive material containing tungsten, copper, or aluminum as its main component. For example, tungsten may be used for the conductor 503b.

The conductor 503 functions as the second gate electrode in some cases. In that case, by changing a potential applied to the conductor 503 independently of a potential applied to the conductor 560, the threshold voltage ($V_{th}$) of the transistor 500 can be controlled. In particular, when a negative potential is applied to the conductor 503, the $V_{th}$ of the transistor 500 can be higher to reduce the off-state current of the transistor. Thus, a drain current when a potential applied to the conductor 560 is 0 V can be smaller in the case where a negative potential is applied to the conductor 503 than in the case where the negative potential is not applied to the conductor 503.

In the case where the oxide 530 is a highly purified intrinsic oxide from which as many impurities are eliminated as possible, the transistor 500 might be able to have normally-off characteristics (have a threshold voltage higher than 0 V) with no application of a potential to the conductor 503 and/or the conductor 560. In this case, the conductor 560 and the conductor 503 are preferably connected to each other to be supplied with the same potential.

The resistivity of the conductor 503 is designed in consideration of the potential applied to the conductor 503, and the thickness of the conductor 503 is determined in accordance with the resistivity. The thickness of the insulator 516 is substantially equal to that of the conductor 503. The conductor 503 and the insulator 516 are preferably as thin as possible in the allowable range of the design of the conductor 503. The insulator 516 with a reduced thickness contains a smaller absolute amount of impurity such as hydrogen, inhibiting the diffusion of the impurity into the oxide 530.

When seen from above, the conductor 503 is preferably larger than the region of the oxide 530 not overlapping with the conductor 542a or the conductor 542b. It is particularly preferable that the conductor 503 extend beyond the end portions in the channel width direction of the oxides 530a and 530b, as illustrated in FIG. 20B. That is, the conductor 503 and the conductor 560 preferably overlap with each other with the insulator positioned therebetween, in a region beyond a side surface of the oxide 530 in the channel width direction. With this structure, the channel formation region in the oxide 530 can be electrically surrounded by electric fields of the conductor 560 functioning as the first gate electrode and the conductor 503 functioning as the second gate electrode. In this specification, such a transistor structure in which a channel formation region is electrically surrounded by the electric fields of a first gate and a second gate is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a fin-type structure and a planar structure. With the S-channel structure, resistance to a short-channel effect can be enhanced, that is, a transistor in which a short-channel effect is less likely to occur can be provided.

In the transistor 500 having normally-off characteristics and the above-described S-channel structure, the channel formation region can be electrically surrounded. Accordingly, the transistor 500 can be regarded as having agate-all-around (GAA) structure or a lateral gate-all-around (LGAA) structure. In the transistor 500 having any of the S-channel structure, GAA structure, and LGAA structure, the channel formation region that is usually provided at the interface between the oxide 530 and the gate insulating film or in the vicinity of the interface spreads throughout the entire bulk of the oxide 530. In other words, the transistor 500 having any of the S-channel structure, GAA structure, and LGAA structure can be regarded as having what is called a bulk-flow structure, in which the entire bulk is used as a carrier path. A transistor with a bulk-flow structure can have an increased current density and thus can be expected to have an increased on-state current or an increased field-effect mobility.

As illustrated in FIG. 20B, the conductor 503 is extended to have a function of a wiring. However, without limitation to this structure, a structure in which a conductor functioning as a wiring is provided under the conductor 503 may be employed. In addition, the conductor 503 is not necessarily provided in each transistor. For example, the conductor 503 may be shared by a plurality of transistors.

Although the conductor 503 is the stack of the conductor 503a and the conductor 503b in the transistor 500, the present invention is not limited thereto. For example, the conductor 503 may have a single-layer structure or a stacked-layer structure of three or more layers.

The insulators 522 and 524 function as the gate insulator.

The insulator 522 preferably has a function of inhibiting diffusion of hydrogen (e.g., at least one of hydrogen atoms, hydrogen molecules, and the like). The insulator 522 also preferably has a function of inhibiting diffusion of oxygen (e.g., at least one of oxygen atoms and oxygen molecules). For example, the insulator 522 preferably has a function of inhibiting diffusion of much hydrogen and/or oxygen compared to the insulator 524.

As the insulator 522, an insulator containing an oxide of aluminum and/or hafnium, which is an insulating material, is preferably used. As the insulator, aluminum oxide, hafnium oxide, an oxide containing aluminum and hafnium (hafnium aluminate), or the like is preferably used. The insulator 522 formed of such a material functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. In addition, the conductor 503 can be inhibited from reacting with oxygen in the insulator 524 or the oxide 530.

Alternatively, one or more materials selected from aluminum oxide, bismuth oxide, germanium oxide, niobium oxide, silicon oxide, titanium oxide, tungsten oxide, yttrium oxide, and zirconium oxide may be added to the above insulator, for example. Alternatively, the above insulator to which one or more of the materials are added may be subjected to nitriding treatment. The insulator 522 may have a stacked-layer structure including silicon oxide, silicon oxynitride, or silicon nitride over the above insulator to which one or more of the materials are added.

The insulator 522 may be a single layer or stacked layers of an insulator containing what is called a high-k material such as aluminum oxide, hafnium oxide, tantalum oxide, or zirconium oxide, for example. As miniaturization and high integration of transistors progress, a problem such as a leakage current may arise because of a thinner gate insulator. When a high-k material is used for the insulator functioning as a gate insulator, a gate potential at the time of operation of the transistor can be reduced while the physical thickness is maintained. The insulator 522 can be formed using a high-dielectric-constant substance such as lead zirconate titanate (PZT), strontium titanate ($SrTiO_3$), or $(Ba,Sr)TiO_3$ (BST) in some cases.

The insulator 524 in contact with the oxide 530 is formed using, for example, silicon oxide or silicon oxynitride as appropriate.

In a manufacturing process of the transistor 500, the heat treatment is preferably performed with the surface of the oxide 530 exposed. The heat treatment is performed at a temperature higher than or equal to 100° C. and lower than or equal to 600° C., preferably higher than or equal to 350° C. and lower than or equal to 550° C., for example. The heat treatment is performed in a nitrogen gas atmosphere, an inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O+O\rightarrow$null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulators 522 and 524 may each have a stacked-layer structure of two or more layers. In that case, without limitation to a stacked-layer structure formed of the same material, a stacked-layer structure formed of different materials may be employed. The insulator 524 may be formed into an island shape overlapping with the oxide 530a. In that case, the insulator 544 is in contact with the side surface of the insulator 524 and the top surface of the insulator 522.

The conductors 542a and 542b are provided in contact with the top surface of the oxide 530b. The conductors 542a and 542b function as the source electrode and the drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are a conductive material that is not easily oxidized or a material that maintains the conductivity even when absorbing oxygen.

Note that hydrogen contained in the oxide 530b or the like diffuses into the conductor 542a or 542b in some cases. In particular, when a nitride containing tantalum is used for the conductors 542a and 542b, hydrogen contained in the oxide 530b or the like is likely to be diffused into the conductor 542a or 542b, and the diffused hydrogen is bonded to nitrogen contained in the conductor 542a or 542b in some cases. That is, hydrogen contained in the oxide 530b or the like is sometimes absorbed by the conductor 542a or 542b in some cases.

No curved surface is preferably formed between the side surface of the conductor 542 and a top surface of the conductor 542. Without the curved surface, the conductor 542 can have a large cross-sectional area in the channel width direction. Accordingly, the conductivity of the conductor 542 and the on-state current of the transistor 500 can be increased.

The insulator 571a is provided in contact with a top surface of the conductor 542a, and the insulator 571b is provided in contact with a top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting oxygen diffusion more than the insulator 580. For example, a nitride containing silicon such as silicon nitride may be used for the insulator 571. The insulator 571 preferably has a function of trapping impurities such as hydrogen. In that case, for the insulator 571, a metal oxide including an amorphous structure, for example, an insulator such as aluminum oxide or magnesium oxide including an amorphous structure is used. It is particularly preferable that the insulator 571 be formed using aluminum oxide including an amorphous structure or aluminum oxide with an amorphous structure, which might allow more effective hydrogen trapping or hydrogen fixing. Accordingly, the transistor 500 and the semiconductor device with favorable characteristics and high reliability can be fabricated.

The insulator 544 is provided to cover the insulator 524, the oxide 530a, the oxide 530b, the conductor 542, and the insulator 571. The insulator 544 preferably has a function of trapping and fixing hydrogen. In that case, the insulator 544 preferably includes silicon nitride or a metal oxide including an amorphous structure, for example, an insulator such as aluminum oxide or magnesium oxide including an amorphous structure. The insulator 544 may be a stacked-layer film of aluminum oxide and silicon nitride over the aluminum oxide, for example.

When the above insulators 571 and 544 are provided, the conductor 542 can be surrounded by the insulators having a barrier property against oxygen. That is, oxygen contained in the insulators 524 and 580 can be prevented from diffusing into the conductor 542. As a result, the conductor 542 can be inhibited from being directly oxidized by oxygen contained in the insulators 524 and 580, so that an increase in resistivity and a reduction in an on-state current can be inhibited.

The insulator 552 functions as part of the gate insulator. The insulator 552 is preferably a barrier insulating film against oxygen. Any of the above-described insulators that can be used as the insulator 574 is used as the insulator 552. As the insulator 552, an insulator containing an oxide of aluminum and/or hafnium is preferably used. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used as the insulator 552. In this case, the insulator 552 contains at least oxygen and aluminum.

As shown in FIG. 20B, the insulator 552 is provided in contact with the top surface and side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having an oxygen barrier property can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_OH$ formed in the region 530bc can be reduced. As a result, the electrical characteristics and reliability of the transistor 500 can be improved.

Even when an excessive amount of oxygen is contained in the insulator 580, the insulator 550, and the like, the oxygen can be inhibited from being excessively supplied to the oxide 530a and the oxide 530b. It is thus possible to inhibit excessive oxidation of the region 530ba and the region 530bb due to oxygen penetrating the region 530bc, which would reduce the on-state current or field-effect mobility of the transistor 500.

As shown in FIG. 20A, the insulator 552 is provided in contact with the side surfaces of the conductor 542, the insulator 544, the insulator 571, and the insulator 580. This can inhibit oxidation of the side surface of the conductor 542 and resultant formation of an oxide film on the side surface. It is thus possible to inhibit a reduction in the on-state current or field-effect mobility of the transistor 500.

The insulator 552 needs to be provided in the opening that is formed in the insulator 580 and the like, together with the insulator 554, the insulator 550, and the conductor 560. To miniaturize the transistor 500, the insulator 552 preferably has a small thickness. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that these minimum and maximum values can be combined with each other. In such a case, the insulator 552 at least partly has a region with the above thickness. The thickness of the insulator 552 is preferably smaller than that of the insulator 550. In this case, the insulator 552 at least partly has a region whose thickness is smaller than that of the insulator 550.

To have such a small thickness, the insulator 552 is preferably formed by an ALD method. In an ALD method, a first source gas for reaction (hereinafter, referred to as a precursor or a metal precursor) and a second source gas for reaction (hereinafter, referred to as a reactant, an oxidizer, or a non-metal precursor) are alternately introduced into a chamber, and then the source gas introduction is repeated. As examples of the ALD method, a thermal ALD method, in which a precursor and a reactant react with each other only by a thermal energy, and a plasma-enhanced ALD (PEALD) method, in which a reactant excited by plasma is used, can be given. The use of plasma is sometimes preferable because deposition at a lower temperature is possible in a PEALD method.

In an ALD method, one atomic layer can be deposited at a time using self-regulating characteristics of atoms. Hence, an ALD method has various advantages such as deposition of an extremely thin film, deposition on a component with a high aspect ratio, deposition of a film with few defects such as pinholes, deposition with excellent coverage, and low-temperature deposition. These advantages enable the insulator 552 to have a small thickness as described above and to be formed with favorable coverage over, for example, a side surface of the opening formed in the insulator 580 and the like.

Note that a precursor used in the ALD method sometimes contains carbon or the like. Thus, a film formed by the ALD method may contain impurities such as carbon in a larger amount than a film formed by another deposition method. Note that impurities can be quantified by secondary ion mass spectrometry (SIMS) or X-ray photoelectron spectroscopy (XPS).

The insulator 550 functions as part of the gate insulator. The insulator 550 is preferably in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. In this case, the insulator 550 contains at least oxygen and silicon.

In the insulator 550, the concentration of impurities such as water and hydrogen is preferably reduced as in the insulator 524. It is preferable that the minimum value of the thickness of the insulator 550 be 1 nm or 0.5 nm and the maximum value thereof be 15 nm or 20 nm. Note that these minimum and maximum values can be combined with each other. The thickness of the insulator 550 is preferably greater than or equal to 0.5 nm and less than or equal to 20 nm, further preferably greater than or equal to 1 nm and less than or equal to 15 nm. In such a case, the insulator 550 at least partly has a region with the above thickness.

Although the insulator 550 has a single-layer structure in FIGS. 20A and 20B and the like, the present invention is not limited to the example and the insulator 550 may have a stacked-layer structure including two or more layers. For example, as shown in FIG. 21B, the insulator 550 may have a two-layer structure of an insulator 550*a* and an insulator 550*b* over the insulator 550*a*.

Figure 21B:
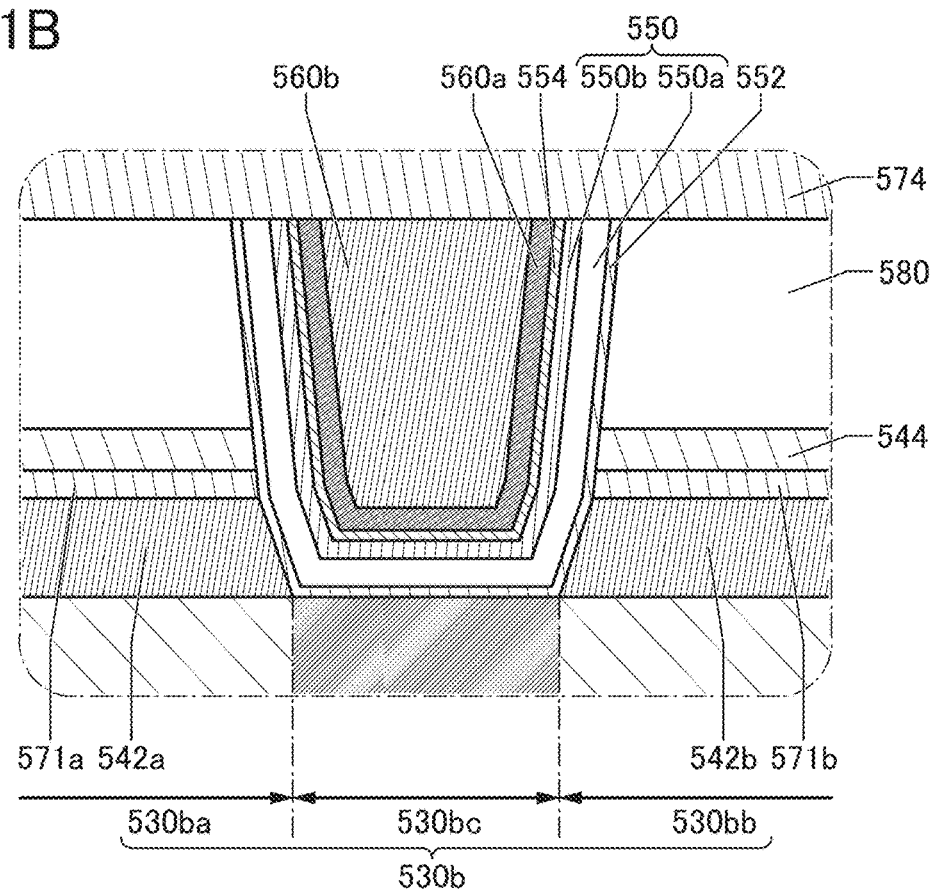

In the case where the insulator 550 has a two-layer structure as shown in FIG. 21B, it is preferable that the lower insulator 550*a* be formed using an insulator that easily transmits oxygen and the upper insulator 550*b* be formed using an insulator having a function of inhibiting oxygen diffusion. This structure can inhibit diffusion of oxygen contained in the insulator 550*a* into the conductor 560. That is, a reduction in the amount of oxygen supplied to the oxide 530 can be inhibited. Moreover, oxidation of the conductor 560 due to oxygen contained in the insulator 550*a* can be inhibited. For example, it is preferable that the insulator 550*a* be formed using any of the above-described materials that can be used for the insulator 550 and the insulator 550*b* be formed using an insulator containing an oxide of aluminum and/or hafnium. The insulator can be aluminum oxide or hafnium oxide. Alternatively, the insulator can be an oxide containing aluminum and hafnium (hafnium aluminate) or an oxide containing hafnium and silicon (hafnium silicate). In this embodiment, hafnium oxide is used for the insulator 550*b*. In this case, the insulator 550*b* contains at least oxygen and hafnium. The thickness of the insulator 550*b* is preferably greater than or equal to 0.5 nm or greater than or equal to 1.0 nm, and less than or equal to 3.0 nm or less than or equal to 5.0 nm. Note that these minimum and maximum values can be combined with each other. In such a case, the insulator 550*b* at least partly has a region with the above thickness.

In the case where silicon oxide, silicon oxynitride, or the like is used for the insulator 550*a*, the insulator 550*b* may be formed using an insulating material that is a high-k material having a high dielectric constant. The gate insulator having a stacked-layer structure of the insulator 550*a* and the insulator 550*b* can be thermally stable and can have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced. As a result, the insulator 550 can have a high withstand voltage.

The insulator 554 functions as part of the gate insulator. The insulator 554 is preferably a barrier insulating film against hydrogen. In this case, impurities contained in the conductor 560, such as hydrogen, can be prevented from being diffused into the insulator 550 and the oxide 530*b*. Any of the above-described insulators that can be used as the insulator 576 is used as the insulator 554. For example, silicon nitride deposited by a PEALD method can be used for the insulator 554. In this case, the insulator 554 contains at least nitrogen and silicon.

The insulator 554 may also have an oxygen barrier property. In this case, oxygen contained in the insulator 550 can be inhibited from being diffused into the conductor 560.

The insulator 554 needs to be provided in the opening that is formed in the insulator 580 and the like, together with the insulator 552, the insulator 550, and the conductor 560. To miniaturize the transistor 500, the insulator 554 preferably has a small thickness. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that these minimum and maximum values can be combined with each other. In such a case, the insulator 554 at least partly has a region with the above thickness. The thickness of the insulator 554 is preferably smaller than that of the insulator 550. In this case, the insulator 554 at least partly has a region whose thickness is smaller than that of the insulator 550.

The conductor 560 functions as the first gate electrode of the transistor 500. The conductor 560 preferably includes the conductor 560*a* and the conductor 560*b* over the conductor 560*a*. For example, the conductor 560*a* is preferably positioned to cover the bottom surface and the side surface of the conductor 560*b*. As shown in FIGS. 20A and 20B, the top surface of the conductor 560 is substantially level with the upper portion of the insulator 550. Note that although shown as having a two-layer structure of the conductor 560*a* and the conductor 560*b* in FIGS. 20A and 20B, the conductor 560 can have, besides the two-layer structure, a single-layer structure or a stacked-layer structure of three or more layers.

The conductor 560*a* is preferably formed using a conductive material which has a function of inhibiting diffusion of impurities such as hydrogen atoms, hydrogen molecules, water molecules, nitrogen atoms, nitrogen molecules, nitrogen oxide molecules, and copper atoms. Alternatively, the conductor 560*a* is preferably formed using a conductive material having a function of inhibiting diffusion of oxygen (e.g., at least one of oxygen atoms and oxygen molecules).

When the conductor 560*a* has a function of inhibiting oxygen diffusion, it is possible to prevent a reduction in conductivity of the conductor 560*b* due to oxidation of the conductor 560*b* caused by oxygen in the insulator 550. As the conductive material having a function of inhibiting oxygen diffusion, for example, titanium, titanium nitride, tantalum, tantalum nitride, ruthenium, or ruthenium oxide is preferably used.

The conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. In this manner, the conductor 560 can surely be provided in the region between the conductor 542a and the conductor 542b without alignment.

As shown in FIG. 20B, in the channel width direction of the transistor 500, the level of the bottom surface of the conductor 560 in a region where the conductor 560 and the oxide 530b do not overlap with each other is preferably lower than the level of a bottom surface of the oxide 530b, with the level of a bottom surface of the insulator 522 as a reference. When the conductor 560 functioning as the gate electrode covers side and top surfaces of the channel formation region in the oxide 530b with the insulator 550 and the like therebetween, the electric field of the conductor 560 is likely to affect the entire channel formation region in the oxide 530b. Hence, the transistor 500 can have a higher on-state current and higher frequency characteristics. The difference between the level of the bottom surface of the conductor 560 in the region where the oxides 530a and 530b do not overlap with the conductor 560 and the level of the bottom surface of the oxide 530b, with the level of the bottom surface of the insulator 522 as a reference, is preferably greater than or equal to 0 nm, greater than or equal to 3 nm, or greater than or equal to 5 nm, and less than or equal to 20 nm, less than or equal to 50 nm, or less than or equal to 100 nm. Note that these minimum and maximum values can be combined with each other.

The insulator 580 is provided over the insulator 544, and the opening is formed in a region where the insulator 550 and the conductor 560 are provided. In addition, the top surface of the insulator 580 may be planarized.

The insulator 580 functioning as an interlayer film preferably has a low dielectric constant. When a material with a low dielectric constant is used for the interlayer film, the parasitic capacitance generated between wirings can be reduced. The insulator 580 is preferably formed using a material similar to that used for the insulator 516, for example. Silicon oxide and silicon oxynitride are particularly preferable because of their thermal stability. Silicon oxide, silicon oxynitride, and porous silicon oxide are particularly preferable because a region containing oxygen that is released by heating can be easily formed in these materials.

The concentration of impurities such as water and hydrogen in the insulator 580 is preferably reduced. For example, an oxide containing silicon such as silicon oxide or silicon oxynitride can be used for the insulator 580, as appropriate.

The insulator 574 preferably functions as a barrier insulating film that inhibits impurities such as water and hydrogen from diffusing into the insulator 580 from above and also has a function of trapping impurities such as hydrogen. The insulator 574 preferably functions as a barrier insulating film for inhibiting transmission of oxygen. For the insulator 574, a metal oxide including an amorphous structure, for example, an insulator such as aluminum oxide including an amorphous structure can be used. In this case, the insulator 574 contains at least oxygen and aluminum. The insulator 574, which has a function of trapping impurities such as hydrogen, is provided in contact with the insulator 580 in a region interposed between the insulator 512 and the insulator 581, whereby impurities such as hydrogen contained in the insulator 580 and the like can be trapped and the amount of hydrogen in the region can be suppressed to a certain value. It is particularly preferable that the insulator 574 be formed using aluminum oxide including an amorphous structure, which might allow more effective hydrogen trapping or hydrogen fixing. Accordingly, the transistor 500 and the semiconductor device with favorable characteristics and high reliability can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. A silicon nitride film as the insulator 576 can have a high density when formed by a sputtering method. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that the conductor 540a, the conductor 540b, and the like may function as wirings for electrical connection to the light-emitting device 150 and the like provided thereabove. In the display apparatus 100B in FIG. 19, the conductor 540a, the conductor 540b, and the like may function as wirings for electrical connection to the transistor 300 and the like. Note that in this specification and the like, the conductors 540a and 540b are collectively referred to as the conductor 540.

The conductor 540a is provided in a region overlapping with the conductor 542a, for example. Specifically, an opening portion is provided in the insulator 571, the insulator 544, the insulator 580, the insulator 574, the insulator 576, and the insulator 581 shown in FIG. 20A in the region overlapping with the conductor 542a, and the conductor 540a is provided inside the opening portion. The conductor 540b is provided in a region overlapping with the conductor 542b, for example. Specifically, an opening portion is provided in the insulator 571, the insulator 544, the insulator 580, the insulator 574, the insulator 576, and the insulator 581 shown in FIG. 20A in the region overlapping with the conductor 542b, and the conductor 540b is provided inside the opening portion.

As shown in FIG. 20A, an insulator 541a having an impurity barrier property may be provided between the conductor 540a and a side surface of the opening portion in the region overlapping with the conductor 542a. In a similar manner, an insulator 541b having an impurity barrier property may be provided between the conductor 540b and a side surface of the opening portion in the region overlapping with the conductor 542b. Note that in this specification and the like, the insulators 541a and 541b are collectively referred to as the insulator 541.

The conductors 540a and 540b are preferably formed using a conductive material containing tungsten, copper, or aluminum as its main component. The conductors 540a and 540b may have a stacked-layer structure.

In the case where the conductor 540 has a stacked-layer structure, a conductive material having a function of inhibiting transmission of impurities such as water and hydrogen is preferably used for a first conductor in the vicinity of the insulator 574, the insulator 576, the insulator 581, the insulator 580, the insulator 544, and the insulator 571. For example, tantalum, tantalum nitride, titanium, titanium nitride, ruthenium, or ruthenium oxide is preferably used. The conductive material having a function of inhibiting transmission of impurities such as water and hydrogen can be used as a single layer or stacked layers. Furthermore, impurities such as water and hydrogen contained in the components above the insulator 576 can be inhibited from entering the oxide 530 through the conductors 540a and 540b.

The insulators 541a and 541b are formed using any of the barrier insulating films that can be used for the insulator 544, for example. An insulator such as silicon nitride, aluminum oxide, or silicon nitride oxide may be used as the insulators 541a and 541b, for example. Since the insulators 541a and 541b are provided in contact with the insulators 574, 576, and 571, impurities such as water and hydrogen contained in the insulator 580 or the like can be inhibited from entering the oxide 530 through the conductors 540a and 540b. Silicon nitride is particularly preferable because of its high blocking property against hydrogen. Furthermore, oxygen contained in the insulator 580 can be prevented from being absorbed by the conductors 540a and 540b.

In the case where the insulators 541a and 541b each have a stacked-layer structure as shown in FIG. 20A, a first insulator that is in contact with an inner wall of the opening provided in the insulator 580 and the like and a second insulator inside the first insulator are preferably a barrier insulating film against oxygen and a barrier insulating film against hydrogen.

For example, aluminum oxide deposited by an ALD method is used as the first insulator and silicon nitride deposited by a PEALD method is used as the second insulator. Such a structure can inhibit oxidation of the conductor 540 and reduce entry of hydrogen into the conductor 540.

Although the first insulator of the insulator 541 and the second insulator of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

The transistor included in the semiconductor device of one embodiment of the present invention does not necessarily have the structure of the transistor 500 shown in FIGS. 20A and 20B. The structure of the transistor included in the semiconductor device of one embodiment of the present invention may be changed in accordance with circumstances.

An insulator 111 is provided above the transistor 500.

An insulator having a function of inhibiting diffusion of impurities, such as water and hydrogen, and oxygen is preferably used for the insulator 111; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 111. For example, aluminum oxide or magnesium oxide, which has high hydrogen-trapping and hydrogen-fixing capabilities, is preferably used for the insulator 111.

The insulator 111 is preferably a film with high planarity. In this case, an organic material such as an acrylic resin or a polyimide can be used for the insulator 111, for example.

The light-emitting devices 150a to 150c are provided above the insulator 111.

Here, the light-emitting devices 150a to 150c are described.

The light-emitting device described in this embodiment is a self-luminous light-emitting device such as an organic EL element (also referred to as an organic light-emitting diode (OLED)). Note that the light-emitting device electrically connected to a pixel circuit can be a self-luminous light-emitting device such as a light-emitting diode (LED), a micro LED, a quantum-dot light-emitting diode (QLED), or a semiconductor laser.

Over the insulator 111 are provided a conductor 121a, a conductor 121b, and a conductor 121c functioning as respective pixel electrodes of the light-emitting devices 150a, 150b, and 150c. In FIG. 19, none of the conductors 121a to 121c is provided over part of the insulator 111. Note that in this specification and the like, the conductors 121a to 121c are collectively referred to as the conductor 121 in some cases.

The conductors 121a to 121c can be formed in such a manner that, for example, a conductive film is formed over the insulator 111 and the conductive film is subjected to a patterning step, an etching step, or the like.

The conductors 121a to 121c function as anodes of the light-emitting devices 150a to 150c of the display apparatus 100B, for example.

The conductors 121a to 121c can be formed using indium tin oxide (sometimes referred to as ITO), for example.

Each of the conductors 121a to 121c may have a stacked-layer structure of two or more layers instead of a single-layer structure. For example, the first conductor can be formed using a conductor with high visible-light reflectance and the uppermost conductor can be formed using a conductor with a high light-transmitting property. Examples of a conductor with high visible-light reflectance include silver, aluminum, and an alloy of silver (Ag), palladium (Pd), and copper (Cu)(Ag—Pd—Cu (APC)). Examples of a conductor with a high light-transmitting property include indium tin oxide described above. The conductors 121a to 121c can each be a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

An insulator 112 is provided over the insulator 111, the conductor 121a, the conductor 121b, and the conductor 121c. In FIG. 19, the insulator 112 is provided only partly over the conductor 121a, the conductor 121b, and the conductor 121c. The insulator 112 can be provided in such a manner that, for example, an insulating film to be the insulator 112 is formed over the insulator 111 and the conductors 121a to 121c, and the insulating film is subjected to patterning by a photolithography method or the like to be provided with opening portions reaching the conductors 121a to 121c in the regions overlapping with the conductors 121a to 121c.

The insulator 112 can be formed using an inorganic film with an insulating property, for example. For the inorganic film with an insulating property, silicon oxide, silicon oxynitride, silicon nitride oxide, silicon nitride, aluminum oxide, aluminum oxynitride, aluminum nitride oxide, or aluminum nitride can be used, for example.

Alternatively, the insulator 112 may be formed using an organic film with an insulating property. Examples of the organic film that can be used for the insulator 112 include a polyimide film.

The insulator 112 may have a multilayer structure. Specifically, the insulator 112 may have a multilayer structure in which the first layer is the aforementioned organic film and the second layer is the aforementioned inorganic film.

An EL layer 141*a* is provided over the insulator 112 and the conductor 121*a*. An EL layer 141*b* is provided over the insulator 112 and the conductor 121*b*. An EL layer 141*c* is provided over the insulator 112 and the conductor 121*c*. Note that none of the EL layers 141*a* to 141*c* is provided over part of the insulator 112 in FIG. 19.

The EL layers 141*a* to 141*c* preferably include light-emitting layers emitting light of different colors. For example, the EL layer 141*a* can include a blue (B)-light-emitting layer, the EL layer 141*b* can include a green (G)-light-emitting layer, and the EL layer 141*c* can include a red (R)-light-emitting layer. The display apparatus 100B may have such an SBS structure in which light-emitting layers for respective colors are provided over a plurality of pixel electrodes (the conductors 121*a* to 121*c*).

Note that the combination of the colors of light emitted by the light-emitting layers of the EL layers 141*a* to 141*c* is not limited to the above example, and cyan, magenta, yellow, or the like may also be used. The number of colors of light emitted by the light-emitting devices 150 of the display apparatus 100B, which is three in the above example, may be two or four or more.

The EL layers 141*a* to 141*c* may each include one or more of an electron-injection layer, an electron-transport layer, a hole-injection layer, and a hole-transport layer in addition to a layer containing a light-emitting organic compound (the light-emitting layer).

The EL layers 141*a* to 141*c* can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Figure 22A:
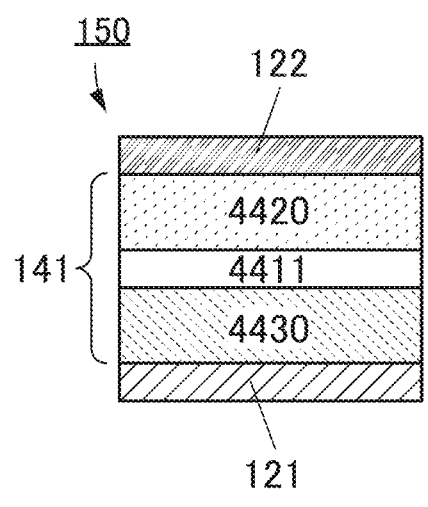
FIGS. 22A to 22C are schematic views each showing a structure example of a light-emitting device.

Like the light-emitting device 150 shown in FIG. 22A, the light-emitting devices 150*a* to 150*c* in FIG. 19 can include a plurality of layers such as a layer 4420, a light-emitting layer 4411, and a layer 4430.

The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes (the conductor 121 and a later-described conductor 122), can function as a single light-emitting unit, and the structure in FIG. 22A is referred to as a single structure in this specification and the like.

Figure 22B:
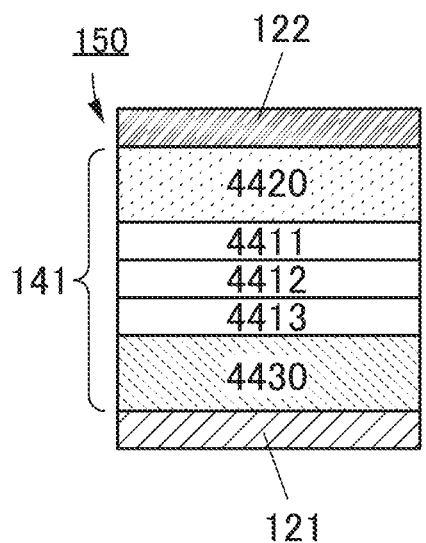

Note that the structure in which a plurality of light-emitting layers (light-emitting layers 4411, 4412, and 4413) are provided between the layer 4420 and the layer 4430 as illustrated in FIG. 22B is another variation of the single structure.

Figure 22C:
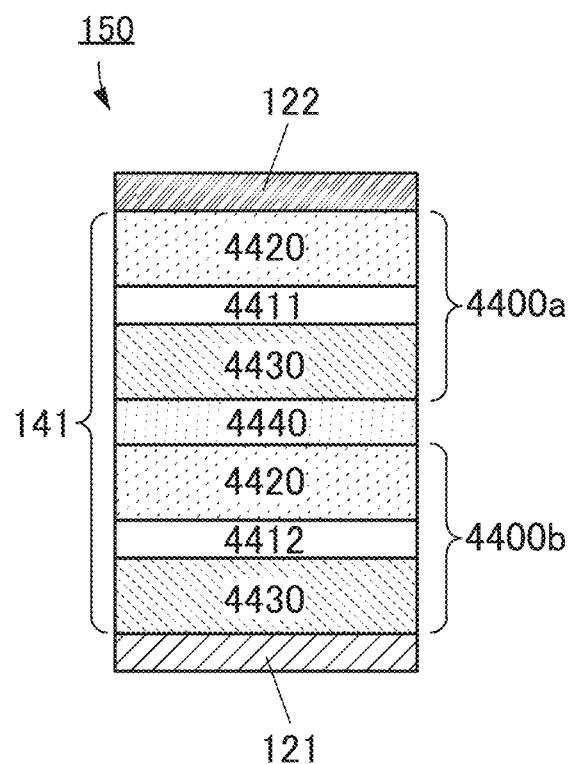

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400*a* and a light-emitting unit 4400*b* can be connected in series with an intermediate layer (charge-generation layer) 4440 therebetween as shown in FIG. 22C. Such a structure is referred to as a tandem structure in this specification. A tandem structure may be rephrased as a stack structure in this specification and the like. By having a tandem structure, a light-emitting device can emit light at high luminance. By having a tandem structure, a light-emitting device presumably has increased emission efficiency and an extended lifetime. In the case where the light-emitting device 150 of the display apparatus 100B in FIG. 19 has a tandem structure, the EL layer 141 can include, for example, the layer 4420, the light-emitting layer 4411, and the layer 4430 that are included in the light-emitting unit 4400*a*, the intermediate layer 4440, and the layer 4420, the light-emitting layer 4412, and the layer 4430 that are included in the light-emitting unit 4400*b*.

In displaying white, the aforementioned SBS structure consumes lower power than the aforementioned single structure and tandem structure. To reduce power consumption, the SBS structure is thus preferably used. Meanwhile, the single structure and the tandem structure are preferable in that the manufacturing cost is low or the manufacturing yield is high because the manufacturing processes of the single structure and the tandem structure are simpler than that of the SBS structure.

The emission color of the light-emitting device 150 can be changed to red, green, blue, cyan, magenta, yellow, white, or the like depending on the material of the EL layer 141. When the light-emitting device 150 has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

The EL layers 141*a*, 141*b*, and 141*c* are preferably provided not to be in contact with each other in such a manner that there is a gap between the EL layers of two light-emitting devices with different colors as shown in FIG. 19. This suitably prevents unintentional light emission (also referred to as crosstalk) from being caused by a current flowing through two adjacent EL layers. As a result, the contrast can be increased to achieve a display apparatus with high display quality.

The EL layers 141a to 141c can be formed using a photolithography method. For example, the EL layers 141a to 141c can be formed in such a manner that an EL film to be the EL layers 141a to 141c is formed over the insulator 111 and the conductor 121 and then subjected to patterning by a photolithography method. Alternatively, the EL layers 141a to 141c may be formed in such a manner that the conductor 122 is formed over the EL film and both the conductor 122 and the EL film are subjected to patterning by a photolithography method. In this case, the EL layers 141a to 141c have the same structure. Accordingly, in order that the display apparatus 100B employing the above formation method can carry out color display, the light-emitting devices 150a to 150c respectively including the EL layers 141a to 141c emit white light and the white light is extracted to the outside through coloring layers (color filters).

Alternatively, the EL layers 141a to 141c are formed in the following manner: an EL film to be the EL layer 141a is formed over the insulator 111 and the conductor 121 and processed by a photolithography method to form the EL layer 141a; and the EL layer 141b and the EL layer 141c are formed in the predetermined regions by the same steps. The EL layers 141a to 141c formed by this method can have different structures, enabling the display apparatus 100B to have the SBS structure.

When the above method is employed, the gap between pixels can be short. As a result, the number of pixels included in the display portion can be large, increasing the resolution of the display apparatus. The gap between the pixels is preferably less than or equal to 5 μm, further preferably less than or equal to 1 sm.

The display apparatus 100B in FIG. 19 fabricated by the above-described method can have a resolution preferably higher than or equal to 1000 ppi, further preferably higher than or equal to 3000 ppi, still further preferably higher than or equal to 5000 ppi.

Other than a photolithography method, a nanoimprint method, a lift-off method, or the like may be employed in the formation of the EL layers 141a to 141c. Alternatively, island-shaped thin films may be directly formed by a film formation method using a shielding mask such as a metal mask.

The conductor 122 is provided over the insulator 112, the EL layer 141a, the EL layer 141b, and the EL layer 141c. In addition, an insulator 113 is provided over the conductor 122.

The conductor 122 functions as, for example, a common electrode of the light-emitting devices 150a to 150c. The conductor 122 preferably contains a conductive material having a light-transmitting property so that light from the light-emitting device 150 can be extracted to above the display apparatus 100B.

The conductor 122 is preferably formed using a light-transmitting and light-reflective material having high conductivity (sometimes referred to as a transflective electrode). The conductor 122 can be formed using, for example, an alloy of silver and magnesium, or indium tin oxide.

The insulator 113 functions as, for example, a passivation film protecting the light-emitting devices 150a, 150b, and 150c. It is thus preferable that the insulator 113 be formed using a material preventing entry of water and the like. The insulator 113 can be formed using any of the materials usable for the insulator 111, for example. Specifically, aluminum oxide, silicon nitride, silicon nitride oxide, or the like can be used.

A resin layer 161 is provided over the insulator 113. A substrate 102 is provided over the resin layer 161.

The substrate 102 is preferably a light-transmitting substrate, for example. Using a light-transmitting substrate as the substrate 102 enables extraction of light emitted from the light-emitting devices 150a, 150b, and 150c to above the substrate 102.

Note that the display apparatus of one embodiment of the present invention does not necessary have the structure of the display apparatus 100B in FIG. 19. The structure of the display apparatus of one embodiment of the present invention may be changed as appropriate as long as an object of one embodiment of the present invention is achieved.

For example, the transistor 500 in the pixel layer PXAL of the display apparatus 100B in FIG. 19 may be a transistor formed over a semiconductor substrate. In a display apparatus 100C shown in FIG. 23, a semiconductor substrate is bonded above the circuit layer SICL and the wiring layer LINL of the display apparatus 100B shown in FIG. 19, and the light-emitting device 150 and a transistor as a counterpart of the transistor 500 are provided above the semiconductor substrate.

Figure 23:
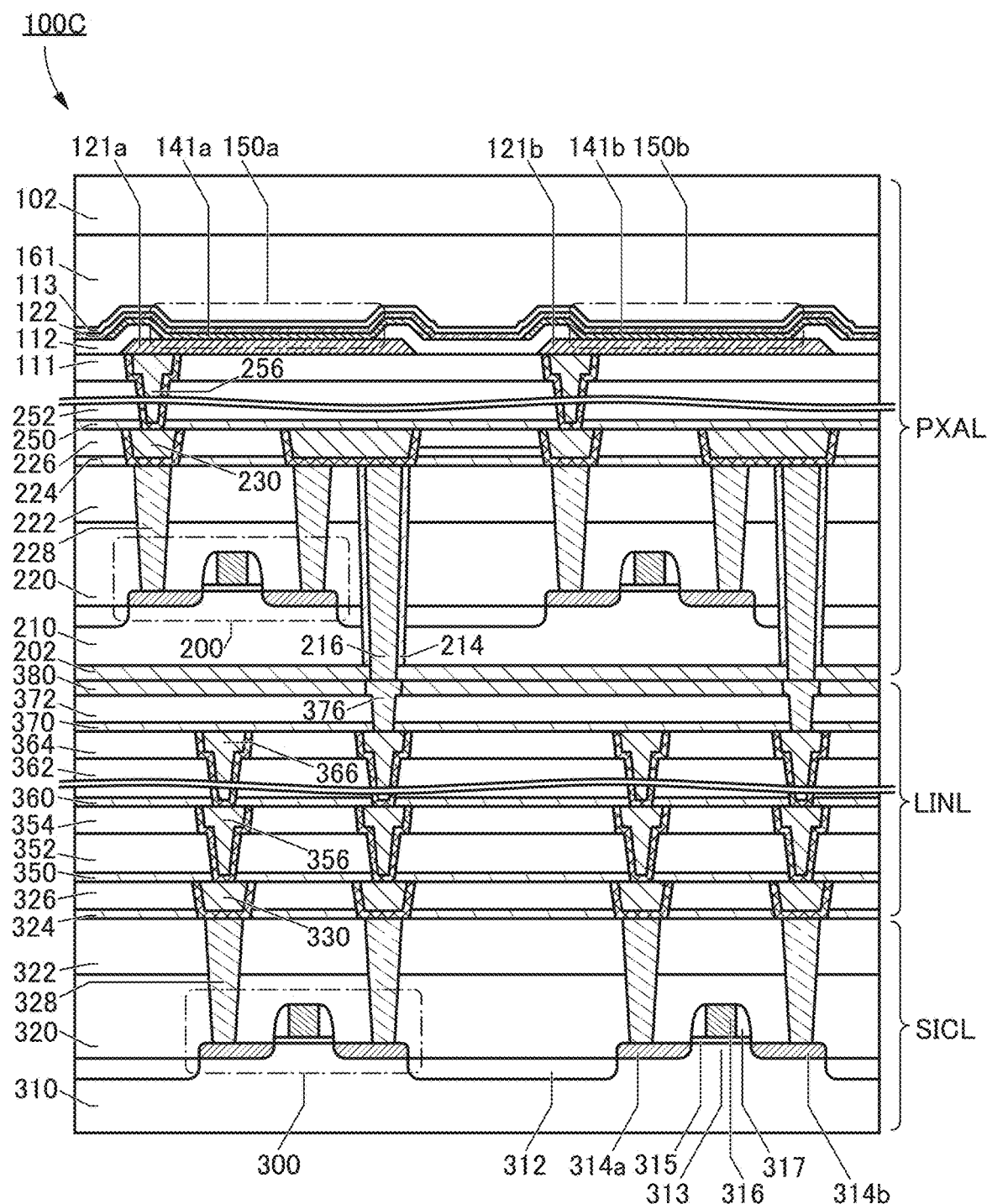
FIG. 23 is a schematic cross-sectional view showing a structure example of a display apparatus.

For the circuit layer SICL in the display apparatus 100C shown in FIG. 23, refer to the description of the display apparatus 100B shown in FIG. 19. For the stacked layers from the insulator 324 to the insulator 364 included in the wiring layer LINL, refer to the description of the display apparatus 100B shown in FIG. 19.

An insulator 370 and an insulator 372 are sequentially stacked over the insulator 364 and the conductor 366.

The insulator 370 is preferably formed using an insulator having a barrier property against an impurity such as water or hydrogen, like the insulator 324 and the like. Thus, the insulator 370 can be formed using any of the materials usable for the insulator 324 and the like, for example.

The insulator 372 has functions of an interlayer insulating film and a planarization film. The insulator 372 is preferably formed using an insulator having a barrier property against impurities such as water and hydrogen, like the insulator 324. Thus, the insulator 372 can be formed using any of the materials usable for the insulator 324.

The conductor 376 is embedded to fill an opening portion provided in regions of the insulator 370 and the insulator 372 that overlap with part of the conductor 366. The conductor 376 is also formed over the insulator 372. After that, the conductor 376 is patterned into a form of a wiring, a terminal, a pad, or the like by etching treatment or the like.

The conductor 376 can be formed using, for example, copper, aluminum, tin, zinc, tungsten, silver, platinum, or gold. The material used for the conductor 376 preferably contains the same component as the material used for a later-described conductor 216 in the pixel layer PXAL.

Then, an insulator 380 is formed to cover the insulator 372 and the conductor 376 and is subsequently subjected to planarization treatment by a chemical mechanical polishing (CMP) method or the like until the conductor 376 is exposed. In this manner, the conductor 376 serving as a wiring, a terminal, a pad, or the like can be formed over the substrate 310.

Like the insulator 324, the insulator 380 is preferably formed using a film with a barrier property inhibiting diffusion of impurities such as water and hydrogen, for example. In other words, the insulator 380 is preferably formed using any of the materials usable for the insulator 324. Like the insulator 326, the insulator 380 may be formed using an insulator having a relatively low dielectric constant to reduce the parasitic capacitance generated between wirings, for example. In other words, the insulator 380 may be formed using any of the materials usable for the insulator 326.

The pixel layer PXAL is provided with a substrate 210, a transistor 200, the light-emitting device 150 (the light-emitting devices 150a and 150b are shown in FIG. 23), and the substrate 102, for example. Moreover, the pixel layer PXAL is provided with an insulator 220, an insulator 222, an insulator 226, an insulator 250, an insulator 252, the insulator 111, the insulator 112, the insulator 113, and the resin layer 161, for example. Furthermore, the pixel layer PXAL is provided with the conductor 216, a conductor 228, a conductor 230, a conductor 256, the conductor 121 (the conductors 121a and 121b are shown in FIG. 23), and the conductor 122, for example.

An insulator 202 in FIG. 23 functions as a bonding layer together with the insulator 380, for example. The insulator 202 preferably contains, for example, the same component as the material used for the insulator 380.

The substrate 210 is provided above the insulator 202. In other words, the insulator 202 is provided on a bottom surface of the substrate 210. The substrate 210 is preferably a substrate usable for the substrate 310, for example. Note that in the description of the display apparatus 100C shown in FIG. 23, the substrate 310 is a semiconductor substrate containing silicon.

Over the substrate 210, the transistor 200 is formed, for example. Being formed on the substrate 210 that is a semiconductor substrate containing silicon, the transistor 200 functions as a Si transistor. For the structure of the transistor 200, refer to the description of the transistor 300 included in the display apparatus 100B in FIG. 19.

Above the transistor 200, the insulator 220 and the insulator 222 are provided. The insulator 220 has functions of an interlayer insulating film and a planarization film, for example, like the insulator 320. The insulator 222 has functions of an interlayer insulating film and a planarization film, for example, like the insulator 322.

A plurality of opening portions are provided in the insulators 220 and 222. The plurality of opening portions are formed in regions overlapping with a source and a drain of the transistor 200, a region overlapping with the conductor 376, and the like. Of the plurality of opening portions, the opening portions formed in the regions overlapping with the source and the drain of the transistor 200 are each filled with the conductor 228. Of the other opening portions, the opening portion formed in the region overlapping with the conductor 376 has a side surface provided with an insulator 214, and the conductor 216 fills the space inside the insulator 214. The conductor 216 is sometimes particularly referred to as a through silicon via (TSV).

For the conductor 216 or the conductor 218, any of the materials usable for the conductor 328 can be used, for example. In particular, the conductor 216 is preferably formed using the same material as the conductor 376.

The insulator 214 has a function of insulating the conductor 216 from the substrate 210, for example. Note that the insulator 214 is preferably formed using, for example, any of the materials usable for the insulator 320, the insulator 324, or the like.

The insulator 380 and the conductor 376 that are formed over the substrate 310 are bonded to the insulator 202 and the conductor 216 that are formed on the substrate 210 by a bonding step, for example.

Before the bonding step, for example, planarization treatment is performed to make surfaces of the insulator 380 and the conductor 376 level with each other on the substrate 310 side. In a similar manner, planarization treatment is performed to make surfaces of the insulator 202 and the conductor 216 level with each other on the substrate 210 side.

In the bonding step, hydrophilic bonding or the like can be employed for bonding of the insulator 380 and the insulator 202, i.e., bonding of insulators; in the hydrophilic bonding, after high planarity is obtained by polishing or the like, the surfaces of the insulators are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be obtained.

Surface activated bonding, diffusion bonding, or the like can be employed for bonding of the conductor 376 and the conductor 216, i.e., bonding of conductors. Surface activated bonding is a method in which an oxide film and a layer adsorbing impurities over the surface of each conductor are removed by sputtering treatment or the like and the cleaned and activated surfaces of the conductors are made to be in contact with and bonded to each other. Diffusion bonding is a method in which the surfaces of the conductors are bonded to each other by adjusting temperature and pressure together. Both methods can cause bonding at an atomic level and therefore the bonding with excellent electric and mechanical strength can be achieved.

Through the above-described bonding step, the conductor 376 on the substrate 310 side can be electrically connected to the conductor 216 on the substrate 210 side. In addition, mechanically strong connection can be established between the insulator 380 on the substrate 310 side and the insulator 202 on the substrate 210 side.

The insulating layers and the metal layers are mixed on the bonding surfaces of the substrates 310 and 210; therefore, for example, surface activated bonding and hydrophilic bonding are preferably performed in combination when the substrates 310 and 210 are bonded to each other. For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed with the metal layers having surfaces of a hardly oxidizable metal such as gold.

Note that the substrate 310 and the substrate 210 may be bonded by a bonding method different from the above-described methods. For example, the substrate 310 and the substrate 210 may be bonded by flip-chip bonding. In the case of employing flip-chip bonding, a connection terminal such as a bump may be provided above the conductor 376 on the substrate 310 side or provided below the conductor 216 on the substrate 210 side. Flip-chip bonding can be performed by, for example, injecting a resin containing anisotropic conductive particles between the insulator 380 and the insulator 202 and between the conductor 376 and the conductor 216, or by using a Sn—Ag solder. Alternatively, ultrasonic wave bonding can be used in the case where the bump and a conductor connected to the bump are gold. To reduce thermal stress, physical stress such as an impact, or the like, the above-described flip-chip bonding may be combined with injection of an underfill agent between the insulator 380 and the insulator 202 and between the conductor 376 and the conductor 216. Furthermore, a die bonding film may be used in bonding of the substrate 310 and the substrate 210, for example.

An insulator 224 and the insulator 226 are sequentially stacked over the insulator 222, the insulator 214, the conductor 216, and the conductor 228.

Like the insulator 324, the insulator 224 is preferably a barrier insulating film inhibiting diffusion of impurities such as water and hydrogen to the region above the insulator 224. Thus, the insulator 224 is preferably formed using, for example, any of the materials usable for the insulator 324.

Like the insulator 326, the insulator 226 is preferably an interlayer film with a low dielectric constant. Thus, the insulator 226 is preferably formed using, for example, any of the materials usable for the insulator 326.

In the insulators 224 and 226, the conductor 230 and the like that are electrically connected to the transistor 200, the light-emitting device 150, and the like are embedded. Note that the conductor 230 and the like function as plugs or wirings. For the conductor 230, any of the materials usable for the conductors 328 and 330 and the like can be used, for example.

Over the insulators 224 and 226, the insulators 250, 252, and 111 are sequentially stacked.

The insulator 250 is preferably formed using an insulator having a barrier property against impurities such as water and hydrogen, like the insulator 324 and the like. Thus, the insulator 250 can be formed using any of the materials usable for the insulator 324 and the like, for example.

The insulator 352 has functions of an interlayer insulating film and a planarization film. The insulator 352 is preferably formed using an insulator having a barrier property against impurities such as water and hydrogen, like the insulator 324. Thus, the insulator 352 can be formed using any of the materials usable for the insulator 324.

For the insulator 111, refer to the description of the insulator 111 included in the display apparatus 100B in FIG. 19.

The conductor 256 is embedded to fill an opening portion provided in regions of the insulator 250, the insulator 252, and the insulator 111 that overlap with part of the conductor 230. The conductor 256 is also formed over the insulator 252. The conductor 256 functions as a plug or a wiring that is connected to the light-emitting device 150, for example. Note that the conductor 256 can be formed using a material similar to that for the conductor 328 and the conductor 330.

For the light-emitting device 150, the resin layer 161, and the substrate 102 that are provided above the insulator 111, refer to the description of the light-emitting device 150, the resin layer 161, and the substrate 102 that are included in the display apparatus 100B in FIG. 19.

In the display apparatus of one embodiment of the present invention, semiconductor substrates may be bonded to each other and a light-emitting device may be provided above the bonded semiconductor substrates as described above. In addition, the light-emitting device may be formed before or after the step of bonding the semiconductor substrates, for example.

<Sealing Structure Example of Display Apparatus>

Next, a sealing structure for the light-emitting devices 150a to 150c which the display apparatus 100B in FIG. 19 can have is described.

Figure 24A:
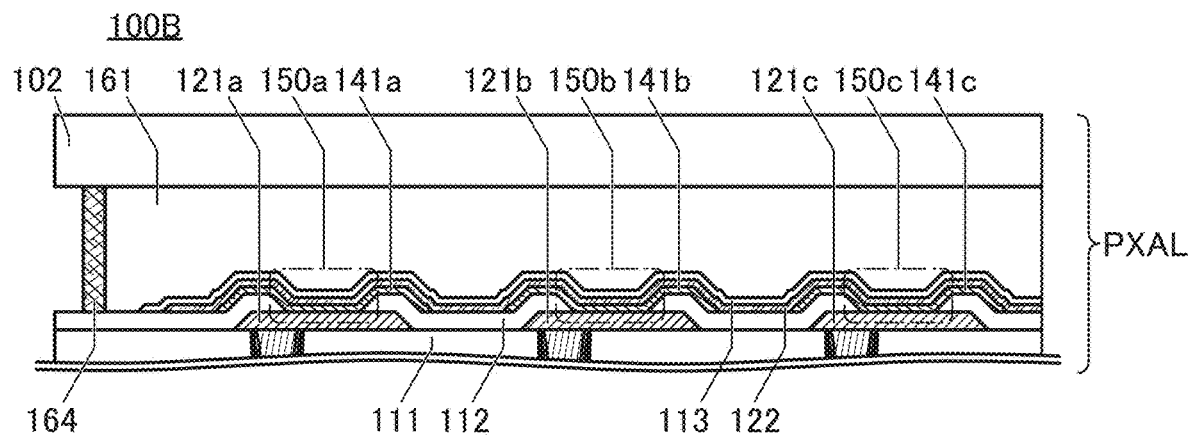
FIGS. 24A and 24B are schematic cross-sectional views each showing a structure example of a display apparatus.

FIG. 24A is a cross-sectional view of a sealing structure example which the display apparatus 100B in FIG. 19 can have. Specifically, FIG. 24A shows an end portion of a pixel array ALP of the display apparatus 100B in FIG. 19 and components provided around the end portion. FIG. 24A also shows part of the pixel layer PXAL of the display apparatus 100B. Specifically, FIG. 24A shows the insulator 111, a plug connected to the transistor 500, and insulators, conductors, the light-emitting devices 150a to 150c, and the like that are positioned above the insulator 111.

In the display apparatus 100B shown in FIG. 24A, an adhesive layer 164 is provided at or around the end portion of the pixel array ALP. Specifically, the display apparatus 100B is fabricated such that the adhesive layer 164 is placed between the insulator 112 and the substrate 102.

The adhesive layer 164 is preferably formed using, for example, a material inhibiting transmission of an impurity such as moisture. Using the material for the adhesive layer 164 can increase the reliability of the display apparatus 100B.

The structure in which the adhesive layer 164 is used to bond the insulator 112 and the substrate 102 with the resin layer 161 positioned between the insulator 112 and the substrate 102 is sometimes referred to as a solid sealing structure. In the case where the resin layer 161 in the solid sealing structure has a function of bonding the insulator 112 and the substrate 102 like the adhesive layer 164, the adhesive layer 164 is not necessarily provided.

A structure in which the adhesive layer 164 is used to bond the insulator 112 and the substrate 102 with not the resin layer 161 but an inert gas filling the space between the insulator 112 and the substrate 102 is sometimes referred to as a hollow sealing structure (not shown). Examples of an inert gas include a nitrogen gas and an argon gas.

Figure 24B:
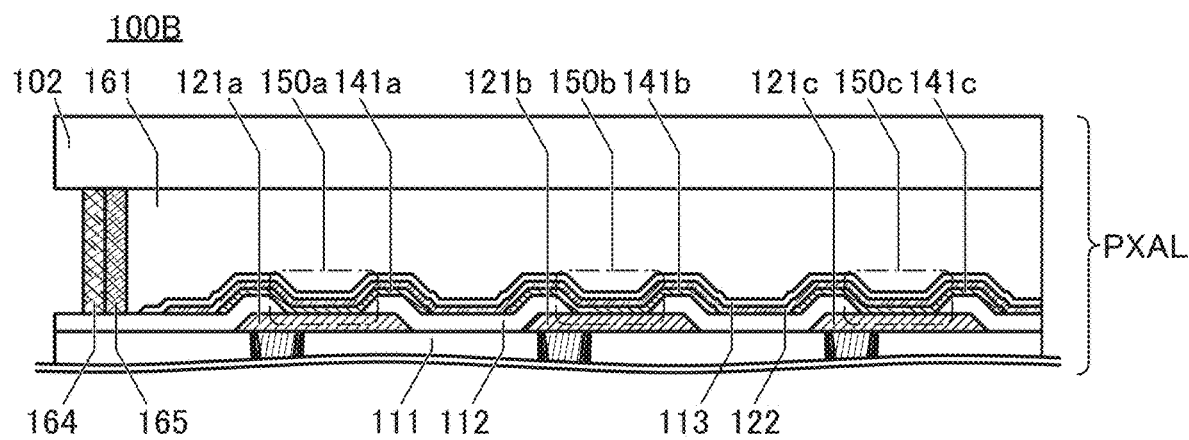

In the sealing structure of the display apparatus 100B shown in FIG. 24A, two or more overlapping adhesive layers may be used. For example, as shown in FIG. 24B, an adhesive layer 165 may be provided inward from the adhesive layer 164 (may be provided between the adhesive layer 164 and the resin layer 161). Two or more overlapping adhesive layers can inhibit transmission of an impurity such as moisture more, further increasing the reliability of the display apparatus 100B.

A desiccant may be mixed into the adhesive layer 165. In this case, the desiccant adsorbs moisture contained in the resin layer 161, insulators, conductors, EL layers, and the like that are provided inward from the adhesive layers 164 and 165, increasing the reliability of the display apparatus 100B.

Although the solid sealing structure of the display apparatus 100B is shown in FIG. 24B, a hollow sealing structure may be employed.

Furthermore, the resin layer 161 filling the space in each of the sealing structures of the display apparatus 100B shown in FIGS. 24A and 24B may be replaced with an inert liquid. Examples of an inert liquid include a fluorine-based inert liquid.

<Variation of Display Apparatus>

One embodiment of the present invention is not limited to the above-described structures, and the above-described structures can be modified as appropriate in accordance with circumstances. Variations of the display apparatus 100B in FIG. 19 are described below with reference to FIGS. 25A to 25C and FIGS. 26A to 26D. Each of FIGS. 25A to 25C and FIGS. 26A to 26D shows part of the pixel layer PXAL of the display apparatus 100B. Specifically, each of FIGS. 25A to 25C and FIGS. 26A to 26D shows the insulator 111, a plug connected to the transistor 500, and insulators, conductors, the light-emitting devices 150a to 150c, and the like that are positioned above the insulator 111.

The display apparatus 100B may have a structure in which the light-emitting devices 150 emit light of two colors, for example. The display apparatus 100B may have a structure in which the light-emitting devices 150 emit light of four or more colors, for example (not shown).

Figure 25A:
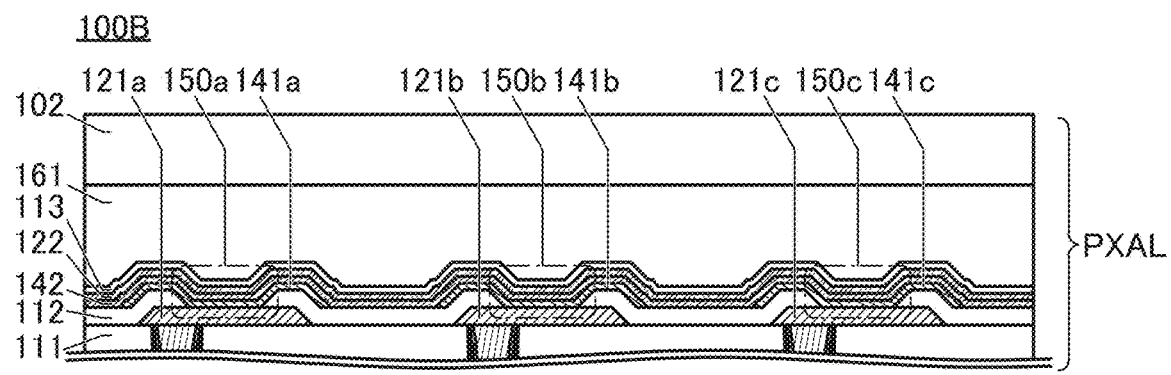
FIGS. 25A to 25C are schematic cross-sectional views each showing a structure example of a display apparatus.

The display apparatus 100B may have a structure in which, for example, an EL layer 142 is provided over the EL layers 141a to 141c and the insulator 112 as shown in FIG. 25A. Specifically, for example, the EL layer 142 can include the layer 4420 shown in FIG. 22A when the EL layers 141a to 141c each include the layer 4430 and the light-emitting layer 4411 shown in FIG. 22A. In this case, the layer 4420 of the EL layer 142 functions as a common layer shared by the light-emitting devices 150a to 150c. In a similar manner, for another example, the EL layer 142 can include the layer 4420 shown in FIG. 22B when the EL layers 141a to 141c each include the layer 4430 and the light-emitting layer 4411 shown in FIG. 22B. In this case, the layer 4420 of the EL layer 142 functions as a common layer shared by the light-emitting devices 150a to 150c. For another example, the EL layer 142 can include the layer 4420 of the light-emitting unit 4400b shown in FIG. 22C when the EL layers 141a to 141c each include the layer 4430, the light-emitting layer 4412, and the layer 4420 that are included in the light-emitting unit 4400b, the intermediate layer 4440, and the layer 4430 and the light-emitting layer 4411 that are included in the light-emitting unit 4400a in FIG. 22C. In this case, the layer 4420 of the light-emitting unit 4400a in the EL layer 142 functions as a common layer shared by the light-emitting devices 150a to 150c.

Figure 25B:
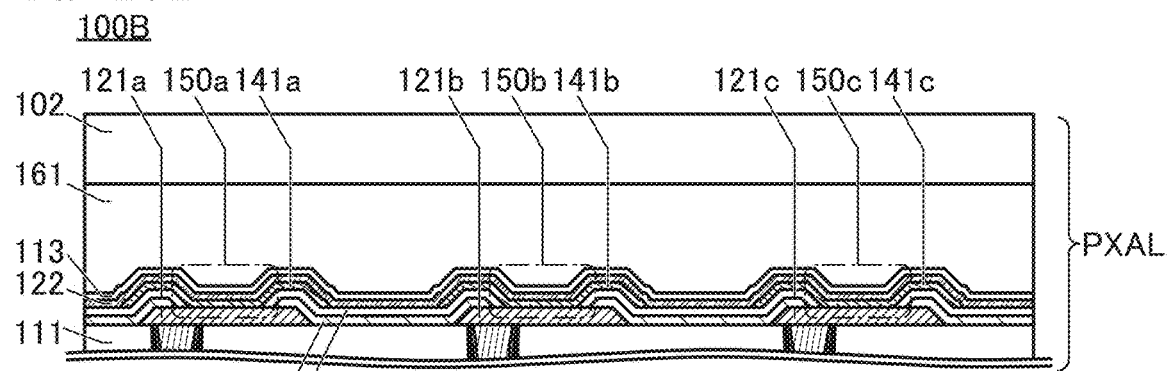

In the display apparatus 100B, for example, the insulator 112 may have a multilayer structure that includes an insulator made of an organic material as the first layer and an insulator made of an inorganic material as the second layer, as described above. As an example, FIG. 25B shows a cross-sectional view of part of the display apparatus 100B in which the insulator 112 has a multilayer structure including an insulator 112a that is an insulator made of an organic material and an insulator 112b that is an insulator made of an inorganic material.

The organic material can be a polyimide or the like, and the inorganic material can be any of the materials usable for the insulator 112 and the like of the display apparatus 100B shown in FIG. 19.

Figure 25C:
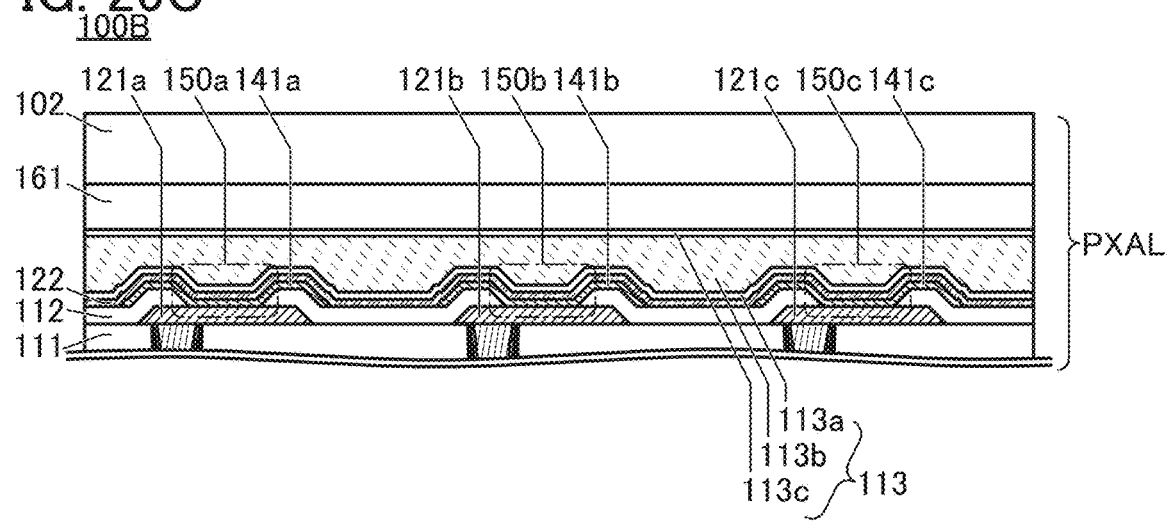

In the display apparatus 100B, for example, the insulator 113 may have a stacked-layer structure including two or more layers, instead of a single-layer structure. The insulator 113 may have a three-layer structure that includes an insulator made of an inorganic material as the first layer, an insulator made of an organic material as the second layer, and an insulator made of an inorganic material as the third layer. FIG. 25C shows a cross-sectional view of part of the display apparatus 100B in which the insulator 113 has a multilayer structure including an insulator 113a that is an insulator made of an inorganic material, an insulator 113b that is an insulator made of an organic material, and an insulator 113c that is an insulator made of an inorganic material.

In the display apparatus 100B, for example, the EL layers 141a to 141c may each have a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between a bottom surface of the light-emitting layer and a top surface of the lower electrode, i.e., the thickness of the layer 4430 in FIG. 22A, is set to the value corresponding to the wavelength of the color of light emitted by the light-emitting layer of the EL layer 141.

For example, light that is reflected back by the lower electrode (reflected light) considerably interferes with light that directly enters the upper electrode from the light-emitting layer (incident light). For this reason, the optical path length between the lower electrode and the light-emitting layer is preferably adjusted to $(2n-1)\lambda/4$ (n is a natural number greater than or equal to 1 and $\lambda$ is the wavelength of light to be amplified). By adjusting the optical path length, the phases of the reflected light and the incident light each having the wavelength $\lambda$ can be aligned with each other, and the light emitted from the light-emitting layer can be further amplified. In the case where the reflected light and the incident light have a wavelength other than the wavelength $\lambda$, their phases are not aligned with each other, resulting in attenuation without resonation.

In the above structure, the EL layer may include a plurality of light-emitting layers or a single light-emitting layer. It is also possible to, for example, combine the microcavity structure with the aforementioned tandem structure; specifically, a structure in which one light-emitting device includes a plurality of EL layers sandwiching a charge-generation layer and each EL layer includes one or more light-emitting layers can be applied to the microcavity structure.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR preferably includes a microcavity structure. Note that in the case of a display apparatus which displays images with subpixels of four colors, red, yellow, green, and blue, the display apparatus can have favorable characteristics because the luminance can be increased owing to yellow light emission and each subpixel can employ a microcavity structure suitable for the wavelength of the corresponding color.

Figure 26A:
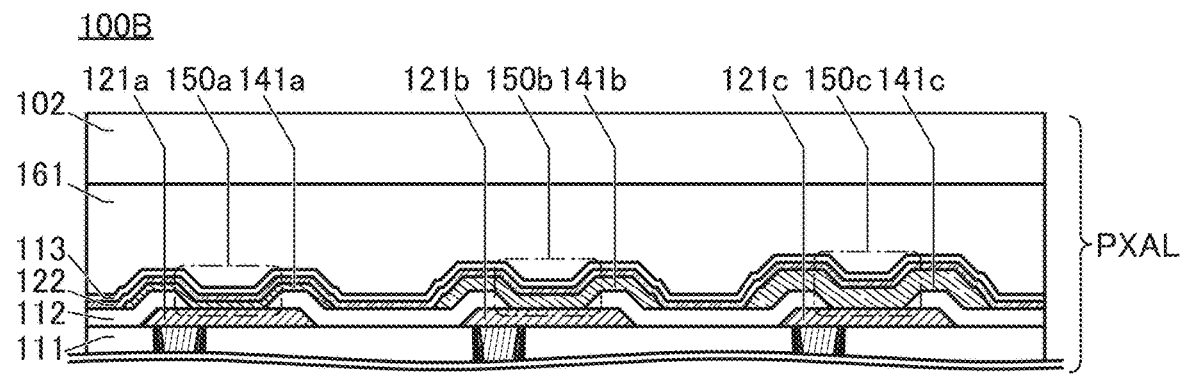
FIGS. 26A to 26D are schematic cross-sectional views each showing a structure example of a display apparatus.

As an example, FIG. 26A shows a cross-sectional view of part of the display apparatus 100B including a microcavity structure. In the case where the light-emitting device 150a includes a blue (B)-light-emitting layer, the light-emitting device 150b includes a green (G)-light-emitting layer, and the light-emitting device 150c includes a red (R)-light-emitting layer, it is preferable that the EL layer 141a have the smallest thickness, the EL layer 141b have the second largest thickness, and the EL layer 141c have the largest thickness as shown in FIG. 26A. Specifically, the thicknesses of the layers 4430 included in the EL layers 141a, 141b, and 141c are determined depending on the color of the light emitted by the corresponding light-emitting layer. In this case, the layer 4430 of the EL layer 141a has the smallest thickness and the layer 4430 of the EL layer 141c has the largest thickness.

Figure 26B:
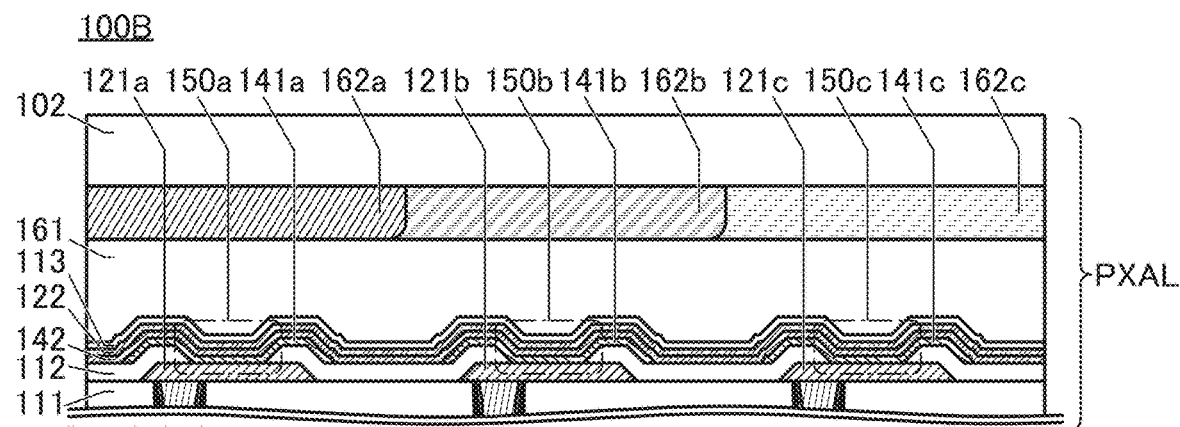

In the display apparatus 100B, for example, a coloring layer (color filter) or the like may be provided. As an example, FIG. 26B shows a structure in which a coloring layer 162a, a coloring layer 162b, and a coloring layer 162c are provided between the resin layer 161 and the substrate 102. Note that the coloring layers 162a to 162c can be formed on the substrate 102, for example. In the case where the light-emitting device 150a includes a blue (B)-light-emitting layer, the light-emitting device 150b includes a green (G)-light-emitting layer, and the light-emitting device 150c includes a red (R)-light-emitting layer, the coloring layer 162a is a blue coloring layer, the coloring layer 162b is a green coloring layer, and the coloring layer 162c is a red coloring layer.

The display apparatus 100B shown in FIG. 26B can be fabricated in such a manner that the substrate 102 provided with the coloring layers 162a to 162c and the substrate 310 over which components up to the light-emitting devices 150a to 150c are formed are bonded to each other with the resin layer 161 therebetween. This bonding is preferably performed such that the light-emitting device 150a and the coloring layer 162a overlap with each other, the light-emitting device 150b and the coloring layer 162b overlap with each other, and the light-emitting device 150c and the coloring layer 162c overlap with each other. In the display apparatus 100B provided with the coloring layers 162a to 162c, for example, the light emitted by the light-emitting device 150b is extracted to above the substrate 102 through the coloring layer 162b instead of through the coloring layer 162a or the coloring layer 162c. That is, light emitted from the light-emitting device 150 in an oblique direction (a direction at an elevation angle with a top surface of the substrate 102 used as a horizontal plane) can be blocked in the display apparatus 100B; thus, the viewing angle dependence of the display apparatus 100B can be reduced, inhibiting the display quality of an image displayed by the display apparatus 100B from decreasing when the image is viewed from an oblique direction.

The coloring layers 162a to 162c formed on the substrate 102 may be covered with, for example, a resin which is also referred to as an overcoat layer. Specifically, the resin layer 161, the overcoat layer, the coloring layers 162a to 162c, and the substrate 102 may be stacked in this order in the display apparatus 100B (not shown). Note that examples of the resin usable for the overcoat layer include a thermosetting material having a light-transmitting property and based on an acrylic or epoxy resin.

In the display apparatus 100B, for example, a black matrix (not shown) may be provided in addition to the coloring layers. A black matrix provided between the coloring layer 162a and the coloring layer 162b, between the coloring layer 162b and the coloring layer 162c, and between the coloring layer 162c and the coloring layer 162a can enhance blockage of the light emitted from the light-emitting devices 150 of the display apparatus 100B in an oblique direction (a direction at an elevation angle with the top surface of the substrate 102 used as a horizontal plane), further inhibiting the display quality of an image displayed by the display apparatus 100B from decreasing when the image is viewed from an oblique direction.

In the case where the display apparatus includes coloring layers as shown in FIG. 26B or the like, the light-emitting devices 150a to 150c of the display apparatus may each be a white-light-emitting device (not shown). The structure of the light-emitting device can be a single structure or a tandem structure, for example.

Figure 26C:
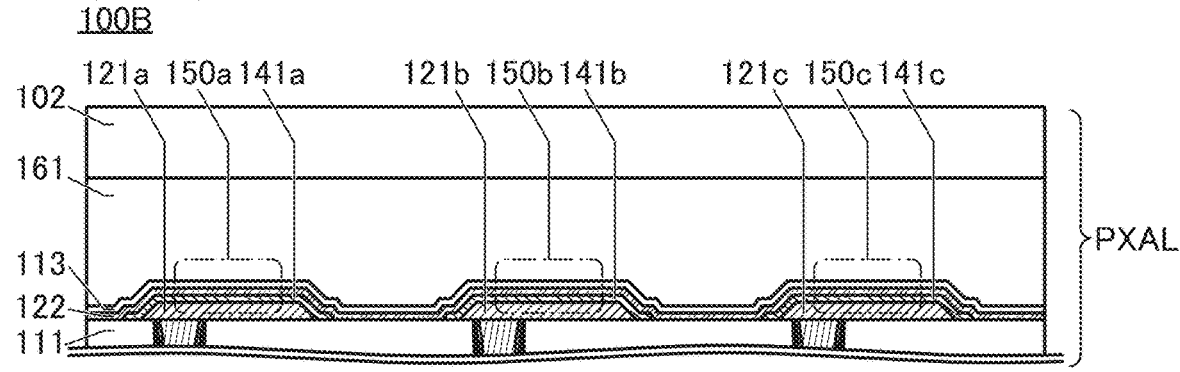
Figure 26D:
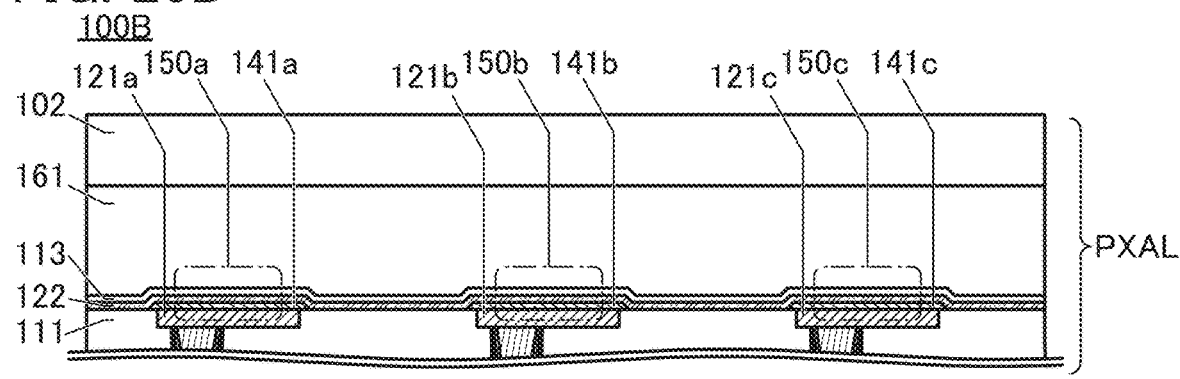

The display apparatus 100B may have a structure in which the insulator 112 is not provided over the conductors 121a to 121c, for example. FIG. 26C shows a structure example in which the display apparatus 100B in FIG. 19 or the like does not include the insulator 112. Furthermore, the display apparatus 100B may have a structure in which the conductors 121a to 121c are embedded in the insulator 111, for example. FIG. 26D shows a structure example of the display apparatus in which the conductors 121a to 121c are embedded in the insulator 111. Note that this structure can be fabricated in such a manner that, for example, opening portions in which the conductors 121a to 121c are to be embedded are formed in the insulator 111, a conductive film to be the conductors 121a to 121c is formed, and then, chemical mechanical polishing (CMP) is performed until the insulator 111 is exposed.

In the above-described structures of the display apparatus 100B, the conductors 121a to 121c serve as the anodes and the conductor 122 serves as a cathode; however, the display apparatus 100B may have a structure in which the conductors 121a to 121c serve as cathodes and the conductor 122 serves as an anode. In other words, in the above-described manufacturing process, the stacking order of the hole-injection layer, hole-transport layer, light-emitting layer, electron-transport layer, and electron-injection layer that are included in the EL layers 141a to 141c and the EL layer 142 can be reversed.

Note that the insulators, the conductors, the semiconductors, and the like disclosed in this specification and the like can be formed by a physical vapor deposition (PVD) method or a chemical vapor deposition (CVD) method. Examples of a PVD method include a sputtering method, a resistance heating evaporation method, an electron beam evaporation method, and a pulsed laser deposition (PLD) method. Examples of a CVD method include a plasma CVD method and a thermal CVD method. Examples of a thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer react with each other in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching of corresponding switching valves (also referred to as high-speed valves) such that the source gases are not mixed. For example, a first source gas is introduced, an inert gas (e.g., argon or nitrogen) or the like is introduced at the same time as or after the introduction of the first source gas, and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on a surface of a substrate to form a first thin layer, and then the second source gas is introduced to react with the first thin layer; thus, a second thin layer is stacked over the first thin layer, and a thin film is formed as a result. The sequence of the gas introduction is controlled and repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to adjust a thickness accurately and thus is suitable for manufacturing a minute FET.

A variety of films such as the metal film, the semiconductor film, and the inorganic insulating film described in this embodiment and the foregoing embodiments can be formed by a thermal CVD method such as an MOCVD method or an ALD method. For example, to form an In—Ga—Zn—O film, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, when a hafnium oxide film is formed by a deposition apparatus using ALD, two kinds of gases, i.e., ozone (O$_3$) as an oxidizer and a source gas obtained by vaporization of a liquid containing a solvent and a hafnium precursor compound (hafnium alkoxide or hafnium amide such as tetrakis(dimethylamide)hafnium (TDMAH, Hf[N(CH$_3$)$_2$]$_4$)) are used. Alternatively, tetrakis(ethylmethylamide)hafnium may be used, for instance.

For example, when an aluminum oxide film is formed by a deposition apparatus using ALD, two kinds of gases, i.e., H$_2$O as an oxidizer and a source gas obtained by vaporization of a liquid containing a solvent and an aluminum precursor compound (e.g., trimethylaluminum (TMA, Al(CH$_3$)$_3$)) are used. Alternatively, tris(dimethylamide)aluminum, triisobutylaluminum, aluminum tris(2,2,6,6-tetramethyl-3,5-heptanedionate), or the like may be used.

For example, when a silicon oxide film is formed by a deposition apparatus using ALD, hexachlorodisilane is adsorbed on a surface where the film is to be formed, and radicals of an oxidizing gas (e.g., O$_2$ or dinitrogen monoxide) are supplied to react with the adsorbate.

For example, when a tungsten film is formed by a deposition apparatus using ALD, a WF$_6$ gas and a B$_2$H$_6$ gas are sequentially introduced to form an initial tungsten film, and then a WF$_6$ gas and an H$_2$ gas are sequentially introduced to form a tungsten film. Note that a SiH$_4$ gas may be used instead of a B$_2$H$_6$ gas.

In the case where an In—Ga—Zn—O film is formed as an oxide semiconductor film with a deposition apparatus using ALD, a precursor (sometimes called a metal precursor or the like) and an oxidizer (sometimes called a reactant, a non-metal precursor, or the like) are sequentially and repetitively introduced. Specifically, for example, an In(CH$_3$)$_3$ gas as a precursor and as an O$_3$ gas) as an oxidizer are introduced to form an In-0 layer; a Ga(CH$_3$)$_3$ gas as a precursor and an O$_3$ gas) as an oxidizer are introduced to form a GaO layer; and then, a Zn(CH$_3$)$_2$ gas as a precursor and an O$_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an H$_2$O gas that is obtained by bubbling water with an inert gas such as Ar may be used instead of an O$_3$ gas), it is preferable to use an O$_3$ gas), which does not contain H. An In(C$_2$H$_5$)$_3$ gas may be used instead of an In(CH$_3$)$_3$ gas. A Ga(C$_2$H$_5$)$_3$ gas may be used instead of a Ga(CH$_3$)$_3$ gas. Moreover, a Zn(CH$_3$)$_2$ gas may be used.

The display portion of the display apparatus of one embodiment of the present invention can have a freely selected screen ratio (aspect ratio). For example, the display apparatus is compliant with any of various screen ratios such as 1.1 (square), 4:3, 16:9, and 16:10.

The shape of the display apparatus of one embodiment of the present invention is not particularly limited. The display apparatus can have any of various shapes such as a rectangular shape, a polygonal shape (e.g., octagon), a circular shape, and an elliptical shape.

<Configuration Example of Pixel Circuit>

Here, configuration examples of a pixel circuit that can be included in the pixel layer PXAL are described.

Figure 27A:
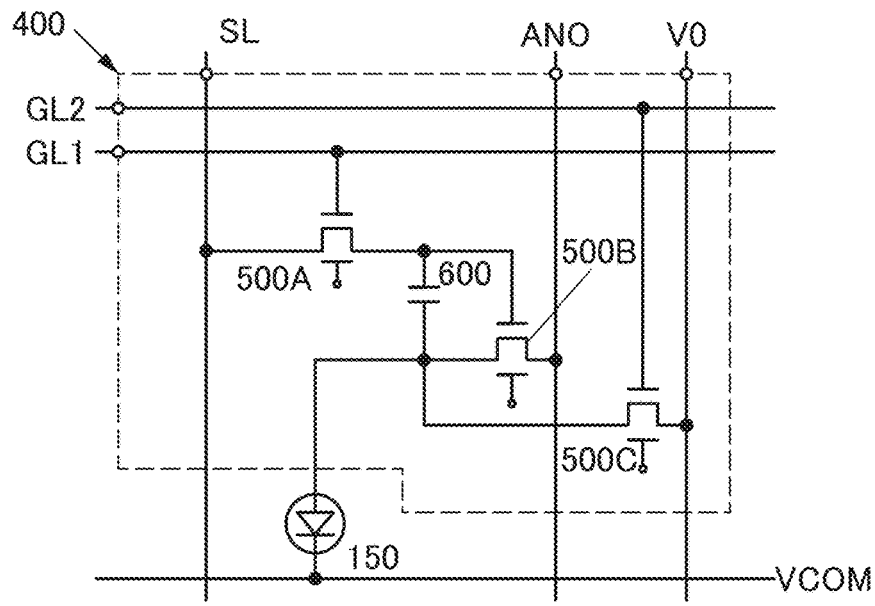
FIGS. 27A and 27B are a circuit diagram and a perspective view showing a configuration example of a pixel circuit included in a display apparatus.
Figure 27B:
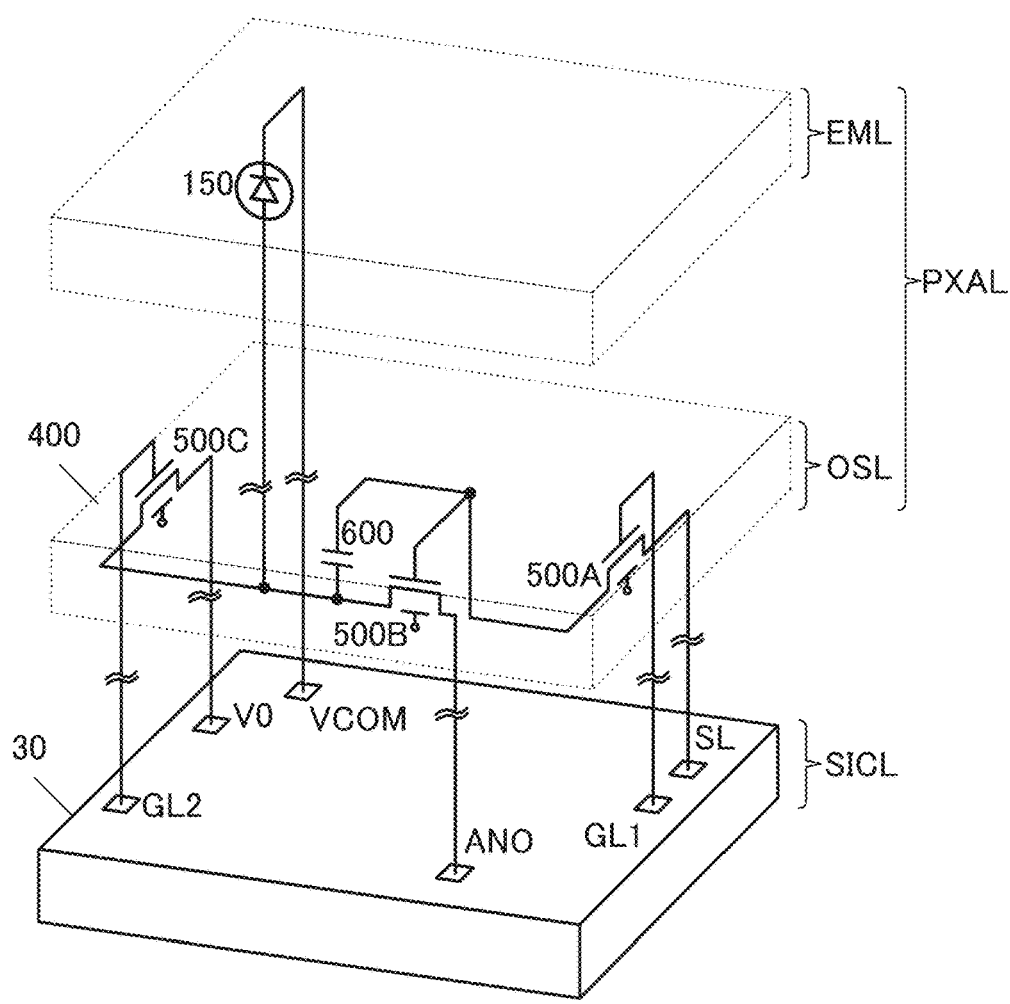

FIGS. 27A and 27B show a configuration example of a pixel circuit that can be included in the pixel layer PXAL and the light-emitting device 150 connected to the pixel circuit. FIG. 27A shows connection of circuit elements of a pixel circuit 400 included in the pixel layer PXAL, and FIG. 27B schematically shows the positional relation of the circuit layer SICL including a driver circuit 30 and the like, a layer OSL including a plurality of transistors of the pixel circuit, and a layer EML including the light-emitting device 150. Note that the pixel layer PXAL of the display apparatus 100B shown in FIG. 19 has a structure including, for example, the layer OSL and the layer EML shown in FIG. 27B.

The pixel circuit 400 illustrated as an example in FIGS. 27A and 27B includes a transistor 500A, a transistor 500B, a transistor 500C, and a capacitor 600. As the transistors 500A, 500B, and 500C, for example, transistors usable as the above-described transistor 500 can be used. That is, the transistors 500A, 500B, and 500C can be OS transistors. Each of the transistors 500A, 500B, and 500C preferably includes a back gate electrode, in which case the back gate electrode and a gate electrode can be supplied with the same signals or different signals.

The transistor 500B includes the gate electrode electrically connected to the transistor 500A, a first electrode electrically connected to the light-emitting device 150, and a second electrode electrically connected to a wiring ANO. The wiring ANO supplies a potential for supplying a current to the light-emitting device 150.

The transistor 500A includes a first electrode electrically connected to the gate electrode of the transistor 500B, a second electrode electrically connected to the wiring SL functioning as a source line, and the gate electrode having a function of controlling the conduction state or the non-conduction state based on the potential of a wiring GL1 functioning as a gate line.

The transistor 500C includes a first electrode electrically connected to a wiring V0, a second electrode electrically connected to the light-emitting device 150, and the gate electrode having a function of controlling the conduction state or the non-conduction state based on the potential of a wiring GL2 functioning as a gate line. The wiring V0 supplies a reference potential and outputs a current flowing in the pixel circuit 400 to the driver circuit 30.

The capacitor 600 includes a conductive film electrically connected to the gate electrode of the transistor 500B and a conductive film electrically connected to the second electrode of the transistor 500C.

The light-emitting device 150 includes an anode electrically connected to the first electrode of the transistor 500B and a cathode electrically connected to a wiring VCOM. The wiring VCOM supplies a potential for supplying a current to the light-emitting device 150.

Accordingly, the intensity of light emitted by the light-emitting device 150 can be controlled in accordance with an image signal supplied to the gate electrode of the transistor 500B. Furthermore, variations in the gate-source voltage of the transistor 500B can be reduced by the reference potential of the wiring V0 supplied through the transistor 500C.

A current value that can be used for setting of pixel parameters can be output from the wiring V0. Specifically, the wiring V0 can function as a monitor line for outputting a current flowing in the transistor 500B or a current flowing in the light-emitting device 150 to the outside. A current output to the wiring V0 is converted into a voltage by a source follower circuit or the like and output to the outside. Alternatively, a current output to the wiring V0 can be converted into a digital signal by an A-D converter or the like and output to the arithmetic circuit MAC1, the arithmetic circuit MAC2, or the like described in the above embodiment.

In the configuration illustrated as an example in FIG. 27B, the wirings electrically connecting the pixel circuit 400 and the driver circuit 30 can be short, so that the wiring resistance of the wirings can be low. Thus, data writing can be performed at a high speed, leading to high-speed operation of the display apparatus 100B. Therefore, even when the number of pixel circuits 400 included in the display apparatus 100B is large, a sufficiently long frame period can be ensured and thus the pixel density of the display apparatus 100B can be increased. In addition, the increased pixel density of the display apparatus 100B can increase the resolution of an image displayed by the display apparatus 100B. For example, the pixel density of the display apparatus 100B can be higher than or equal to 1000 ppi, higher than or equal to 5000 ppi, or higher than or equal to 7000 ppi. Thus, the display apparatus 100B can be, for example, a display apparatus for VR or AR and can be suitably used in an electronic device with a short distance between the display portion and the user, such as an HMD.

Although FIGS. 27A and 27B illustrate, as an example, the pixel circuit 400 including three transistors in total, one embodiment of the present invention is not limited thereto. Configuration examples which can be used for the pixel circuit 400 will be described below.

Figure 28A:
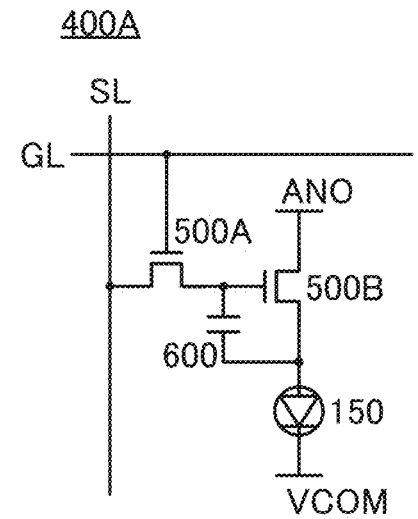
FIGS. 28A to 28D are circuit diagrams each showing a configuration example of a pixel circuit included in a display apparatus.

A pixel circuit 400A illustrated in FIG. 28A includes the transistor 500A, the transistor 500B, and the capacitor 600. FIG. 28A illustrates the light-emitting device 150 connected to the pixel circuit 400A. The wirings SL, GL, ANO, and VCOM are electrically connected to the pixel circuit 400A.

The gate of the transistor 500A is electrically connected to the wiring GL, one of the source and the drain of the transistor 500A is electrically connected to the wiring SL, and the other of the source and the drain of the transistor 500A is electrically connected to the gate of the transistor 500B and one electrode of the capacitor 600. One of the source and the drain of the transistor 500B is electrically connected to the wiring ANO and the other of the source and the drain of the transistor 500B is electrically connected to the anode of the light-emitting device 150. The other electrode of the capacitor 600 is electrically connected to the anode of the light-emitting device 150. The cathode of the light-emitting device 150 is electrically connected to the wiring VCOM.

Figure 28B:
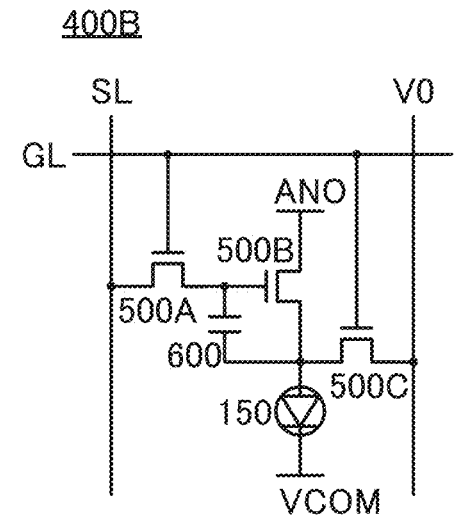

A pixel circuit 400B illustrated in FIG. 28B has a configuration in which the transistor 500C is added to the pixel circuit 400A. In addition, the wiring V0 is electrically connected to the pixel circuit 400B.

Figure 28C:
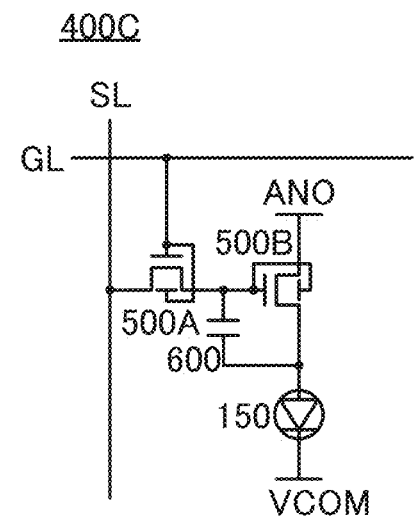
Figure 28D:
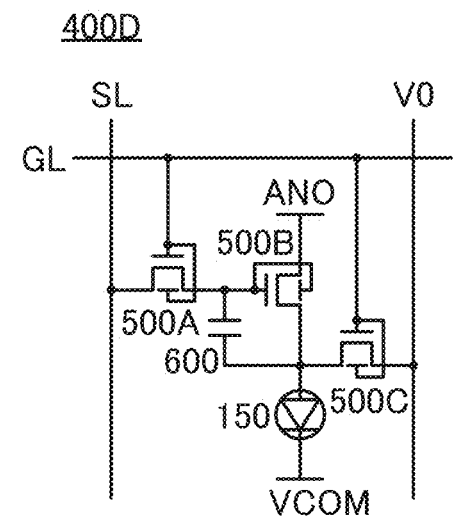

A pixel circuit 400C illustrated in FIG. 28C is an example in which a transistor including a gate and a back gate that are electrically connected to each other is used as each of the transistor 500A and the transistor 500B of the pixel circuit 400A. A pixel circuit 400D illustrated in FIG. 28D is an example in the case where such transistors are used in the pixel circuit 400B. With these structures, a current that can flow in the transistors can be increased. Although a transistor in which a pair of gates are electrically connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 29A:
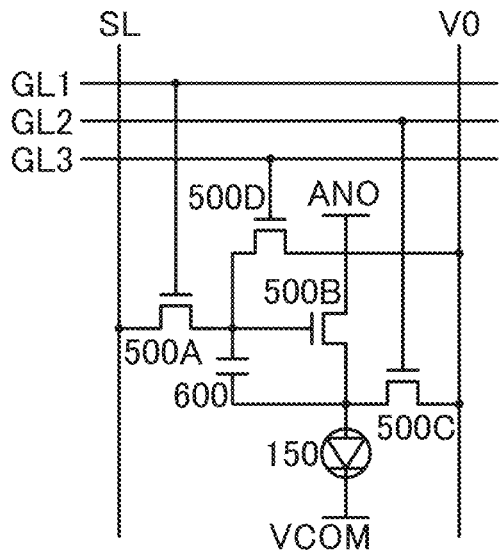
FIGS. 29A to 29D are circuit diagrams each showing a configuration example of a pixel circuit included in a display apparatus.

A pixel circuit 400E illustrated in FIG. 29A has a configuration in which a transistor 500D is added to the pixel circuit 400B. Three wirings (wirings GL1, GL2, and GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistors 500C and 500D are turned on at the same time, the source and the gate of the transistor 500B have the same potential, so that the transistor 500B can be turned off. Thus, a current flowing to the light-emitting device 150 can be blocked forcibly. Such a pixel circuit is suitable for the case of using a display method in which a display period and an off period are alternately provided.

Figure 29B:
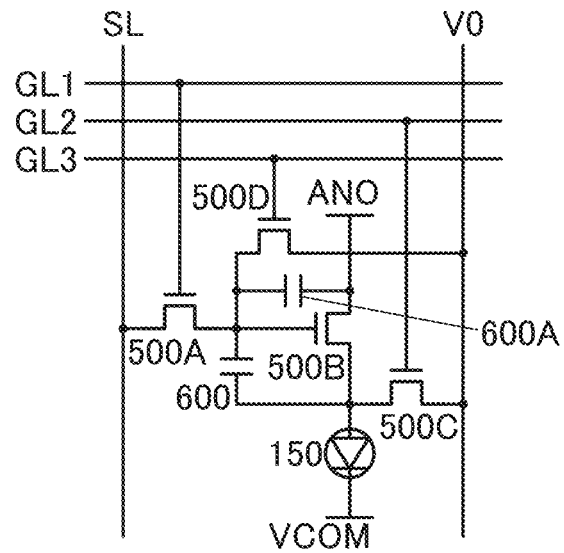

A pixel circuit 400F illustrated in FIG. 29B is an example in which a capacitor 600A is added to the pixel circuit 400E. The capacitor 600A functions as a storage capacitor.

Figure 29C:
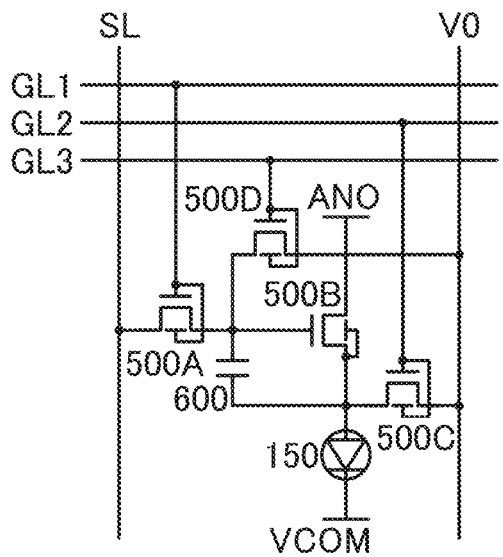
Figure 29D:
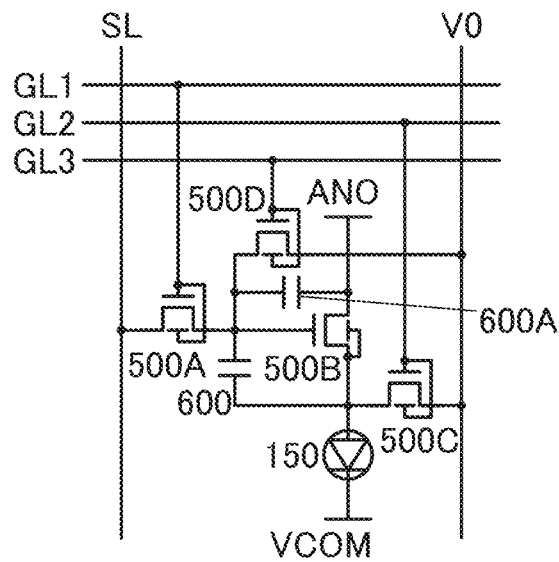

A pixel circuit 400G illustrated in FIG. 29C and a pixel circuit 400H illustrated in FIG. 29D are respectively examples of the cases where transistors each including a gate and a back gate that are electrically connected to each other are used in the pixel circuit 400E and the pixel circuit 400F. A transistor including a gate and a back gate that are electrically connected to each other is used as each of the transistors 500A, 500C, and 500D, and a transistor in which one of gates is electrically connected to a source is used as the transistor 500B.

<Schematic top view and cross-sectional view of light-emitting device>

Figure 30A:
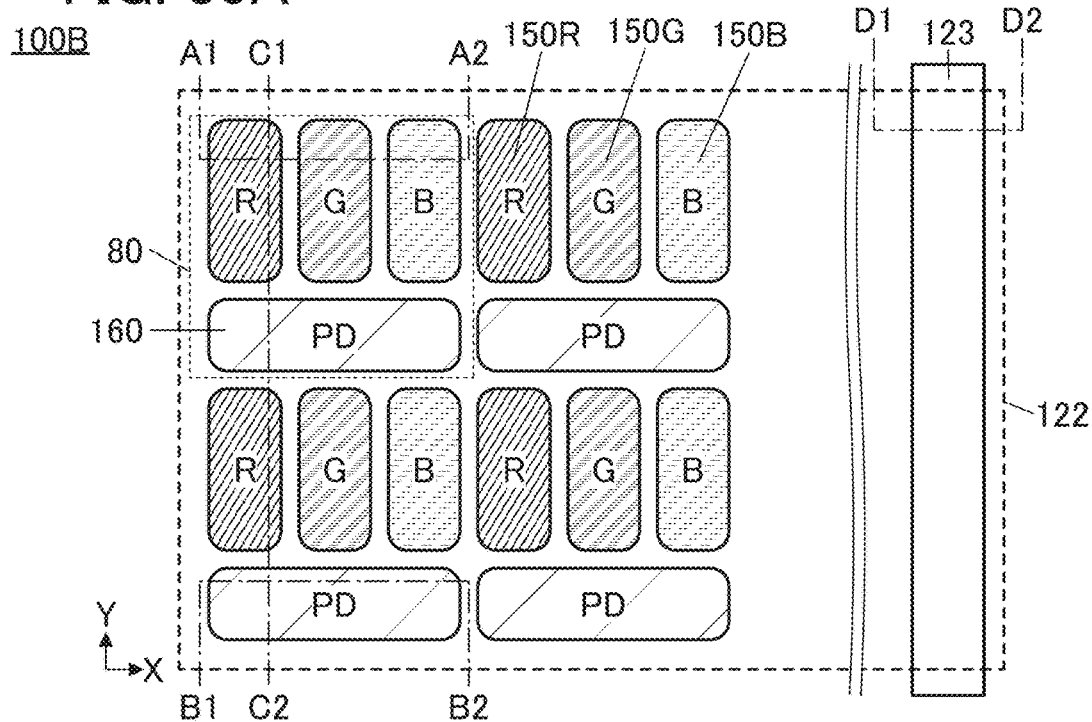
FIGS. 30A and 30B are top views each showing a structure example of a light-emitting device and a light-receiving element included in a display apparatus.

FIG. 30A is a schematic top view illustrating a structure example of the case where light-emitting devices and a light-receiving element are provided in one pixel in the display apparatus 100B of one embodiment of the present invention. The display apparatus 100B includes light-emitting devices 150R that emit red light, light-emitting devices 150G that emit green light, light-emitting devices 150B that emit blue light, and light-receiving elements 160. In FIG. 30A, light-emitting regions of the light-emitting devices 150 are denoted by R, G, and B to easily differentiate the light-emitting devices 150. In addition, light-receiving regions of the light-receiving elements 160 are denoted by PD.

The light-emitting devices 150R, the light-emitting devices 150G, the light-emitting devices 150B, and the light-receiving elements 160 are arranged in a matrix. FIG. 30A illustrates an example where the light-emitting devices 150R, the light-emitting devices 150G, and the light-emitting devices 150B are arranged in the X direction and the light-receiving elements 160 are arranged thereunder. FIG. 30A illustrates a structure example where the light-emitting devices 150 that emit light of the same color are arranged in the Y direction intersecting the X direction. In the display apparatus 100B in FIG. 30A, a pixel 80 can be composed of a sub-pixel including the light-emitting device 150R, a sub-pixel including the light-emitting device 150G, and a sub-pixel including the light-emitting device 150B, which are arranged in the X direction, and a sub-pixel including the light-receiving element 160 provided under the sub-pixels, for example.

As each of the light-emitting devices 150R, 150G, and 150B, an EL element such as an organic light-emitting diode (OLED) or a quantum-dot light-emitting diode (QLED) is preferably used. Examples of a light-emitting substance included in the EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Note that as the TADF material, a TADF material whose singlet excited state and triplet excited state are in a thermal equilibrium state may be used. Because such a TADF material has a short emission lifetime (a short excitation lifetime), it inhibits a reduction in the efficiency of the light-emitting device in a high luminance region.

As the light-receiving elements 160, a PN photodiode or a PIN photodiode can be used, for example. The light-receiving elements 160 each function as a photoelectric conversion element that senses light incident on the corresponding light-receiving element 160 and generates electric charges. The amount of generated electric charges depends on the amount of incident light.

It is particularly preferable to use an organic photodiode including a layer containing an organic compound as the light-receiving elements 160. An organic photodiode, which is easily made thin, lightweight, and large in area and has a high degree of freedom for shape and design, can be used in a variety of display apparatuses.

In one embodiment of the present invention, organic EL elements are used as the light-emitting devices 150, and organic photodiodes are used as the light-receiving elements 160. The organic EL elements and the organic photodiodes can be formed over one substrate. Thus, the organic photodiodes can be incorporated in a display apparatus including the organic EL elements. A photolithography method is preferably employed to separate the organic EL elements from each other, separate the organic photodiodes from each other, and separate the organic EL element from the organic photodiode. This can reduce the distance between the light-emitting devices, that between the organic photodiodes, and that between the light-emitting device and the organic photodiode, enabling fabrication of a display apparatus having a higher aperture ratio than that formed using, for example, a shadow mask such as a metal mask.

FIG. 30A shows the conductor 122 functioning as a common electrode and a conductor 123 functioning as a connection electrode. The conductor 123 is electrically connected to the conductor 122. The conductor 123 is provided outside a display portion where the light-emitting devices 150 and the light-receiving elements 160 are arranged. In FIG. 30A, the conductor 122 having a region overlapping with the light-emitting devices 150, the light-receiving elements 160, and the conductor 123 is shown by dashed lines.

The conductor 123 can be provided along the outer periphery of the display portion. For example, the conductor 123 may be provided along one side of the outer periphery of the display portion or two or more sides of the outer periphery of the display portion. That is, the top surface shape of the conductor 123 can be a band shape, an L shape, a square bracket shape, a quadrangle, or the like in the case where the top surface shape of the display portion is a rectangle.

Figure 30B:
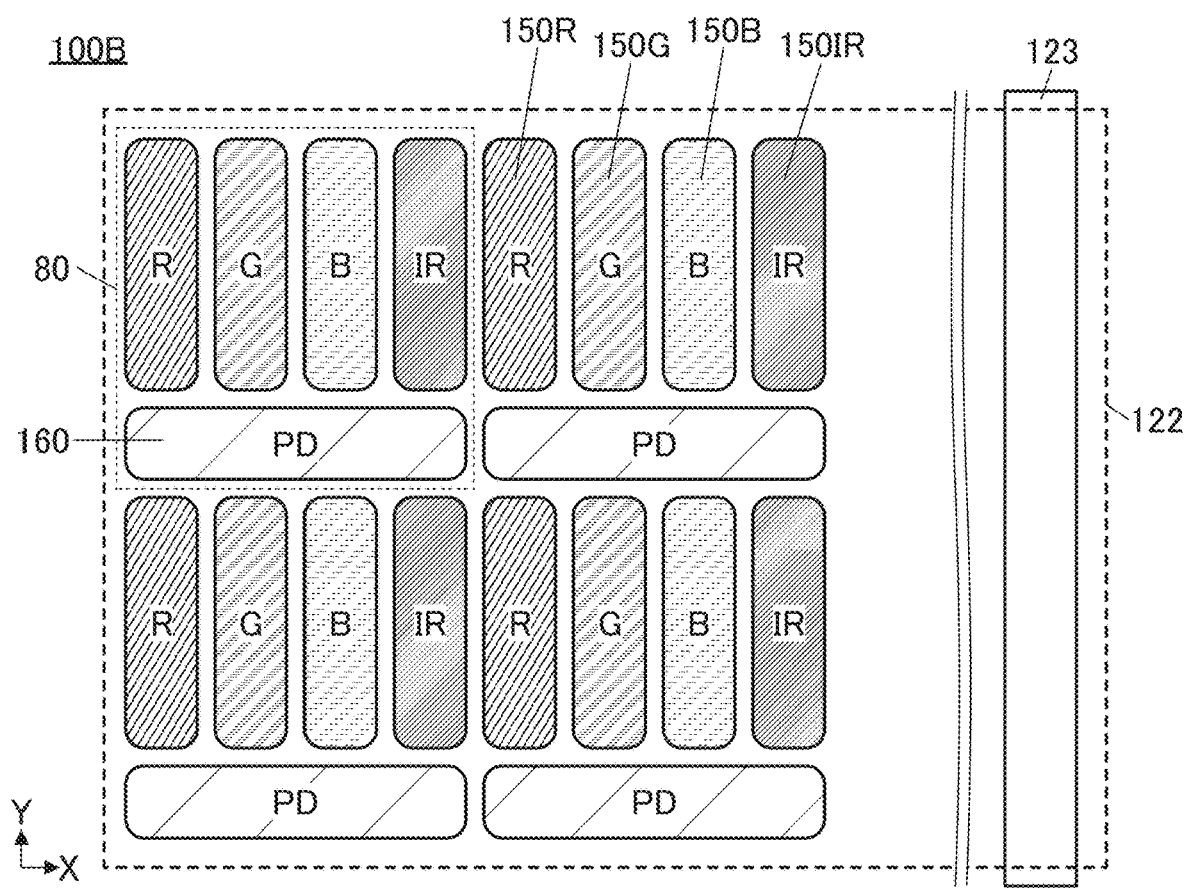

FIG. 30B is a schematic top view illustrating a structure example of the display apparatus 100B, which is a modification example of the display apparatus 100B illustrated in FIG. 30A. The display apparatus 100B illustrated in FIG. 30B is different from the display apparatus 100B in FIG. 30A in that light-emitting devices 150IR that emit infrared light are included. The light-emitting devices 150IR can emit near-infrared light (light with a wavelength greater than or equal to 750 nm to less than or equal to 1300 nm), for example.

In the example illustrated in FIG. 30B, the light-emitting devices 150IR as well as the light-emitting devices 150R, 150G, and 150B are arranged in the X direction, and the light-receiving elements 160 are arranged thereunder. The light-receiving elements 160 each have a function of detecting infrared light.

FIG. 31A is a cross-sectional view taken along dashed-dotted line A1-A2 in FIG. 30A, and FIG. 31B is a cross-sectional view taken along dashed-dotted line B1-B2 in FIG. 30A. FIG. 31C is a cross-sectional view taken along dashed-dotted line C1-C2 in FIG. 30A, and FIG. 31D is a cross-sectional view taken along dashed-dotted line D1-D2 in FIG. 30A. The light-emitting devices 150R, the light-emitting devices 150G, the light-emitting devices 150B, and the light-receiving elements 160 are provided over the insulator 111. In the case where the display apparatus 100B includes the light-emitting devices 150IR, the light-emitting devices 150IR are provided over the insulator 111.

In the case where the expression "B over A" or "B under A" is used in this specification and the like, for example, A and B do not always need to include a region where they are in contact with each other.

FIG. 31A illustrates a cross-sectional structure example of the light-emitting devices 150R, 150G, and 150B shown in FIG. 30A. FIG. 31B illustrates a cross-sectional structure example of the light-receiving element 160 shown in FIG. 30A.

The light-emitting device 150R includes a conductor 121R functioning as a pixel electrode, a hole-injection layer 85R, a hole-transport layer 86R, a light-emitting layer 87R, an electron-transport layer 88R, a common layer 89, the conductor 122, and a protective layer 91. The light-emitting device 150G includes a conductor 121G functioning as a pixel electrode, a hole-injection layer 85G, a hole-transport layer 86G, a light-emitting layer 87G, an electron-transport layer 88G, the common layer 89, the conductor 122, and the protective layer 91. The light-emitting device 150B includes a conductor 121B functioning as a pixel electrode, a hole-injection layer 85B, a hole-transport layer 86B, a light-emitting layer 87B, an electron-transport layer 88B, the common layer 89, the conductor 122, and the protective layer 91. The light-receiving element 160 includes a conductor 121PD functioning as a pixel electrode, a hole-transport layer 86PD, a light-receiving layer 90, an electron-transport layer 88PD, the common layer 89, the conductor 122, and the protective layer 91.

As the conductor 121R, the conductor 121G, and the conductor 121B, for example, the conductor 121a, the conductor 121b, and the conductor 121c shown in FIG. 19 can be used.

The common layer 89 has a function of an electron-injection layer in the light-emitting device 150. Meanwhile, the common layer 89 has a function of an electron-transport layer in the light-receiving element 160. Therefore, the light-receiving element 160 does not necessarily have to include the electron-transport layer 88PD.

The hole-injection layer 85, the hole-transport layer 86, the electron-transport layer 88, and the common layer 89 can also be referred to as functional layers.

The conductor 121, the hole-injection layer 85, the hole-transport layer 86, the light-emitting layer 87, and the electron-transport layer 88 can each be separately provided for each device. The light-emitting devices 150R, 150G, and 150B and the light-receiving elements 160 include the common layer 89 and the conductor 122 in common.

The light-emitting devices 150 and the light-receiving elements 160 may each include a hole-blocking layer and an electron-blocking layer other than the layers illustrated in FIG. 31A. The light-emitting devices 150 and the light-receiving elements 160 may each include a layer containing a bipolar substance (a substance with a high electron-transport property and a high hole-transport property).

An insulating layer 92 is provided to cover an end portion of the conductor 121R, an end portion of the conductor 121G, an end portion of the conductor 121B, and an end portion of the conductor 121PD. End portions of the insulating layer 92 are preferably tapered. Note that the insulating layer 92 is not necessarily provided.

The hole-injection layer 85R, the hole-injection layer 85G, the hole-injection layer 85B, and the hole-transport layer 86PD each have, for example, a region in contact with a top surface of the conductor 121 and a region in contact with a surface of the insulating layer 92. Furthermore, an end portion of the hole-injection layer 85R, an end portion of the hole-injection layer 85G, an end portion of the hole-injection layer 85B, and an end portion of the hole-transport layer 86PD are positioned over the insulating layer 92.

A gap is provided between the common layer 89 and the insulating layer 92. This can inhibit contact between the common layer 89 and each of a side surface of the light-emitting layer 87, a side surface of the light-receiving layer 90, a side surface of the hole-transport layer 86, and a side surface of the hole-injection layer 85. Thus, a short circuit in the light-emitting devices 150 and a short circuit in the light-receiving elements 160 can be inhibited.

The shorter the distance between the light-emitting layers 87 is, the more easily the gap is formed, for example. For example, when the distance is less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be favorably formed.

The protective layer 91 has a function of preventing diffusion of impurities such as water into each light-emitting device from above, for example.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 91.

A stack of an inorganic insulating film and an organic insulating film can be used as the protective layer 91. For example, a structure where an organic insulating film is provided between a pair of inorganic insulating films is preferably employed. Furthermore, an organic insulating film preferably functions as a planarization film. In that case, a top surface of the organic insulating film can be flat, resulting in improved coverage with an inorganic insulating film thereover and an enhanced barrier property. A top surface of the protective layer 91 is flat; thus, in the case where a structure (e.g., a color filter, an electrode of a touch sensor, or a lens array) is provided above the protective layer 91, the influence of an uneven shape due to a structure below the protective layer 91 can be reduced.

FIG. 31A shows the light-emitting device 150 in which the conductor 121, the hole-injection layer 85, the hole-transport layer 86, the light-emitting layer 87, the electron-transport layer 88, the common layer (electron-injection layer) 89, the conductor 122, and the protective layer 91 are provided in this order from the bottom, and the light-receiving element 160 in which the conductor 121PD, the hole-transport layer 86PD, the light-receiving layer 90, the electron-transport layer 88PD, the common layer 89, the conductor 122, and the protective layer 91 are provided in this order from the bottom; however, one embodiment of the present invention is not limited to this example. For example, in the light-emitting device 150, a conductor functioning as a pixel electrode, an electron-injection layer, an electron-transport layer, a light-emitting layer, a hole-transport layer, a hole-injection layer, and a conductor functioning as a common electrode may be provided in this order from the bottom; in the light-receiving element 160, a conductor functioning as a pixel electrode, an electron-transport layer, a light-receiving layer, a hole-transport layer, and the conductor functioning as the common electrode may be provided in this order from the bottom. In this case, the hole-injection layer of the light-emitting device 150 can be a common layer, which can be provided between the hole-transport layer and the common electrode of the light-receiving element 160. The electron-injection layer can be provided separately for each light-emitting device 150.

Note that this embodiment can be combined with any of the other embodiments in this specification as appropriate.

Embodiment 6

Described in this embodiment is a metal oxide (hereinafter also referred to as an oxide semiconductor) applicable to an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 32A. FIG. 32A is a diagram showing the classification of crystal structures of an oxide semiconductor, typically IGZO (a metal oxide containing In, Ga, and Zn).

As shown in FIG. 32A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures (excluding single crystal and poly crystal). Note that the term "Crystalline" excludes single crystal, poly crystal, and completely amorphous. The term "Crystal" includes single crystal and poly crystal structures.

Note that the structures in the thick frame in FIG. 32A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 32B shows an XRD spectrum, which is obtained by grazing-incidence XRD (GIXD) measurement, of a CAAC-IGZO film classified into "Crystalline" (the vertical axis represents intensity in arbitrary unit (a. u.). Note that a GIXD method is also referred to as a thin film method or a Seemann-Bohlin method. The XRD spectrum that is shown in FIG. 32B and obtained by GIXD measurement is hereinafter simply referred to as an XRD spectrum in some cases. The CAAC-IGZO film in FIG. 32B has anatomic ratio of In:Ga:Zn=4:2:3 or a neighborhood thereof. The CAAC-IGZO film in FIG. 32B has a thickness of 500 nm.

As shown in FIG. 32B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 32B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 32C shows a diffraction pattern of the CAAC-IGZO film. FIG. 32C shows a diffraction pattern obtained by the NBED method in which an electron beam is incident in the direction parallel to the substrate. The CAAC-IGZO film in FIG. 32C has an atomic ratio of In:Ga:Zn=4:2:3 or a neighborhood thereof. In the nanobeam electron diffraction method, electron diffraction is performed with a probe diameter of 1 nm.

As shown in FIG. 32C, a plurality of spots indicating c-axis alignment are observed in the diffraction pattern of the CAAC-IGZO film.

<<Structure of Oxide Semiconductor>>

Oxide semiconductors might be classified in a manner different from the one in FIG. 32A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the Inlayer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a grain boundary as compared with In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, and the like might decrease the crystallinity of an oxide semiconductor. This means that the CAAC-OS can be referred to as an oxide semiconductor having few impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using $\theta/2\theta$ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In-Ga—Zn oxide are denoted with [In], [Ga], and [Zn], respectively. For example, the first region in the CAC-OS in the In-Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In-Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (p), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 7

In this embodiment, a display module including the display apparatus of one embodiment of the present invention is described.

<Structure Example of Display Module>

First, a display module including the display apparatus of one embodiment of the present invention is described.

Figure 33A:
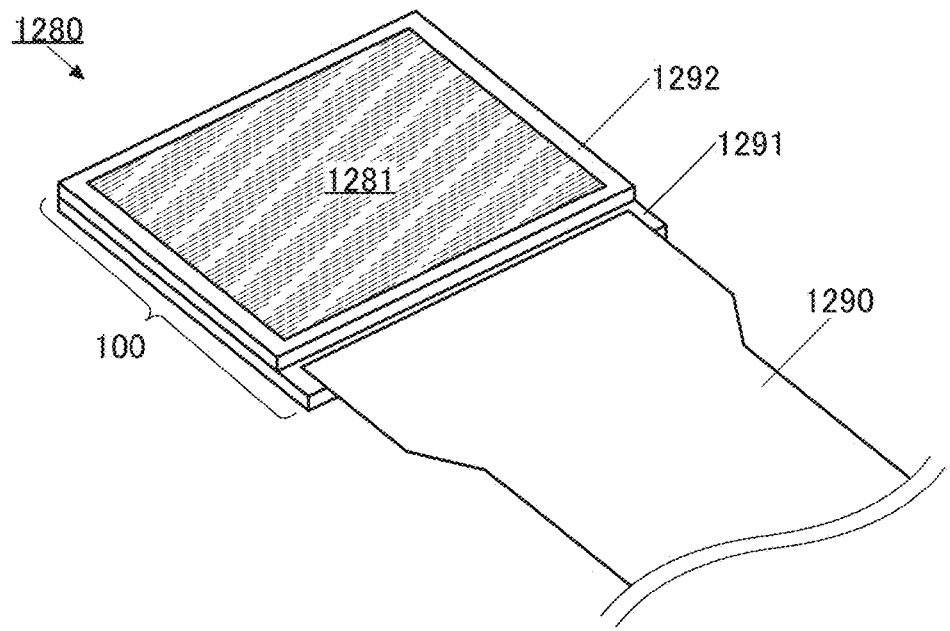
FIGS. 33A and 33B show a structure example of a display module.

FIG. 33A is a perspective view of a display module 1280. The display module 1280 includes the display apparatus 100 and an FPC 1290.

The display module 1280 includes a substrate 1291 and a substrate 1292. The display module 1280 includes a display portion 1281. The display portion 1281 is a region of the display module 1280 where an image is displayed and is a region where light emitted from pixels provided in a pixel portion 1284 described later can be seen.

Figure 33B:
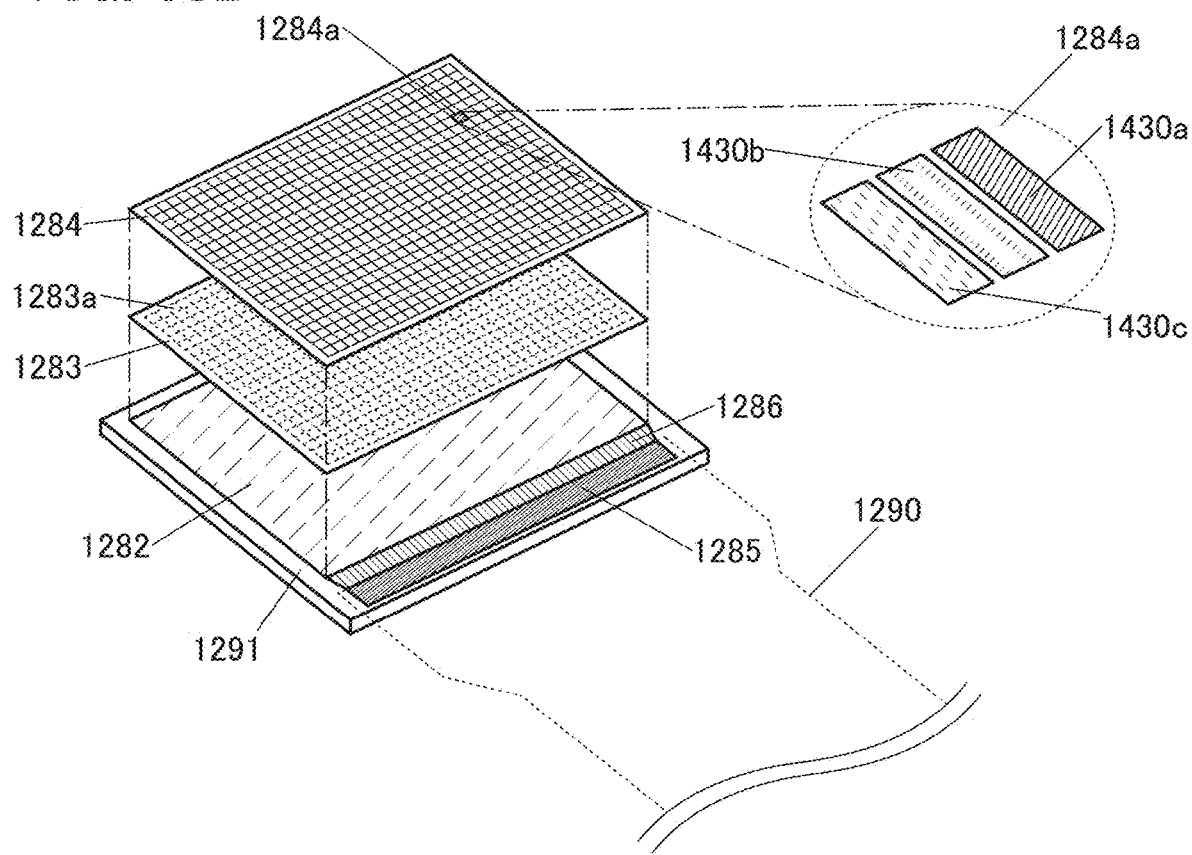

FIG. 33B is a perspective view schematically illustrating a structure on the substrate 1291 side. Over the substrate 1291, a circuit portion 1282, a pixel circuit portion 1283 over the circuit portion 1282, and the pixel portion 1284 over the pixel circuit portion 1283 are stacked. In addition, a terminal portion 1285 for connection to the FPC 1290 is included in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284a arranged periodically. An enlarged view of one pixel 1284a is shown on the right side in FIG. 33B. The pixel 1284a includes a light-emitting device 1430a, a light-emitting device 1430b, and a light-emitting device 1430c which are different in the emission color. Note that the light-emitting devices 1430a, 1430b, and 1430c correspond to the above-described light-emitting devices 150a, 150b, and 150c. The above-described light emitting devices may be arranged in a stripe pattern as shown in FIG. 33B. Alternatively, a variety of kinds of patterns such as a delta pattern or a pentile pattern can be employed.

The pixel circuit portion 1283 includes a plurality of pixel circuits 1283a arranged periodically.

One pixel circuit 1283a is a circuit that controls light emission from three light-emitting devices included in one pixel 1284a. One pixel circuit 1283a may be provided with three circuits each of which controls light emission of one light-emitting device. For example, the pixel circuit 1283a can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display apparatus is achieved.

The circuit portion 1282 includes a circuit for driving the pixel circuits 1283a in the pixel circuit portion 1283. For example, one or both of a gate line driver circuit and a source line driver circuit are preferably included. In addition, at least one of an arithmetic circuit, a memory circuit, a power supply circuit, and the like may be included.

The FPC 1290 serves as a wiring for supplying a video signal, a power supply potential, or the like to the circuit portion 1282 from the outside. An IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, and further preferably higher than or equal to 60% and lower than or equal to 95%. Furthermore, the pixels 1284a can be arranged extremely densely and thus the display portion 1281 can have greatly high resolution. For example, the pixels 1284a are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has extremely high resolution, and thus can be suitably used for a device for VR such as a head-mounted display or a glasses-type device for AR. For example, even in the case of a structure in which the display portion of the display module 1280 is seen through a lens, pixels of the extremely-high-resolution display portion 1281 included in the display module 1280 are prevented from being seen when the display portion is enlarged by the lens, so that display providing a high sense of immersion can be performed. Without being limited thereto, the display module 1280 can be suitably used for electronic devices including a relatively small display portion. For example, the display module 1280 can be favorably used in a display portion of an electronic device to be worn on a human body, such as a wrist-watch type electronic device.

Note that this embodiment can be combined with any of the other embodiments in this specification as appropriate.

Embodiment 8

In this embodiment, an example of a head-mounted display including a display apparatus will be described as an example of an electronic device of one embodiment of the present invention.

Figure 34A:
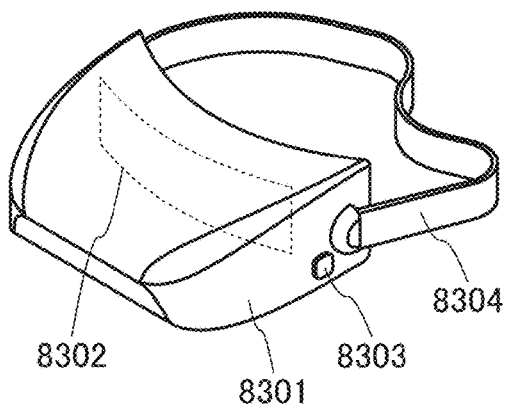
FIGS. 34A to 34F show structure examples of an electronic device.
Figure 34B:
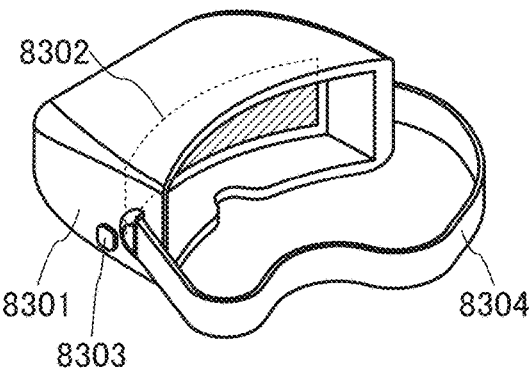

FIGS. 34A and 34B are external views of a head-mounted display 8300.

The head-mounted display 8300 includes a housing 8301, a display portion 8302, an operation button 8303, and a band-like fixing member 8304.

The operation button 8303 functions as a power button or the like. The head-mounted display 8300 may include another button in addition to the operation button 8303.

Figure 34C:
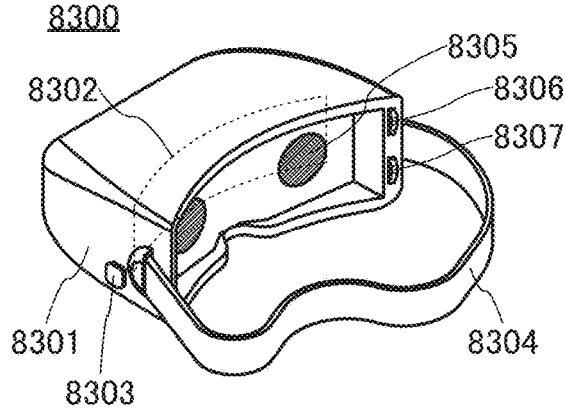

As shown in FIG. 34C, lenses 8305 may be provided between the display portions 8302 and the user's eyes. The user can see magnified images on the display portions 8302 through the lenses 8305, thereby having a more realistic sensation. In this case, as shown in FIG. 34C, a dial 8306 for changing the position of the lenses and adjusting visibility may be provided.

The display apparatus of one embodiment of the present invention can be used for the display portion 8302. Since the display apparatus of one embodiment of the present invention has an extremely high resolution, even when images are magnified using the lenses 8305 as shown in FIG. 34C, the user does not perceive pixels, and thus, more realistic images can be displayed.

FIGS. 34A to 34C show examples in which the head-mounted display includes one display portion 8302. Such a structure can reduce the number of components.

The display portion 8302 can display an image for the right eye and an image for the left eye side by side on a right region and a left region, respectively. Thus, a three-dimensional image using binocular disparity can be displayed.

One image which can be seen with both eyes may be displayed on the entire display portion 8302. Thus, a panorama image can be displayed from end to end of the field of view, which can provide a higher sense of reality.

Here, the head-mounted display 8300 preferably has a mechanism for optimizing the curvature of the display portion 8302 in accordance with the size of the user's head, the position of the user's eyes, or the like. For example, the user himself/herself may adjust the curvature of the display portion 8302 by operating a dial 8307 for adjusting the curvature of the display portion 8302. Alternatively, the head-mounted display 8300 may include a sensor for detecting the size of the user's head, the position of the user's eyes, or the like (e.g., a camera, a contact sensor, and a noncontact sensor) on the housing 8301 and have a mechanism for adjusting the curvature of the display portion 8302 on the basis of data detected by the sensor.

In the case where the lenses 8305 are used, the head-mounted display 8300 preferably has a mechanism for adjusting the position and angle of the lenses 8305 in synchronization with the curvature of the display portion 8302. Alternatively, the dial 8306 may have a function of adjusting the angle of the lenses.

Figure 34D:
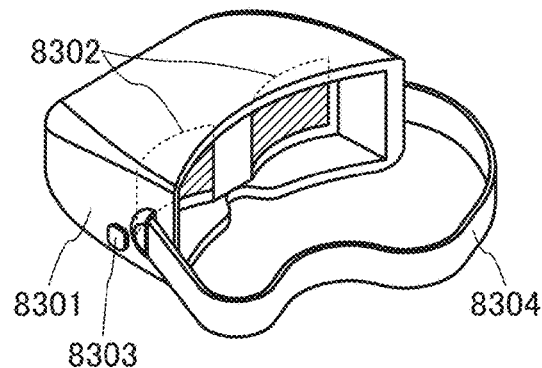
Figure 34E:
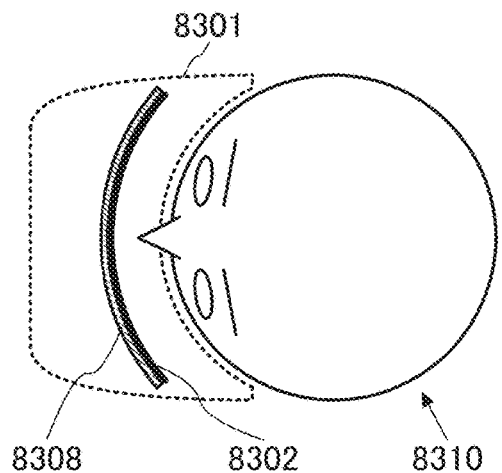
Figure 34F:
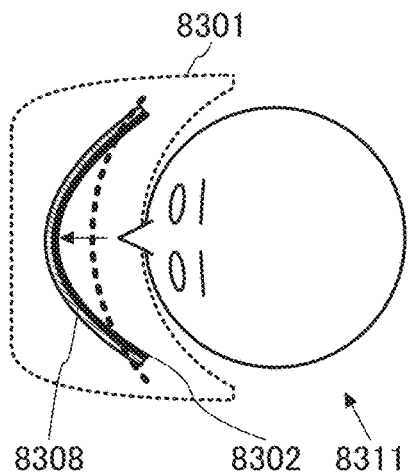

FIGS. 34E and 34F show an example of including a driver portion 8308 that controls the curvature of the display portion 8302. The driver portion 8308 is fixed to at least a part of the display portion 8302. The driver portion 8308 has a function of changing the shape of the display portion 8302 when the part of the driver portion 8308 that is fixed to the display portion 8302 changes in shape or moves.

FIG. 34E is a schematic view showing the case where a user 8310 having a relatively large head wears the housing 8301. In that case, the driver portion 8308 adjusts the shape of the display portion 8302 so that the curvature is relatively small (the radius of curvature is large).

By contrast, FIG. 34F shows the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature is large (the radius of curvature is small). In FIG. 34F, the position and shape of the display portion 8302 in FIG. 34E are denoted by a dashed line.

When the head-mounted display 8300 has such a mechanism for adjusting the curvature of the display portion 8302, optimal display can be offered to a variety of users of all ages and genders.

When the curvature of the display portion 8302 is changed in accordance with contents displayed on the display portion 8302, the user can feel high realistic sensation. For example, shaking can be expressed by vibrating the curvature of the display portion 8302. In this way, it is possible to produce various effects according to the scene in contents, and provide the user with new experiences. Further realistic display can be provided in conjunction with a vibration module provided in the housing 8301.

Note that the head-mounted display 8300 may include two display portions 8302 as shown in FIG. 34D.

When the two display portions 8302 are provided, the user's eyes can see the respective display portions. This allows a high-resolution image to be displayed even when three-dimensional display using parallax or the like is performed. In addition, the display portion 8302 is curved around an arc with an approximate center at the user's eye. This keeps a certain distance between the user's eye and the display surface of the display portion, enabling the user to see a more natural image. Furthermore, the user's eye is positioned in the normal direction of the display surface of the display portion; therefore, even when the luminance or chromaticity of light from the display portion is changed with the viewing angle, the influence of the change can be substantially ignorable and thus a more realistic image can be displayed.

Note that this embodiment can be combined with any of the other embodiments in this specification as appropriate.

Embodiment 9

In this embodiment, a display module that can be fabricated using the display apparatus of one embodiment of the present invention is described.

Figure 35A:
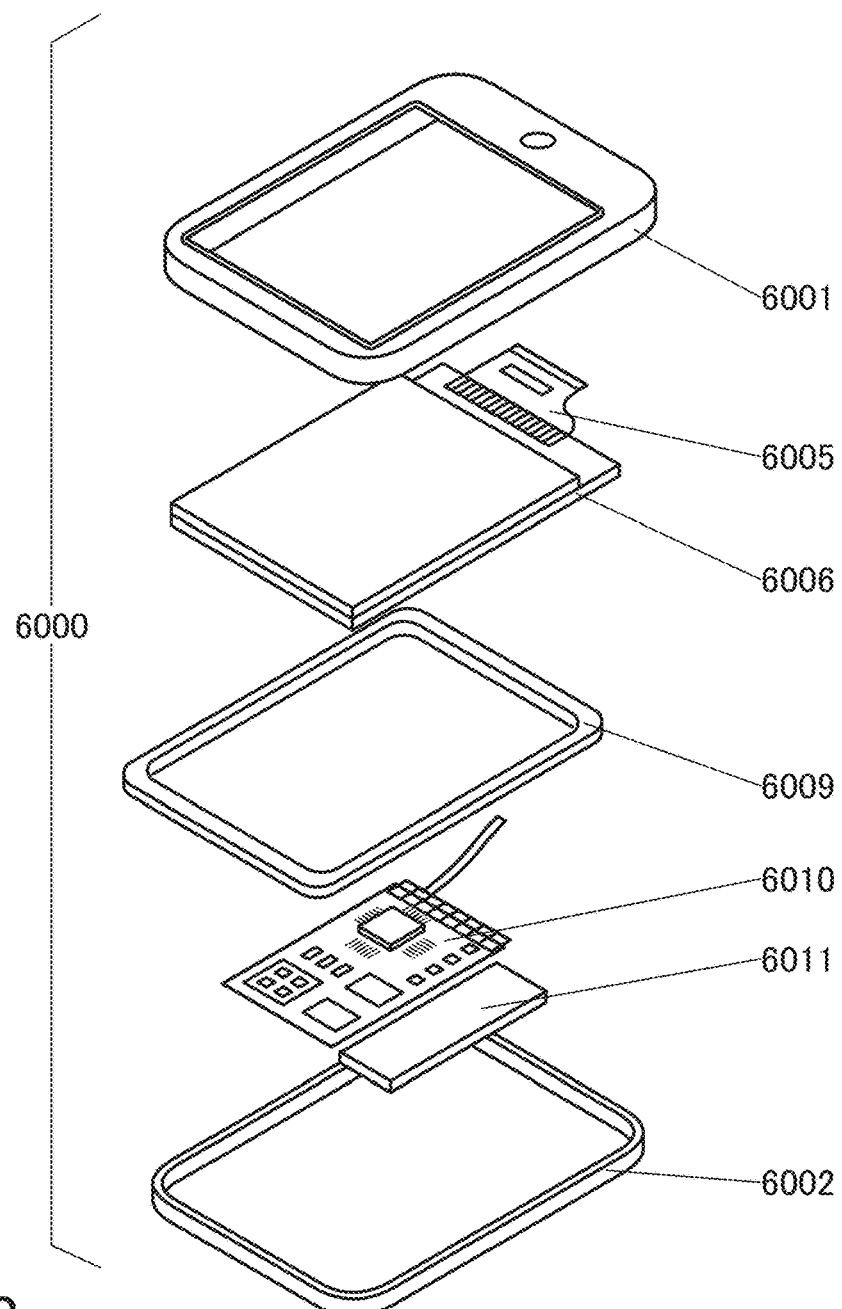
FIGS. 35A and 35B show a structure example of a display module.

In a display module 6000 in FIG. 35A, a display apparatus 6006 connected to an FPC 6005, a frame 6009, a printed circuit board 6010, and a battery 6011 are provided between an upper cover 6001 and a lower cover 6002.

For example, the display apparatus fabricated using one embodiment of the present invention can be used as the display apparatus 6006. With the display apparatus 6006, a display module with extremely low power consumption can be achieved.

The shapes and sizes of the upper cover 6001 and the lower cover 6002 can be changed as appropriate in accordance with the size of the display apparatus 6006.

The display apparatus 6006 may function as a touch panel.

The frame 6009 may have a function of protecting the display apparatus 6006 or blocking electromagnetic waves generated by the operation of the printed circuit board 6010, or function as a radiator plate, for example.

The printed circuit board 6010 includes a power supply circuit, a signal processing circuit for outputting a video signal and a clock signal, a battery control circuit, and the like.

Figure 35B:
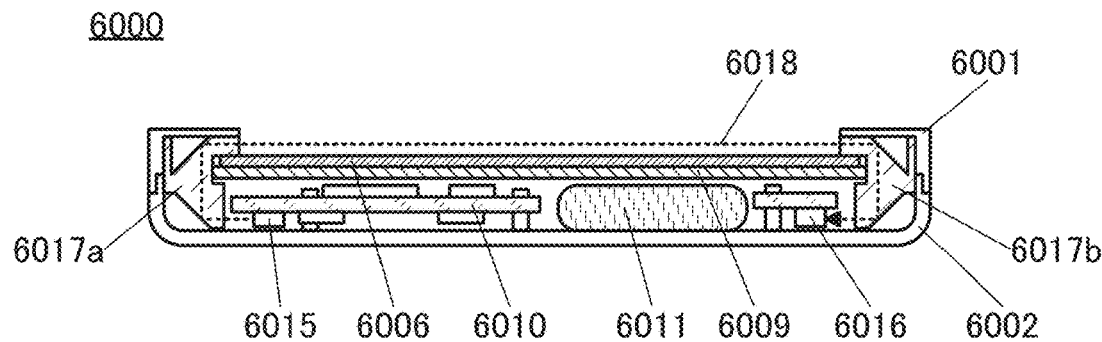

FIG. 35B is a schematic cross-sectional view of the display module 6000 with an optical touch sensor.

The display module 6000 includes a light-emitting portion 6015 and a light-receiving portion 6016 which are provided on the printed circuit board 6010. A pair of light guide portions (a light guide portion 6017a and a light guide portion 6017b) is provided in a region surrounded by the upper cover 6001 and the lower cover 6002.

The display apparatus 6006 overlaps with the printed circuit board 6010 and the battery 6011 with the frame 6009 located therebetween. The display apparatus 6006 and the frame 6009 are fixed to the light guide portion 6017a and the light guide portion 6017b.

Light 6018 emitted from the light-emitting portion 6015 travels over the display apparatus 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display apparatus 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light. As the light-receiving portion 6016, a photoelectric element that receives light emitted by the light-emitting portion 6015 and converts it into an electrical signal can be used. A photodiode that can receive infrared light can be favorably used.

With the use of the light guide portions 6017a and 6017b transmitting the light 6018, the light-emitting portion 6015 and the light-receiving portion 6016 can be placed under the display apparatus 6006, and a malfunction of the touch sensor due to external light reaching the light-receiving portion 6016 can be inhibited. It is particularly preferable to use a resin that absorbs visible light and transmits infrared light, in which case the malfunction of the touch sensor can be inhibited more effectively.

Note that this embodiment can be combined with any of the other embodiments in this specification as appropriate.

Embodiment 10

In this embodiment, an example of an electronic device to which the display apparatus of one embodiment of the present invention can be applied will be described.

Figure 36A:
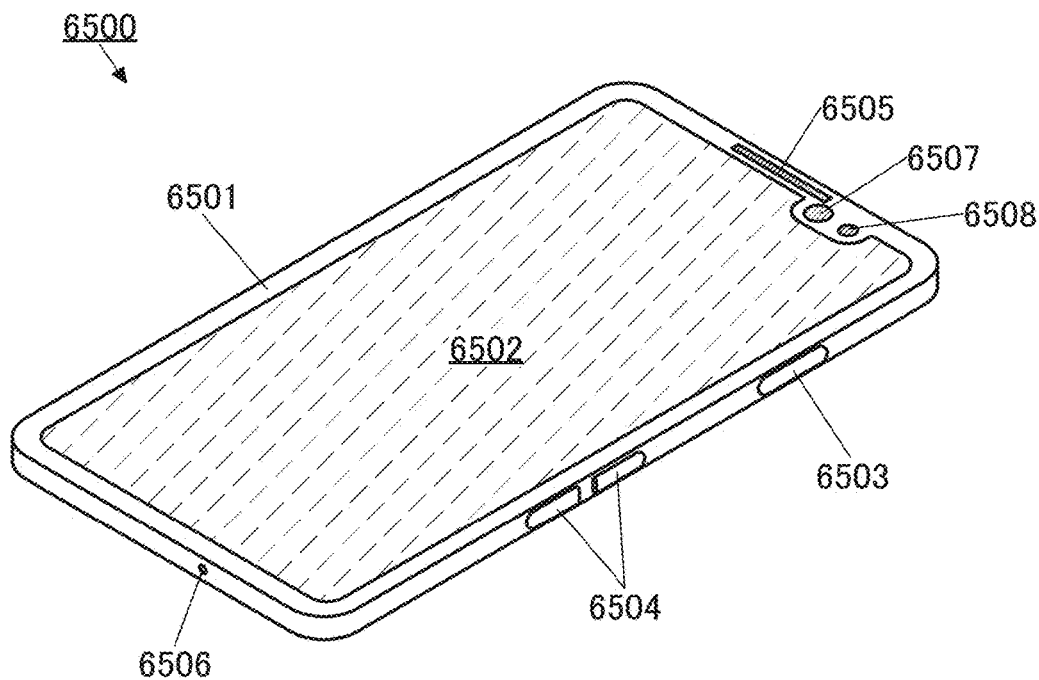
FIGS. 36A and 36B show a structure example of an electronic device.

An electronic device 6500 in FIG. 36A is a portable information terminal that can be used as a smartphone.

The electronic device 6500 includes a housing 6501, a display portion 6502, a power button 6503, buttons 6504, a speaker 6505, a microphone 6506, a camera 6507, and a light source 6508. The display portion 6502 has a touch panel function.

The display apparatus of one embodiment of the present invention can be used in the display portion 6502.

Figure 36B:
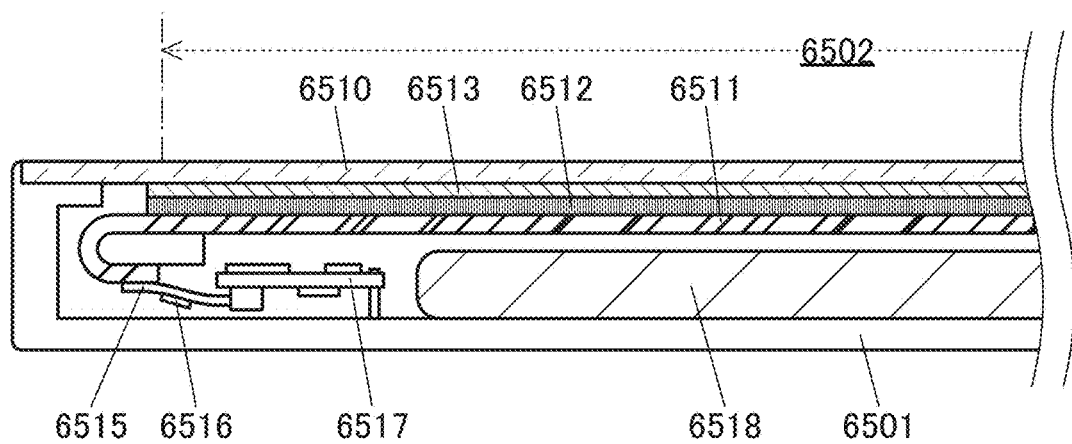

FIG. 36B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

A part of the display panel 6511 is folded back in a region outside the display portion 6502. An FPC 6515 is connected to the folded part. An IC 6516 is mounted on the FPC 6515. The FPC 6515 is connected to a terminal provided on the printed circuit board 6517.

A flexible display panel can be used as the display panel 6511, for example. Thus, an extremely lightweight electronic device can be achieved. Furthermore, since the display panel 6511 is extremely thin, the battery 6518 with a high capacity can be mounted without an increase in the thickness of the electronic device. Moreover, a part of the display panel 6511 is folded back so that a connection portion with the FPC 6515 is provided on the back side of the pixel portion, whereby an electronic device with a narrow bezel can be achieved.

Note that this embodiment can be combined with any of the other embodiments in this specification as appropriate.

Embodiment 11

In this embodiment, electronic devices each including a display apparatus fabricated using one embodiment of the present invention will be described.

Electronic devices described below as examples are each provided with a display apparatus of one embodiment of the present invention in a display portion. Thus, the electronic devices achieve high resolution. In addition, the electronic devices can achieve both high resolution and a large screen.

One embodiment of the present invention includes the display apparatus and at least one of an antenna, a battery, a housing, a camera, a speaker, a microphone, a touch sensor, and an operation button.

The electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display an image, information, or the like on a display portion. When the electronic device includes an antenna and a secondary battery, the antenna may be used for contactless power transmission.

The display portion of the electronic device of one embodiment of the present invention can display, for example, an image with full high definition, 4K2K, 8K4K, 16K8K, or higher resolution.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game machine; a portable information terminal; an audio reproducing device; and the like.

The electronic device using one embodiment of the present invention can be incorporated along a flat surface or a curved surface of an inside or outside wall surface of a house or a building, an interior or exterior surface of a car, or the like.

Figure 37A:
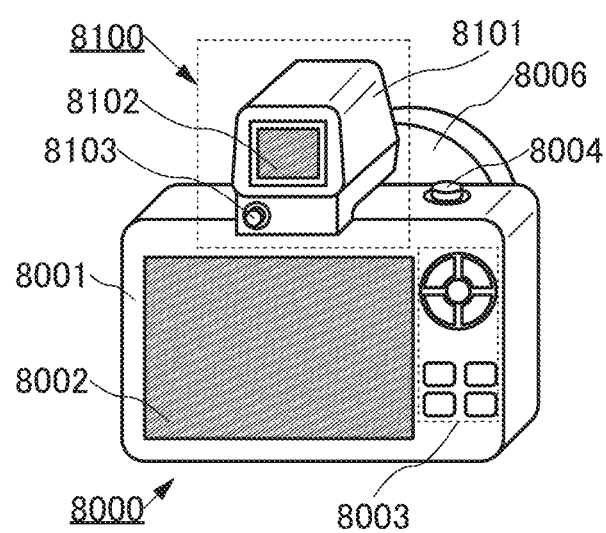
FIGS. 37A to 37C show structure examples of electronic devices.

FIG. 37A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display an image or the like received from the camera 8000 on the display portion 8102.

The button 8103 functions as a power supply button or the like.

A display apparatus of one embodiment of the present invention can be used in the display portion 8002 of the camera 8000 and the display portion 8102 of the finder 8100. Note that a finder may be incorporated in the camera 8000.

Figure 37B:
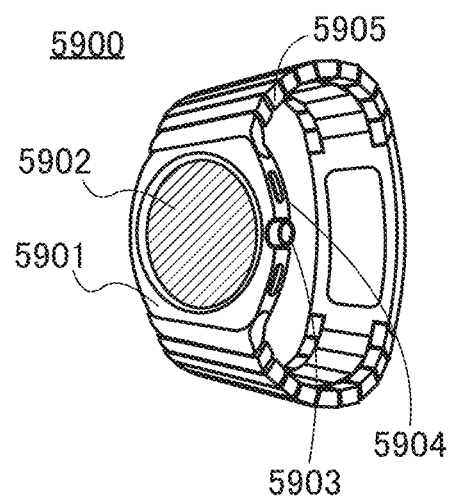

FIG. 37B is an external view of an information terminal 5900 as an example of a wearable terminal. The information terminal 5900 includes a housing 5901, a display portion 5902, an operation button 5903, an operator 5904, a band 5905, and the like.

The wearable terminal can display an image with high display quality on the display portion 5902 by including the display apparatus described in the above embodiment.

Figure 37C:
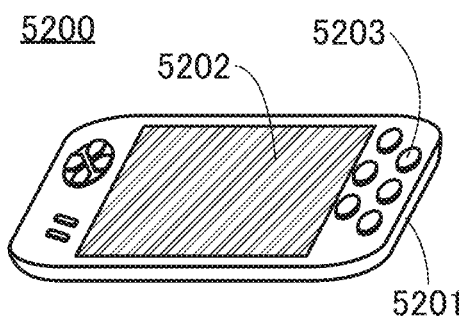

FIG. 37C is an external view of a portable game machine 5200 as an example of a game machine. The portable game machine 5200 includes a housing 5201, a display portion 5202, a button 5203, and the like.

An image displayed on the portable game machine 5200 can be output with a display apparatus such as a television device, a personal computer display, a game display, or a head-mounted display.

The portable game machine 5200 can display an image with high display quality on the display portion 5202 by including the display apparatus described in the above embodiment. In addition, the portable game machine 5200 with low power consumption can be provided. Furthermore, heat generation from a circuit can be reduced owing to low power consumption; thus, the influence of heat generation on the circuit, the peripheral circuit, and the module can be reduced.

Figure 38A:
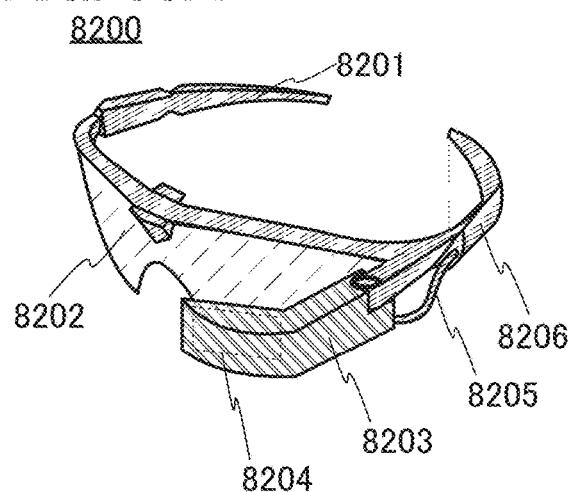
FIGS. 38A to 38D show structure examples of electronic devices.

FIG. 38A is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing the current flowing accompanying the movement of the user's eyeball at a position in contact with the user to recognize the user's sight line. The mounting portion 8201 may also have a function of monitoring the user's pulse with the use of the current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display apparatus of one embodiment of the present invention can be used in the display portion 8204.

Figure 38B:
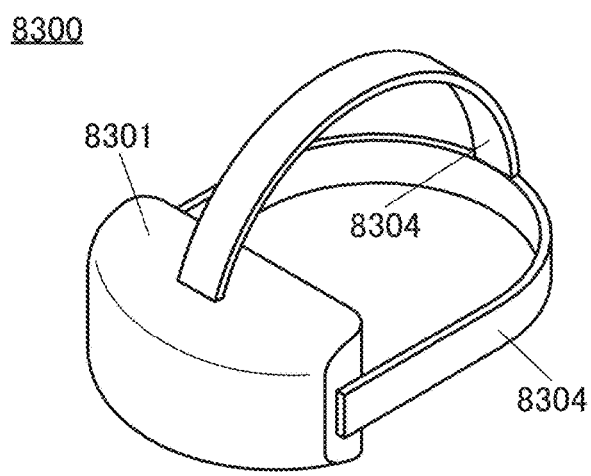
Figure 38C:
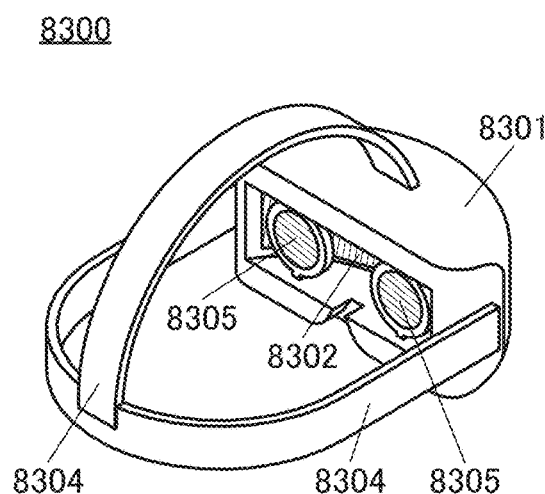
Figure 38D:
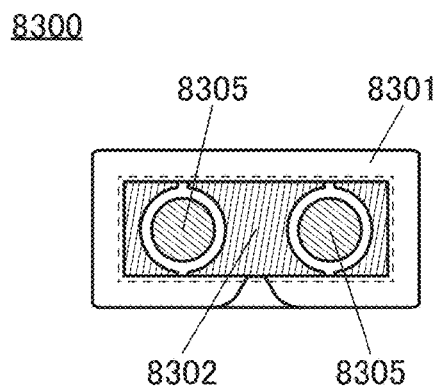

FIGS. 38B, 38C, and 38D are external views of the head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

A display apparatus of one embodiment of the present invention can be used in the display portion 8302. A display apparatus including a semiconductor device of one embodiment of the present invention has an extremely high resolution; thus, even when an image is magnified using the lenses 8305 as shown in FIG. 38D, the user does not perceive pixels, and thus a more realistic image can be displayed.

Note that this embodiment can be combined with any of the other embodiments in this specification as appropriate.

Example 1

In this example, results of fabricating the arithmetic circuit described in Embodiment 1 and performing various kinds of measurements on the arithmetic circuit are described.

Figure 39:
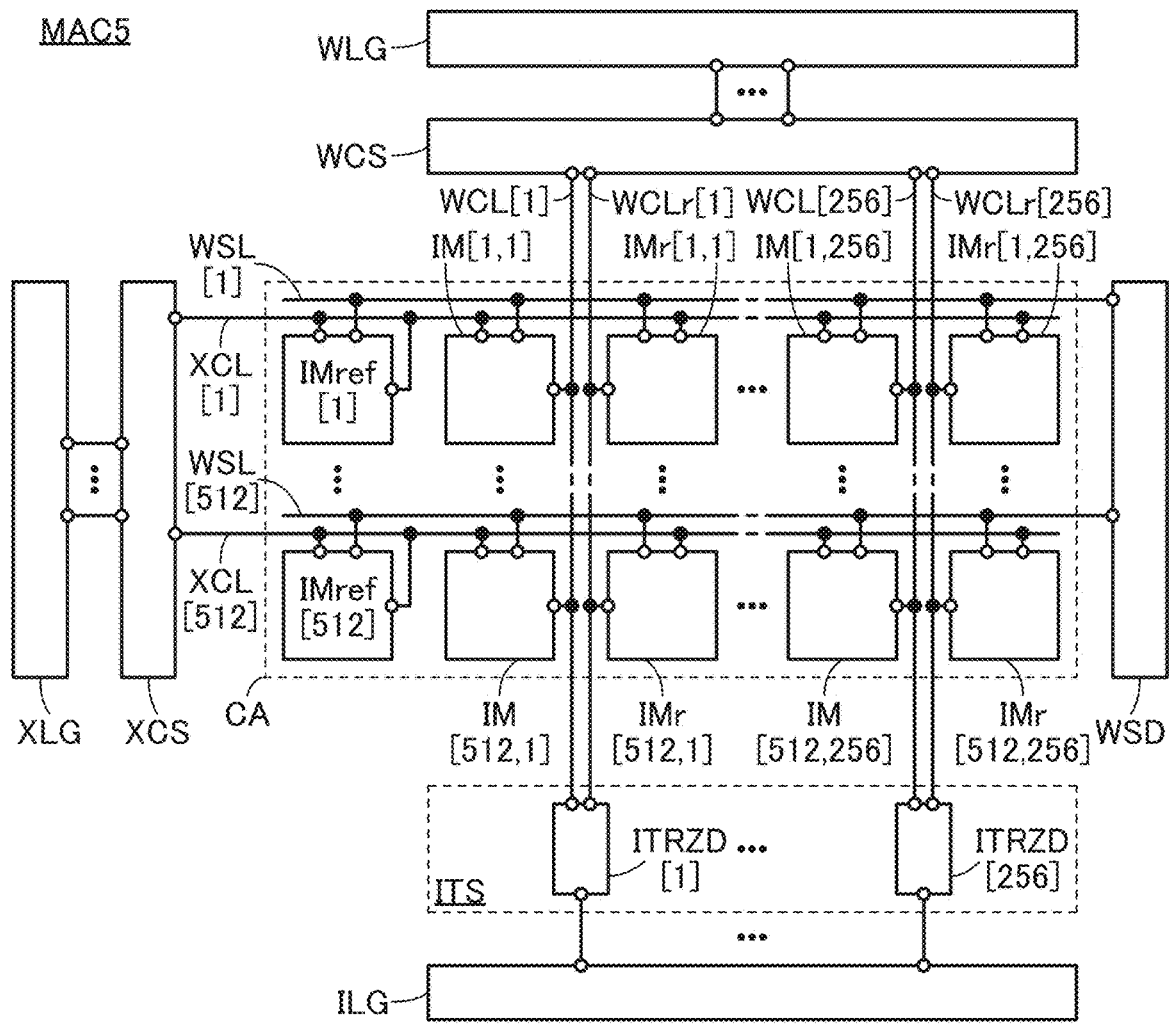
FIG. 39 is a block diagram showing a configuration of a semiconductor device described in Example.

FIG. 39 is a block diagram of the fabricated arithmetic circuit. Like the arithmetic circuit MAC1 described in Embodiment 1, an arithmetic circuit MAC5 has the cell array CA that includes the cells IM, IMr, and IMref.

Specifically, the cell array CA includes the cells IM[1,1] to IM[512,256], the cells IMr[1,1] to IMr[512,256], and the cells IMref[1] to IMref[512]. That is, the cells IM[1,1] to IM[512,256] and the cells IMr[1,1] to IMr[512,256] are arranged in a matrix of 512×512 in the cell array CA. The cells IMref[1] to IMref[512] are arranged on the left side of the matrix of 512×512 in a top view.

The arithmetic circuit MAC5 includes the circuit WCS, the circuit XCS, the circuit WSD, and the circuit ITS. The circuit ITS of the arithmetic circuit MAC5 includes the converter circuits ITRZD[1] to ITRZD[256] like the circuit ITS described in Embodiment 1. The arithmetic circuit MAC5 also includes a circuit WLG, a circuit XLG, and a circuit ILG.

In the cell array CA, the wirings WCL[1] to WCL[256] and the wirings WCLr[1] to WCLr[256] extend in the column direction. In the cell array CA, the wirings WSL[1] to WSL[512] and the wirings XCL[1] to XCL[512] extend in the row direction.

The cells IM[1,1] to IM[512,1] are electrically connected to the wiring WCL[1], and the cells IMr[1,1] to IMr[512,1] are electrically connected to the wiring WCLr[1]. The cells IM[1,256] to IM[512,256] are electrically connected to the wiring WCL[256], and the cells IMr[1,256] to IMr[512,256] are electrically connected to the wiring WCLr[256].

The circuit WCS is electrically connected to the wirings WCL[1] to WCL[256] and the wirings WCLr[1] to WCLr[256]. The circuit XCS is electrically connected to the wirings XCL[1] to XCL[512]. The circuit WSD is electrically connected to the wirings WSL[1] to WSL[512]. The circuit ITRZD[1] is electrically connected to the wiring WCL[1] and the wiring WCLr[1]. The circuit ITRZD[256] is electrically connected to the wiring WCL[256] and the wiring WCLr[256].

The circuit WLG is electrically connected to the circuit WCS. The circuit XLG is electrically connected to the circuit XCS. The circuit ILG is electrically connected to the converter circuits ITRZD[1] to ITRZD[256].

Like the circuit WCS described in Embodiment 1, the circuit WCS of the arithmetic circuit MAC5 has a function of supplying a current in an amount corresponding to the first data. Like the circuit XCS described in Embodiment 1, the circuit XCS of the arithmetic circuit MAC5 has a function of supplying a current in an amount corresponding to the reference data or a current in an amount corresponding to the second data. Like the circuit WSD described in Embodiment 1, the circuit WSD of the arithmetic circuit MAC5 has a function of supplying a predetermined signal to any of the wirings WSL[1] to WSL[512] at the time of writing of the first data to the cells of the cell array CA, to select a row of the cell array CA to which the first data is to be written. The converter circuits ITRZD[1] to ITRZD[256] have a function of performing AD conversion.

The circuit WLG is a logic circuit for controlling the circuit WCS. Specifically, the circuit WLG has a function of transmitting a digital value corresponding to the first data, to the circuit WCS. The circuit XLG is a logic circuit for controlling the circuit XCS. Specifically, the circuit XLG has a function of transmitting a digital value corresponding to the second data, to the circuit XCS. The circuit ILG is a logic circuit for controlling the converter circuits ITRZD[1] to ITRZD[256]. Specifically, the circuit ILG has a function of acquiring arithmetic operation results of the arithmetic circuit MAC5 from the digital values output from the converter circuits ITRZD[1] to ITRZD[256].

Next, the circuit configuration of the cells included in the cell array CA is described.

Figure 40:
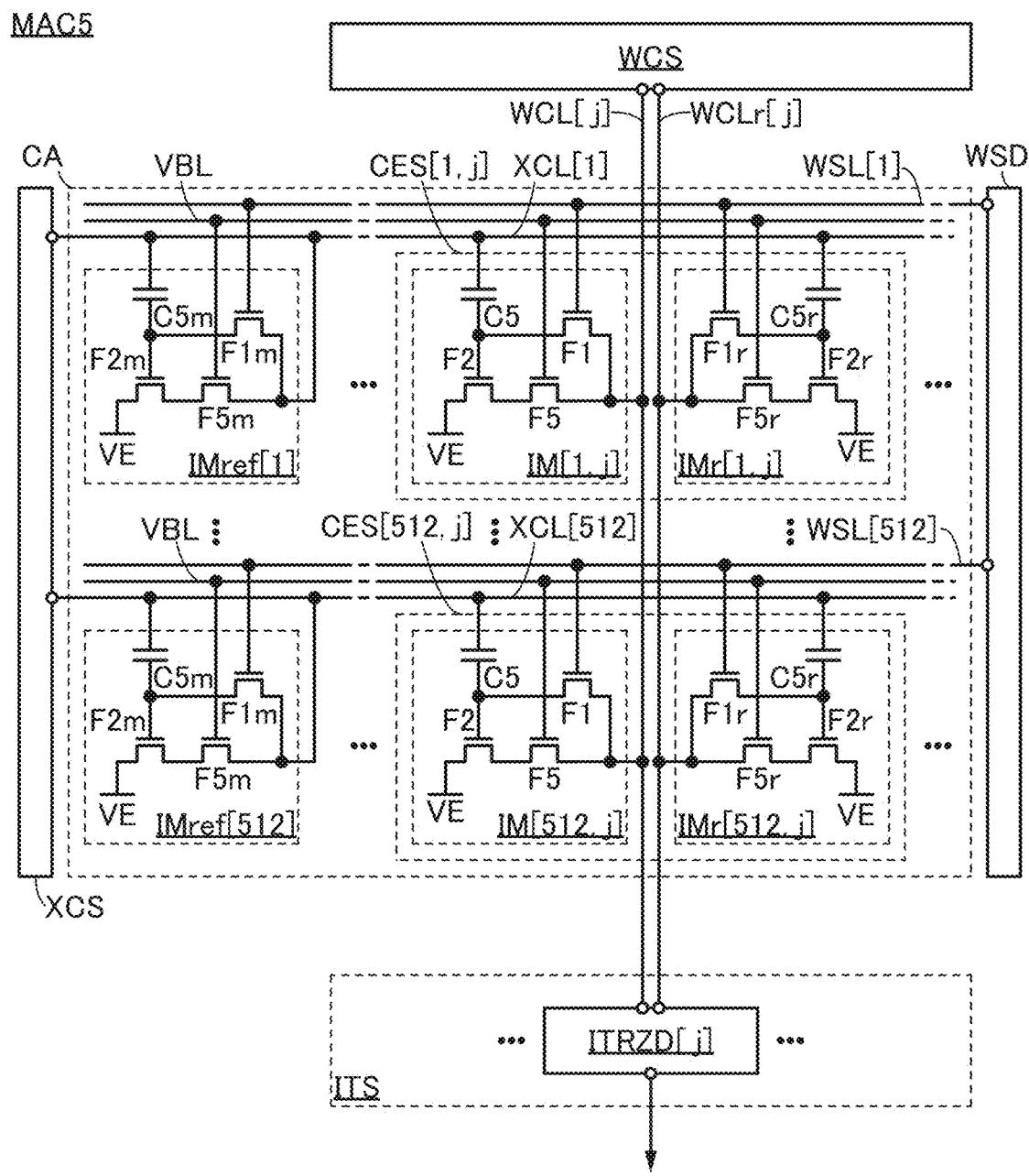
FIG. 40 is a circuit diagram showing a configuration of a semiconductor device described in Example.

FIG. 40 is a circuit diagram specifically illustrating the cells included in the cell array CA of the arithmetic circuit MAC5 in FIG. 39. FIG. 40 shows the cell IM[1, j] (j is an integer greater than or equal to 1 and less than or equal to 256), the cell IM[512, j], the cell IMr[1 j], the cell IMr[512, j], the cell IMref[1], and the cell IMref[512]. To illustrate the connection structure between the above cells and the circuits WCS, XCS, WSD, and ITS (ITRZD[j]), FIG. 40 also shows the circuits WCS, XCS, WSD, and ITS (ITRZD[j]).

In FIG. 40, the cell IM[1, j] and the cell IMr[1, j] are collectively denoted as the circuit CES[1, j] as in FIG. 2 illustrating the arithmetic circuit MAC1. In FIG. 40, the cell IM[512, j] and the cell IMr[512,j] are collectively denoted as the circuit CES[512, j].

The cell IM[1, j] shown in FIG. 40 is a variation of the cell IM[1, j] of the arithmetic circuit MAC1 in FIG. 2 and is different from the cell IM[1, j] of the arithmetic circuit MAC1 in that a transistor F5 is included. The cell IM[512, j] in the arithmetic circuit MAC5 also includes the transistor F5.

In the cell array CA in FIG. 40, a wiring VBL is provided unlike in the cell array CA of the arithmetic circuit MAC1 illustrated in FIG. 2.

In each of the cells IM[1, j] to IM[512, j], the first terminal of the transistor F1 is electrically connected to the gate of the transistor F2. The first terminal of the transistor F2 is electrically connected to the wiring VE. The first terminal of the capacitor C5 is electrically connected to the gate of the transistor F2. The second terminal of the transistor F2 is electrically connected to a first terminal of the transistor F5.

In each of the cells IMr[1, j] to IMr[512, j], the first terminal of the transistor F1r is electrically connected to the gate of the transistor F2r. The first terminal of the transistor F2r is electrically connected to the wiring VE. The first terminal of the capacitor C5r is electrically connected to the gate of the transistor F2r. The second terminal of the transistor F2r is electrically connected to a first terminal of a transistor F5r.

Note that the cells IM[1, j] to IM[512, j] have the same circuit configurations as the cells IMr[1, j] to IMr[512, j], respectively. Thus, the cells IM and the cells IMr can be interchanged in the description of this example. Likewise, the wirings WCL and the wirings WCLr can be interchanged in the description of this example. The same applies to the circuit elements included in the cells IM and IMr.

In each of the cells IMref[1] to IMref[512], the first terminal of the transistor F1m is electrically connected to the gate of the transistor F2m. The first terminal of the transistor F2m is electrically connected to the wiring VE. The first terminal of the capacitor C5m is electrically connected to the gate of the transistor F2m. The second terminal of the transistor F2m is electrically connected to a first terminal of a transistor F5m.

The wiring WSL[1] is electrically connected to the gate of the transistor F1 included in each of the cells IM[1,1] to IM[1,256], the gate of the transistor F1r included in each of the cells IMr[1,1] to IMr[1,256], and the gate of the transistor F1m included in the cell IMref[1].

The wiring XCL[1] is electrically connected to the second terminal of the capacitor C5 included in each of the cells IM[1,1] to IM[1,256], the second terminal of the capacitor C5r included in each of the cells IMr[1,1] to IMr[1,256], the second terminal of the capacitor C5m included in the cell IMref[1], and the second terminal of the transistor F1m included in the cell IMref[1].

The wiring WCL[j] is electrically connected to the second terminal of the transistor F1 included in each of the cells IM[1, j] to IM[512, j].

The wiring WCLr[j] is electrically connected to the second terminal of the transistor F1r included in each of the cells IMr[1, j] to IMr[512, j].

The wiring VBL is electrically connected to a gate of the transistor F5 included in each of the cells IM[1,1] to IM[1,256], a gate of the transistor F5r included in each of the cells IMr[1,1] to IMr[1,256], and a gate of the transistor F5m included in the cell IMref[1]. The wiring VBL is electrically connected to the gate of the transistor F5 included in each of the cells IM[512,1] to IM[512,256], the gate of the transistor F5r included in each of the cells IMr[512,1] to IMr[512,256], and the gate of the transistor F5m included in the cell IMref[512].

Absence of the transistor F5 in each of the cell IM[1,1] (not shown) to the cell IM[512,256] (not shown) in FIG. 40 might cause drain-induced barrier lowering (DIBL) at the time of application of a high-level potential from the wiring WCL to the second terminal of the transistor F2. Drain-induced barrier lowering in the transistor F2 reduces its threshold voltage, so that the voltage range where the transistor F2 operates in the subthreshold region might be varied.

Providing the transistor F5 between the second terminal of the transistor F2 and the wiring WCL as in the cells IM[1,1] to IM[512,256] in FIG. 40 can prevent direct application of a high-level potential from the wiring WCL to the second terminal of the transistor F2. As a result, drain-induced barrier lowering in the transistor F2 can be prevented. Thus, the transistor F2 included in each of the cells IM[1,1] to IM[512,256] in FIG. 40 can stably operate.

Likewise, providing the transistor F5r in each of the cells IMr[1,1] to IMr[512,256] in FIG. 40 enables stable operation of the transistor F2r. Furthermore, providing the transistor F5m in each of the cells IMref[1] to IMref[512] in FIG. 40 enables stable operation of the transistor F2m.

The transistors F5, F5r, and F5m in FIG. 40 are sometimes referred to as clamp transistors, clamp FETs, or the like. The gates of the transistors F5, F5r, and F5m are preferably supplied with a constant voltage. Thus, the wiring VBL shown in FIG. 40 functions as a wiring for supplying a constant voltage. Note that the constant voltage was 0.7 V in this example.

The wiring VE shown in FIG. 40 functions as a wiring for supplying the ground potential.

Note that each of the transistors F1, F1r, and F1m included in the cell array CA includes indium gallium zinc oxide in the channel formation region. In other words, the transistors F1, F1r, and F1m are OS transistors.

Each of the transistors F2, F5, F2r, F5r, F2m, and F5m included in the cell array CA includes silicon in the channel formation region. In other words, the transistors F2, F5, F2r, F5r, F2m, and F5m are Si transistors.

In the arithmetic circuit MAC5, the transistors F2, F2r, and F2m in an on state operate in the subthreshold region.

Figure 41:
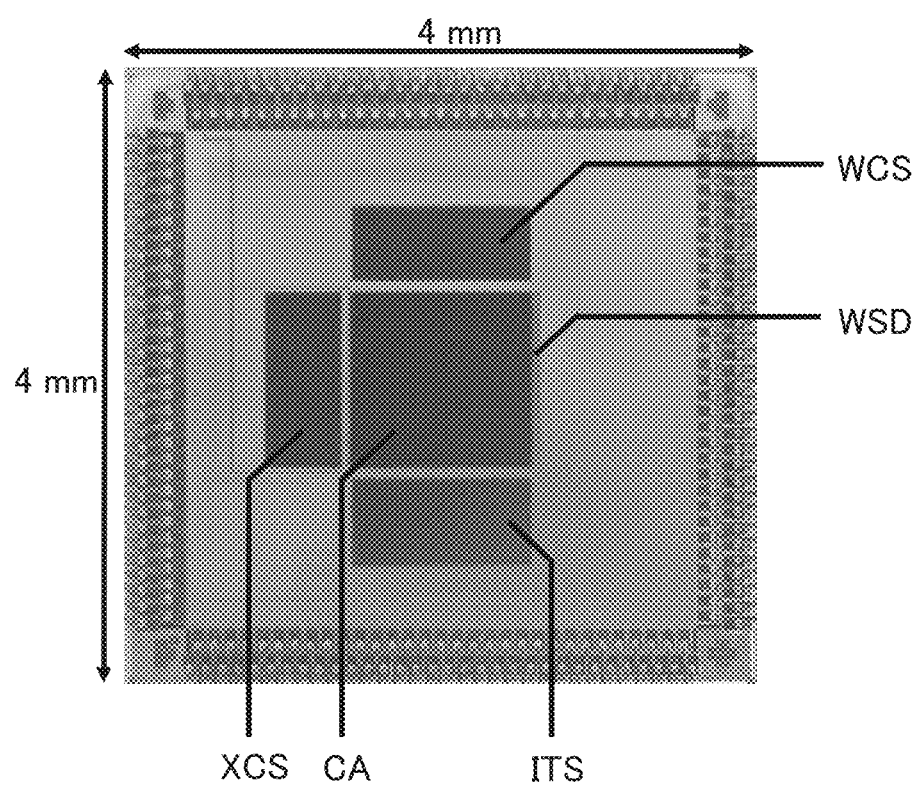
FIG. 41 is a top-view photograph of a semiconductor device described in Example.

FIG. 41 is a top-view photograph of a semiconductor chip in which the arithmetic circuit MAC5 shown in FIG. 39 and FIG. 40 was fabricated. The arithmetic circuit MAC5 was designed to be within a size of 4 mm×4 mm.

Figure 42A:
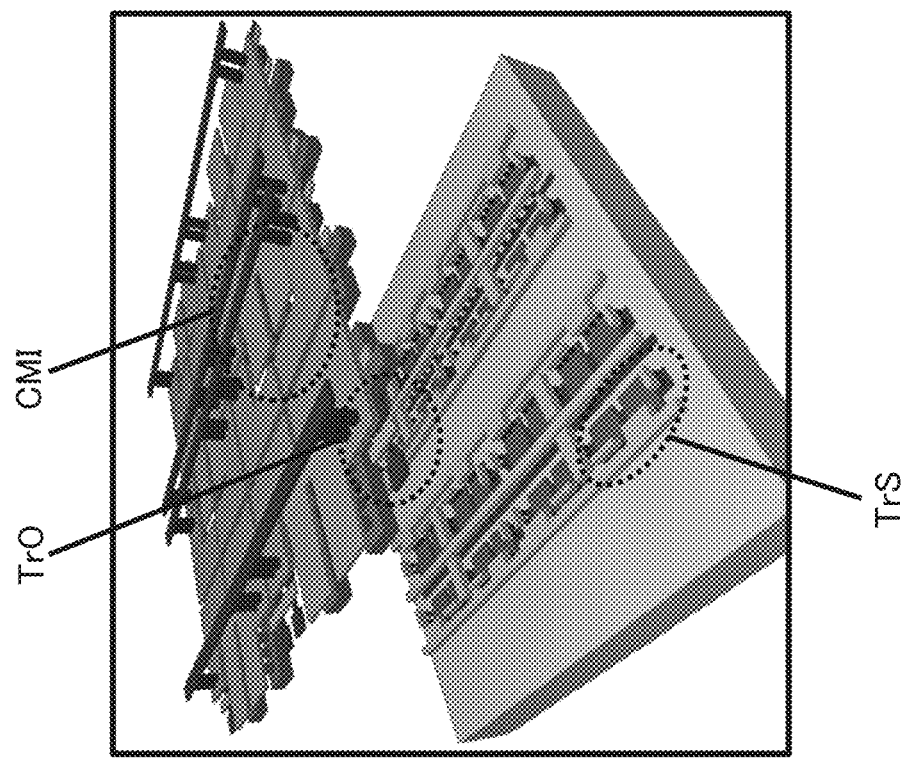
FIG. 42A is a layout of a structure of a semiconductor device described in Example and FIG. 42B is a cross-sectional image of the semiconductor device.
Figure 42B:
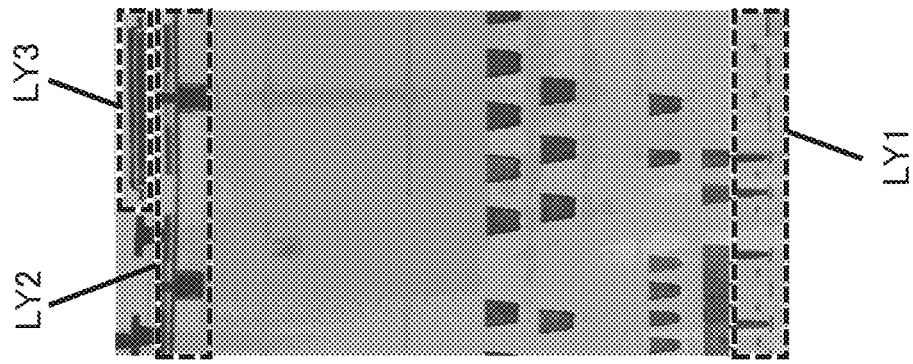

FIG. 42A is a schematic perspective view (sometimes referred to as layout diagram) for illustrating the stacked-layer structure of the semiconductor chip, and FIG. 42B is a cross-sectional image of the semiconductor chip obtained with a scanning transmission electron microscope (STEM). The semiconductor chip includes, as shown in FIG. 42B, a layer LY1, a layer LY2 above the layer LY1, and a layer LY3 above the layer LY2. The layer LY1 includes a semiconductor substrate formed of silicon and transistors TrS (Si transistors) formed over the semiconductor substrate. Furthermore, the layer LY1 includes a CMOS circuit formed over the semiconductor substrate. The layer LY2 includes transistors TrO (OS transistors) that include indium gallium zinc oxide in the channel formation regions. The layer LY3 includes a plurality of planar MIM capacitors CMI.

Next, results of performing various kinds of measurements on the semiconductor chip shown in FIG. 41 are described.

Figure 43A:
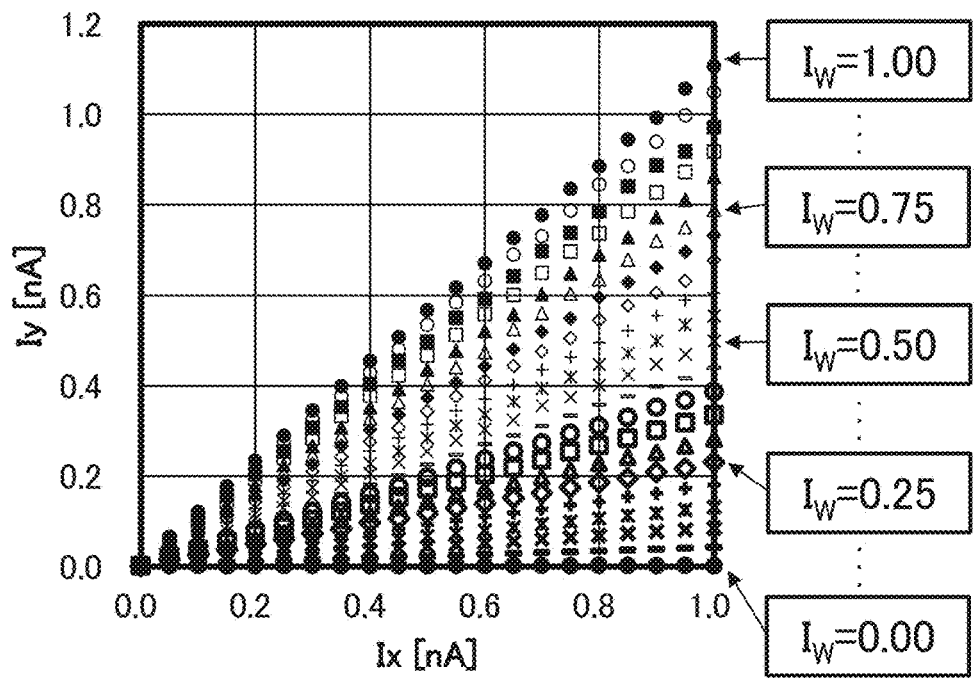
FIGS. 43A and 43B are graphs showing multiplication characteristics of a semiconductor device described in Example.
Figure 43B:
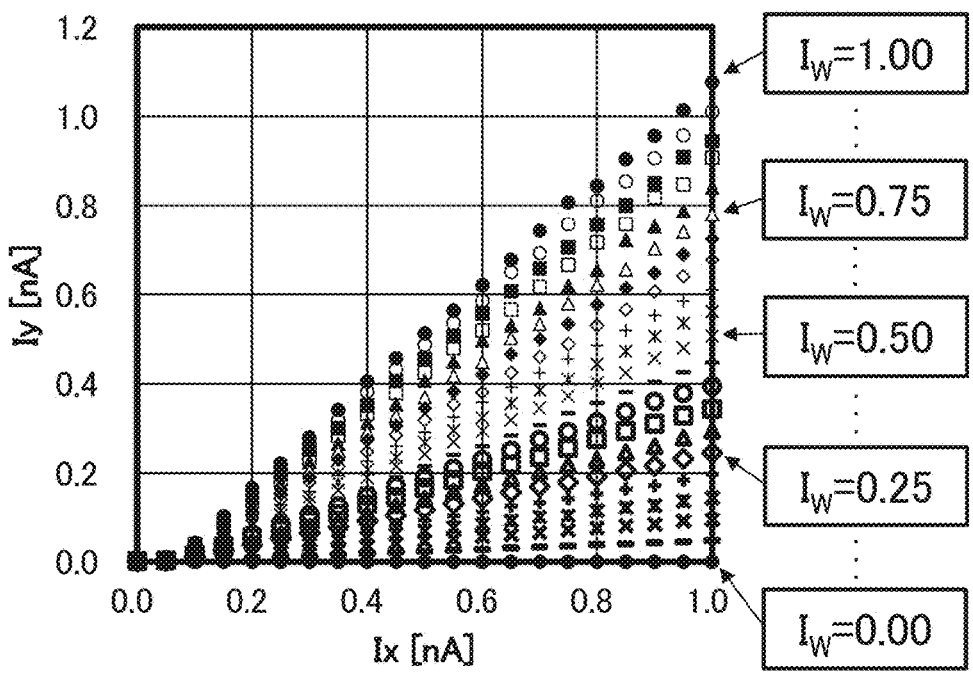
Figure 44:
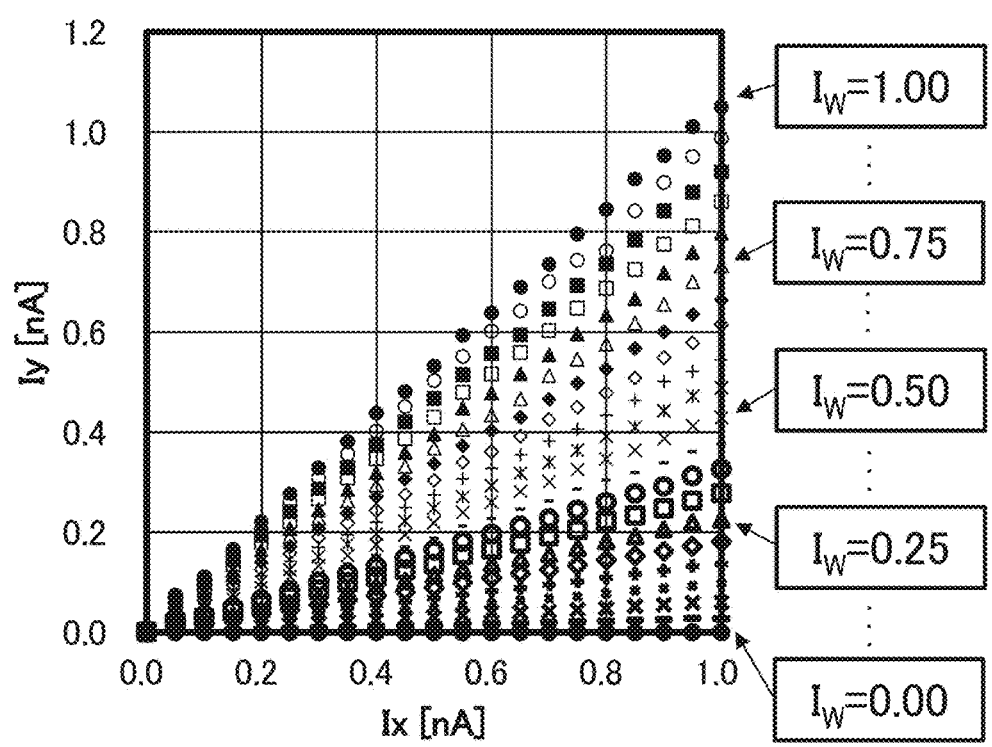
FIG. 44 is a graph showing multiplication characteristics of a semiconductor device described in Example.

FIGS. 43A and 43B and FIG. 44 are each a graph showing the multiplication characteristics of one cell of the semiconductor chip measured at a predetermined temperature. FIG. 43A is the graph obtained by the measurement at 25° C. (sometimes referred to as room temperature (RT)), FIG. 43B is the graph obtained by the measurement at 85° C., and FIG. 44 is the graph obtained by the measurement at −40° C.

In each of FIGS. 43A and 43B and FIG. 44, the horizontal axis represents the amount (denoted as $I_x$) of the current flowing as the second data from the circuit XCS to the cell IMref through the wiring XCL, and the vertical axis represents the amount (denoted as I) of the current flowing as the multiplication result from the converter circuit ITRZD to the cell IM through the wiring WCL. Note that a current amount $I_W$ corresponding to $I_y$), which was set in the cell IM as the first data, was from 0.00 nA to 1.00 nA in the steps of 0.05 nA. FIGS. 43A and 43B and FIG. 44 show the results with each current amount $I_W$ that could be set in the cell IM. Note that the cell IM retained a potential corresponding to the current amount $I_W$. Ideally, the current amount $I_W$ set in the cell IM corresponds to slopes in the graphs in FIGS. 43A and 43B and FIG. 44.

The measurement results in FIGS. 43A and 43B and FIG. 44 show that the arithmetic circuit MAC5 adequately performed multiplication. It was also confirmed that the multiplication characteristics of the arithmetic circuit MAC5 were not affected by the temperature set at −40° C., 25° C., or 85° C.

Figure 45A:
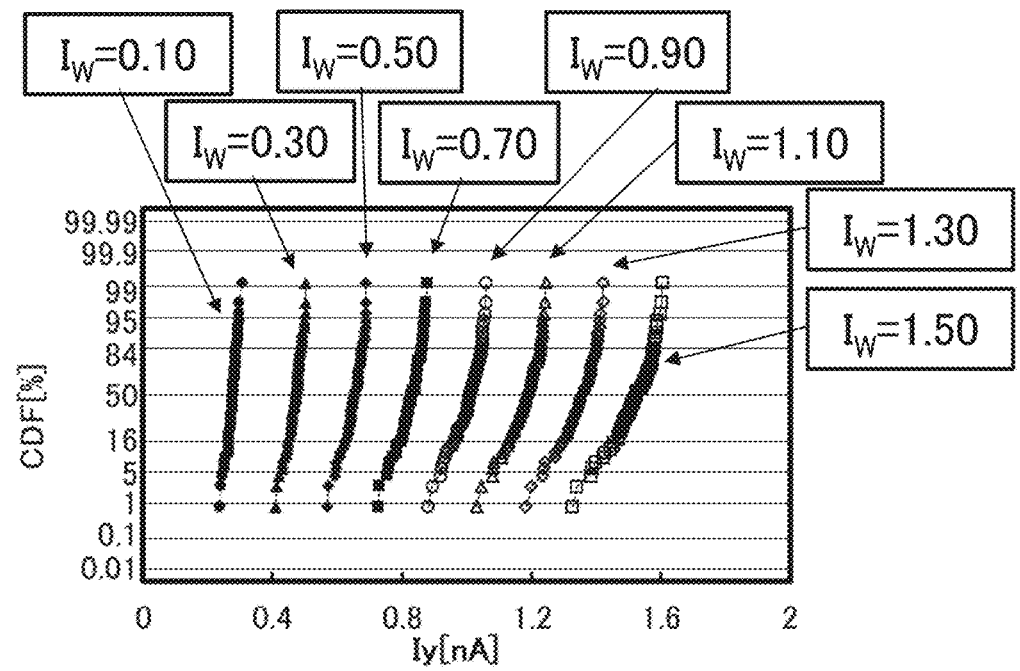
FIG. 45A is a graph showing distribution of current amounts output from a semiconductor device described in Example.

FIG. 45A is a graph showing distribution of the current amounts $I_y$ output from a plurality of cells IM electrically connected to one wiring WCL. Note that the amount A of the current flowing from the circuit XCS to each cell IMref through the wiring XCL in each row was 1 nA (the value of the second data X was "1"). The horizontal axis represents the current amount $I_y$ output from the cell IM, and the vertical axis represents the cumulant (the value of a cumulative distribution function (CDF)) of the number of the cells IM that output a current in an amount smaller than or equal to the current amount $I_y$. Note that the current amount $I_W$ corresponding to W, which was set in the cell IM as the first data, was from 0.10 nA to 1.50 nA in the steps of 0.20 nA. FIG. 45A shows the results with each current amount $I_W$ that could be set in the cell IM. Note that the cell IM retained a potential corresponding to the current amount $I_W$.

FIG. 45A shows that when the current amount $I_W$ set in the cell IM was smaller (the cell IM retained a lower potential), the current amount I varied less despite an increase in the CDF. It was thus confirmed that the smaller the current amount $I_W$ set in the cell IM is, the smaller the variation in the current amounts A output from the plurality of cells IM.

Figure 45B:
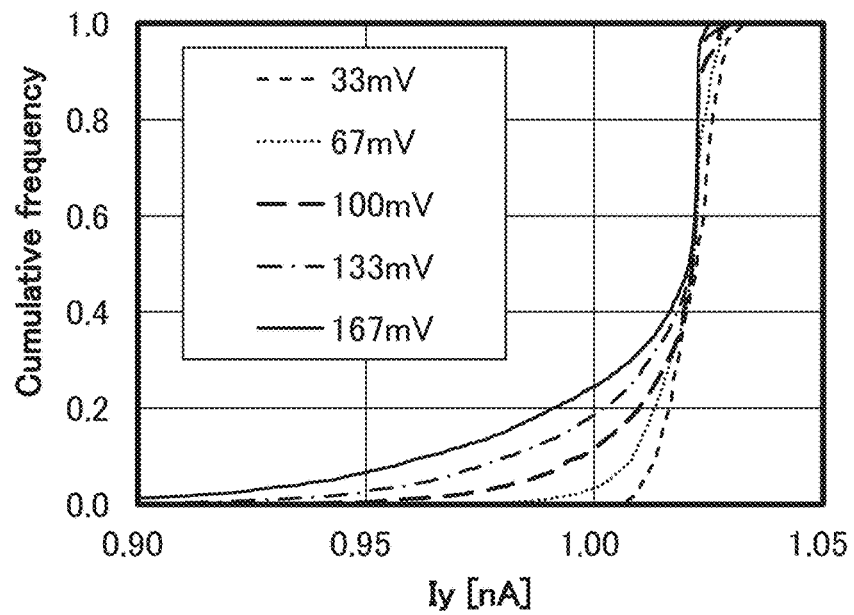
FIG. 45B is a graph showing simulation results indicating a relation between a variation in the threshold voltage of a transistor included in a semiconductor device described in Example and the current amount output from the semiconductor device.

FIG. 45B shows results of simulation of the influence of a variation in the threshold voltage of the transistors F1 in the cells IM on the current amount $I_y$ output from the cell IM. FIG. 45B shows a cumulative frequency against the current amount $I_y$ output from the cell IM in the following cases with the average value of the threshold voltage set at the central value: the case where the variation in the threshold voltage is smaller than 33 mV; the case where the variation in the threshold voltage is smaller than 66 mV; the case where the variation in the threshold voltage is smaller than 100 mV; the case where the variation in the threshold voltage is smaller than 133 mV; and the case where the variation in the threshold voltage is smaller than 167 mV. It was found from FIG. 45B that the larger the variation in the threshold voltage of the transistors F1 is, the more the distribution of the current amounts A expands, indicating the necessity of reducing the variation of the threshold voltage of the transistors F1.

Figure 46:
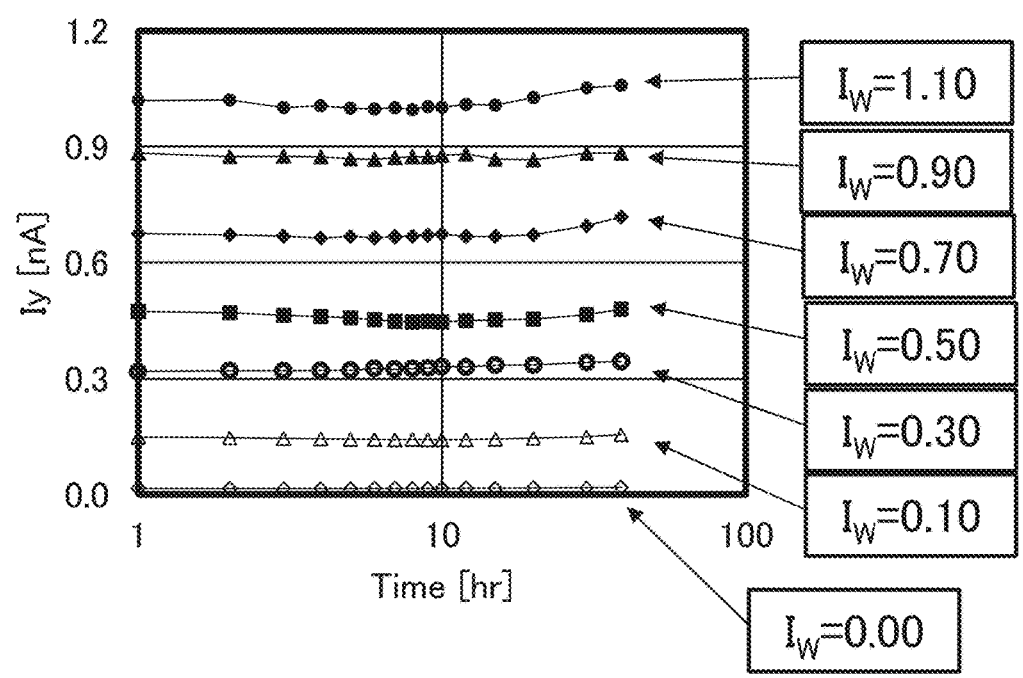
FIG. 46 is a graph showing retention characteristics of a semiconductor device described in Example.

FIG. 46 is a graph showing the data retention characteristics of the cell IM, or specifically, the current amount $I_y$ output from the cell IM against the elapsed time since writing of W as the first data to the cell IM. Note that the current amount $I_W$ corresponding to W, which was set in the cell IM as the first data, was 0.00 nA, 0.10 nA, 0.30 nA, 0.50 nA, 0.70 nA, 0.90 nA, or 1.10 nA. FIG. 46 shows the results with each current amount $I_W$ that could be set in the cell IM. The cell IM retained a potential corresponding to the current amount $I_W$. FIG. 46 showed that the current amount $I_y$ changed 5% or less from the initial value after 30 hours elapsed, irrespective of the current amount $I_W$.

Next, the results of a test of recognizing handwriting by using the MNIST database are described.

Figure 47:
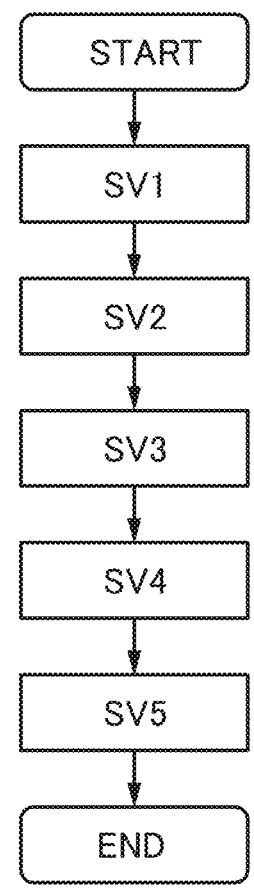
FIG. 47 is a flowchart showing a handwritten character recognition operation.

FIG. 47 shows a model of the fully connected neural network used in the test. The fully connected neural network has an input layer, an intermediate layer, and an output layer, and the model thereof includes Steps SV1 to SV5 as shown in FIG. 47. Note that the model shown in FIG. 47 is sometimes referred to as a flowchart.

In the model of the fully connected neural network shown in FIG. 47, a product-sum operation is performed in each of the intermediate layer and the output layer. In the test, the operations in the intermediate layer and the output layer are performed using the same arithmetic circuit MAC5 so that a product-sum operation is performed in each of the intermediate layer and the output layer. The digital value output from each of the converter circuits ITRZD[1] to ITRZD[256] of the arithmetic circuit MAC5 is input to the circuit XCS of the arithmetic circuit MAC5, and the circuit XCS outputs an analog current corresponding to the digital value to the wiring XCL. Accordingly, the number of rows of the arithmetic circuit MAC5 used for the calculation in the output layer is 256.

In Step SV1, image data that is a handwritten character is input to the arithmetic circuit MAC5 as the second data. This corresponds to data input to the input layer of the fully connected neural network. Note that the number of pixels of the image data is 23×22.

Specifically, the data of each pixel (23×22=506) in the image data is converted into a digital value by the circuit XLG, and the digital value is input to the circuit XCS. Thus, the circuit XCS can output an analog current corresponding to the digital value to the cell array CA. Here, the analog current is the second data used in the arithmetic operation in the intermediate layer.

In Step SV2, of the cells IM[1,I] to IM[512,256] and the cells IMr[1,1] to IMr[512,256] included in the cell array CA of the arithmetic circuit MAC5, the cells IM[1,1] to IM[506,256] and the cells IMr[1,1] to IMr[506,256] retain 506×256 pieces of first data used for the arithmetic operation in the intermediate layer. Specifically, the first data is a value obtained through learning. Then, the circuit XCS outputs an analog current to the cell array CA, so that a product-sum operation of the first data and the second data can be performed. This corresponds to the arithmetic operation in the intermediate layer of the fully connected neural network.

In Step SV3, the arithmetic operation using a ReLU function is performed with the use of the arithmetic operation results obtained in Step SV2. The result of the arithmetic operation using a ReLU function is converted into a digital value through analog-to-digital conversion or the like. The digital value is input to the circuit XCS, whereby the circuit XCS can output an analog current corresponding to the digital value to the cell array CA. Here, the analog current is the second data used in the arithmetic operation in the output layer.

In Step SV4, the cells IM[1,1] to IM[256,256] and the cells IMr[1,1] to IMr[256,256] included in the cell array CA of the arithmetic circuit MAC5 retain 256×10 pieces of first data used for the arithmetic operation in the output layer. Specifically, the first data is a value obtained through learning. Then, the circuit XCS outputs an analog current to the cell array CA, so that a product-sum operation of the first data and the second data can be performed. This corresponds to the arithmetic operation in the output layer of the fully connected neural network.

In Step SV5, the circuit ITS outputs 10 pieces of data on the arithmetic operation results. Note that each of the 10 pieces of data on the arithmetic operation results corresponds to the correspondence degree of the handwritten character input in Step SV1.

The handwritten character recognition using the arithmetic circuit MAC5 on the basis of the above-described model of the fully connected neural network was able to be performed with an accuracy rate of 93.2% and an arithmetic efficiency of 148.2 TOPS/W.

Figure 48:
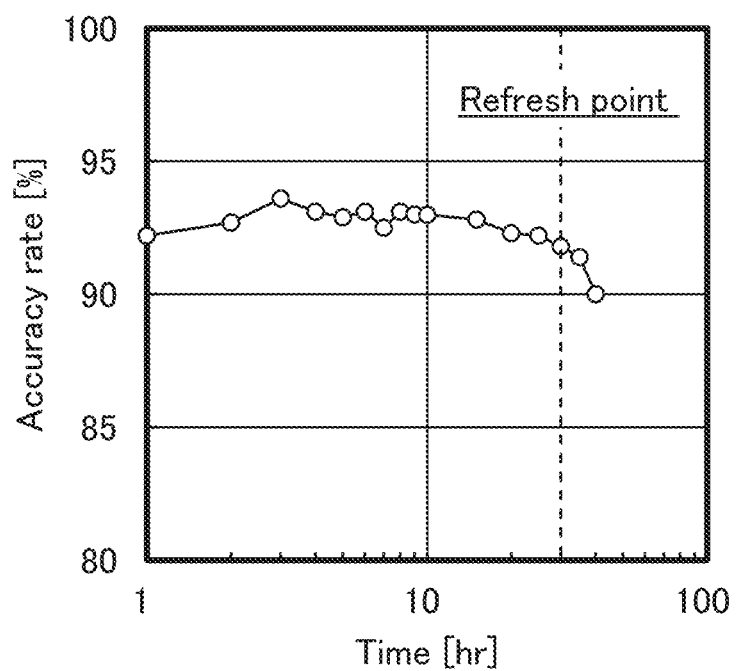
FIG. 48 is a graph showing a relation between operation time and accuracy rate of handwritten character recognition in a semiconductor device described in Example.

FIG. 48 is a graph showing the accuracy rate against the elapsed time since input of image data to the cell IM in the handwritten character recognition based on the above-described model of the fully connected neural network in FIG. 47. From FIG. 48, it was confirmed that the accuracy rate of 90% or higher was maintained before 30 hours elapsed since the image data was input. Note that in FIG. 48, the point in time when 30 hours elapsed is denoted with "Refresh point".

Figure 49:
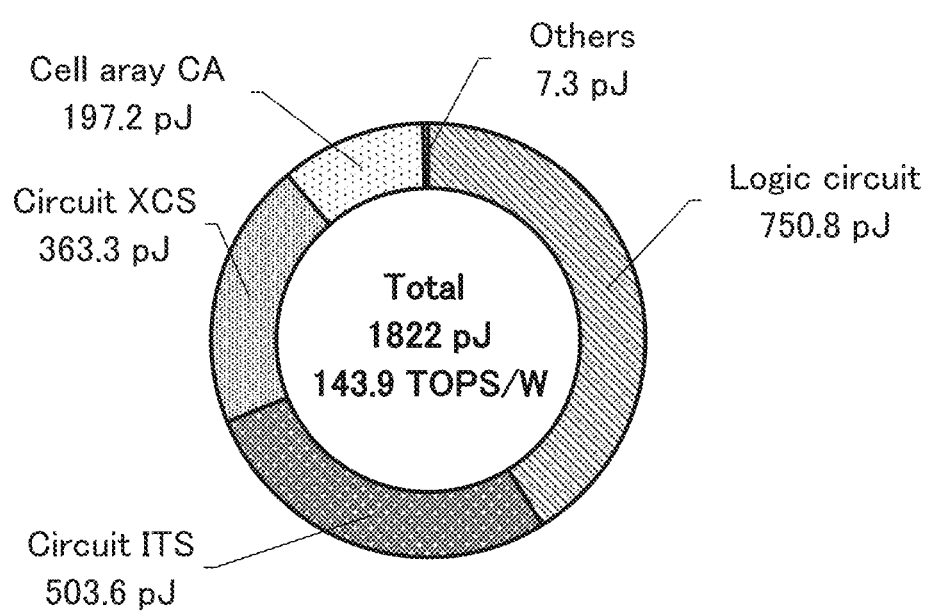
FIG. 49 is a graph showing throughput of handwritten character recognition processing in a semiconductor device described in Example.

FIG. 49 shows a breakdown of power consumption of the arithmetic circuit MAC5 when the inference was performed with the fully connected neural network in FIG. 47. From FIG. 49, it was confirmed that the power consumption of the cell array CA accounted for approximately 10% of the entire power consumption.

Figure 50A:
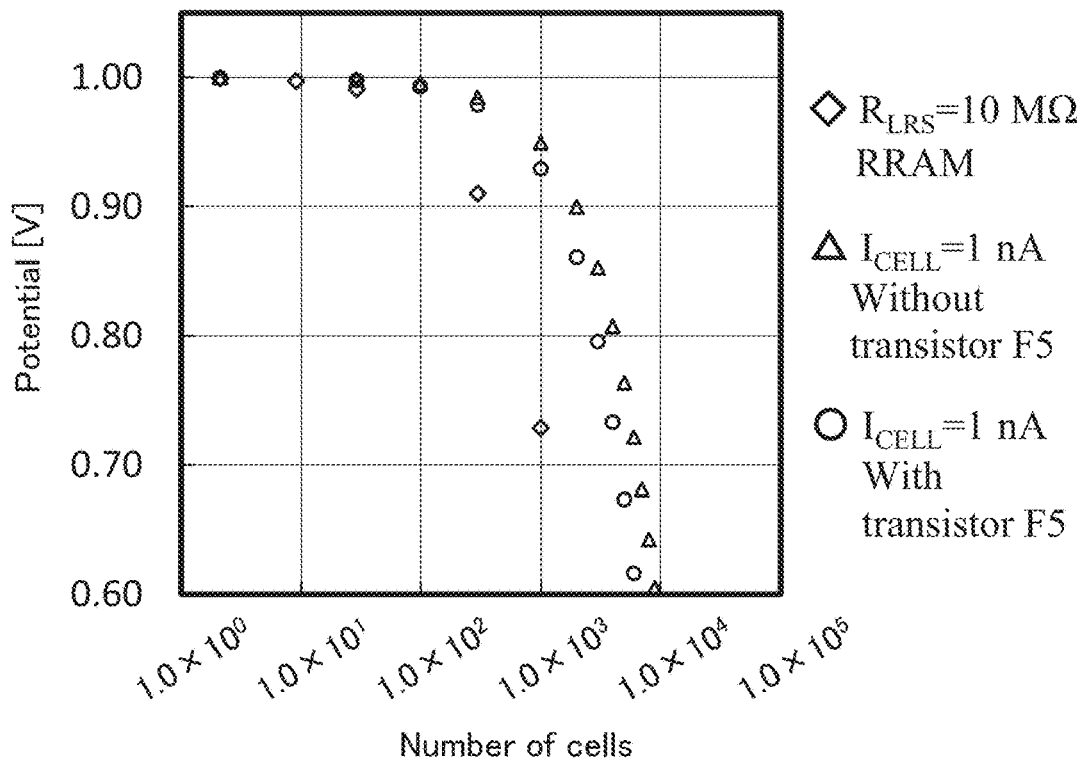
FIGS. 50A and 50B are graphs showing simulation results of an output current amount and the potential of one wiring connected to cells against the number of cells.
Figure 50B:
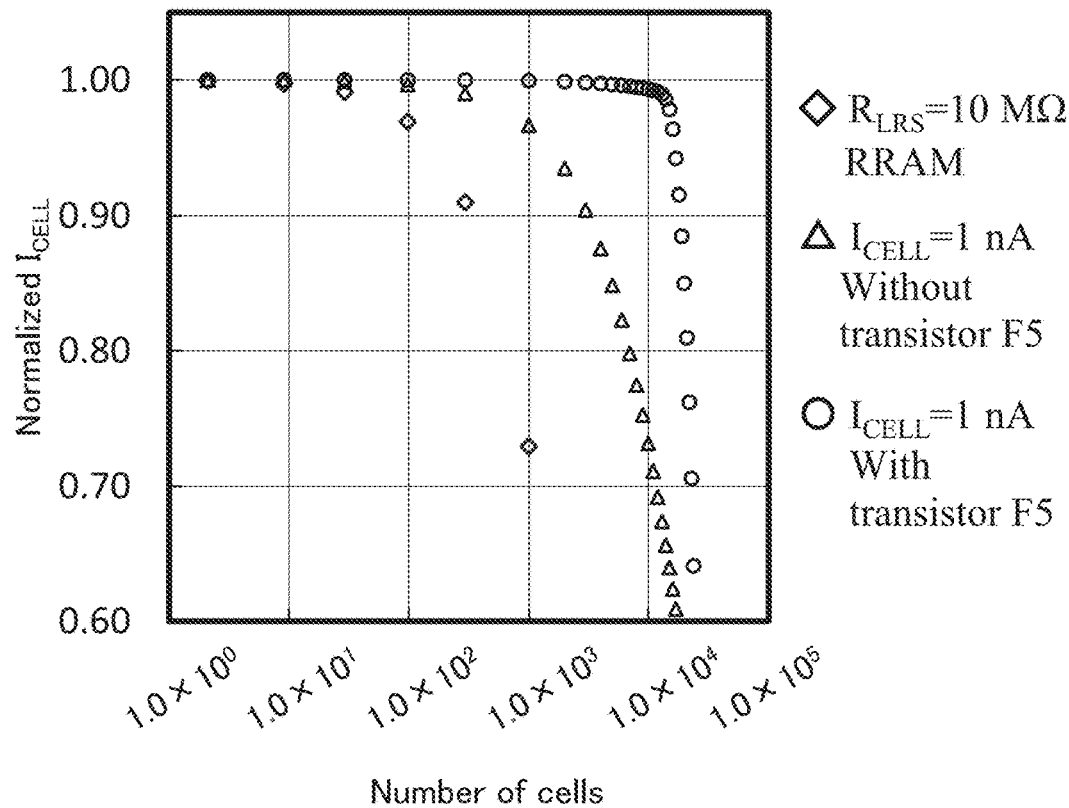

Simulation was performed to examine the dependence of the potential of the wiring WCL and the amount of a current flowing in the cell IM on the distance from the circuit ITS (read circuit) to the cell IM. FIG. 50A shows the simulated potential of the wiring WCL against the number of the cells IM electrically connected to one wiring WCL. FIG. 50B shows the simulated amount of a current output from each of the cells IM against the number of the cells IM electrically connected to one wiring WCL. Note that FIGS. 50A and 50B each show the results in the case where the cells IM are resistive random access memories (RRAMs), those in the case where the cells IM do not include the transistor F5, and those in the case where the cells IM include the transistors F5.

Note that a resistance $R_{LRS}$ of a variable resistor in a low-resistance state in the cell IM is 10 MC in the case where the cells IM are RRAMs. Furthermore, a current amount ICELL output from one cell IM is 1 nA in the case where the cells IM do not include the transistor F5 and the case where the cells IM include the transistors F5. In the graph shown in FIG. 50B, the vertical axis represents the current amount $I_{CELL}$ that is normalized (Normalized $I_{CELL}$).

The results in FIGS. 50A and 50B showed that in the case where the cells IM do not include the transistor F5, the amount of the current flowing in the wiring WCL decreases after the number of the cells IM electrically connected to the wiring WCL reaches approximately $1.0 \times 10^3$ or more. Meanwhile, in the case where the cells IM include the transistors F5, the amount of the current flowing in the wiring WCL does not decrease even when the number of the cells IM electrically connected to one wiring WCL is $1.0 \times 10^4$.

Figure 51:
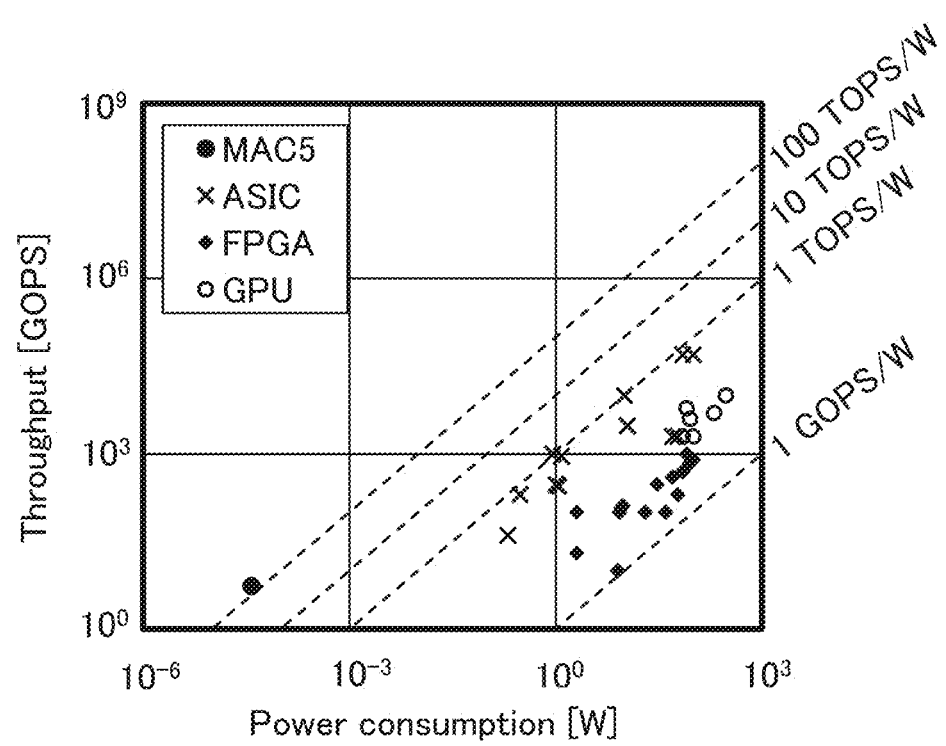
FIG. 51 is a graph showing benchmarks of a semiconductor device described in Example, ASICs, FPGAs, and GPUs.

Table 1 below shows comparison between the arithmetic circuit developed by the present applicant and the arithmetic circuits developed by other study groups and the like (A to E). FIG. 51 shows benchmarks of the arithmetic circuit (MAC5) developed by the present applicant, ASICs, FPGAs, and GPUs. It was confirmed that the arithmetic circuit MAC5 fabricated in this example achieved higher arithmetic efficiency than the other arithmetic circuits in the table below and FIG. 51.

TABLE 1

| | Arithmetic circuit MAC5 in this example | A | B | C | D | E |
|---|---|---|---|---|---|---|
| Peripheral circuit | | Incorporated | Incorporated | Incorporated | Not incorporated (only included in simulation) | Not incorporated (only included in simulation) | Not incorporated (only included in simulation) |
| Memory device | | CAAC-IGZO | RRAM | PCM | FeFET | RRAM | IGZO |
| Current/cell | | Below 1 nA | Below 4 μA | Below 8 μA | Below 5 μA | Below 135 μA | N.A. |
| Capacity of memory device | | 256 Kb | 158.8 Kb | 65.5 Kb | N.A. | 4 Kb | 36 Kb |
| Weight | | Analog | Analog | Analog | Two bits | Two bits | Ternary |
| Arithmetic efficiency | | 143.9 TOPS/W | 78.4 TOPS/W | 10.5 TOPS/W | 71.04 TOPS/W (simulated value) | N.A. | 15000 TOPS/W (simulated value) |
| Accuracy rate | | 93.2% *1 | 94.4% *1 | 85.6% *2 | 91.0% *2 | 96.4% *1 | 88% *2 |

*1 MNIST, *2 CIFAR-10

Note that in Table 1, the data on A was cited from Q. Liu et al., ISSCC, 2020, that on B was cited from R. Khaddan-Aljameh et al., VLSI, 2021., that on C was cited from S. Dutta et al., IEDM, 2020, that on D was cited from E. Esmanhotto et al., IEDM, 2020, and that on E was cited from D. Saito et al., IEEE Transactions on Electron Devices, vol. 67, no. 11.

This application is based on Japanese Patent Application Serial No. 2021-039484 filed with Japan Patent Office on Mar. 11, 2021, Japanese Patent Application Serial No. 2021-046105 filed with Japan Patent Office on Mar. 19, 2021, and Japanese Patent Application Serial No. 2021-120665 filed with Japan Patent Office on Jul. 21, 2021, the entire contents of which are hereby incorporated by reference.

What is claimed is:

1. A semiconductor device comprising:
   a converter circuit comprising:
      a first input terminal electrically connected to a first wiring;
      a second input terminal electrically connected to a second wiring; and
      an output terminal;
   a first cell electrically connected to the first wiring and a third wiring;
   a second cell electrically connected to the second wiring and the third wiring;
   a third cell electrically connected to the first wiring and a fourth wiring;
   a fourth cell electrically connected to the second wiring and the fourth wiring; and a first circuit configured:
  to send one of two first data to the first cell through the first wiring;
  to send the other of the two first data to the second cell through the second wiring;
  to send third data to the third cell through the first wiring; and
  to send the third data to the fourth cell through the second wiring,
wherein the third wiring is configured to send second data to the first cell and the second cell,
wherein the fourth wiring is configured to send fourth data to the third cell and the fourth cell,
wherein the first cell is configured to retain a first potential corresponding to the one of the two first data and to input a first current corresponding to a product of the one of the two first data and the second data into the first wiring,
wherein the second cell is configured to retain a second potential corresponding to the other of the two first data and to input a second current corresponding to a product of the other of the two first data and the second data into the second wiring,
wherein the third cell is configured to retain a third potential corresponding to the third data and to input a third current corresponding to a product of the third data and the fourth data,
wherein the fourth cell is configured to retain the third potential corresponding to the third data and to input a fourth current corresponding to a product of the third data and the fourth data into the second wiring,
wherein the converter circuit is configured to output a voltage corresponding to a differential current between a sum of the first current and the third current and a sum of the second current and the fourth current from the output terminal of the converter circuit, and
wherein at least one of the two first data is data representing 0.

2. The semiconductor device according to claim 1, wherein the converter circuit is configured to output a voltage corresponding to a sum of products of the second data and a difference between the two first data.

3. The semiconductor device according to claim 1,
wherein the semiconductor device comprises a plurality of cell units,
wherein one of the plurality of cell units comprises the first cell, the second cell, the third cell and the fourth cell, and
wherein each of the plurality of cell units is configured to flow current to the converter circuit.

4. The semiconductor device according to claim 1, further comprising:
a first reference cell; and
a second reference cell,
wherein each of the first cell, the second cell, the third cell and the fourth cell comprises a first transistor, a second transistor, and a first capacitor where one of a source and a drain of the first transistor is electrically connected to a gate of the second transistor and a first terminal of the first capacitor,
wherein each of the first reference cell and the second reference cell comprises a third transistor, a fourth transistor, and a second capacitor,
wherein each of the second transistor and the fourth transistor is configured to flow a current belonging to a subthreshold region for operation,
wherein in the first cell:
  the other of the source and the drain of the first transistor is electrically connected to the first wiring and one of a source and a drain of the second transistor; and
  a second terminal of the first capacitor is electrically connected to the third wiring,
wherein in the second cell:
  the other of the source and the drain of the first transistor is electrically connected to the second wiring and the one of the source and the drain of the second transistor; and
  a second terminal of the first capacitor is electrically connected to the third wiring,
wherein in the third cell:
  the other of the source and the drain of the first transistor is electrically connected to the first wiring and one of the source and the drain of the second transistor; and
  a second terminal of the first capacitor is electrically connected to the fourth wiring,
wherein in the fourth cell:
  the other of the source and the drain of the first transistor is electrically connected to the second wiring and the one of the source and the drain of the second transistor; and
  a second terminal of the first capacitor is electrically connected to the fourth wiring,
wherein in the first reference cell:
  one of a source and a drain of the third transistor is electrically connected to a gate of the fourth transistor and a first terminal of the second capacitor;
  the other of the source and the drain of the third transistor is electrically connected to the third wiring and one of a source and a drain of the fourth transistor; and
  a second terminal of the second capacitor is electrically connected to the third wiring, and
wherein in the second reference cell:
  one of a source and a drain of the third transistor is electrically connected to a gate of the fourth transistor and a first terminal of the second capacitor;
  the other of the source and the drain of the third transistor is electrically connected to the fourth wiring and one of the source and the drain of the fourth transistor; and
  a second terminal of the second capacitor is electrically connected to the fourth wiring.

5. The semiconductor device according to claim 4, further comprising:
a first layer comprising the first cell, the second cell, the third cell and the fourth cell; and
a second layer over the first layer, the second layer comprising a light-receiving element,
wherein the light-receiving element is electrically connected to the third wiring, and
wherein the light-receiving element is configured to generate a current corresponding to intensity of received light and is configured to flow the generated current to the third wiring as the third data.

6. A display apparatus comprising:
the semiconductor device according to claim 5; and
a light-emitting device,
wherein the second layer comprises the light-emitting device.

7. An electronic device comprising:
the display apparatus according to claim 6; and
a housing.

8. An operation method of a semiconductor device, comprising:
the first step comprising:
writing a first potential corresponding to one of two first data into a first cell; and
writing a second potential corresponding to the other of the two first data into a second cell;
the second step comprising:
writing a third potential corresponding to third data into each of a third cell and a fourth cell,
the third step comprising:
sending second data into the first cell and the second cell;
outputting a first current corresponding to a product of the one of the two first data and the second data from the first cell into a converter circuit; and
outputting a second current corresponding to a product of the other of the two first data and the second data into the converter circuit;
the fourth step comprising:
sending fourth data to the third cell and the fourth cell;
outputting a third current corresponding to a product of the third data and the fourth data from the third cell to the converter circuit; and
outputting a fourth current corresponding to a product of the third data and the fourth data from the fourth cell to the converter circuit; and
the fifth step comprising:
outputting a voltage corresponding to a differential current between a sum of the first current and the third current and a sum of the second current and the fourth current from the converter circuit,
wherein at least one of the two first data is data representing 0.

9. The operation method of a semiconductor device, according to claim 8,
wherein a first wiring sends the first potential to the first cell,
wherein a second wiring sends the second potential to the second cell,
wherein a third wiring sends the second data to the first cell and the second cell,
wherein the first wiring sends the third potential to the third cell, and the second wiring sends the third potential to the fourth cell, and
wherein a fourth wiring sends the fourth data to the third cell and the fourth cell.

10. The operation method of a semiconductor device, according to claim 8, further comprising a sixth step, a seventh step, an eighth step, a ninth step, a tenth step and an eleventh,
wherein the sixth step comprises a step of selecting any one of a first mode, a second mode and a third mode,
wherein the seventh step comprises:
a step of proceeding to the ninth step when the first mode is selected in the sixth step; and
a step of proceeding to the eighth step when the first mode is not selected in the sixth step,
wherein the eighth step comprises:
a step of proceeding to the tenth step when the second mode is selected in the sixth step; and
a step of proceeding to the eleventh step when the second mode is not selected in the sixth step,
wherein the ninth step comprises a step of setting the fourth data to $D_{XL}$,
wherein the tenth step comprises a step of setting the fourth data to $D_{XM}$,
wherein the eleventh step comprises a step of setting the fourth data to $D_{XS}$,
wherein the $D_{XL}$ is a value larger than the $D_{XM}$ and the $D_{XS}$,
wherein the $D_{XM}$ is a value larger than the $D_{XS}$,
wherein the $D_{XS}$ is a positive value, and
wherein the third step, the fourth step and the fifth step are performed after any one of the ninth step, the tenth step and the eleventh step is performed.

11. The operation method of a semiconductor device, according to claim 8, further comprising a sixth step, a seventh step, an eighth step, a ninth step, a tenth step and an eleventh step,
wherein the sixth step comprises a step of selecting any one of a first mode, a second mode and a third mode,
wherein the seventh step comprises:
a step of proceeding to the ninth step when the first mode is selected in the sixth step; and
a step of proceeding to the eighth step when the first mode is not selected in the sixth step,
wherein the eighth step comprises:
a step of proceeding to the tenth step when the second mode is selected in the sixth step; and
a step of proceeding to the eleventh step when the second mode is not selected in the sixth step,
wherein the ninth step comprises a step of setting the third data to $D_{WL}$,
wherein the tenth step comprises a step of setting the third data to $D_{WM}$,
wherein the eleventh step comprises a step of setting the third data to $D_{WS}$,
wherein the $D_{WL}$ is a value larger than the $D_{WM}$ and the $D_{WS}$,
wherein the $D_{WM}$ is a value larger than the $D_{WS}$,
wherein the $D_{WS}$ is a positive value, and
wherein the third step, the fourth and the fifth step are performed after any one of the ninth step, the tenth step and the eleventh step is performed.

12. The operation method of a semiconductor device, according to claim 10, wherein the first mode is selected in the sixth step when arithmetic processing performed by the semiconductor device is an authentication operation using an image.

13. The operation method of a semiconductor device, according to claim 10, wherein any one of the first mode, the second mode and the third mode is selected in the sixth step in accordance with power supplied to the semiconductor device.

* * * * *